(12) United States Patent
Huang

(10) Patent No.: US 12,395,192 B2
(45) Date of Patent: Aug. 19, 2025

(54) DATA INTERLEAVING METHOD AND DATA INTERLEAVING APPARATUS

(71) Applicant: Huawei Technologies Co., Ltd., Shenzhen (CN)

(72) Inventor: Kechao Huang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/593,519

(22) Filed: Mar. 1, 2024

(65) Prior Publication Data

US 2024/0275409 A1  Aug. 15, 2024

Related U.S. Application Data

(63) Continuation of application No. PCT/CN2022/110483, filed on Aug. 5, 2022.

(30) Foreign Application Priority Data

Sep. 3, 2021  (CN) .......................... 202111034610.X
Mar. 23, 2022  (CN) .......................... 202210290884.3

(51) Int. Cl.
*H03M 13/00*  (2006.01)
*H03M 13/27*  (2006.01)

(52) U.S. Cl.
CPC .............................. *H03M 13/2732* (2013.01)

(58) Field of Classification Search
CPC ......... H03M 13/2778; H03M 13/2703; H03M 13/2742; H03M 13/2771; H03M 13/2792; H03M 13/2732
See application file for complete search history.

(56) References Cited

U.S. PATENT DOCUMENTS 7,065,696 B1 * 6/2006 Liu ........................ H04L 1/0054
714/775
7,167,114 B2 * 1/2007 Champion ............ H04L 1/0071
341/81

(Continued)

FOREIGN PATENT DOCUMENTS

| CN | 1463525 A | 12/2003 |
| CN | 105071859 A | 11/2015 |

(Continued)

OTHER PUBLICATIONS

Wang Chen:"800G pluggable MSA 4×200G-FR4 Technical Specification Draft 1.0",Jun. 8, 2021,total 17 pages.

(Continued)

*Primary Examiner* — Esaw T Abraham
(74) *Attorney, Agent, or Firm* — Slater Matsil, LLP

(57) ABSTRACT

A data interleaving method including the following steps: separately delaying n data streams based on n delay lines, a delay value of each delay line is any delay value in a delay value set, the delay value set includes p delay values, a difference between every two adjacent delay values in the p delay values in the delay value set in ascending order is V symbols, a quantity of delay lines corresponding to each delay value in the delay value set is n/p, and V is an integer greater than or equal to 34; obtaining L*m symbols from each of n delayed data streams to obtain L first symbol sets; and separately interleaving the L first symbol sets to obtain L second symbol sets, where a quantity of symbols in the second symbol set is the same as a quantity of symbols in the first symbol set.

20 Claims, 36 Drawing Sheets

(56) References Cited

U.S. PATENT DOCUMENTS

| | | | | |
|---|---|---|---|---|
| 7,779,327 | B2 * | 8/2010 | Lee | H04L 1/007 |
| | | | | 714/755 |
| 7,995,696 | B1 * | 8/2011 | Norrie | H04L 25/14 |
| | | | | 375/372 |
| 8,737,522 | B2 * | 5/2014 | Taylor | H04L 1/0071 |
| | | | | 375/295 |
| 9,048,911 | B2 * | 6/2015 | Stadelmeier | H04B 7/0885 |
| 9,520,900 | B2 * | 12/2016 | Taylor | H03M 13/2732 |
| 2020/0220659 | A1 | 7/2020 | Riani et al. | |

FOREIGN PATENT DOCUMENTS

| | | |
|---|---|---|
| CN | 107124185 A | 9/2017 |
| CN | 108306639 A | 7/2018 |
| CN | 111684771 A | 9/2020 |
| EP | 3001572 A1 | 3/2016 |
| EP | 4459908 A1 | 11/2024 |
| JP | 2013183214 A | 9/2013 |
| JP | 2016208263 A | 12/2016 |

OTHER PUBLICATIONS

Ethernet Technology Consortium 800G Specification, Mar. 2020, total 17 pages, URL:https://ethernettechnologyconsortium.org/wp-content/uploads/2020/03/800G-Specification_r1.0.pdf.

IEEE Std 802.3™—2018,IEEE Standard for Ethernet, Jun. 14, 2018,total 5600 pages.

IEEE P802.3ck™ /D1.3,Draft Standard for Ethernet Amendment:Standard for Ethernet Amendment:Physical Layer Specifications and Management Parameters for 100 GB/s,200 GB/s,and 400 GB/s Electrical Interfaces Based on 100 GB/s Signaling,Sep. 1, 2020,total 283 pages.

Kishore Kota et al.,"Further considerations for 800LR Campus link specifications",OIF2021.242.01,May 2021,total 20 pages.

Tao Kai et al.,"FPGA Evaluation of 800G LR FEC Scheme",OIF2021.415.00,Jul. 26, 2021,total 5 pages.

* cited by examiner

DATA INTERLEAVING METHOD AND DATA INTERLEAVING APPARATUS

CROSS-REFERENCE TO RELATED APPLICATIONS

This application is a continuation of International Application No. PCT/CN2022/110483, filed on Aug. 5, 2022, which claims priorities to Chinese Patent Application No. 202111034610.X, filed on Sep. 3, 2021 and Chinese Patent Application No. 202210290884.3, filed on Mar. 23, 2022. All of the aforementioned patent applications are hereby incorporated by reference in their entireties.

TECHNICAL FIELD

This application relates to the communication field, and in particular, to a data interleaving method and a data interleaving apparatus.

BACKGROUND

Continuously promoted by 5G, cloud computing, big data, artificial intelligence, and the like, optical communication systems and optical transport networks (OTNs) are developing toward large capacities and ultra-high speeds. Transmitted data is corrected through forward error correction (FEC) encoding. This can resolve transmission bit errors and recover, from received data, original data that is sent at a transmit end.

Currently, a cascaded FEC transmission solution is provided. A transmit-end device and a transmit-end processing module are connected through an attachment unit interface (AUI). The transmit-end device performs first FEC encoding on to-be-transmitted data, and sends data obtained through the first FEC encoding to the transmit-end processing module. The transmit-end processing module performs second FEC encoding on the data obtained through the first FEC encoding, and transmits, to a data receive end through a channel, data obtained through the second FEC encoding. Specifically, the transmit-end processing module receives a plurality of data streams, first separately performs convolutional interleaving on the plurality of data streams, and then performs second FEC encoding on each data stream obtained through the convolutional interleaving. It should be understood that, to improve performance, one data stream on which the second FEC encoding is performed needs to be from a plurality of codewords obtained through the first FEC encoding. However, this needs to be implemented through convolutional interleaving with a high latency, and an application effect is not ideal in a scenario requiring a low latency.

SUMMARY

Embodiments of this application provide a data interleaving method and a data interleaving apparatus, so that good performance of a cascaded FEC solution can be implemented in a scenario in which a low latency is used.

According to a first aspect, this application provides a data interleaving method. The method includes the following steps: separately delaying n data streams based on n delay lines, where n is a positive integer that is divisible by p, p is an integer greater than 1, a delay value of each delay line is any delay value in a delay value set, the delay value set includes p delay values, a smallest delay value in the delay value set is 0, a difference between every two adjacent delay values in the p delay values in the delay value set in ascending order is V symbols, V is an integer greater than or equal to 34, and a quantity of delay lines corresponding to each delay value in the delay value set is n/p; obtaining L*m symbols from each of n delayed data streams to obtain L first symbol sets, where each first symbol set includes n*m symbols, L is an integer greater than or equal to 1, and m is an integer greater than or equal to 1; and separately interleaving the L first symbol sets to obtain L second symbol sets, where a quantity of symbols in each second symbol set is the same as a quantity of symbols in each first symbol set.

In this implementation, all the n data streams are codewords obtained through outer-code encoding. After the n data streams are separately delayed, data interleaving is further performed on the n delayed data streams. According to the delaying processing solution provided in this application, n symbols output from the n delayed data streams at a same moment can be from a plurality of different outer-code codewords by using a low latency. This helps reduce a data interleaving latency while ensuring good performance. In other words, the solution combining delaying processing and data interleaving in this application uses a low overall latency, and is more applicable to an application scenario requiring a low latency.

In some possible implementations, p=4, n is divisible by 16, the n delay lines include at least one group of delay lines, and each group of delay lines includes 16 adjacent delay lines; and delay values of delay line $a_0$, delay line $a_1$, delay line $a_2$, delay line $a_3$, delay line $a_4$, delay line $a_5$, delay line $a_6$, delay line $a_7$, delay line $a_8$, delay line $a_9$, delay line $a_{10}$, delay line $a_{11}$, delay line $a_{12}$, delay line $a_{13}$, delay line $a_{14}$, and delay line $a_{15}$ in group k of delay lines in the n delay lines satisfy a first condition, where $0 \leq k < n/16$, and $a_0, a_1, a_2, a_3, a_4, a_5, a_6, a_7, a_8, a_9, a_{10}, a_{11}, a_{12}, a_{13}, a_{14}$, and $a_{15}$ are non-negative integers less than 16 and are not equal to each other, where the first condition is:

a difference between the delay value of delay line $a_0$ and the delay value of delay line $a_1$ is 2V symbols;
a difference between the delay value of delay line $a_2$ and the delay value of delay line $a_3$ is 2V symbols;
a difference between the delay value of delay line $a_4$ and the delay value of delay line $a_5$ is 2V symbols;
a difference between the delay value of delay line $a_6$ and the delay value of delay line $a_7$ is 2V symbols;
a difference between the delay value of delay line $a_8$ and the delay value of delay line $a_9$ is 2V symbols;
a difference between the delay value of delay line $a_{10}$ and the delay value of delay line $a_{11}$ is 2V symbols;
a difference between the delay value of delay line $a_{12}$ and the delay value of delay line $a_{13}$ is 2V symbols; and
a difference between the delay value of delay line $a_{14}$ and the delay value of delay line $a_{15}$ is 2V symbols.

In this implementation, a client side has 8*100G interfaces with each lane of 100 Gb/s and uses a "100G RS-FEC" mode. If the foregoing first condition is satisfied and $V \geq 68$, in 16 symbols output each time after data streams 0 to 15 (or data streams 16 to 31) in 32 data streams are delayed, symbol $a_0$ and symbol $a_1$ are from two different RS codeword symbols, symbol $a_2$ and symbol $a_3$ are from two different RS codeword symbols, . . . , and symbol $a_{14}$ and symbol $a_{15}$ are from two different RS codeword symbols. This delay design manner facilitates subsequent use of an interleaving processing solution that is easy to implement and has a low latency, so as to implement good performance of a cascaded FEC solution and reduce an overall latency of a transmission solution.

In some possible implementations, in each group of 16 delay lines in the n delay lines, quantities of delay lines whose delay values are 0 symbols, V symbols, 2V symbols, and 3V symbols are all 4.

In some possible implementations, the delay values of delay line $a_0$, delay line $a_1$, delay line $a_2$, delay line $a_3$, delay line $a_4$, delay line $a_5$, delay line $a_6$, delay line $a_7$, delay line $a_8$, delay line $a_9$, delay line $a_{10}$, delay line $a_{11}$, delay line $a_{12}$, delay line $a_{13}$, delay line $a_{14}$, and delay line $a_{15}$ in group k of delay lines in the n delay lines satisfy a second condition, where the second condition is:

the delay value of delay line $a_0$, the delay value of delay line $a_4$, the delay value of delay line $a_8$, and the delay value of delay line $a_{12}$ are not equal to each other; the delay value of delay line $a_1$, the delay value of delay line $a_5$, the delay value of delay line $a_9$, and the delay value of delay line $a_{13}$ are not equal to each other; the delay value of delay line $a_2$, the delay value of delay line $a_6$, the delay value of delay line $a_{10}$, and the delay value of delay line $a_{14}$ are not equal to each other; and the delay value of delay line $a_3$, the delay value of delay line $a_7$, the delay value of delay line $a_{11}$, and the delay value of delay line $a_{15}$ are not equal to each other.

In this implementation, the client side has a 1*800G interface or 2*400G interfaces with each lane of 100 Gb/s. If the second condition is satisfied and V≥68, in the 16 symbols output each time after data streams 0 to 15 (or data streams 16 to 31) in the 32 data streams are delayed, symbol $a_0$, symbol $a_4$, symbol $a_8$, and symbol $a_{12}$ are from 4 different RS codeword symbols; symbol $a_1$, symbol $a_5$, symbol $a_9$, and symbol $a_{13}$ are from 4 different RS codeword symbols; symbol $a_2$, symbol $a_6$, symbol $a_{10}$, and symbol $a_{14}$ are from four different RS codeword symbols; and symbol $a_3$, symbol $a_7$, symbol $a_{11}$, and symbol $a_{15}$ are from four different RS codeword symbols. This delay design manner facilitates subsequent use of the interleaving processing solution that is easy to implement and has a low latency, so as to implement good performance of the cascaded FEC solution, and reduce the overall latency of the transmission solution.

In some possible implementations, the delay values of delay line $a_0$, delay line $a_2$, delay line $a_4$, delay line $a_6$, delay line $a_8$, delay line $a_{10}$, delay line $a_{12}$, and delay line $a_{14}$ in group k of delay lines in the n delay lines satisfy a third condition, where the third condition is:

a difference between the delay value of delay line $a_0$ and the delay value of delay line $a_4$ is 2V symbols, a difference between the delay value of delay line $a_2$ and the delay value of delay line $a_6$ is 2V symbols, a difference between the delay value of delay line $a_8$ and the delay value of delay line $a_{12}$ is 2V symbols, and a difference between the delay value of delay line $a_{10}$ and the delay value of delay line $a_{14}$ is 2V symbols.

In this implementation, the client side has 4*200G interfaces with each lane of 100 Gb/s. If the first and third conditions are satisfied and V≥68, in the 16 symbols output each time after data streams 0 to 15 (or data streams 16 to 31) in the 32 data streams are delayed, symbol $a_0$, symbol $a_1$, symbol $a_4$, and symbol $a_5$ are from four different RS codeword symbols; symbol $a_2$, symbol $a_3$, symbol $a_6$, and symbol $a_7$ are from four different RS codeword symbols; symbol $a_8$, symbol $a_9$, symbol $a_{12}$, and symbol $a_{13}$ are from four different RS codeword symbols; and symbol $a_{10}$, symbol $a_{11}$, symbol $a_{14}$, and symbol $a_{15}$ are from four different RS codeword symbols. This delay design manner facilitates subsequent use of the interleaving processing solution that is easy to implement and has a low latency, so as to implement good performance of the cascaded FEC solution, and reduce the overall latency of the transmission solution.

In some possible implementations, a first delay value set {A} sequentially includes the delay values of delay line $a_0$, delay line $a_1$, delay line $a_2$, delay line $a_3$, delay line $a_4$, delay line as, delay line $a_6$, delay line $a_7$, delay line $a_8$, delay line $a_9$, delay line $a_{10}$, delay line $a_{11}$, delay line $a_{12}$, delay line $a_{13}$, delay line $a_{14}$, and delay line $a_{15}$ in group k of delay lines in the n delay lines, and the first delay value set {A} includes one of the following:

{0, 2V, 0, 2V, 2V, 0, 2V, 0, V, 3V, V, 3V, 3V, V, 3V, V},
{0, 2V, 0, 2V, 2V, 0, 2V, 0, V, 3V, 3V, V, 3V, V, V, 3V},
{0, 2V, 0, 2V, 2V, 0, 2V, 0, 3V, V, V, 3V, V, 3V, 3V, V},
{0, 2V, 0, 2V, 2V, 0, 2V, 0, 3V, V, 3V, V, 3V, V, V, 3V},
{0, 2V, V, 3V, 2V, 0, 3V, V, V, 3V, 0, 2V, 3V, V, 2V, 0},
{0, 2V, V, 3V, 2V, 0, 3V, V, V, 3V, 2V, 0, 3V, V, 0, 2V},
{0, 2V, V, 3V, 2V, 0, 3V, V, 3V, V, 0, 2V, V, 3V, 2V, 0},
{0, 2V, V, 3V, 2V, 0, 3V, V, 3V, V, 2V, 0, V, 3V, 0, 2V},
{0, 2V, 2V, 0, 2V, 0, 0, 2V, V, 3V, V, 3V, 3V, V, 3V, V},
{0, 2V, 2V, 0, 2V, 0, 0, 2V, V, 3V, 3V, V, 3V, V, V, 3V},
{0, 2V, 2V, 0, 2V, 0, 0, 2V, 3V, V, V, 3V, V, 3V, 3V, V},
{0, 2V, 2V, 0, 2V, 0, 0, 2V, 3V, V, 3V, V, 3V, V, V, 3V},
{0, 2V, 3V, V, 2V, 0, V, 3V, V, 3V, 0, 2V, 3V, V, 2V, 0},
{0, 2V, 3V, V, 2V, 0, V, 3V, V, 3V, 2V, 0, 3V, V, 0, 2V},
{0, 2V, 3V, V, 2V, 0, V, 3V, 3V, V, 0, 2V, V, 3V, 2V, 0},
{0, 2V, 3V, V, 2V, 0, V, 3V, 3V, V, 2V, 0, V, 3V, 0, 2V},
{V, 3V, 0, 2V, 3V, V, 2V, 0, 0, 2V, V, 3V, 2V, 0, 3V, V},
{V, 3V, 0, 2V, 3V, V, 2V, 0, 0, 2V, 3V, V, 2V, 0, V, 3V},
{V, 3V, 0, 2V, 3V, V, 2V, 0, 2V, 0, V, 3V, 0, 2V, 3V, V},
{V, 3V, 0, 2V, 3V, V, 2V, 0, 2V, 0, 3V, V, 0, 2V, V, 3V},
{V, 3V, V, 3V, 3V, V, 3V, V, 0, 2V, 0, 2V, 2V, 0, 2V, 0},
{V, 3V, V, 3V, 3V, V, 3V, V, 0, 2V, 2V, 0, 2V, 0, 0, 2V},
{V, 3V, V, 3V, 3V, V, 3V, V, 2V, 0, 0, 2V, 0, 2V, 2V, 0},
{V, 3V, V, 3V, 3V, V, 3V, V, 2V, 0, 2V, 0, 0, 2V, 0, 2V},
{V, 3V, 2V, 0, 3V, V, 0, 2V, V, 3V, 0, 2V, 3V, V, 2V, 0},
{V, 3V, 2V, 0, 3V, V, 0, 2V, V, 3V, 2V, 0, 3V, V, 0, 2V},
{V, 3V, 2V, 0, 3V, V, 0, 2V, 3V, V, 0, 2V, V, 3V, 2V, 0},
{V, 3V, 2V, 0, 3V, V, 0, 2V, 3V, V, 2V, 0, V, 3V, 0, 2V},
{V, 3V, 3V, V, 3V, V, V, 3V, 0, 2V, 0, 2V, 2V, 0, 2V, 0},
{V, 3V, 3V, V, 3V, V, V, 3V, 0, 2V, 2V, 0, 2V, 0, 0, 2V},
{V, 3V, 3V, V, 3V, V, V, 3V, 2V, 0, 0, 2V, 0, 2V, 2V, 0},
{V, 3V, 3V, V, 3V, V, V, 3V, 2V, 0, 2V, 0, 0, 2V, 0, 2V},
{2V, 0, 0, 2V, 0, 2V, 2V, 0, V, 3V, V, 3V, 3V, V, 3V, V},
{2V, 0, 0, 2V, 0, 2V, 2V, 0, V, 3V, 3V, V, 3V, V, V, 3V},
{2V, 0, 0, 2V, 0, 2V, 2V, 0, 3V, V, V, 3V, V, 3V, 3V, V},
{2V, 0, 0, 2V, 0, 2V, 2V, 0, 3V, V, 3V, V, 3V, V, V, 3V},
{2V, 0, V, 3V, 0, 2V, 3V, V, V, 3V, 0, 2V, 3V, V, 2V, 0},
{2V, 0, V, 3V, 0, 2V, 3V, V, V, 3V, 2V, 0, 3V, V, 0, 2V},
{2V, 0, V, 3V, 0, 2V, 3V, V, 3V, V, 0, 2V, V, 3V, 2V, 0},
{2V, 0, V, 3V, 0, 2V, 3V, V, 3V, V, 2V, 0, V, 3V, 0, 2V},
{2V, 0, 2V, 0, 0, 2V, 0, 2V, V, 3V, V, 3V, 3V, V, 3V, V},
{2V, 0, 2V, 0, 0, 2V, 0, 2V, V, 3V, 3V, V, 3V, V, V, 3V},
{2V, 0, 2V, 0, 0, 2V, 0, 2V, 3V, V, V, 3V, V, 3V, 3V, V},
{2V, 0, 2V, 0, 0, 2V, 0, 2V, 3V, V, 3V, V, 3V, V, V, 3V},
{2V, 0, 3V, V, 0, 2V, V, 3V, V, 3V, 0, 2V, 3V, V, 2V, 0},
{2V, 0, 3V, V, 0, 2V, V, 3V, V, 3V, 2V, 0, 3V, V, 0, 2V},
{2V, 0, 3V, V, 0, 2V, V, 3V, 3V, V, 0, 2V, V, 3V, 2V, 0},
{2V, 0, 3V, V, 0, 2V, V, 3V, 3V, V, 2V, 0, V, 3V, 0, 2V},
{3V, V, 0, 2V, V, 3V, 2V, 0, 0, 2V, V, 3V, 2V, 0, 3V, V},
{3V, V, 0, 2V, V, 3V, 2V, 0, 0, 2V, 3V, V, 2V, 0, V, 3V},
{3V, V, 0, 2V, V, 3V, 2V, 0, 2V, 0, V, 3V, 0, 2V, 3V, V},
{3V, V, 0, 2V, V, 3V, 2V, 0, 2V, 0, 3V, V, 0, 2V, V, 3V},
{3V, V, V, 3V, V, 3V, 3V, V, 0, 2V, 0, 2V, 2V, 0, 2V, 0},
{3V, V, V, 3V, V, 3V, 3V, V, 0, 2V, 2V, 0, 2V, 0, 0, 2V},
{3V, V, V, 3V, V, 3V, 3V, V, 2V, 0, 0, 2V, 0, 2V, 2V, 0},
{3V, V, V, 3V, V, 3V, 3V, V, 2V, 0, 2V, 0, 0, 2V, 0, 2V},
{3V, V, 2V, 0, V, 3V, 0, 2V, V, 3V, 0, 2V, 3V, V, 2V, 0},
{3V, V, 2V, 0, V, 3V, 0, 2V, V, 3V, 2V, 0, 3V, V, 0, 2V},
{3V, V, 2V, 0, V, 3V, 0, 2V, 3V, V, 0, 2V, V, 3V, 2V, 0},
{3V, V, 2V, 0, V, 3V, 0, 2V, 3V, V, 2V, 0, V, 3V, 0, 2V},
{3V, V, 3V, V, V, 3V, V, 3V, 0, 2V, 0, 2V, 2V, 0, 2V, 0},
{3V, V, 3V, V, V, 3V, V, 3V, 0, 2V, 2V, 0, 2V, 0, 0, 2V},
{3V, V, 3V, V, V, 3V, V, 3V, 2V, 0, 0, 2V, 0, 2V, 2V, 0}, and
{3V, V, 3V, V, V, 3V, V, 3V, 2V, 0, 2V, 0, 0, 2V, 0, 2V}.

In this implementation, the client side has a 1*800G interface, 2*400G interfaces, modes) with each lane of 100

Gb/s. If the foregoing first delay value set {A} is satisfied and V≥68, in the 16 symbols output each time after data streams 0 to 15 (or data streams 16 to 31) in the 32 data streams are delayed, symbol $a_0$, symbol $a_1$, symbol $a_4$, symbol $a_5$, symbol $a_8$, symbol $a_9$, symbol $a_{12}$, and symbol $a_{13}$ are from eight different RS codeword symbols; and symbol $a_2$, symbol $a_3$, symbol $a_6$, symbol $a_7$, symbol $a_{10}$, symbol $a_{11}$, symbol $a_{14}$, and symbol $a_{15}$ are from eight different RS codeword symbols. This delay design manner facilitates subsequent use of the interleaving processing solution that is easy to implement and has a low latency, so as to implement good performance of the cascaded FEC solution, and reduce the overall latency of the transmission solution.

In some possible implementations, the delay values of delay line $a_0$, delay line $a_1$, delay line $a_2$, delay line $a_3$, delay line $a_4$, delay line $a_5$, delay line $a_6$, delay line $a_7$, delay line $a_8$, delay line $a_9$, delay line $a_{10}$, delay line $a_{11}$, delay line $a_{12}$, delay line $a_{13}$, delay line $a_{14}$, and delay line $a_{15}$ in group k of delay lines in the n delay lines satisfy a fourth condition, where the fourth condition is:

the delay value of delay line $a_0$ and the delay value of delay line $a_2$ are equal or have a difference of 2V symbols;

the delay value of delay line $a_1$ and the delay value of delay line $a_3$ are equal or have a difference of 2V symbols;

the delay value of delay line $a_2$ and the delay value of delay line $a_4$ are equal or have a difference of 2V symbols;

the delay value of delay line $a_3$ and the delay value of delay line $a_5$ are equal or have a difference of 2V symbols;

the delay value of delay line $a_4$ and the delay value of delay line $a_6$ are equal or have a difference of 2V symbols;

the delay value of delay line $a_5$ and the delay value of delay line $a_7$ are equal or have a difference of 2V symbols;

the delay value of delay line $a_9$ and the delay value of delay line $a_{10}$ are equal or have a difference of 2V symbols;

the delay value of delay line $a_{10}$ and the delay value of delay line $a_{11}$ are equal or have a difference of 2V symbols;

the delay value of delay line $a_{10}$ and the delay value of delay line $a_{12}$ are equal or have a difference of 2V symbols;

the delay value of delay line $a_{11}$ and the delay value of delay line $a_{13}$ are equal or have a difference of 2V symbols;

the delay value of delay line $a_{12}$ and the delay value of delay line $a_{14}$ are equal or have a difference of 2V symbols; and the delay value of delay line $a_{13}$ and the delay value of delay line $a_{15}$ are equal or have a difference of 2V symbols.

In some possible implementations, a second delay value set {B} sequentially includes the delay values of delay line $a_0$, delay line $a_1$, delay line $a_2$, delay line $a_3$, delay line $a_4$, delay line $a_5$, delay line $a_6$, delay line $a_7$, delay line $a_8$, delay line $a_9$, delay line $a_{10}$, delay line $a_{11}$, delay line $a_{12}$, delay line $a_{13}$, delay line $a_{14}$, and delay line $a_{15}$ in group k of delay lines in the n delay lines, and the second delay value set {B} includes one of the following:

{0, 2V, 0, 2V, 2V, 0, 2V, 0, V, 3V, V, 3V, 3V, V, 3V, V},
{0, 2V, 0, 2V, 2V, 0, 2V, 0, V, 3V, 3V, V, 3V, V, V, 3V},
{0, 2V, 0, 2V, 2V, 0, 2V, 0, 3V, V, V, 3V, V, 3V, 3V, V},
{0, 2V, 0, 2V, 2V, 0, 2V, 0, 3V, V, 3V, V, V, 3V, V, 3V},
{0, 2V, 2V, 0, 2V, 0, 0, 2V, V, 3V, V, 3V, 3V, V, 3V, V},
{0, 2V, 2V, 0, 2V, 0, 0, 2V, V, 3V, 3V, V, 3V, V, V, 3V},
{0, 2V, 2V, 0, 2V, 0, 0, 2V, 3V, V, V, 3V, V, 3V, 3V, V},
{0, 2V, 2V, 0, 2V, 0, 0, 2V, 3V, V, 3V, V, V, 3V, V, 3V},
{V, 3V, V, 3V, 3V, V, 3V, V, 0, 2V, 0, 2V, 2V, 0, 2V, 0},
{V, 3V, V, 3V, 3V, V, 3V, V, 0, 2V, 2V, 0, 2V, 0, 0, 2V},
{V, 3V, V, 3V, 3V, V, 3V, V, 2V, 0, 0, 2V, 0, 2V, 2V, 0},
{V, 3V, V, 3V, 3V, V, 3V, V, 2V, 0, 2V, 0, 0, 2V, 0, 2V},
{V, 3V, 3V, V, 3V, V, V, 3V, 0, 2V, 0, 2V, 2V, 0, 2V, 0},
{V, 3V, 3V, V, 3V, V, V, 3V, 0, 2V, 2V, 0, 2V, 0, 0, 2V},
{V, 3V, 3V, V, 3V, V, V, 3V, 2V, 0, 0, 2V, 0, 2V, 2V, 0},
{V, 3V, 3V, V, 3V, V, V, 3V, 2V, 0, 2V, 0, 0, 2V, 0, 2V},
{2V, 0, 0, 2V, 0, 2V, 2V, 0, V, 3V, V, 3V, 3V, V, 3V, V},
{2V, 0, 0, 2V, 0, 2V, 2V, 0, V, 3V, 3V, V, 3V, V, V, 3V},
{2V, 0, 0, 2V, 0, 2V, 2V, 0, 3V, V, V, 3V, V, 3V, 3V, V},
{2V, 0, 0, 2V, 0, 2V, 2V, 0, 3V, V, 3V, V, V, 3V, V, 3V},
{2V, 0, 2V, 0, 0, 2V, 0, 2V, V, 3V, V, 3V, 3V, V, 3V, V},
{2V, 0, 2V, 0, 0, 2V, 0, 2V, V, 3V, 3V, V, 3V, V, V, 3V},
{2V, 0, 2V, 0, 0, 2V, 0, 2V, 3V, V, V, 3V, V, 3V, 3V, V},
{2V, 0, 2V, 0, 0, 2V, 0, 2V, 3V, V, 3V, V, V, 3V, V, 3V},
{3V, V, V, 3V, V, 3V, 3V, V, 0, 2V, 0, 2V, 2V, 0, 2V, 0},
{3V, V, V, 3V, V, 3V, 3V, V, 0, 2V, 2V, 0, 2V, 0, 0, 2V},
{3V, V, V, 3V, V, 3V, 3V, V, 2V, 0, 0, 2V, 0, 2V, 2V, 0},
{3V, V, V, 3V, V, 3V, 3V, V, 2V, 0, 2V, 0, 0, 2V, 0, 2V},
{3V, V, 3V, V, V, 3V, V, 3V, 0, 2V, 0, 2V, 2V, 0, 2V, 0},
{3V, V, 3V, V, V, 3V, V, 3V, 0, 2V, 2V, 0, 2V, 0, 0, 2V},
{3V, V, 3V, V, V, 3V, V, 3V, 2V, 0, 0, 2V, 0, 2V, 2V, 0}, and
{3V, V, 3V, V, V, 3V, V, 3V, 2V, 0, 2V, 0, 0, 2V, 0, 2V}.

In some possible implementations, a serial number value set {C} sequentially includes values of $a_0$, $a_1$, $a_2$, $a_3$, $a_4$, $a_5$, $a_6$, $a_7$, $a_8$, $a_9$, $a_{10}$, $a_{11}$, $a_{12}$, $a_{13}$, $a_{14}$, and $a_{15}$, and the value set {C} includes one of the following:

{0, 1, 2, 3, 4, 5, 6, 7, 8, 9, 10, 11, 12, 13, 14, 15},
{0, 1, 2, 3, 4, 5, 6, 7, 8, 9, 10, 11, 14, 15, 12, 13},
{0, 1, 2, 3, 4, 5, 6, 7, 10, 11, 8, 9, 12, 13, 14, 15},
{0, 1, 2, 3, 4, 5, 6, 7, 10, 11, 8, 9, 14, 15, 12, 13},
{0, 1, 2, 3, 6, 7, 4, 5, 8, 9, 10, 11, 12, 13, 14, 15},
{0, 1, 2, 3, 6, 7, 4, 5, 8, 9, 10, 11, 14, 15, 12, 13},
{0, 1, 2, 3, 6, 7, 4, 5, 10, 11, 8, 9, 12, 13, 14, 15},
{0, 1, 2, 3, 6, 7, 4, 5, 10, 11, 8, 9, 14, 15, 12, 13},
{2, 3, 0, 1, 4, 5, 6, 7, 8, 9, 10, 11, 12, 13, 14, 15},
{2, 3, 0, 1, 4, 5, 6, 7, 8, 9, 10, 11, 14, 15, 12, 13},
{2, 3, 0, 1, 4, 5, 6, 7, 10, 11, 8, 9, 12, 13, 14, 15},
{2, 3, 0, 1, 4, 5, 6, 7, 10, 11, 8, 9, 14, 15, 12, 13},
{2, 3, 0, 1, 6, 7, 4, 5, 8, 9, 10, 11, 12, 13, 14, 15},
{2, 3, 0, 1, 6, 7, 4, 5, 8, 9, 10, 11, 14, 15, 12, 13},
{2, 3, 0, 1, 6, 7, 4, 5, 10, 11, 8, 9, 12, 13, 14, 15},
{2, 3, 0, 1, 6, 7, 4, 5, 10, 11, 8, 9, 14, 15, 12, 13},
{0, 3, 1, 2, 4, 7, 5, 6, 8, 11, 9, 10, 12, 15, 13, 14},
{0, 3, 1, 2, 4, 7, 5, 6, 8, 11, 9, 10, 13, 14, 12, 15},
{0, 3, 1, 2, 4, 7, 5, 6, 9, 10, 8, 11, 12, 15, 13, 14},
{0, 3, 1, 2, 4, 7, 5, 6, 9, 10, 8, 11, 13, 14, 12, 15},
{0, 3, 1, 2, 5, 6, 4, 7, 8, 11, 9, 10, 12, 15, 13, 14},
{0, 3, 1, 2, 5, 6, 4, 7, 8, 11, 9, 10, 13, 14, 12, 15},
{0, 3, 1, 2, 5, 6, 4, 7, 9, 10, 8, 11, 12, 15, 13, 14},
{0, 3, 1, 2, 5, 6, 4, 7, 9, 10, 8, 11, 13, 14, 12, 15},
{1, 2, 0, 3, 4, 7, 5, 6, 8, 11, 9, 10, 12, 15, 13, 14},
{1, 2, 0, 3, 4, 7, 5, 6, 8, 11, 9, 10, 13, 14, 12, 15},
{1, 2, 0, 3, 4, 7, 5, 6, 9, 10, 8, 11, 12, 15, 13, 14},
{1, 2, 0, 3, 4, 7, 5, 6, 9, 10, 8, 11, 13, 14, 12, 15},
{1, 2, 0, 3, 5, 6, 4, 7, 8, 11, 9, 10, 12, 15, 13, 14},
{1, 2, 0, 3, 5, 6, 4, 7, 8, 11, 9, 10, 13, 14, 12, 15},
{1, 2, 0, 3, 5, 6, 4, 7, 9, 10, 8, 11, 12, 15, 13, 14}, and
{1, 2, 0, 3, 5, 6, 4, 7, 9, 10, 8, 11, 13, 14, 12, 15}.

In some possible implementations, each first symbol set includes n first symbol subsets, and each first symbol subset includes m symbols sequentially arranged; and each second symbol set includes r second symbol subsets, and each second symbol subset includes c symbols, where r is an integer greater than 1, c is an integer greater than 1, n*m=r*c, and the c symbols in each second symbol subset correspond to c symbols distributed in c first symbol subsets in the first symbol set.

In some possible implementations, n=32, and serial number values of 32 first symbol subsets include $b_0$, $b_1$, $b_2$, $b_3$, $b_4$, $b_5$, $b_6$, $b_7$, $b_8$, $b_9$, $b_{10}$, $b_{11}$, $b_{12}$, $b_{13}$, $b_{14}$, $b_{15}$, $b_{16}$, $b_{17}$, $b_{18}$, $b_{19}$, $b_{20}$, $b_{21}$, $b_{22}$, $b_{23}$, $b_{24}$, $b_{25}$, $b_{26}$, $b_{27}$, $b_{28}$, $b_{29}$, $b_{30}$, and $b_{31}$, where $b_0$, $b_1$, $b_2$, $b_3$, $b_4$, $b_5$, $b_6$, $b_7$, $b_8$, $b_9$, $b_{10}$, $b_{11}$, $b_{12}$, $b_{13}$, $b_{14}$, and $b_{15}$ are respectively equal to delay line serial number values $a_0$, $a_1$, $a_2$, $a_3$, $a_4$, $a_5$, $a_6$, $a_7$, $a_8$, $a_9$, $a_{10}$, $a_{11}$, $a_{12}$, $a_{13}$, $a_{14}$, and $a_{15}$ of group 0 of delay lines in sequence; and $b_{16}$, $b_{17}$, $b_{18}$, $b_{19}$, $b_{20}$, $b_{21}$, $b_{22}$, $b_{23}$, $b_{24}$, $b_{25}$, $b_{26}$, $b_{27}$, $b_{28}$, $b_{29}$, $b_{30}$, and $b_{31}$ are respectively equal to delay line serial number values $a_0+16$, $a_1+16$, $a_2+16$, $a_3+16$, $a_4+16$, $a_5+16$, $a_6+16$, $a_7+16$, $a_8+16$, $a_9+16$, $a_{10}+16$, $a_{11}+16$, $a_{12}+16$, $a_{13}+16$, $a_{14}+16$, and $a_{15}+16$ of group 1 of delay lines in sequence.

In some possible implementations, n=32, m=1, c=8, r=4, and eight symbols in each second symbol subset satisfy a fifth condition, where the fifth condition includes any one of the following conditions:
- the eight symbols in each second symbol subset are respectively from first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set;
- the eight symbols in each second symbol subset are respectively from first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set;
- the eight symbols in each second symbol subset are respectively from first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;
- the eight symbols in each second symbol subset are respectively from first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set;
- four symbols in each second symbol subset are respectively from four first symbol subsets in first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other four symbols in each second symbol subset are respectively from four first symbol subsets in first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;
- four symbols in each second symbol subset are respectively from four first symbol subsets in first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other four symbols in each second symbol subset are respectively from four first symbol subsets in first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set;
- four symbols in each second symbol subset are respectively from four first symbol subsets in first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other four symbols in each second symbol subset are respectively from four first symbol subsets in first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set; and
- four symbols in each second symbol subset are respectively from four first symbol subsets in first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other four symbols in each second symbol subset are respectively from four first symbol subsets in first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set.

In some possible implementations, symbol j in second symbol subset i in the second symbol set is from first symbol subset $b_x$ in the first symbol set, where x=i+j*4, 0≤i<4, and 0≤j<8.

In some possible implementations, symbol j in second symbol subset i in the second symbol set is from first symbol subset $b_x$ in the first symbol set, where x=(i %2)*2+⌊i/2⌋*16+(j %2)+⌊j/2⌋*4, 0≤i<4, 0≤j<8, Y % Z represents a remainder obtained by dividing Y by Z, and ⌊Y/Z⌋ represents a quotient obtained by dividing Y by Z.

In some possible implementations, n=32, m=1, c=16, r=2, and 16 symbols in each second symbol subset satisfy a sixth condition, where the sixth condition includes any one of the following conditions:
- eight symbols in each second symbol subset are respectively from first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other eight symbols in each second symbol subset are respectively from first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;
- eight symbols in each second symbol subset are respectively from first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other eight symbols in each second symbol subset are respectively from first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set;
- eight symbols in each second symbol subset are respectively from first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other eight symbols in each second symbol subset are respectively from first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set; and eight symbols in each second symbol subset are respectively from first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other eight symbols in each second symbol subset are respectively from first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set.

In some possible implementations, symbol j in second symbol subset i in the second symbol set is from first symbol subset $b_x$ in the first symbol set, where $x=i*2+\lfloor j/2 \rfloor*4+j \% 2$, $0 \le i < 2$, $0 \le j < 16$, $Y \% Z$ represents a remainder obtained by dividing Y by Z, and $\lfloor Y/Z \rfloor$ represents a quotient obtained by dividing Y by Z.

In some possible implementations, symbol j in second symbol subset i in the second symbol set is from first symbol subset $b_x$ in the first symbol set, where $x=i*2+(j \% 8)*4+\lfloor j/8 \rfloor$, $0 \le i < 2$, $0 \le j < 16$, $Y \% Z$ represents a remainder obtained by dividing Y by Z, and $\lfloor Y/Z \rfloor$ represents a quotient obtained by dividing Y by Z.

In some possible implementations, symbol j in second symbol subset i in the second symbol set is from first symbol subset by in the first symbol set, where $x=(i\hat{}\lfloor j/8 \rfloor)*2+\lfloor j/2 \rfloor*4+j \% 2$, $0 \le i < 2$, $0 \le j < 16$, $Y \% Z$ represents a remainder obtained by dividing Y by Z, and $\lfloor Y/Z \rfloor$ represents a quotient obtained by dividing Y by Z.

In some possible implementations, n=32, m=3, c=12, r=8, and 12 symbols in each second symbol subset satisfy a seventh condition, where the seventh condition includes any one of the following conditions:

eight symbols in each second symbol subset are respectively from first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other four symbols in each second symbol subset are respectively from four first symbol subsets in first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

six symbols in each second symbol subset are respectively from six first symbol subsets in first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other six symbols in each second symbol subset are respectively from six first symbol subsets in first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

four symbols in each second symbol subset are respectively from four first symbol subsets in first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other eight symbols in each second symbol subset are respectively from first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

eight symbols in each second symbol subset are respectively from first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other four symbols in each second symbol subset are respectively from four first symbol subsets in first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set;

six symbols in each second symbol subset are respectively from six first symbol subsets in first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other six symbols in each second symbol subset are respectively from six first symbol subsets in first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set;

four symbols in each second symbol subset are respectively from four first symbol subsets in first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other eight symbols in each second symbol subset are respectively from first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set;

eight symbols in each second symbol subset are respectively from first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other four symbols in each second symbol subset are respectively from four first symbol subsets in first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

six symbols in each second symbol subset are respectively from six first symbol subsets in first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other six symbols in each second symbol subset are respectively from six first symbol subsets in first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

four symbols in each second symbol subset are respectively from four first symbol subsets in first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other eight symbols in each second symbol subset are respectively from first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

eight symbols in each second symbol subset are respectively from first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other four symbols in each second symbol subset are respectively from four first symbol subsets in first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set;

six symbols in each second symbol subset are respectively from six first symbol subsets in first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other six symbols in each second symbol subset are respectively from six first symbol subsets in first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set; and four symbols in each second symbol subset are respectively from four first symbol subsets in first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other eight symbols in each second symbol subset are respectively from first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set.

In some possible implementations, symbol j in second symbol subset i in the second symbol set is from symbol $\lfloor x/32 \rfloor$ in first symbol subset $b_{x \ \%32}$ in the first symbol set, where $x=\lfloor i/2 \rfloor*24+(i\ \%2)*2+\lfloor j/2 \rfloor*4+(j\ \%2)$, $0 \leq i < 8$, $0 \leq j < 12$, Y % Z represents a remainder obtained by dividing Y by Z, and $\lfloor Y/Z \rfloor$ represents a quotient obtained by dividing Y by Z.

In some possible implementations, symbol j in second symbol subset i in the second symbol set is from symbol $\lfloor x/32 \rfloor$ in first symbol subset $b_{x \ \%32}$ in the first symbol set, where $x=(i\ \%4)*24+\lfloor i/4 \rfloor*2+(j\ \%6)*4+\lfloor j/6 \rfloor$, $0 \leq i < 8$, $0 \leq j < 12$, Y % Z represents a remainder obtained by dividing Y by Z, and $\lfloor Y/Z \rfloor$ represents a quotient obtained by dividing Y by Z.

In some possible implementations, n=32, m=3, c=12, r=8, and 12 symbols in each second symbol subset satisfy an eighth condition, where the eighth condition includes:

four symbols in each second symbol subset are respectively from symbol 0 in first symbol subset $k_1$, symbol 0 in first symbol subset $k_1+8$, symbol 0 in first symbol subset $k_1+16$, and symbol 0 in first symbol subset $k_1+24$ in the first symbol set; other four symbols in each second symbol subset are respectively from symbol 1 in first symbol subset $k_2$, symbol 1 in first symbol subset $k_2+8$, symbol 1 in first symbol subset $k_2+16$, and symbol 1 in first symbol subset $k_2+24$ in the first symbol set; and the other four symbols in each second symbol subset are respectively from symbol 2 in first symbol subset $k_3$, symbol 2 in first symbol subset $k_3+8$, symbol 2 in first symbol subset $k_3+16$, and symbol 2 in first symbol subset $k_3+24$ in the first symbol set, where $k_1$, $k_2$, and $k_3$ are not equal to each other, $0 \leq k_1 < 8$, $0 \leq k_2 < 8$, and $0 \leq k_3 < 8$.

In some possible implementations, symbol j in second symbol subset i in the second symbol set is from symbol $\lfloor x/32 \rfloor$ in first symbol subset $b_{x \ \%32}$ in the first symbol set, where $x=(i+(j\ \%4)*8+\lfloor j/4 \rfloor*G)\ \%32+\lfloor j/4 \rfloor*32$, $0 \leq i < 8$, $0 \leq j < 12$, Y % Z represents a remainder obtained by dividing Y by Z, $\lfloor Y/Z \rfloor$ represents a quotient obtained by dividing Y by Z, and G is 2, 6, 10, 14, 18, 22, 26, or 30.

In some possible implementations, m symbols in first symbol subset h in the first symbol set are from delayed data stream h, $0 \leq h \leq n-1$, and V is an integer greater than or equal to 68.

In some possible implementations, V=Q*d, Q represents a quantity of storage elements in the delay line, d represents a quantity of symbols stored in each storage element, Q is an integer greater than or equal to 1, and d is an integer greater than or equal to 1.

In some possible implementations, each first symbol set is a first symbol matrix, each first symbol matrix includes n rows and m columns of symbols, each second symbol set is a second symbol matrix, each second symbol matrix includes r rows and c columns of symbols, and c symbols in each row of the second symbol matrix correspond to c symbols distributed in c rows of the first symbol matrix.

In some possible implementations, the n delay lines include g groups of delay lines, each group of delay lines includes p delay lines, delay values of the p delay lines in each group of delay lines are respectively the p delay values in the delay value set, each first symbol set is a first symbol matrix, each first symbol matrix includes n rows and m columns of symbols, each second symbol set is a second symbol matrix, each second symbol matrix includes r rows and c columns of symbols, c symbols in each row of the second symbol matrix correspond to c symbols distributed in c rows of the first symbol matrix, and g is an integer greater than 1.

In some possible implementations, n symbols in each column of the first symbol matrix include g groups, each of the g groups includes p symbols, g is an integer greater than 1, the c symbols in each row of the second symbol matrix include s groups, each of the s groups includes p symbols, s is an integer greater than 1, one group of p symbols in the second symbol matrix is from one group of p symbols in the first symbol matrix, and a total of 2p symbols in any two groups in each row of the second symbol matrix are from different rows of the first symbol matrix.

In some possible implementations, n=32, m=1, r=4, c=8, p=4, g=8, and s=2; and eight symbols in one row of the second symbol matrix respectively correspond to four symbols in group a and four symbols in group b in the first symbol matrix, where $0 \leq a < 4$, and $4 \leq b < 8$.

In some possible implementations, a symbol in row i and column j of the second symbol matrix corresponds to a symbol in row x %32 and column 0 of the first symbol matrix, where 0≤i<4 and 0≤j<8. x=(4*i+⌊j/4⌋*G+j %4)%16+⌊j/4⌋*16, where G is 0, 4, 8, or 12, Y % Z represents a remainder obtained by dividing Y by Z, and ⌊Y/Z⌋ represents a quotient obtained by dividing Y by Z.

In some possible implementations, n=32, m=2, r=4, c=16, p=4, g=8, and s=4; 16 symbols in one row of the second symbol matrix respectively correspond to four symbols in group a in column 0 of the first symbol matrix, four symbols in group b in column 0 of the first symbol matrix, four symbols in group e in column 1 of the first symbol matrix, and four symbols in group f in column 1 of the first symbol matrix, where a, b, e, and f are not equal to each other; and 0≤a<4, 0≤e<4, 4≤b<8, and 4≤f<8.

In some possible implementations, a symbol in row i and column j of the second symbol matrix corresponds to a symbol in row x %32 and column ⌊x/32⌋ of the first symbol matrix, where 0≤i<4 and 0≤j<16. x=(4*i+⌊j/8⌋*8+j %4)%16+⌊j/4⌋*16, where Y % Z represents a remainder obtained by dividing Y by Z, and ⌊Y/Z⌋ represents a quotient obtained by dividing Y by Z.

In some possible implementations, n=32, m=3, r=8, c=12, p=4, g=8, and s=3; 12 symbols in one row of the second symbol matrix respectively correspond to four symbols in group a in column 0 of the first symbol matrix, four symbols in group b in column 1 of the first symbol matrix, and four symbols in group e in column 2 of the first symbol matrix, where a, b, and e are not equal to each other; and 0≤a<4 and 4≤e<8, or 0≤e<4 and 4≤a<8.

In some possible implementations, a symbol in row i and column j of the second symbol matrix corresponds to a symbol in row x %32 and column ⌊x/32⌋ of the first symbol matrix, where 0≤i<8 and 0≤j<12. x=(4*i+⌊j/4⌋*24+j %4)%32+⌊j/4⌋*32, where Y % Z represents a remainder obtained by dividing Y by Z, and ⌊Y/Z⌋ represents a quotient obtained by dividing Y by Z.

In some possible implementations, first forward error correction FEC encoding is performed on all the n data streams, every A codewords obtained through the first FEC encoding are distributed in the n data streams, A consecutive symbols in each data stream are from A different first FEC codewords, A is an integer greater than or equal to 1, the n delay lines include g groups of delay lines, each group of delay lines includes p delay lines, delay values of the p delay lines in each group of delay lines are respectively the p delay values in the delay value set, g is an integer greater than or equal to 1, n=p*g, A*p symbols in each delayed group of p data streams are from A*p different first FEC codewords, and the A*p symbols include A consecutive symbols of each of the p data streams.

In some possible implementations, each first symbol set is a first symbol matrix, each first symbol matrix includes n rows and m columns of symbols, each second symbol set is a second symbol matrix, each second symbol matrix includes r rows and c columns of symbols, the first symbol matrix includes g first symbol sub-matrices, each first symbol sub-matrix includes p rows and m columns of symbols, the second symbol matrix includes g second symbol sub-matrices, each second symbol sub-matrix includes r0 rows and c columns of symbols, r0 is an integer greater than or equal to 1, c is an integer greater than or equal to 1, r=r0*g, p*m=r0*c, second symbol sub-matrix t is obtained by interleaving first symbol sub-matrix t, 0≤t<g, and c symbols in each row of each second symbol matrix are from c different codewords.

In some possible implementations, c symbols in each row of second symbol sub-matrix t are from c symbols in first symbol sub-matrix t, and c symbols in second symbol sub-matrix t are distributed in at most A columns of first symbol sub-matrix t.

In some possible implementations, symbols in first symbol sub-matrix t are arranged in an order, and symbols in row 0 to row p−1 of each column of first symbol sub-matrix t are p symbols arranged in the order; in two adjacent columns of first symbol sub-matrix t, symbols in row p−1 of the former column to row 1 of the latter column are two symbols arranged in the order; and c symbols in row 0 of second symbol sub-matrix t are from c symbols in group 0 that are arranged in the order starting from row 0 and column 0 of first symbol sub-matrix t, and the rest can be deduced by analogy, until c symbols in row r0−1 of second symbol sub-matrix t are from the last group of c symbols that are arranged in the order starting from row 0 and column 0 of first symbol sub-matrix t.

In some possible implementations, A=2, n=8, p=8, and g=1; or A=2, n=16, p=8, and g=2.

In some possible implementations, m=9, r=8*g, and c=9; m=5, r=4*g, and c=10; m=11, r=8*g, and c=11; m=3, r=2*g, and c=12; m=13, r=8*g, and c=13; m=7, r=4*g, and c=14; m=15, r=8*g, and c=15; or m=2, r=g, and c=16.

In some possible implementations, the delay values of the p delay lines in each group of delay lines sequentially increase by V symbols or sequentially decrease by V symbols.

In some possible implementations, n=32, and serial number values of 32 symbols that are output each time after 32 data streams are delayed include $b_0, b_1, b_2, b_3, b_4, b_5, b_6, b_7, b_8, b_9, b_{10}, b_{11}, b_{12}, b_{13}, b_{14}, b_{15}, b_{16}, b_{17}, b_{18}, b_{19}, b_{20}, b_{21}, b_{22}, b_{23}, b_{24}, b_{25}, b_{26}, b_{27}, b_{28}, b_{29}, b_{30}$, and $b_{31}$, where 16 symbols in group 0 in the 32 symbols that are output each time after the 32 data streams are delayed are from 16 different codewords, and 16 symbols in group 1 in the 32 symbols that are output each time after the 32 data streams are delayed are from 16 different codewords, where the 16 symbols in group 0 include: symbol $b_0$, symbol $b_1$, symbol $b_4$, symbol $b_5$, symbol $b_8$, symbol $b_9$, symbol $b_{12}$, symbol $b_{13}$, symbol $b_{16}$, symbol $b_{17}$, symbol $b_{20}$, symbol $b_{21}$, symbol $b_{24}$, symbol $b_{25}$, symbol $b_{28}$, and symbol $b_{29}$; and the 16 symbols in group 1 include: symbol $b_2$, symbol $b_3$, symbol $b_6$, symbol $b_7$, symbol $b_{10}$, symbol $b_{11}$, symbol $b_{14}$, symbol $b_{15}$, symbol $b_{18}$, symbol $b_{19}$, symbol $b_{22}$, symbol $b_{23}$, symbol $b_{26}$, symbol $b_{27}$, symbol $b_{30}$, and symbol $b_{31}$; or the 16 symbols in group 0 include: symbol $b_0$, symbol $b_1$, symbol $b_4$, symbol $b_5$, symbol $b_8$, symbol $b_9$, symbol $b_{12}$, symbol $b_{13}$, symbol $b_{18}$, symbol $b_{19}$, symbol $b_{22}$, symbol $b_{23}$, symbol $b_{26}$, symbol $b_{27}$, symbol $b_{30}$, and symbol $b_{31}$; and the 16 symbols in group 1 include: symbol $b_2$, symbol $b_3$, symbol $b_6$, symbol $b_7$, symbol $b_{10}$, symbol $b_{11}$, symbol $b_{14}$, symbol $b_{15}$, symbol $b_{16}$, symbol $b_{17}$, symbol $b_{20}$, symbol $b_{21}$, symbol $b_{24}$, symbol $b_{25}$, symbol $b_{28}$, and symbol $b_{29}$.

In some possible implementations, each first symbol set is a first symbol matrix, each first symbol matrix includes 32 rows and m columns of symbols, each second symbol set is a second symbol matrix, and each second symbol matrix includes r rows and c columns of symbols, where 16 rows of symbols in group 0 in the first symbol matrix sequentially includes a symbol in row 0, a symbol in row 1, a symbol in row 4, a symbol in row 5, a symbol in row 8, a symbol in row 9, a symbol in row 12, a symbol in row 13, a symbol in row 16, a symbol in row 17, a symbol in row 20, a symbol in row 21, a symbol in row 24, a symbol in row 25, a symbol in row 28, and a symbol in row 29; and 16 rows of symbols in group 1 in the first symbol matrix sequentially includes a symbol in row 2, a symbol in row 3, a symbol in row 6, a symbol in row 7, a symbol in row 10, a symbol in row 11, a symbol in row 14, a symbol in row 15, a symbol in row 18, a symbol in row 19, a symbol in row 22, a symbol in row 23, a symbol in row 26, a symbol in row 27, a symbol in row 30, and a symbol in row 31;

the 16 rows of symbols in group 0 are arranged in an order, and symbols in row 0 to row 15 of each column in the 16 rows of symbols in group 0 are 16 symbols arranged in the order; in two adjacent columns of the 16 rows of symbols in group 0, symbols in row 15 of the former column to row 0 of the latter column are two symbols arranged in the order; and c symbols in row 0 in r/2 rows of symbols in group 0 in the second symbol matrix are from c symbols in group 0 that are arranged in the order starting from row 0 and column 0 in the 16 rows of symbols in group 0, and the rest can be deduced by analogy, until c symbols in row r/2-1 in the r/2 rows of symbols in group 0 in the second symbol matrix are from the last group of c symbols that are arranged in the order starting from row 0 and column 0 in the 16 rows of symbols in group 0; and the 16 rows of symbols in group 1 are arranged in an order, and symbols in row 0 to row 15 of each column in the 16 rows of symbols in group 1 are 16 symbols arranged in the order; in two adjacent columns of the 16 rows of symbols in group 1, symbols in row 15 of the former column to row 0 of the latter column are two symbols arranged in the order; and c symbols in row 0 in r/2 rows of symbols in group 1 in the second symbol matrix are from c symbols in group 0 that are arranged in the order starting from row 0 and column 0 in the 16 rows of symbols in group 1, and the rest can be deduced by analogy, until c symbols in row r/2-1 in the r/2 rows of symbols in group 1 in the second symbol matrix are from the last group of c symbols that are arranged in the order starting from row 0 and column 0 in the 16 rows of symbols in group 1.

In some possible implementations, before the separately delaying n data streams based on n delay lines, the method further includes: performing lane reordering on the n data streams, to enable the n data streams to be arranged in a preset order; or after the separately delaying n data streams based on n delay lines, and before the obtaining L*m symbols from each of n delayed data streams to obtain L first symbol sets, the method further includes: performing lane reordering on the n data streams, to enable the n data streams to be arranged in a preset order.

In some possible implementations, before the separately delaying n data streams based on n delay lines, the method further includes: performing lane de-skew processing on the n data streams to obtain n aligned lane data streams.

In some possible implementations, the n data streams are all data streams obtained through the first FEC encoding, and after the separately interleaving the L first symbol sets to obtain L second symbol sets, the method further includes: performing second FEC encoding on the r second symbol subsets in each second symbol set to obtain L*r codewords.

According to a second aspect, this application provides a data interleaving apparatus. The data interleaving apparatus includes a delayer and an interleaver. The delayer is configured to separately delay n data streams based on n delay lines, where n is a positive integer that is divisible by p, p is an integer greater than 1, a delay value of each delay line is any delay value in a delay value set, the delay value set includes p delay values, a smallest delay value in the delay value set is 0, a difference between every two adjacent delay values in the p delay values in the delay value set in ascending order is V symbols, V is an integer greater than or equal to 34, and a quantity of delay lines corresponding to each delay value in the delay value set is n/p; and the interleaver is configured to: obtain L*m symbols from each of n delayed data streams to obtain L first symbol sets, where each first symbol set includes n*m symbols, L is an integer greater than or equal to 1, and m is an integer greater than or equal to 1; and separately interleave the L first symbol sets to obtain L second symbol sets, where a quantity of symbols in each second symbol set is the same as a quantity of symbols in each first symbol set.

In some possible implementations, p=4, n is divisible by 16, the n delay lines include at least one group of delay lines, and each group of delay lines includes 16 adjacent delay lines; and delay values of delay line $a_0$, delay line $a_1$, delay line $a_2$, delay line $a_3$, delay line $a_4$, delay line $a_5$, delay line $a_6$, delay line $a_7$, delay line $a_8$, delay line $a_9$, delay line $a_{10}$, delay line $a_{11}$, delay line $a_{12}$, delay line $a_{13}$, delay line $a_{14}$, and delay line $a_{15}$ in group k of delay lines in the n delay lines satisfy a first condition, where $0 \leq k < n/16$, and $a_0, a_1, a_2, a_3, a_4, a_5, a_6, a_7, a_8, a_9, a_{10}, a_{11}, a_{12}, a_{13}, a_{14}$, and $a_{15}$ are non-negative integers less than 16 and are not equal to each other, where the first condition is:

a difference between the delay value of delay line $a_0$ and the delay value of delay line $a_1$ is 2V symbols;

a difference between the delay value of delay line $a_2$ and the delay value of delay line $a_3$ is 2V symbols;

a difference between the delay value of delay line $a_4$ and the delay value of delay line $a_5$ is 2V symbols;

a difference between the delay value of delay line $a_6$ and the delay value of delay line $a_7$ is 2V symbols;

a difference between the delay value of delay line $a_8$ and the delay value of delay line $a_9$ is 2V symbols;

a difference between the delay value of delay line $a_{10}$ and the delay value of delay line $a_{11}$ is 2V symbols;

a difference between the delay value of delay line $a_{12}$ and the delay value of delay line $a_{13}$ is 2V symbols; and a difference between the delay value of delay line $a_{14}$ and the delay value of delay line $a_{15}$ is 2V symbols.

In some possible implementations, in each group of 16 delay lines in the n delay lines, quantities of delay lines whose delay values are 0 symbols, V symbols, 2V symbols, and 3V symbols are all 4.

In some possible implementations, the delay values of delay line $a_0$, delay line $a_1$, delay line $a_2$, delay line $a_3$, delay line $a_4$, delay line $a_5$, delay line $a_6$, delay line $a_7$, delay line $a_8$, delay line $a_9$, delay line $a_{10}$, delay line $a_{11}$, delay line $a_{12}$, delay line $a_{13}$, delay line $a_{14}$, and delay line $a_{15}$ in group k of delay lines in the n delay lines satisfy a second condition, where the second condition is:

the delay value of delay line $a_0$, the delay value of delay line $a_4$, the delay value of delay line $a_8$, and the delay value of delay line $a_{12}$ are not equal to each other; the delay value of delay line $a_1$, the delay value of delay line $a_5$, the delay value of delay line $a_9$, and the delay value of delay line $a_{13}$ are not equal to each other; the delay value of delay line $a_2$, the delay value of delay line $a_6$, the delay value of delay line $a_{10}$, and the delay value of delay line $a_{14}$ are not equal to each other; and the delay value of delay line $a_3$, the delay value of delay line $a_7$, the delay value of delay line $a_{11}$, and the delay value of delay line $a_{15}$ are not equal to each other.

In some possible implementations, the delay values of delay line $a_0$, delay line $a_2$, delay line $a_4$, delay line $a_6$, delay line $a_8$, delay line $a_{10}$, delay line $a_{12}$, and delay line $a_{14}$ in group k of delay lines in the n delay lines satisfy a third condition, where the third condition is:

a difference between the delay value of delay line $a_0$ and the delay value of delay line $a_4$ is 2V symbols, a difference between the delay value of delay line $a_2$ and the delay value of delay line $a_6$ is 2V symbols, a difference between the delay value of delay line $a_8$ and the delay value of delay line $a_{12}$ is 2V symbols, and a difference between the delay value of delay line $a_{10}$ and the delay value of delay line $a_{14}$ is 2V symbols.

In some possible implementations, a first delay value set {A} sequentially includes the delay values of delay line $a_0$, delay line $a_1$, delay line $a_2$, delay line $a_3$, delay line $a_4$, delay line $a_5$, delay line $a_6$, delay line $a_7$, delay line $a_8$, delay line $a_9$, delay line $a_{10}$, delay line $a_{11}$, delay line $a_{12}$, delay line $a_{13}$, delay line $a_{14}$, and delay line $a_{15}$ in group k of delay lines in the n delay lines, and the first delay value set {A} includes one of the following:

{0, 2V, 0, 2V, 2V, 0, 2V, 0, V, 3V, V, 3V, 3V, V, 3V, V},
{0, 2V, 0, 2V, 2V, 0, 2V, 0, V, 3V, 3V, V, 3V, V, V, 3V},
{0, 2V, 0, 2V, 2V, 0, 2V, 0, 3V, V, V, 3V, V, 3V, 3V, V},
{0, 2V, 0, 2V, 2V, 0, 2V, 0, 3V, V, 3V, V, V, 3V, 3V},
{0, 2V, V, 3V, 2V, 0, 3V, V, V, 3V, 0, 2V, 3V, V, 2V, 0},
{0, 2V, V, 3V, 2V, 0, 3V, V, V, 3V, 2V, 0, 3V, V, 0, 2V},
{0, 2V, V, 3V, 2V, 0, 3V, V, 3V, V, 0, 2V, V, 3V, 2V, 0},
{0, 2V, V, 3V, 2V, 0, 3V, V, 3V, V, 2V, 0, V, 3V, 0, 2V},
{0, 2V, 2V, 0, 2V, 0, 0, 2V, V, 3V, V, 3V, 3V, V, 3V, V},
{0, 2V, 2V, 0, 2V, 0, 0, 2V, V, 3V, 3V, V, 3V, V, V, 3V},
{0, 2V, 2V, 0, 2V, 0, 0, 2V, 3V, V, V, 3V, V, 3V, 3V, V},
{0, 2V, 2V, 0, 2V, 0, 0, 2V, 3V, V, 3V, V, V, 3V, 3V, V},
{0, 2V, 3V, V, 2V, 0, V, 3V, V, 3V, 0, 2V, 3V, V, 2V, 0},
{0, 2V, 3V, V, 2V, 0, V, 3V, V, 3V, 2V, 0, 3V, V, 0, 2V},
{0, 2V, 3V, V, 2V, 0, V, 3V, 3V, V, 0, 2V, V, 3V, 2V, 0},
{0, 2V, 3V, V, 2V, 0, V, 3V, 3V, V, 2V, 0, V, 3V, 0, 2V},
{V, 3V, 0, 2V, 3V, V, 2V, 0, 0, 2V, V, 3V, 2V, 0, 3V, V},
{V, 3V, 0, 2V, 3V, V, 2V, 0, 0, 2V, 3V, V, 2V, 0, V, 3V},
{V, 3V, 0, 2V, 3V, V, 2V, 0, 2V, 0, V, 3V, 0, 2V, 3V, V},
{V, 3V, 0, 2V, 3V, V, 2V, 0, 2V, 0, 3V, V, 0, 2V, V, 3V},
{V, 3V, V, 3V, 3V, V, 3V, V, 0, 2V, 0, 2V, 2V, 0, 2V, 0},
{V, 3V, V, 3V, 3V, V, 3V, V, 0, 2V, 2V, 0, 2V, 0, 0, 2V},
{V, 3V, V, 3V, 3V, V, 3V, V, 2V, 0, 0, 2V, 0, 2V, 2V, 0},
{V, 3V, V, 3V, 3V, V, 3V, V, 2V, 0, 2V, 0, 0, 2V, 0, 2V},
{V, 3V, 2V, 0, 3V, V, 0, 2V, 0, V, 3V, 2V, 0, 3V, V},
{V, 3V, 2V, 0, 3V, V, 0, 2V, 0, 2V, 3V, V, 2V, 0, V, 3V},
{V, 3V, 2V, 0, 3V, V, 0, 2V, 2V, 0, V, 3V, 0, 2V, 3V, V},
{V, 3V, 2V, 0, 3V, V, 0, 2V, 2V, 0, 3V, V, 0, 2V, V, 3V},
{V, 3V, 3V, V, 3V, V, V, 3V, 0, 2V, 0, 2V, 2V, 0, 2V, 0},
{V, 3V, 3V, V, 3V, V, V, 3V, 0, 2V, 2V, 0, 2V, 0, 0, 2V},
{V, 3V, 3V, V, 3V, V, V, 3V, 2V, 0, 0, 2V, 0, 2V, 2V, 0},
{V, 3V, 3V, V, 3V, V, V, 3V, 2V, 0, 2V, 0, 0, 2V, 0, 2V},
{2V, 0, 0, 2V, 0, 2V, 2V, 0, V, 3V, V, 3V, 3V, V, 3V, V},
{2V, 0, 0, 2V, 0, 2V, 2V, 0, V, 3V, 3V, V, 3V, V, V, 3V},
{2V, 0, 0, 2V, 0, 2V, 2V, 0, 3V, V, V, 3V, V, 3V, 3V, V},
{2V, 0, 0, 2V, 0, 2V, 2V, 0, 3V, V, 3V, V, V, 3V, 3V, V},
{2V, 0, V, 3V, 0, 2V, 3V, V, V, 3V, 0, 2V, 3V, V, 2V, 0},
{2V, 0, V, 3V, 0, 2V, 3V, V, V, 3V, 2V, 0, 3V, V, 0, 2V},
{2V, 0, V, 3V, 0, 2V, 3V, V, 3V, V, 0, 2V, V, 3V, 2V, 0},
{2V, 0, V, 3V, 0, 2V, 3V, V, 3V, V, 2V, 0, V, 3V, 0, 2V},
{2V, 0, 2V, 0, 0, 2V, 0, 2V, V, 3V, V, 3V, 3V, V, 3V, V},
{2V, 0, 2V, 0, 0, 2V, 0, 2V, V, 3V, 3V, V, 3V, V, V, 3V},
{2V, 0, 2V, 0, 0, 2V, 0, 2V, 3V, V, V, 3V, V, 3V, 3V, V},
{2V, 0, 2V, 0, 0, 2V, 0, 2V, 3V, V, 3V, V, V, 3V, 3V, V},
{2V, 0, 3V, V, 0, 2V, V, 3V, V, 3V, 0, 2V, 3V, V, 2V, 0},
{2V, 0, 3V, V, 0, 2V, V, 3V, V, 3V, 2V, 0, 3V, V, 0, 2V},
{2V, 0, 3V, V, 0, 2V, V, 3V, 3V, V, 0, 2V, V, 3V, 2V, 0},
{2V, 0, 3V, V, 0, 2V, V, 3V, 3V, V, 2V, 0, V, 3V, 0, 2V},
{3V, V, 0, 2V, V, 3V, 2V, 0, 0, 2V, V, 3V, 2V, 0, 3V, V},
{3V, V, 0, 2V, V, 3V, 2V, 0, 0, 2V, 3V, V, 2V, 0, V, 3V},
{3V, V, 0, 2V, V, 3V, 2V, 0, 2V, 0, V, 3V, 0, 2V, 3V, V},
{3V, V, 0, 2V, V, 3V, 2V, 0, 2V, 0, 3V, V, 0, 2V, V, 3V},
{3V, V, V, 3V, V, 3V, 3V, V, 0, 2V, 0, 2V, 2V, 0, 2V, 0},

{3V, V, V, 3V, V, 3V, 3V, V, 0, 2V, 2V, 0, 2V, 0, 0, 2V},
{3V, V, V, 3V, V, 3V, 3V, V, 2V, 0, 0, 2V, 0, 2V, 2V, 0},
{3V, V, V, 3V, V, 3V, 3V, V, 2V, 0, 2V, 0, 0, 2V, 0, 2V},
{3V, V, 2V, 0, V, 3V, 0, 2V, 0, V, 3V, 2V, 0, 3V, V},
{3V, V, 2V, 0, V, 3V, 0, 2V, 0, 2V, 3V, V, 2V, 0, V, 3V},
{3V, V, 2V, 0, V, 3V, 0, 2V, 2V, 0, V, 3V, 0, 2V, 3V, V},
{3V, V, 2V, 0, V, 3V, 0, 2V, 2V, 0, 3V, V, 0, 2V, V, 3V},
{3V, V, 3V, V, V, 3V, V, 3V, 0, 2V, 0, 2V, 2V, 0, 2V, 0},
{3V, V, 3V, V, V, 3V, V, 3V, 0, 2V, 2V, 0, 2V, 0, 0, 2V},
{3V, V, 3V, V, V, 3V, V, 3V, 2V, 0, 0, 2V, 0, 2V, 2V, 0}, and
{3V, V, 3V, V, V, 3V, V, 3V, 2V, 0, 2V, 0, 0, 2V, 0, 2V}.

In some possible implementations, the delay values of delay line $a_0$, delay line $a_1$, delay line $a_2$, delay line $a_3$, delay line $a_4$, delay line $a_5$, delay line $a_6$, delay line $a_7$, delay line $a_8$, delay line $a_9$, delay line $a_{10}$, delay line $a_{11}$, delay line $a_{12}$, delay line $a_{13}$, delay line $a_{14}$, and delay line $a_{15}$ in group k of delay lines in the n delay lines satisfy a fourth condition, where the fourth condition is:

the delay value of delay line $a_0$ and the delay value of delay line $a_2$ are equal or have a difference of 2V symbols;

the delay value of delay line $a_1$ and the delay value of delay line $a_3$ are equal or have a difference of 2V symbols;

the delay value of delay line $a_2$ and the delay value of delay line $a_4$ are equal or have a difference of 2V symbols;

the delay value of delay line $a_3$ and the delay value of delay line $a_5$ are equal or have a difference of 2V symbols;

the delay value of delay line $a_4$ and the delay value of delay line $a_6$ are equal or have a difference of 2V symbols;

the delay value of delay line $a_5$ and the delay value of delay line $a_7$ are equal or have a difference of 2V symbols;

the delay value of delay line $a_8$ and the delay value of delay line $a_{10}$ are equal or have a difference of 2V symbols;

the delay value of delay line $a_9$ and the delay value of delay line $a_{11}$ are equal or have a difference of 2V symbols;

the delay value of delay line $a_{10}$ and the delay value of delay line $a_{12}$ are equal or have a difference of 2V symbols;

the delay value of delay line $a_{11}$ and the delay value of delay line $a_{13}$ are equal or have a difference of 2V symbols;

the delay value of delay line $a_{12}$ and the delay value of delay line $a_{14}$ are equal or have a difference of 2V symbols; and the delay value of delay line $a_{13}$ and the delay value of delay line $a_{15}$ are equal or have a difference of 2V symbols.

In some possible implementations, a second delay value set {B} sequentially includes the delay values of delay line $a_0$, delay line $a_1$, delay line $a_2$, delay line $a_3$, delay line $a_4$, delay line $a_5$, delay line $a_6$, delay line $a_7$, delay line $a_8$, delay line $a_9$, delay line $a_{10}$, delay line $a_{11}$, delay line $a_{12}$, delay line $a_{13}$, delay line $a_{14}$, and delay line $a_{15}$ in group k of delay lines in the n delay lines, and the second delay value set {B} includes one of the following:

{0, 2V, 0, 2V, 2V, 0, 2V, 0, V, 3V, V, 3V, 3V, V, 3V, V},
{0, 2V, 0, 2V, 2V, 0, 2V, 0, V, 3V, 3V, V, 3V, V, V, 3V},
{0, 2V, 0, 2V, 2V, 0, 2V, 0, 3V, V, V, 3V, V, 3V, 3V, V},
{0, 2V, 0, 2V, 2V, 0, 2V, 0, 3V, V, 3V, V, V, 3V, V, 3V},
{0, 2V, 2V, 0, 2V, 0, 0, 2V, V, 3V, V, 3V, 3V, V, 3V, V},
{0, 2V, 2V, 0, 2V, 0, 0, 2V, V, 3V, 3V, V, 3V, V, V, 3V},
{0, 2V, 2V, 0, 2V, 0, 0, 2V, 3V, V, V, 3V, V, 3V, 3V, V},
{0, 2V, 2V, 0, 2V, 0, 0, 2V, 3V, V, 3V, V, V, 3V, V, 3V},
{V, 3V, V, 3V, 3V, V, 3V, V, 0, 2V, 0, 2V, 2V, 0, 2V, 0},
{V, 3V, V, 3V, 3V, V, 3V, V, 0, 2V, 2V, 0, 2V, 0, 0, 2V},
{V, 3V, V, 3V, 3V, V, 3V, V, 2V, 0, 0, 2V, 0, 2V, 2V, 0},
{V, 3V, V, 3V, 3V, V, 3V, V, 2V, 0, 2V, 0, 0, 2V, 0, 2V},
{V, 3V, 3V, V, 3V, V, V, 3V, 0, 2V, 0, 2V, 2V, 0, 2V, 0},
{V, 3V, 3V, V, 3V, V, V, 3V, 0, 2V, 2V, 0, 2V, 0, 0, 2V},
{V, 3V, 3V, V, 3V, V, V, 3V, 2V, 0, 0, 2V, 0, 2V, 2V, 0},
{V, 3V, 3V, V, 3V, V, V, 3V, 2V, 0, 2V, 0, 0, 2V, 0, 2V},
{2V, 0, 0, 2V, 0, 2V, 2V, 0, V, 3V, V, 3V, 3V, V, 3V, V},
{2V, 0, 0, 2V, 0, 2V, 2V, 0, V, 3V, 3V, V, 3V, V, V, 3V},
{2V, 0, 0, 2V, 0, 2V, 2V, 0, 3V, V, V, 3V, V, 3V, 3V, V},
{2V, 0, 0, 2V, 0, 2V, 2V, 0, 3V, V, 3V, V, V, 3V, V, 3V},
{2V, 0, 2V, 0, 0, 2V, 0, 2V, V, 3V, V, 3V, 3V, V, 3V, V},
{2V, 0, 2V, 0, 0, 2V, 0, 2V, V, 3V, 3V, V, 3V, V, V, 3V},
{2V, 0, 2V, 0, 0, 2V, 0, 2V, 3V, V, V, 3V, V, 3V, 3V, V},
{2V, 0, 2V, 0, 0, 2V, 0, 2V, 3V, V, 3V, V, V, 3V, V, 3V},
{3V, V, V, 3V, V, 3V, 3V, V, 0, 2V, 0, 2V, 2V, 0, 2V, 0},
{3V, V, V, 3V, V, 3V, 3V, V, 0, 2V, 2V, 0, 2V, 0, 0, 2V},
{3V, V, V, 3V, V, 3V, 3V, V, 2V, 0, 0, 2V, 0, 2V, 2V, 0},
{3V, V, V, 3V, V, 3V, 3V, V, 2V, 0, 2V, 0, 0, 2V, 0, 2V},
{3V, V, 3V, V, V, 3V, V, 3V, 0, 2V, 0, 2V, 2V, 0, 2V, 0},
{3V, V, 3V, V, V, 3V, V, 3V, 0, 2V, 2V, 0, 2V, 0, 0, 2V},
{3V, V, 3V, V, V, 3V, V, 3V, 2V, 0, 0, 2V, 0, 2V, 2V, 0}, and
{3V, V, 3V, V, V, 3V, V, 3V, 2V, 0, 2V, 0, 0, 2V, 0, 2V}.

In some possible implementations, a serial number value set {C} sequentially includes values of $a_0$, $a_1$, $a_2$, $a_3$, $a_4$, $a_5$, $a_6$, $a_7$, $a_8$, $a_9$, $a_{10}$, $a_{11}$, $a_{12}$, $a_{13}$, $a_{14}$, and $a_{15}$, and the value set {C} includes one of the following:

{0, 1, 2, 3, 4, 5, 6, 7, 8, 9, 10, 11, 12, 13, 14, 15},
{0, 1, 2, 3, 4, 5, 6, 7, 8, 9, 10, 11, 14, 15, 12, 13},
{0, 1, 2, 3, 4, 5, 6, 7, 10, 11, 8, 9, 12, 13, 14, 15},
{0, 1, 2, 3, 4, 5, 6, 7, 10, 11, 8, 9, 14, 15, 12, 13},
{0, 1, 2, 3, 6, 7, 4, 5, 8, 9, 10, 11, 12, 13, 14, 15},
{0, 1, 2, 3, 6, 7, 4, 5, 8, 9, 10, 11, 14, 15, 12, 13},
{0, 1, 2, 3, 6, 7, 4, 5, 10, 11, 8, 9, 12, 13, 14, 15},
{0, 1, 2, 3, 6, 7, 4, 5, 10, 11, 8, 9, 14, 15, 12, 13},
{2, 3, 0, 1, 4, 5, 6, 7, 8, 9, 10, 11, 12, 13, 14, 15},
{2, 3, 0, 1, 4, 5, 6, 7, 8, 9, 10, 11, 14, 15, 12, 13},
{2, 3, 0, 1, 4, 5, 6, 7, 10, 11, 8, 9, 12, 13, 14, 15},
{2, 3, 0, 1, 4, 5, 6, 7, 10, 11, 8, 9, 14, 15, 12, 13},
{2, 3, 0, 1, 6, 7, 4, 5, 8, 9, 10, 11, 12, 13, 14, 15},
{2, 3, 0, 1, 6, 7, 4, 5, 8, 9, 10, 11, 14, 15, 12, 13},
{2, 3, 0, 1, 6, 7, 4, 5, 10, 11, 8, 9, 12, 13, 14, 15},
{2, 3, 0, 1, 6, 7, 4, 5, 10, 11, 8, 9, 14, 15, 12, 13},
{0, 3, 1, 2, 4, 7, 5, 6, 8, 11, 9, 10, 12, 15, 13, 14},
{0, 3, 1, 2, 4, 7, 5, 6, 8, 11, 9, 10, 13, 14, 12, 15},
{0, 3, 1, 2, 4, 7, 5, 6, 9, 10, 8, 11, 12, 15, 13, 14},
{0, 3, 1, 2, 4, 7, 5, 6, 9, 10, 8, 11, 13, 14, 12, 15},
{0, 3, 1, 2, 5, 6, 4, 7, 8, 11, 9, 10, 12, 15, 13, 14},
{0, 3, 1, 2, 5, 6, 4, 7, 8, 11, 9, 10, 13, 14, 12, 15},
{0, 3, 1, 2, 5, 6, 4, 7, 9, 10, 8, 11, 12, 15, 13, 14},
{0, 3, 1, 2, 5, 6, 4, 7, 9, 10, 8, 11, 13, 14, 12, 15},
{1, 2, 0, 3, 4, 7, 5, 6, 8, 11, 9, 10, 12, 15, 13, 14},
{1, 2, 0, 3, 4, 7, 5, 6, 8, 11, 9, 10, 13, 14, 12, 15},
{1, 2, 0, 3, 4, 7, 5, 6, 9, 10, 8, 11, 12, 15, 13, 14},
{1, 2, 0, 3, 4, 7, 5, 6, 9, 10, 8, 11, 13, 14, 12, 15},
{1, 2, 0, 3, 5, 6, 4, 7, 8, 11, 9, 10, 12, 15, 13, 14},
{1, 2, 0, 3, 5, 6, 4, 7, 8, 11, 9, 10, 13, 14, 12, 15},
{1, 2, 0, 3, 5, 6, 4, 7, 9, 10, 8, 11, 12, 15, 13, 14}, and
{1, 2, 0, 3, 5, 6, 4, 7, 9, 10, 8, 11, 13, 14, 12, 15}.

In some possible implementations, each first symbol set includes n first symbol subsets, and each first symbol subset includes m symbols sequentially arranged; and each second symbol set includes r second symbol subsets, and each second symbol subset includes c symbols, where r is an integer greater than 1, c is an integer greater than 1, n*m=r*c, and the c symbols in each second symbol subset correspond to c symbols distributed in c first symbol subsets in the first symbol set.

In some possible implementations, n=32, and serial number values of 32 first symbol subsets include $b_0$, $b_1$, $b_2$, $b_3$, $b_4$, $b_5$, $b_6$, $b_7$, $b_8$, $b_9$, $b_{10}$, $b_{11}$, $b_{12}$, $b_{13}$, $b_{14}$, $b_{15}$, $b_{16}$, $b_{17}$, $b_{18}$, $b_{19}$, $b_{20}$, $b_{21}$, $b_{22}$, $b_{23}$, $b_{24}$, $b_{25}$, $b_{26}$, $b_{27}$, $b_{28}$, $b_{29}$, $b_{30}$, and $b_{31}$, where $b_0$, $b_1$, $b_2$, $b_3$, $b_4$, $b_5$, $b_6$, $b_7$, $b_8$, $b_9$, $b_{10}$, $b_{11}$, $b_{12}$, $b_{13}$, $b_{14}$, and bis are respectively equal to delay line serial number values $a_0$, $a_1$, $a_2$, $a_3$, $a_4$, $a_5$, $a_6$, $a_7$, $a_8$, $a_9$, $a_{10}$, $a_{11}$, $a_{12}$, $a_{13}$, $a_{14}$, and $a_{15}$ of group 0 of delay lines in sequence; and $b_{16}$, $b_{17}$, $b_{18}$, $b_{19}$, $b_{20}$, $b_{21}$, $b_{22}$, $b_{23}$, $b_{24}$, $b_{25}$, $b_{26}$, $b_{27}$, $b_{28}$, $b_{29}$, $b_{30}$, and $b_{31}$ are respectively equal to delay line serial number values $a_0+16$, $a_1+16$, $a_2+16$, $a_3+16$, $a_4+16$, $a_5+16$, $a_6+16$, $a_7+16$, $a_8+16$, $a_9+16$, $a_{10}+16$, $a_{11}+16$, $a_{12}+16$, $a_{13}+16$, $a_{14}+16$, and $a_{15}+16$ of group 1 of delay lines in sequence.

In some possible implementations, n=32, m=1, c=8, r=4, and eight symbols in each second symbol subset satisfy a fifth condition, where the fifth condition includes any one of the following conditions:

the eight symbols in each second symbol subset are respectively from first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set;

the eight symbols in each second symbol subset are respectively from first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set;

the eight symbols in each second symbol subset are respectively from first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

the eight symbols in each second symbol subset are respectively from first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set;

four symbols in each second symbol subset are respectively from four first symbol subsets in first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other four symbols in each second symbol subset are respectively from four first symbol subsets in first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

four symbols in each second symbol subset are respectively from four first symbol subsets in first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other four symbols in each second symbol subset are respectively from four first symbol subsets in first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set;

four symbols in each second symbol subset are respectively from four first symbol subsets in first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other four symbols in each second symbol subset are respectively from four first symbol subsets in first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set; and four symbols in each second symbol subset are respectively from four first symbol subsets in first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other four symbols in each second symbol subset are respectively from four first symbol subsets in first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set.

In some possible implementations, symbol j in second symbol subset i in the second symbol set is from first symbol subset $b_x$ in the first symbol set, where $x=i+j*4$, $0 \leq i < 4$, and $0 \leq j < 8$.

In some possible implementations, symbol j in second symbol subset i in the second symbol set is from first symbol subset $b_x$ in the first symbol set, where $x=(i\ \%2)*2+\lfloor i/2 \rfloor*16+(j\ \%2)+\lfloor j/4 \rfloor*4$, $0 \leq i < 4$, $0 \leq j < 8$, $Y\ \%\ Z$ represents a remainder obtained by dividing Y by Z, and $\lfloor Y/Z \rfloor$ represents a quotient obtained by dividing Y by Z.

In some possible implementations, n=32, m=1, c=16, r=2, and 16 symbols in each second symbol subset satisfy a sixth condition, where the sixth condition includes any one of the following conditions:

eight symbols in each second symbol subset are respectively from first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other eight symbols in each second symbol subset are respectively from first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

eight symbols in each second symbol subset are respectively from first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other eight symbols in each second symbol subset are respectively from first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set;

eight symbols in each second symbol subset are respectively from first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other eight symbols in each second symbol subset are respectively from first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set; and eight symbols in each second symbol subset are respectively from first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other eight symbols in each second symbol subset are respectively from first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set.

In some possible implementations, symbol j in second symbol subset i in the second symbol set is from first symbol subset $b_x$ in the first symbol set, where $x=i*2+\lfloor j/2 \rfloor*4+j\ \%2$, $0 \leq i < 2$, $0 \leq j < 16$, $Y\ \%\ Z$ represents a remainder obtained by dividing Y by Z, and $\lfloor Y/Z \rfloor$ represents a quotient obtained by dividing Y by Z.

In some possible implementations, symbol j in second symbol subset i in the second symbol set is from first symbol subset $b_x$ in the first symbol set, where $x=i*2+(j\ \%8)*4+\lfloor j/8 \rfloor$, $0 \leq i < 2$, $0 \leq j < 16$, $Y\ \%\ Z$ represents a remainder obtained by dividing Y by Z, and $\lfloor Y/Z \rfloor$ represents a quotient obtained by dividing Y by Z.

In some possible implementations, symbol j in second symbol subset i in the second symbol set is from first symbol subset $b_x$ in the first symbol set, where $x=(i\hat{}\lfloor j/8 \rfloor)*2+\lfloor j/2 \rfloor*4+j\ \%2$, $0 \leq i < 2$, $0 \leq j < 16$, $Y\ \%\ Z$ represents a remainder obtained by dividing Y by Z, and $\lfloor Y/Z \rfloor$ represents a quotient obtained by dividing Y by Z.

In some possible implementations, n=32, m=3, c=12, r=8, and 12 symbols in each second symbol subset satisfy a seventh condition, where the seventh condition includes any one of the following conditions:

eight symbols in each second symbol subset are respectively from first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other four symbols in each second symbol subset are respectively from four first symbol subsets in first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

six symbols in each second symbol subset are respectively from six first symbol subsets in first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other six symbols in each second symbol subset are respectively from six first symbol subsets in first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

four symbols in each second symbol subset are respectively from four first symbol subsets in first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other eight symbols in each second symbol subset are respectively from first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

eight symbols in each second symbol subset are respectively from first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other four symbols in each second symbol subset are respectively from four first symbol subsets in first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set;

six symbols in each second symbol subset are respectively from six first symbol subsets in first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other six symbols in each second symbol subset are respectively from six first symbol subsets in first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set;

four symbols in each second symbol subset are respectively from four first symbol subsets in first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other eight symbols in each second symbol subset are respectively from first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set;

eight symbols in each second symbol subset are respectively from first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other four symbols in each second symbol subset are respectively from four first symbol subsets in first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

six symbols in each second symbol subset are respectively from six first symbol subsets in first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other six symbols in each second symbol subset are respectively from six first symbol subsets in first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

four symbols in each second symbol subset are respectively from four first symbol subsets in first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other eight symbols in each second symbol subset are respectively from first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

eight symbols in each second symbol subset are respectively from first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other four symbols in each second symbol subset are respectively from four first symbol subsets in first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set;

six symbols in each second symbol subset are respectively from six first symbol subsets in first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other six symbols in each second symbol subset are respectively from six first symbol subsets in first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set; and four symbols in each second symbol subset are respectively from four first symbol subsets in first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other eight symbols in each second symbol subset are respectively from first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set.

In some possible implementations, symbol j in second symbol subset i in the second symbol set is from symbol $\lfloor x/32 \rfloor$ in first symbol subset $b_{x\ \%32}$ in the first symbol set, where $x=\lfloor i/2 \rfloor*24+(i\ \%2)*2+\lfloor j/2 \rfloor*4+(j\ \%2)$, $0 \le i < 8$, $0 \le j < 12$, Y % Z represents a remainder obtained by dividing Y by Z, and $\lfloor Y/Z \rfloor$ represents a quotient obtained by dividing Y by Z.

In some possible implementations, symbol j in second symbol subset i in the second symbol set is from symbol $\lfloor x/32 \rfloor$ in first symbol subset $b_{x\ \%32}$ in the first symbol set, where $x=(i\ \%4)*24+\lfloor i/4 \rfloor*2+(j\ \%6)*4+\lfloor j/6 \rfloor$, $0 \le i < 8$, $0 \le j < 12$, Y % Z represents a remainder obtained by dividing Y by Z, and $\lfloor Y/Z \rfloor$ represents a quotient obtained by dividing Y by Z.

In some possible implementations, n=32, m=3, c=12, r=8, and 12 symbols in each second symbol subset satisfy an eighth condition, where the eighth condition includes:

four symbols in each second symbol subset are respectively from symbol 0 in first symbol subset $k_1$, symbol 0 in first symbol subset $k_1+8$, symbol 0 in first symbol subset $k_1+16$, and symbol 0 in first symbol subset $k_1+24$ in the first symbol set; other four symbols in each second symbol subset are respectively from symbol 1 in first symbol subset $k_2$, symbol 1 in first symbol subset $k_2+8$, symbol 1 in first symbol subset $k_2+16$, and symbol 1 in first symbol subset $k_2+24$ in the first symbol set; and the other four symbols in each second symbol subset are respectively from symbol 2 in first symbol subset $k_3$, symbol 2 in first symbol subset $k_3+8$, symbol 2 in first symbol subset $k_3+16$, and symbol 2 in first symbol subset $k_3+24$ in the first symbol set, where $k_1$, $k_2$, and $k_3$ are not equal to each other, $0 \le k_1 < 8$, $0 \le k_2 < 8$, and $0 \le k_3 < 8$.

In some possible implementations, symbol j in second symbol subset i in the second symbol set is from symbol $\lfloor x/32 \rfloor$ in first symbol subset $b_{x \ \%32}$ in the first symbol set, where $x=(i+(j \ \%4)*8+\lfloor j/4 \rfloor *G) \ \%32+\lfloor j/4 \rfloor *32$, $0 \le i < 8$, $0 \le j < 12$, Y % Z represents a remainder obtained by dividing Y by Z, $\lfloor Y/Z \rfloor$ represents a quotient obtained by dividing Y by Z, and G is 2, 6, 10, 14, 18, 22, 26, or 30.

In some possible implementations, m symbols in first symbol subset h in the first symbol set are from delayed data stream h, $0 \le h \le n-1$, and V is an integer greater than or equal to 68.

In some possible implementations, V=Q*d, Q represents a quantity of storage elements in the delay line, d represents a quantity of symbols stored in each storage element, Q is an integer greater than or equal to 1, and d is an integer greater than or equal to 1.

In some possible implementations, each first symbol set is a first symbol matrix, each first symbol matrix includes n rows and m columns of symbols, each second symbol set is a second symbol matrix, each second symbol matrix includes r rows and c columns of symbols, and c symbols in each row of the second symbol matrix correspond to c symbols distributed in c rows of the first symbol matrix.

In some possible implementations, the n delay lines include g groups of delay lines, each group of delay lines includes p delay lines, delay values of the p delay lines in each group of delay lines are respectively the p delay values in the delay value set, each first symbol set is a first symbol matrix, each first symbol matrix includes n rows and m columns of symbols, each second symbol set is a second symbol matrix, each second symbol matrix includes r rows and c columns of symbols, c symbols in each row of the second symbol matrix correspond to c symbols distributed in c rows of the first symbol matrix, and g is an integer greater than 1.

In some possible implementations, n symbols in each column of the first symbol matrix include g groups, each of the g groups includes p symbols, g is an integer greater than 1, the c symbols in each row of the second symbol matrix include s groups, each of the s groups includes p symbols, s is an integer greater than 1, one group of p symbols in the second symbol matrix is from one group of p symbols in the first symbol matrix, and a total of 2p symbols in any two groups in each row of the second symbol matrix are from different rows of the first symbol matrix.

In some possible implementations, n=32, m=1, r=4, c=8, p=4, g=8, and s=2; and eight symbols in one row of the second symbol matrix respectively correspond to four symbols in group a and four symbols in group b in the first symbol matrix, where $0 \le a < 4$, and $4 \le b < 8$.

In some possible implementations, a symbol in row i and column j of the second symbol matrix corresponds to a symbol in row x %32 and column 0 of the first symbol matrix, where $0 \le i < 4$ and $0 \le j < 8$. $x=(4*i+\lfloor j/4 \rfloor *G+j \ \%4)\%16+\lfloor j/4 \rfloor *16$, where G is 0, 4, 8, or 12, Y % Z represents a remainder obtained by dividing Y by Z, and $\lfloor Y/Z \rfloor$ represents a quotient obtained by dividing Y by Z.

In some possible implementations, n=32, m=2, r=4, c=16, p=4, g=8, and s=4; 16 symbols in one row of the second symbol matrix respectively correspond to four symbols in group a in column 0 of the first symbol matrix, four symbols in group b in column 0 of the first symbol matrix, four symbols in group e in column 1 of the first symbol matrix, and four symbols in group f in column 1 of the first symbol matrix, where a, b, e, and f are not equal to each other; and $0 \le a < 4$, $0 \le e < 4$, $4 \le b < 8$, and $4 \le f < 8$.

In some possible implementations, a symbol in row i and column j of the second symbol matrix corresponds to a symbol in row x %32 and column $\lfloor x/32 \rfloor$ of the first symbol matrix, where $0 \le i < 4$ and $0 \le j < 16$. $x=(4*i+\lfloor j/8 \rfloor *8+j \ \%4)\%16+\lfloor j/4 \rfloor *16$, where Y % Z represents a remainder obtained by dividing Y by Z, and $\lfloor Y/Z \rfloor$ represents a quotient obtained by dividing Y by Z.

In some possible implementations, n=32, m=3, r=8, c=12, p=4, g=8, and s=3; 12 symbols in one row of the second symbol matrix respectively correspond to four symbols in group a in column 0 of the first symbol matrix, four symbols in group b in column 1 of the first symbol matrix, and four symbols in group e in column 2 of the first symbol matrix, where a, b, and e are not equal to each other; and $0 \le a < 4$ and $4 \le e < 8$, or $0 \le e < 4$ and $4 \le a < 8$.

In some possible implementations, a symbol in row i and column j of the second symbol matrix corresponds to a symbol in row x %32 and column $\lfloor x/32 \rfloor$ of the first symbol matrix, where $0 \le i < 8$ and $0 \le j < 12$. $x=(4*i+\lfloor j/4 \rfloor *24+j \ \%4)\%32+\lfloor j/4 \rfloor *32$, where Y % Z represents a remainder obtained by dividing Y by Z, and $\lfloor Y/Z \rfloor$ represents a quotient obtained by dividing Y by Z.

In some possible implementations, first forward error correction FEC encoding is performed on all the n data streams, every A codewords obtained through the first FEC encoding are distributed in the n data streams, A consecutive symbols in each data stream are from A different first FEC codewords, A is an integer greater than or equal to 1, the n delay lines include g groups of delay lines, each group of delay lines includes p delay lines, delay values of the p delay lines in each group of delay lines are respectively the p delay values in the delay value set, g is an integer greater than or equal to 1, n=p*g, A*p symbols in each delayed group of p data streams are from A*p different first FEC codewords, and the A*p symbols include A consecutive symbols of each of the p data streams.

In some possible implementations, each first symbol set is a first symbol matrix, each first symbol matrix includes n rows and m columns of symbols, each second symbol set is a second symbol matrix, each second symbol matrix includes r rows and c columns of symbols, the first symbol matrix includes g first symbol sub-matrices, each first symbol sub-matrix includes p rows and m columns of symbols, the second symbol matrix includes g second symbol sub-matrices, each second symbol sub-matrix includes r0 rows and c columns of symbols, r0 is an integer greater than or equal to 1, c is an integer greater than or equal to 1, r=r0*g, p*m=r0*c, second symbol sub-matrix t is obtained by interleaving first symbol sub-matrix t, $0 \le t < g$, and c symbols in each row of each second symbol matrix are from c different codewords.

In some possible implementations, c symbols in each row of second symbol sub-matrix t are from c symbols in first symbol sub-matrix t, and c symbols in second symbol sub-matrix t are distributed in at most A columns of first symbol sub-matrix t.

In some possible implementations, symbols in first symbol sub-matrix t are arranged in an order, and symbols in row 0 to row p−1 of each column of first symbol sub-matrix t are p symbols arranged in the order; in two adjacent columns of first symbol sub-matrix t, symbols in row p−1 of the former column to row 1 of the latter column are two symbols arranged in the order; and c symbols in row 0 of second symbol sub-matrix t are from c symbols in group 0 that are arranged in the order starting from row 0 and column 0 of first symbol sub-matrix t, and the rest can be deduced by analogy, until c symbols in row r0−1 of second symbol sub-matrix t are from the last group of c symbols that are arranged in the order starting from row 0 and column 0 of first symbol sub-matrix t.

In some possible implementations, A=2, n=8, p=8, and g=1; or A=2, n=16, p=8, and g=2.

In some possible implementations, m=9, r=8*g, and c=9; m=5, r=4*g, and c=10; m=11, r=8*g, and c=11; m=3, r=2*g, and c=12; m=13, r=8*g, and c=13; m=7, r=4*g, and c=14; m=15, r=8*g, and c=15; or m=2, r=g, and c=16.

In some possible implementations, the delay values of the p delay lines in each group of delay lines sequentially increase by V symbols or sequentially decrease by V symbols.

In some possible implementations, n=32, and serial number values of 32 symbols that are output each time after 32 data streams are delayed include $b_0$, $b_1$, $b_2$, $b_3$, $b_4$, $b_5$, $b_6$, $b_7$, $b_8$, $b_9$, $b_{10}$, $b_{11}$, $b_{12}$, $b_{13}$, $b_{14}$, $b_{15}$, $b_{16}$, $b_{17}$, $b_{18}$, $b_{19}$, $b_{20}$, $b_{21}$, $b_{22}$, $b_{23}$, $b_{24}$, $b_{25}$, $b_{26}$, $b_{27}$, $b_{28}$, $b_{29}$, $b_{30}$, and $b_{31}$, where 16 symbols in group 0 in the 32 symbols that are output each time after the 32 data streams are delayed are from 16 different codewords, and 16 symbols in group 1 in the 32 symbols that are output each time after the 32 data streams are delayed are from 16 different codewords, where the 16 symbols in group 0 include: symbol $b_0$, symbol $b_1$, symbol $b_4$, symbol $b_5$, symbol $b_8$, symbol $b_9$, symbol $b_{12}$, symbol $b_{13}$, symbol $b_{16}$, symbol $b_{17}$, symbol $b_{20}$, symbol $b_{21}$, symbol $b_{24}$, symbol $b_{25}$, symbol $b_{28}$, and symbol $b_{29}$; and the 16 symbols in group 1 include: symbol $b_2$, symbol $b_3$, symbol $b_6$, symbol $b_7$, symbol $b_{10}$, symbol $b_{11}$, symbol $b_{14}$, symbol $b_{15}$, symbol $b_{18}$, symbol $b_{19}$, symbol $b_{22}$, symbol $b_{23}$, symbol $b_{26}$, symbol $b_{27}$, symbol $b_{30}$, and symbol $b_{31}$; or the 16 symbols in group 0 include: symbol $b_0$, symbol $b_1$, symbol $b_4$, symbol $b_5$, symbol $b_8$, symbol $b_9$, symbol $b_{12}$, symbol $b_{13}$, symbol $b_{18}$, symbol $b_{19}$, symbol $b_{22}$, symbol $b_{23}$, symbol $b_{26}$, symbol $b_{27}$, symbol $b_{30}$, and symbol $b_{31}$; and the 16 symbols in group 1 include: symbol $b_2$, symbol $b_3$, symbol $b_6$, symbol $b_7$, symbol $b_{10}$, symbol $b_{11}$, symbol $b_{14}$, symbol $b_{15}$, symbol $b_{16}$, symbol $b_{17}$, symbol $b_{20}$, symbol $b_{21}$, symbol $b_{24}$, symbol $b_{25}$, symbol $b_{28}$, and symbol $b_{29}$.

In some possible implementations, each first symbol set is a first symbol matrix, each first symbol matrix includes 32 rows and m columns of symbols, each second symbol set is a second symbol matrix, and each second symbol matrix includes r rows and c columns of symbols, where 16 rows of symbols in group 0 in the first symbol matrix sequentially includes a symbol in row 0, a symbol in row 1, a symbol in row 4, a symbol in row 5, a symbol in row 8, a symbol in row 9, a symbol in row 12, a symbol in row 13, a symbol in row 16, a symbol in row 17, a symbol in row 20, a symbol in row 21, a symbol in row 24, a symbol in row 25, a symbol in row 28, and a symbol in row 29; and 16 rows of symbols in group 1 in the first symbol matrix sequentially includes a symbol in row 2, a symbol in row 3, a symbol in row 6, a symbol in row 7, a symbol in row 10, a symbol in row 11, a symbol in row 14, a symbol in row 15, a symbol in row 18, a symbol in row 19, a symbol in row 22, a symbol in row 23, a symbol in row 26, a symbol in row 27, a symbol in row 30, and a symbol in row 31;

the 16 rows of symbols in group 0 are arranged in an order, and symbols in row 0 to row 15 of each column in the 16 rows of symbols in group 0 are 16 symbols arranged in the order; in two adjacent columns of the 16 rows of symbols in group 0, symbols in row 15 of the former column to row 0 of the latter column are two symbols arranged in the order; and c symbols in row 0 in r/2 rows of symbols in group 0 in the second symbol matrix are from c symbols in group 0 that are arranged in the order starting from row 0 and column 0 in the 16 rows of symbols in group 0, and the rest can be deduced by analogy, until c symbols in row r/2-1 in the r/2 rows of symbols in group 0 in the second symbol matrix are from the last group of c symbols that are arranged in the order starting from row 0 and column 0 in the 16 rows of symbols in group 0; and the 16 rows of symbols in group 1 are arranged in an order, and symbols in row 0 to row 15 of each column in the 16 rows of symbols in group 1 are 16 symbols arranged in the order; in two adjacent columns of the 16 rows of symbols in group 1, symbols in row 15 of the former column to row 0 of the latter column are two symbols arranged in the order; and c symbols in row 0 in r/2 rows of symbols in group 1 in the second symbol matrix are from c symbols in group 0 that are arranged in the order starting from row 0 and column 0 in the 16 rows of symbols in group 1, and the rest can be deduced by analogy, until c symbols in row r/2-1 in the r/2 rows of symbols in group 1 in the second symbol matrix are from the last group of c symbols that are arranged in the order starting from row 0 and column 0 in the 16 rows of symbols in group 1.

In some possible implementations, the data interleaving apparatus further includes a lane reordering unit, and before the n data streams are separately delayed based on the n delay lines, the lane reordering unit is configured to: perform lane reordering on the n data streams, to enable the n data streams to be arranged in a preset order; or after the n data streams are separately delayed based on the n delay lines, and before the L first symbol sets are obtained by obtaining the L*m symbols from each of the delayed n data streams, the lane reordering unit is configured to: perform lane reordering on the n data streams, to enable the n data streams to be arranged in a preset order.

In some possible implementations, the data interleaving apparatus further includes a lane de-skew unit, and before the n data streams are separately delayed based on the n delay lines, the lane de-skew unit is configured to: perform lane de-skew processing on the n data streams to obtain n aligned lane data streams.

In some possible implementations, the data interleaving apparatus further includes an encoder, the n data streams are all data streams obtained through the first FEC encoding, and after the L second symbol sets are obtained by separately interleaving the L first symbol sets, the encoder is configured to: perform second FEC encoding on the r second symbol subsets in each second symbol set to obtain L*r codewords.

In this embodiment of this application, all the n data streams are codewords obtained through outer-code encoding. After the n data streams are separately delayed, data interleaving is further performed on the n delayed data streams. According to the delaying processing solution provided in this application, n symbols output from the n delayed data streams at a same moment can be from a plurality of different outer-code codewords by using a low latency. This helps reduce a data interleaving latency while ensuring good performance. In other words, the solution combining delaying processing and data interleaving in this application uses a low overall latency, and is more applicable to an application scenario requiring a low latency.

DETAILED DESCRIPTION OF ILLUSTRATIVE EMBODIMENTS

Embodiments of this application provide a data interleaving method and a data interleaving apparatus. It should be noted that in the specification, claims, and the foregoing accompanying drawings of this application, the terms "first" and "second" are intended to distinguish between similar objects but do not limit a specific order or sequence. It should be understood that the foregoing terms are interchangeable in proper cases, so that embodiments described in this application can be implemented in an order other than that in content described in this application. In addition, the terms "include", "have" and any other variants thereof are intended to cover non-exclusive inclusion. For example, a process, a method, a system, a product, or a device that includes a series of steps or units is not necessarily limited to those expressly listed steps or units, but may include other steps or units not expressly listed or inherent to the process, the method, the product, or the device.

Figure 1:
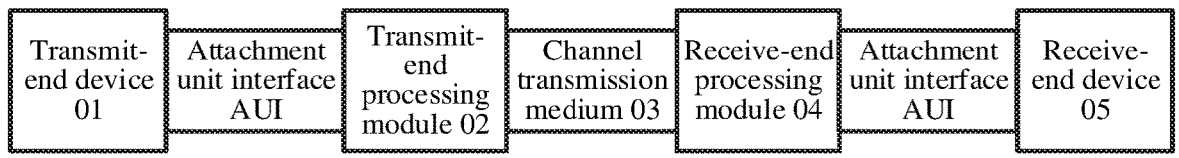
FIG. 1 is a schematic diagram of a communication system to which an embodiment of this application is applied.

FIG. 1 is a schematic diagram of a communication system to which an embodiment of this application is applied. As shown in FIG. 1, the communication system includes a transmit-end device 01, a transmit-end processing module 02, a channel transmission medium 03, a receive-end processing module 04, and a receive-end device 05. For example, the communication system is a data center network. The transmit-end device 01 and the receive-end device 05 may be devices such as a switch or a router. The transmit-end device 01 is also referred to as a client-side chip located at a transmit end, the receive-end device 05 is also referred to as a client-side chip located at a receive end, and the channel transmission medium 03 may be an optical fiber. The transmit-end device 01 may be connected to the transmit-end processing module 02 through an attachment unit interface (AUI), and the receive-end device 05 may be connected to the receive-end processing module 04 through an AUI. The transmit-end processing module 02 and the receive-end processing module 04 may be optical modules, electrical modules, or other modules that process data in a data sending process. For example, the processing module may be an 800LR module (the 800LR module is a coherent optical module). In addition, the transmit-end device 01, the transmit-end processing module 02, the channel transmission medium 03, the receive-end processing module 04, and the receive-end device 05 in the communication system may all support bidirectional transmission, or may support unidirectional transmission. This is not specifically limited herein.

Figure 2:
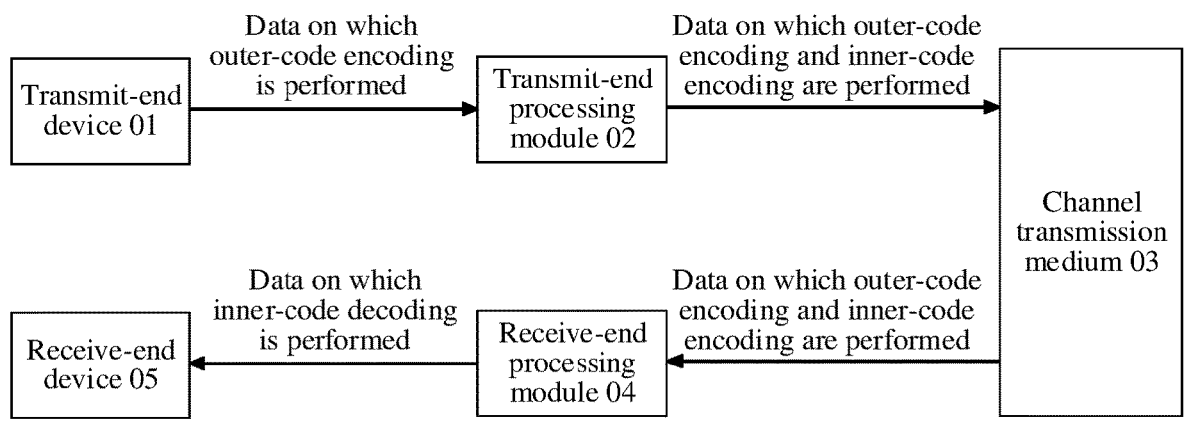
FIG. 2 is a schematic diagram of a data transmission process in the communication system shown in FIG. 1.

FIG. 2 is a schematic diagram of a data transmission process in the communication system shown in FIG. 1. As shown in FIG. 2, in a process of transmitting data from the transmit-end device 01 to the receive-end device 05, the transmit-end device 01 is configured to: perform outer-code encoding on the data, and then transmit, to the transmit-end processing module 02, data obtained through the outer-code encoding. The transmit-end processing module 02 is configured to: perform inner-code encoding on the data obtained through the outer-code encoding, to obtain data obtained through the outer-code encoding and the inner-code encoding, and transmit, to the channel transmission medium 03, the data obtained through the outer-code encoding and the inner-code encoding. The channel transmission medium 03 is configured to transmit, to the receive-end processing module 04, the data obtained through the outer-code encoding and the inner-code encoding. The receive-end processing module 04 is configured to: perform inner-code decoding on the data obtained through the outer-code encoding and the inner-code encoding, and transmit, to the receive-end device 05, data obtained through the inner-code decoding. The receive-end device 05 is configured to perform outer-code decoding on the data obtained through the inner-code decoding.

It should be understood that "inner" in inner code and "outer" in outer code are distinguished based only on a distance between an execution body that performs an operation on data and the channel transmission medium 03. An execution body that performs an operation on inner code is close to the channel transmission medium, and an execution body that performs an operation on outer code is far away from the channel transmission medium. In this embodiment of this application, after being sent from the transmit-end device 01, data is transmitted to the channel transmission medium 03 through the transmit-end processing module 02, and then is transmitted from the channel transmission medium 03 to the receive-end device 05 through the receive-end processing module 04. Data encoded by the transmit-end device 01 is farther away from the channel transmission medium 03 than data encoded by the transmit-end processing module 02, and data decoded by the receive-end device 05 is farther away from the channel transmission medium 03 than data decoded by the receive-end processing module 04. Therefore, the data encoded by the transmit-end device 01 is referred to as data obtained through outer-code encoding, the data encoded by the transmit-end processing module 02 is referred to as data obtained through inner-code encoding, the data decoded by the receive-end device 05 is referred to as data obtained through outer-code decoding, and the data decoded by the receive-end processing module 04 is referred to as data obtained through inner-code decoding. In a possible implementation, an FEC encoding manner is used for both the inner-code encoding and the outer-code encoding, to form a cascaded FEC transmission solution. For example, the transmit-end device 01 may perform outer-code encoding by using RS code, and the transmit-end processing module 02 may perform inner-code encoding by using Hamming code.

It should be noted that the foregoing content is an example of an application scenario of the data interleaving method provided in embodiments of this application, and does not constitute a limitation on the application scenario of the data interleaving method. A person of ordinary skill in the art may learn that, as a service requirement changes, the application scenario of the data interleaving method may be adjusted based on an application requirement. Application scenarios are not listed one by one in embodiments of this application.

For the foregoing transmission solution in which cascaded FEC is used, a data interleaving solution including "delaying" and "interleaving" is designed in this application, so that an overall cascaded FEC solution has good performance and a low latency. In this way, the cascaded FEC transmission solution can be applied to a large quantity of transmission scenarios, and is particularly applicable to a transmission scenario that requires a low transmission latency, for example, a low-latency data center interconnection scenario. Data interleaving is implemented by using the transmit-end processing module 02.

Figure 3A:
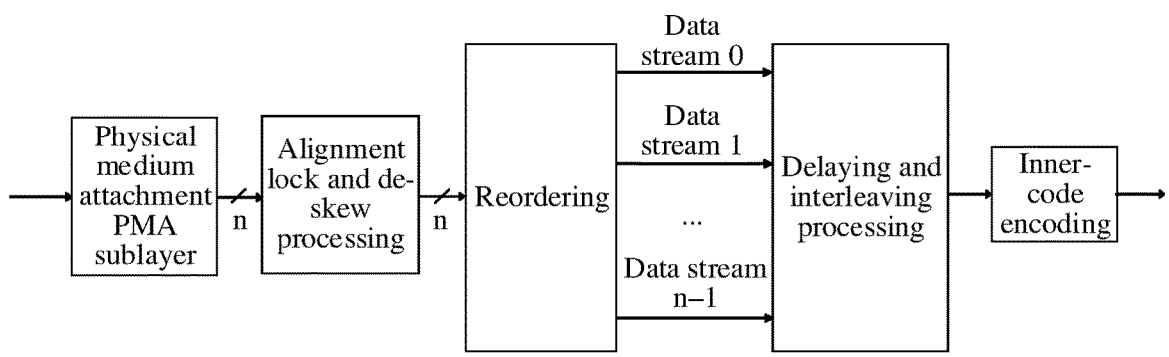
FIG. 3(a) is a schematic data processing diagram of a transmit-end processing module according to an embodiment of this application.

FIG. 3(a) is a schematic data processing diagram of a transmit-end processing module according to an embodiment of this application. As shown in FIG. 3(a), after a physical medium attachment (PMA) sublayer of a transmit-end processing module performs de-multiplexing (de-muxing) processing on data from a plurality of synchronized client lanes, n physical coding sublayer (PCS) or FEC lane data streams obtained through outer-code encoding may be obtained, and n aligned lane data streams are obtained by performing alignment lock and lane de-skew processing. Then, lane reordering is performed on data of n lanes based on alignment markers, so that the data of the n lanes can be arranged in a specified order. n lane data streams obtained through the lane reordering are sent to a designed delaying and interleaving processor for interleaving to disorder data, and then sent to an inner-code encoder for inner-code encoding. After data processing is performed on data streams obtained through the inner-code encoding, data streams obtained through the data processing are sent to a channel transmission medium for transmission. The data processing may include modulation mapping, channel interleaving, polarization distribution, DSP framing, or the like. Herein, n is a positive integer greater than 1.

Figure 3B:
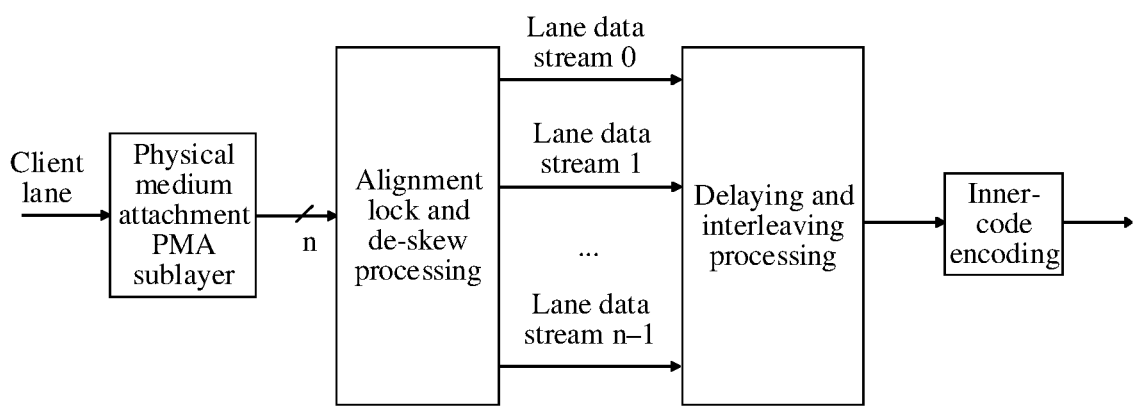
FIG. 3(b) is another schematic data processing diagram of a transmit-end processing module according to an embodiment of this application.

FIG. 3(b) is another schematic data processing diagram of a transmit-end processing module according to an embodiment of this application. As shown in FIG. 3(b), alignment lock and lane de-skew processing are performed on n PCS or FEC lane data streams from a PMA sublayer, to obtain n aligned lane data streams. The n lane data streams are directly sent to a designed delaying and interleaving processor for interleaving to disorder data, and then sent to an inner-code encoder for inner-code encoding.

In some actual scenarios, a lane de-skew processing module uses first in first out (FIFO) to buffer data. In consideration of a case in which a delay line in designed delaying processing is implemented by using a storage element, to reduce hardware implementation complexity and power consumption, lane de-skew processing and the delaying processing may be implemented together, so that a set of FIFO is used for implementing both the de-skew processing and the delaying processing.

Figure 3C:
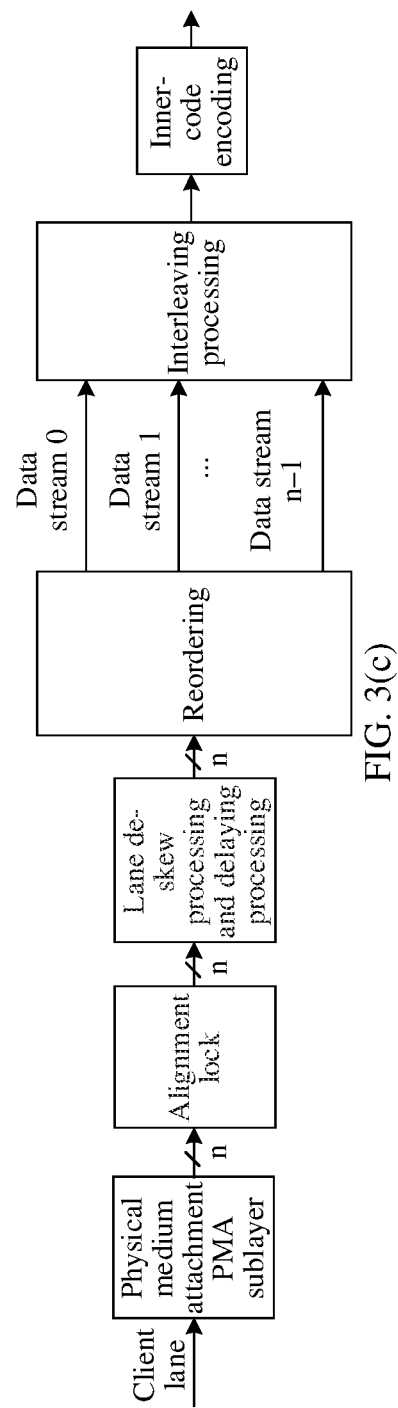
FIG. 3(c) is still another schematic data processing diagram of a transmit-end processing module according to an embodiment of this application.

FIG. 3(c) is still another schematic data processing diagram of a transmit-end processing module according to an embodiment of this application. As shown in FIG. 3(c), for n PCS or FEC lane data streams from a PMA sublayer, alignment lock is first performed, lane de-skew processing and designed delaying processing are performed based on a lane alignment marker, then lane reordering is performed based on the lane alignment marker, and designed interleaving processing is performed. Data that is disordered through interleaving is sent to an inner-code encoder for inner-code encoding.

Figure 3D:
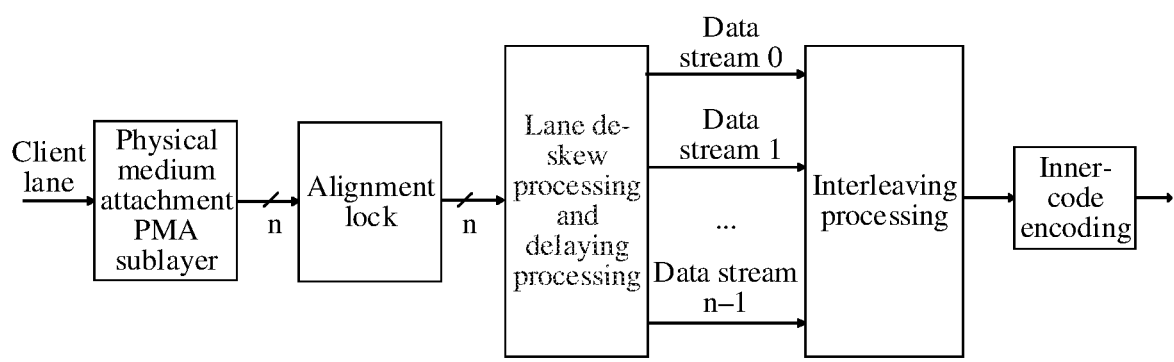
FIG. 3(d) is yet another schematic data processing diagram of a transmit-end processing module according to an embodiment of this application.

FIG. 3(d) is yet another schematic data processing diagram of a transmit-end processing module according to an embodiment of this application. As shown in FIG. 3(d), for n PCS or FEC lane data streams from a PMA sublayer, alignment lock is first performed, lane de-skew processing and designed delaying processing are performed based on a lane alignment marker, and then designed interleaving processing is performed. Data that is disordered through interleaving is sent to an inner-code encoder for inner-code encoding.

Figure 4A:
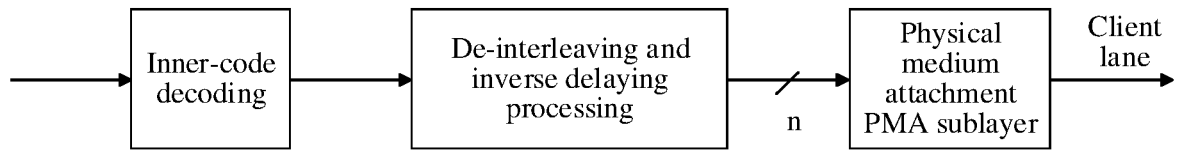
FIG. 4(a) is a schematic data processing diagram for a receive-end processing module according to an embodiment of this application.

FIG. 4(a) is a schematic data processing diagram for a receive-end processing module according to an embodiment of this application. As shown in FIG. 4(a), the receive-end processing module receives a data stream from a channel transmission medium. When a data stream of a transmit-end processing module is obtained through data processing such as modulation mapping, channel interleaving, polarization distribution, or DSP framing, the receive-end processing module first performs corresponding inverse data processing on the data stream, and then sends a processed data stream to an inner-code decoder for decoding. A data stream obtained through the inner-code decoding is sent to a de-interleaving and inverse delaying processor for processing, to obtain n lane data streams, and then the n lane data streams are sent to a PMA sublayer. The PMA sublayer multiplexes the data streams and sends multiplexed data streams to a receive-end device for outer-code decoding. De-interleaving and inverse delaying processing in the receive-end processing module are inverse operations of interleaving and delaying processing in the transmit-end processing module. The de-interleaving is an inverse operation of interleaving in the transmit-end processing module, and the inverse delaying is an inverse operation of delaying in the transmit-end processing module.

Figure 4B:
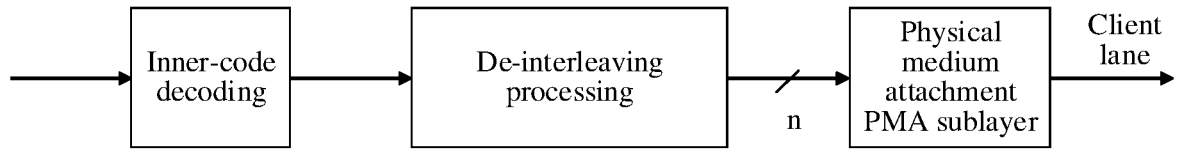
FIG. 4(b) is another schematic data processing diagram for a receive-end processing module according to an embodiment of this application.

FIG. 4(b) is another schematic data processing diagram for a receive-end processing module according to an embodiment of this application. As shown in FIG. 4(b), the receive-end processing module receives a data stream from a channel transmission medium. After de-interleaving processing is performed on a data stream obtained through inner-code decoding, n lane data streams are obtained, and are sent to a PMA sublayer. Herein, the de-interleaving processing in the receive-end processing module is an inverse operation of interleaving processing in a transmit-end processing module. It should be understood that, in the data processing procedure shown in FIG. 4(b), the inverse delaying processing is not performed on the n lane data streams obtained by performing de-interleaving processing on the data stream obtained through the inner code decoding, but the n lane data streams are directly sent to the PMA sublayer. In other words, the n lane data streams sent to the PMA sublayer are not aligned, and there is a delay between the lane data streams. The PMA sublayer multiplexes the n lane data streams and sends processed data streams to a receive-end device. In comparison with the data processing shown in FIG. 4(a), the data processing shown in FIG. 4(b) has lower power consumption and lower hardware implementation complexity.

The following describes the delaying and interleaving processing in the transmit-end processing module in detail. A person of ordinary skill in the art may learn that de-interleaving and inverse delaying processing of the receive-end processing module are inverse operations of the delaying and interleaving processing in the transmit-end processing module, and details are not described herein again.

The following first provides a plurality of specific scenarios to which embodiments of this application may be applied.

Figure 5:
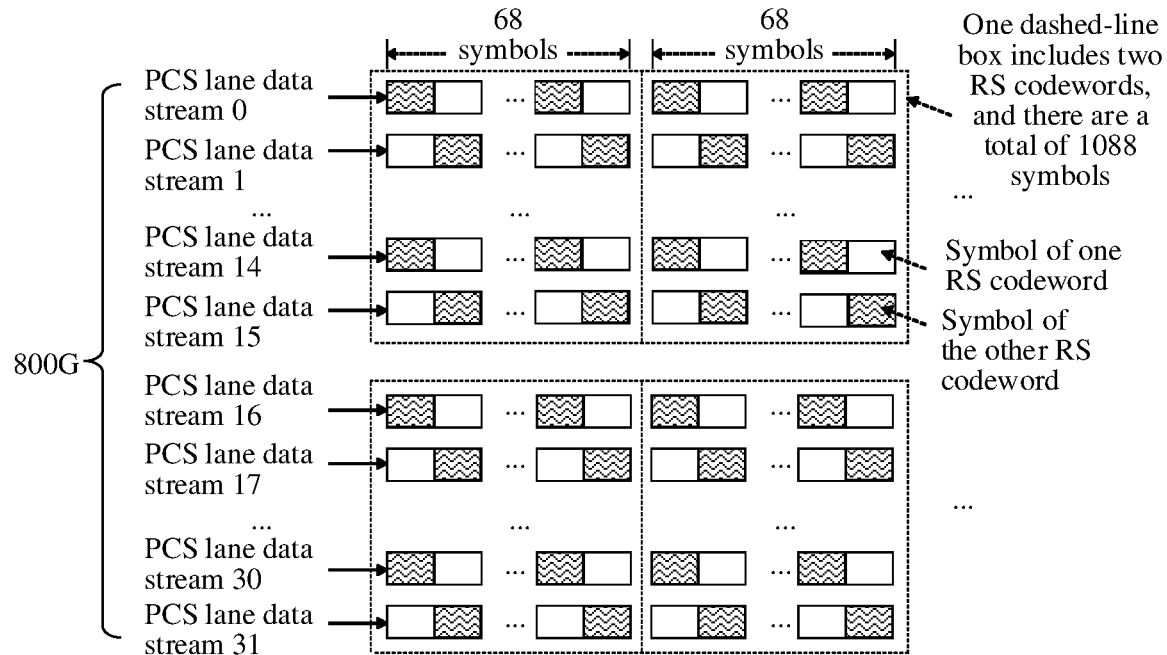
FIG. 5 is a schematic diagram of 32 PCS lane data streams of a 1*800G interface used by a transmit-end device.

FIG. 5 is a schematic diagram of 32 PCS lane data streams of a 1*800G interface used by a transmit-end device. As shown in FIG. 5, the transmit-end device performs KP4 RS(544,514) outer-code encoding on one to-be-transmitted channel of 800GE service data streams to obtain 32 PCS lane data streams. In PCS lane data streams 0 to 15, each data stream is separated by 68 symbols, or to say, each data stream has consecutive 68 symbols, and there are 16*68=1088 symbols in total, including two RS codewords. Two adjacent symbols in each PCS lane data stream are from different RS codewords, and two symbols at same locations of two adjacent PCS lane data streams are from different RS codewords. Similarly, in PCS lane data streams 16 to 31, each data stream is separated by 68 symbols, and there are 16*68=1088 symbols in total, including two RS codewords. Two adjacent symbols in each PCS lane data stream are from different RS codewords, and two symbols at same locations of two adjacent PCS lane data streams are from different RS codewords. The 32 PCS lane data streams are processed at a PMA sublayer and then sent to a transmit-end processing module through an attachment unit interface 800GAUI-8.

Based on the schematic data processing diagrams of the transmit-end processing module shown in FIG. 3(a) to FIG. 3(d), the transmit-end processing module performs alignment lock on the lane data streams by using known alignment markers of PCS lanes. The known alignment markers of the 32 lanes are different (refer to *Ethernet Technology Consortium 800G Specification*). Then, the transmit-end processing module performs lane de-skew processing on the 32 lane data streams, to obtain 32 aligned lane data streams. Then, lane reordering is performed on data of the n=32 lanes based on the alignment markers, so that the data of the n=32 lanes can be arranged in a specified order. One order is that the lane data streams are sorted from 0 to 31 from top to bottom, which is the same as that in FIG. 5.

Figure 6:
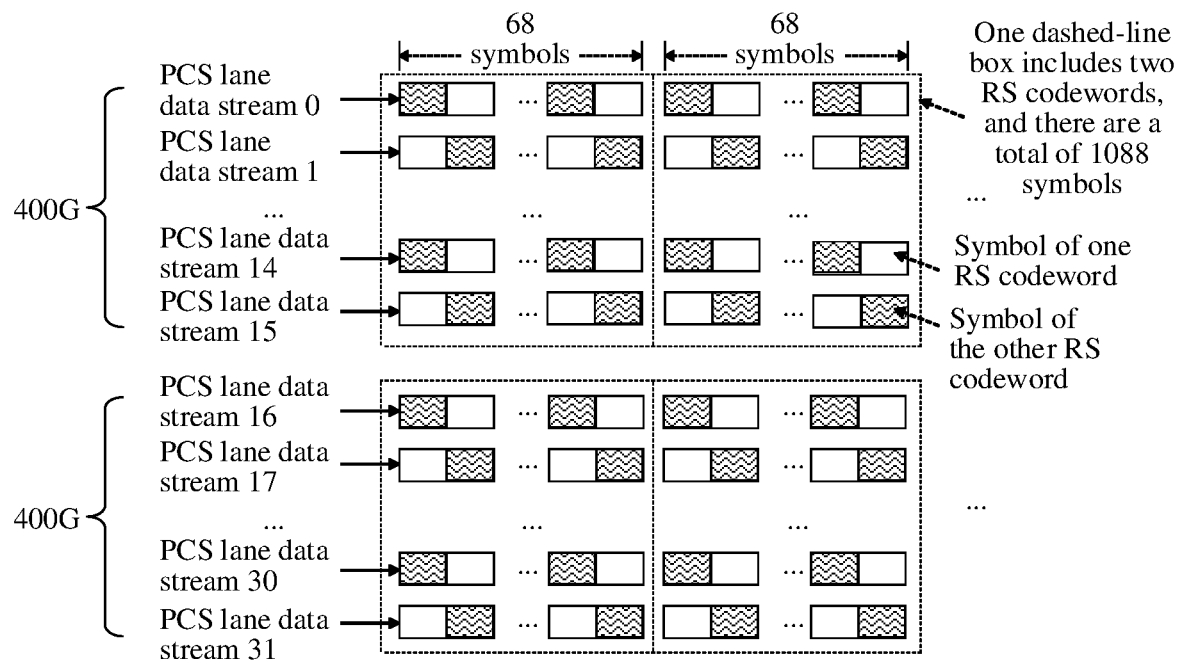
FIG. 6 is a schematic diagram of 32 PCS lane data streams of 2*400G interfaces used by a transmit-end device.

FIG. 6 is a schematic diagram of 32 PCS lane data streams of 2*400G interfaces used by a transmit-end device. As shown in FIG. 6, the transmit-end device performs KP4 RS(544,514) outer-code encoding on two to-be-transmitted channels of 400GE service data streams to obtain a total of 32 PCS lane data streams in two channels, where each channel includes 16 PCS lane data streams. In PCS lane data streams 0 to 15 or PCS lane data streams 16 to 31, each data stream is separated by 68 symbols, and there are 16*68=1088 symbols in total, including two RS codewords. Two adjacent symbols in each PCS lane data stream are from different RS codewords, and two symbols at same locations of two adjacent PCS lane data streams are from different RS codewords. The 32 PCS lane data streams are processed at a PMA sublayer and then sent to a transmit-end processing module through attachment unit interfaces 2*400GAUI-4.

Based on the schematic data processing diagrams of the transmit-end processing module shown in FIG. 3(a) to FIG. 3(d), the transmit-end processing module performs alignment lock on the 16 lane data streams by using known alignment markers of PCS lanes 0 to 15 or PCS lanes 16 to 31. The PCS lanes 0 to 15 can be considered as PCS lanes 0 to 15 in channel 0 of 400G, and PCS lanes 16 to 31 can be considered as PCS lanes 0 to 15 in channel 1 of 400G. The known alignment markers of the 16 lanes in channel 0 of 400G are the same as those of the 16 lanes in channel 1 of 400G. Then, the transmit-end processing module performs lane de-skew processing on the 32 lane data streams, to obtain 32 aligned lane data streams. Then, lane reordering is performed on data of the 16 lanes based on the alignment markers of the PCS lanes 0 to 15 or the PCS lanes 16 to 31, so that the data of the 16 lanes can be arranged in a specified order. Finally, the data of the 32 lanes can be arranged in the specified order. One order is that the lane data streams are sorted from 0 to 31 from top to bottom, which is the same as that in FIG. 6.

It should be understood that, a specific implementation in which the transmit-end processing module performs lane de-skew processing on the 32 lane data streams to obtain the 32 aligned lane data streams is: Lane de-skew processing defined in an existing standard (refer to IEEE 802.3 Clause 120) is performed on the data of the 16 lanes based on the known alignment markers of the PCS lanes 0 to 15 or the PCS lanes 16 to 31, so that there is no skew or latency between the PCS lane data streams in channel 0 of 400G or channel 1 of 400G. In addition, the alignment markers are used for enabling the two channels of PCS lane data streams to be symbol-aligned. In this case, the PCS lane data stream in channel 0 and the PCS lane data stream in channel 1 may have no skew or may have skew. In consideration with a case in which an RS symbol contains 10 bits, in the aligned PCS lane data streams, a quantity of skewed bits between the PCS lane data stream in channel 0 and the PCS lane data stream in channel 1 is a multiple of 10.

Figure 7:
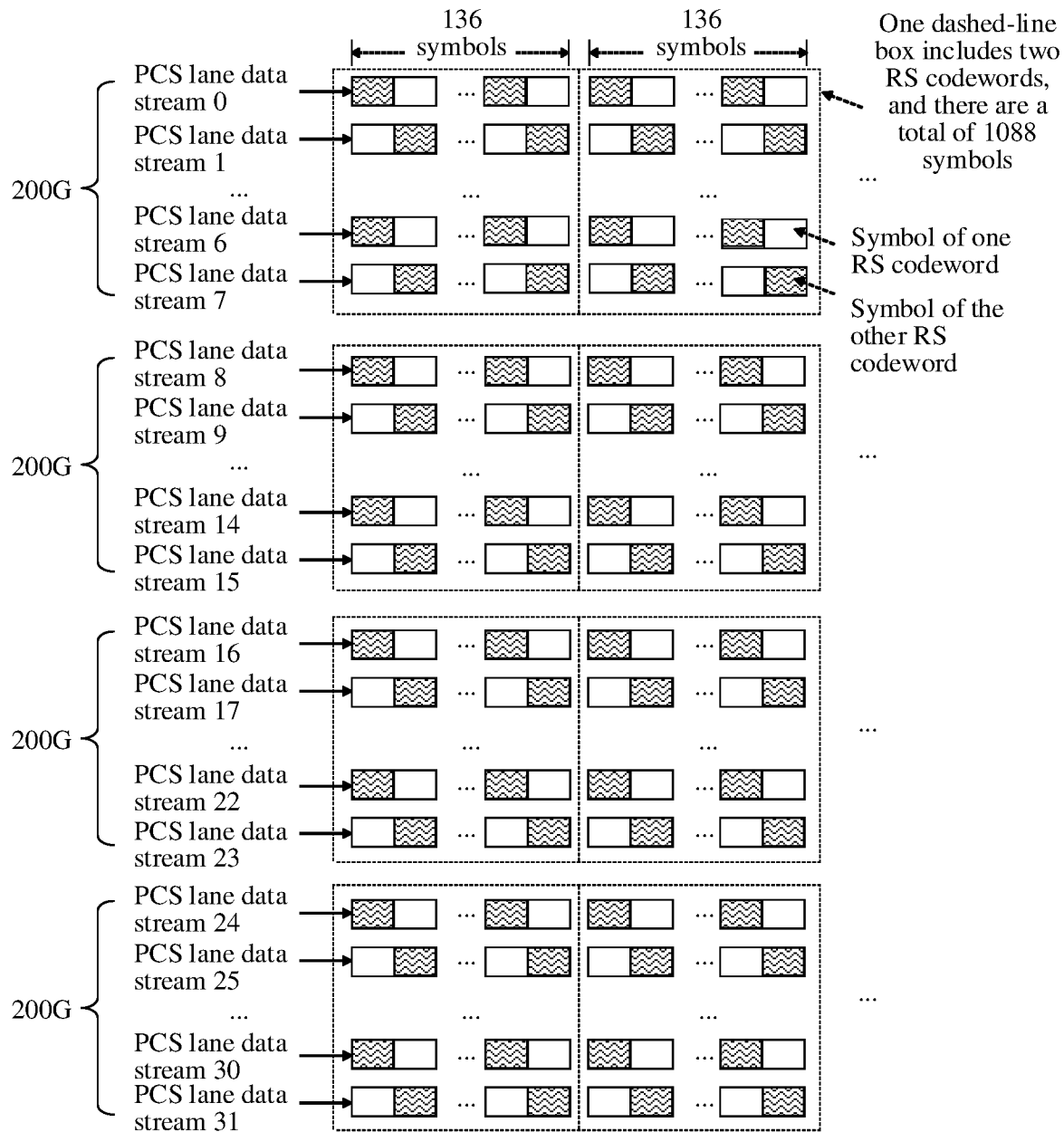
FIG. 7 is a schematic diagram of 32 PCS lane data streams of 4*200G interfaces used by a transmit-end device.

FIG. 7 is a schematic diagram of 32 PCS lane data streams of 4*200G interfaces used by a transmit-end device. As shown in FIG. 7, the transmit-end device performs KP4 RS(544,514) outer-code encoding on four to-be-transmitted channels of 200GE service data streams to obtain a total of 32 PCS lane data streams in four channels, where each channel includes eight PCS lane data streams. In PCS lane data streams 0 to 7, PCS lane data streams 8 to 15, PCS lane data streams 16 to 23, or PCS lane data streams 24 to 31, each data stream is separated by 136 symbols, and there are 8*136=1088 symbols in total, including two RS codewords. Two adjacent symbols in each PCS lane data stream are from different RS codewords, and two symbols at same locations of two adjacent PCS lane data streams are from different RS codewords. The 32 PCS lane data streams are processed at a PMA sublayer and then sent to a transmit-end processing module through attachment unit interfaces 4*200GAUI-2.

Based on the schematic data processing diagrams of the transmit-end processing module shown in FIG. 3(a) to FIG. 3(d), the transmit-end processing module performs alignment lock on the eight lane data streams by using known alignment markers of PCS lanes 0 to 7, PCS lanes 8 to 15, PCS lanes 16 to 23, or PCS lanes 24 to 31. The PCS lanes 0 to 7, the PCS lanes 8 to 15, the PCS lanes 16 to 23, or the PCS lanes 24 to 31 can be considered as PCS lanes 0 to 7 in channel 0, 1, 2, or 3 of 200G respectively. Then, the transmit-end processing module performs lane de-skew processing on the 32 lane data streams, to obtain 32 aligned lane data streams. Then, lane reordering is performed on data of the eight lanes based on the alignment markers of the PCS lanes 0 to 7, the PCS lanes 8 to 15, the PCS lanes 16 to 23, or the PCS lanes 24 to 31, so that the data of the eight lanes can be arranged in a specified order. Finally, the data of the 32 lanes can be arranged in the specified order. One order is that the lane data streams are sorted from 0 to 31 from top to bottom, which is the same as that in FIG. 7.

It should be understood that, a specific implementation in which the transmit-end processing module performs lane de-skew processing on the 32 lane data streams to obtain the 32 aligned lane data streams is: Lane de-skew processing defined in an existing standard (refer to IEEE 802.3 Clause 120) is performed on the data of the eight lanes based on the known alignment markers of the PCS lanes 0 to 7, the PCS lanes 8 to 15, the PCS lanes 16 to 23, or the PCS lanes 24 to 31, so that there is no skew or latency between the PCS lane data streams in channel 0, 1, 2, or 3 of 200G. In addition, the alignment markers are used for enabling the four channels of PCS lane data streams to be symbol-aligned. In this case, the PCS lane data streams in channel 0, channel 1, channel 2, and channel 3 may have no skew or may have skew. In consideration with a case in which an RS symbol contains 10 bits, in the aligned PCS lane data streams, a quantity of skewed bits between the PCS lane data streams in channel 0, channel 1, channel 2, and channel 3 is a multiple of 10.

Figure 8:
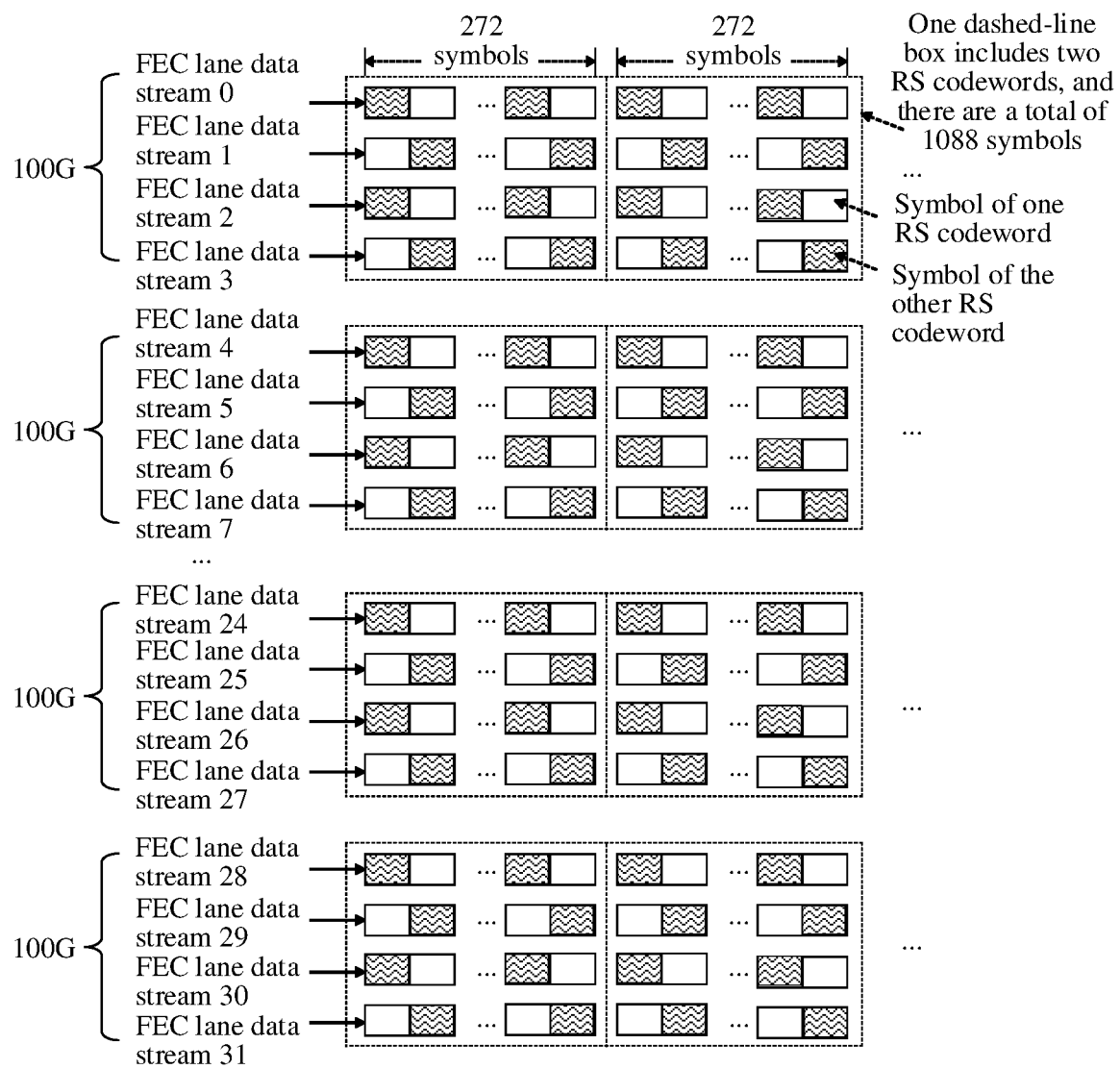
FIG. 8 is a schematic diagram of 32 PCS lane data streams of 8*100G interfaces used by a transmit-end device.

FIG. 8 is a schematic diagram of 32 PCS lane data streams of 8*100G interfaces used by a transmit-end device. As shown in FIG. 8, the transmit-end device performs KP4 RS(544,514) outer-code encoding on eight to-be-transmitted channels of 100GE service data streams to obtain a total of 32 FEC lane data streams in eight channels, where each channel includes four FEC lane data streams. When a "100G RS-FEC-Int" mode in which two KP4 RS(544,514) codewords are interleaved is used, in FEC lane data streams 0 to 3, FEC lane data streams 4 to 7, FEC lane data streams 8 to 11, FEC lane data streams 12 to 15, FEC lane data streams 16 to 19, FEC lane data streams 20 to 23, FEC lane data streams 24 to 27, or FEC lane data streams 28 to 31, each data stream is separated by 272 symbols, and there are 4*272=1088 symbols in total, including two RS codewords. Two adjacent symbols in each FEC lane data stream are from different RS codewords, and two symbols at same locations of two adjacent FEC lane data streams are from different RS codewords. The 32 FEC lane data streams are processed at a PMA sublayer and then sent to a transmit-end processing module through attachment unit interfaces 8*100GAUI-1.

Figure 9:
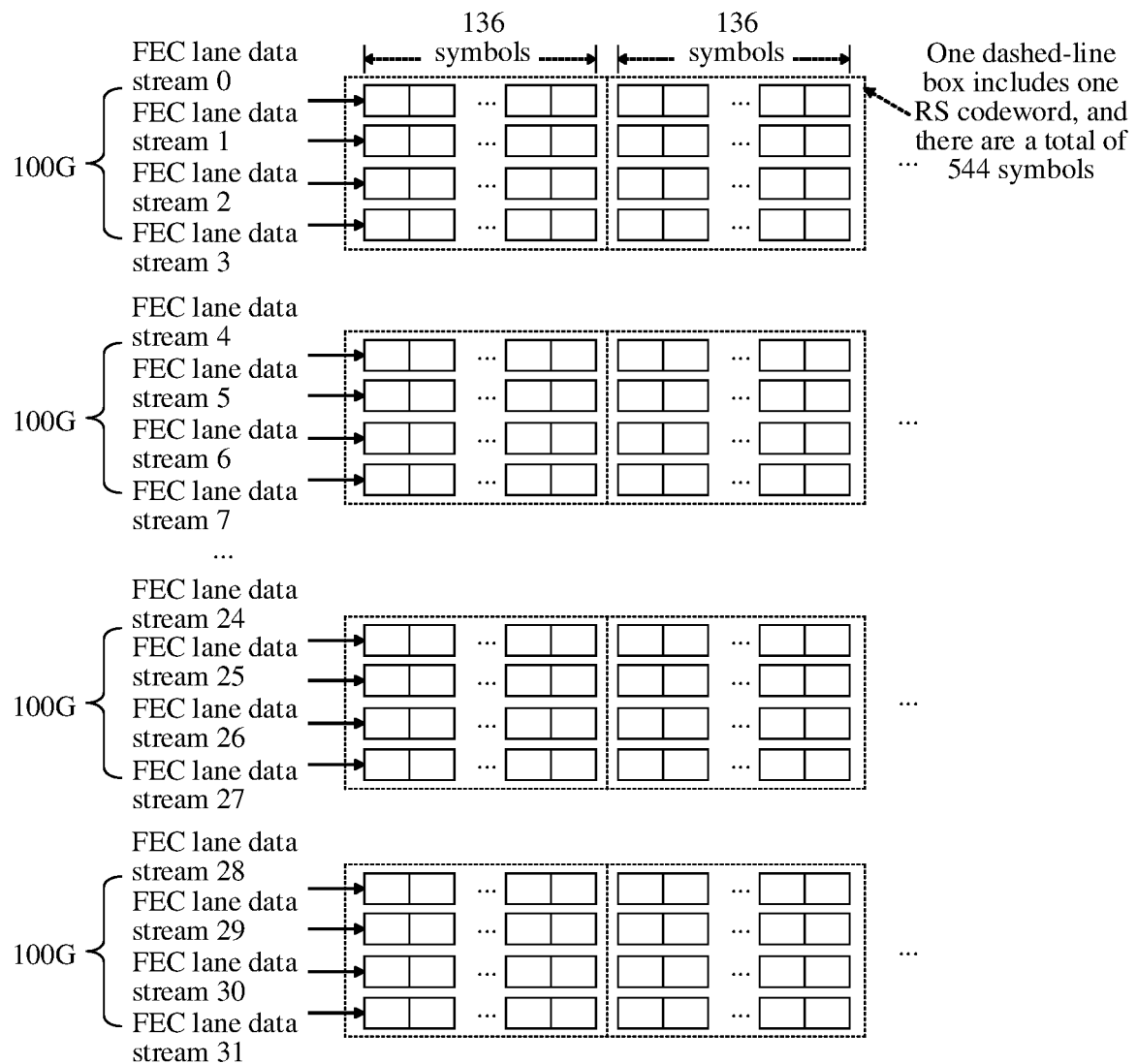
FIG. 9 is another schematic diagram of 32 PCS lane data streams of 8*100G interfaces used by a transmit-end device.

FIG. 9 is another schematic diagram of 32 PCS lane data streams of 8*100G interfaces used by a transmit-end device. As shown in FIG. 9, different from the scenario in FIG. 8, in this scenario, the transmit-end device uses a "100G RS-FEC" mode. In FEC lane data streams 0 to 3, FEC lane data streams 4 to 7, FEC lane data streams 8 to 11, FEC lane data streams 12 to 15, FEC lane data streams 16 to 19, FEC lane data streams 20 to 23, FEC lane data streams 24 to 27, or FEC lane data streams 28 to 31, each data stream is separated by 136 symbols, and there are 4*136=544 symbols in total, including one RS codeword. The 32 FEC lane data streams are processed at a PMA sublayer and then sent to a transmit-end processing module through attachment unit interfaces 8*100GAUI-1.

Based on the schematic data processing diagrams of the transmit-end processing module shown in FIG. 3(a) to FIG. 3(d), the transmit-end processing module performs alignment lock on the four lane data streams by using known alignment markers of FEC lanes 0 to 3, FEC lanes 4 to 7, FEC lanes 8 to 11, FEC lanes 12 to 15, FEC lanes 16 to 19, FEC lanes 20 to 23, FEC lanes 24 to 27, or FEC lanes 28 to 31. FEC lanes 0 to 3, FEC lanes 4 to 7, FEC lanes 8 to 11, FEC lanes 12 to 15, FEC lanes 16 to 19, FEC lanes 20 to 23, FEC lanes 24 to 27, or FEC lanes 28 to 31 can be considered as FEC lanes 0 to 3 in channel 0, 1, 2, 3, 4, 5, 6, or 7 of 100G respectively. Then, the transmit-end processing module performs lane de-skew processing on the 32 lane data streams, to obtain 32 aligned lane data streams. Then, lane reordering is performed on data of the four lanes based on the alignment markers of FEC lanes 0 to 3, FEC lanes 4 to 7, FEC lanes 8 to 11, FEC lanes 12 to 15, FEC lanes 16 to 19, FEC lanes 20 to 23, FEC lanes 24 to 27, or FEC lanes 28 to 31, so that the data of the four lanes can be arranged in a specified order. Finally, the data of the 32 lanes can be arranged in the specified order. One order is that the lane data streams are sorted from 0 to 31 from top to bottom, which is the same as those in FIG. 8 and FIG. 9.

It should be understood that, a specific implementation in which the transmit-end processing module performs lane de-skew processing on the 32 lane data streams to obtain the 32 aligned lane data streams is: Lane de-skew processing defined in an existing standard (refer to IEEE 802.3 Clause 91 or Clause 161) is performed on the data of the four lanes based on the known alignment markers of FEC lanes 0 to 3, FEC lanes 4 to 7, FEC lanes 8 to 11, FEC lanes 12 to 15, FEC lanes 16 to 19, FEC lanes 20 to 23, FEC lanes 24 to 27, or FEC lanes 28 to 31, so that there is no skew or latency between the PCS lane data streams in channel 0, 1, 2, 3, 4, 5, 6, or 7 of 100G. In addition, the alignment markers are used for enabling the eight channels of FEC lane data streams to be symbol-aligned. In this case, the FEC lane data streams in channel 0, channel 1, channel 2, channel 3, channel 4, channel 5, channel 6, and channel 7 may have no skew or may have skew. In consideration with a case in which an RS symbol contains 10 bits, in the aligned FEC lane data streams, a quantity of skewed bits between the FEC lane data streams in channel 0, channel 1, channel 2, channel 3, channel 4, channel 5, channel 6, and channel 7 is a multiple of 10.

In some specific scenarios, an 800G or 1.6T interface is used, and a transmit-end device performs KP4 RS(544,514) outer-code encoding on to-be-transmitted service data streams to obtain n PCS lane data streams. Every A outer-code codewords are distributed in n lane data streams. Specifically, in the n PCS lane data streams, each data stream is separated by B symbols, and there are n*B symbols in total, including A RS codewords, where n*B=A*544. A consecutive symbols in each PCS lane data stream are from A different RS codewords, and A symbols at same locations of A consecutive PCS lane data streams are from A different RS codewords, where an integer A may be 2, 4, or the like. The n PCS lane data streams are processed at a PMA sublayer and then sent to a transmit-end processing module through an attachment unit interface. Some possible parameter combinations are as follows: "n=8, A=2, and B=136", "n=16, A=2, and B=68", "n=8, A=4, and B=272", and "n=16, A=4, and B=136". Based on the schematic data processing diagram of the transmit-end processing module shown in FIG. 3(b), the transmit-end processing module performs alignment lock on the n lane data streams by using known alignment markers of n PCS lanes. Then, the transmit-end processing module performs lane de-skew processing on the n lane data streams, to obtain n aligned lane data streams.

Figure 10:
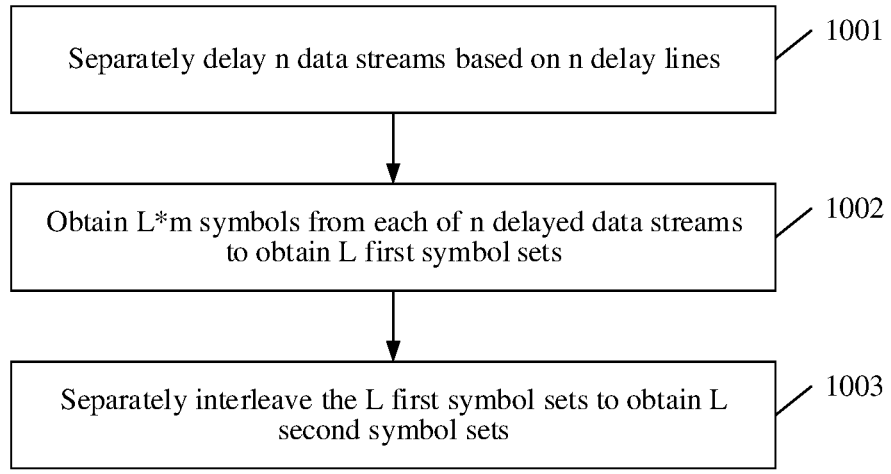
FIG. 10 is a schematic flowchart of a data interleaving method according to an embodiment of this application.

FIG. 10 is a schematic flowchart of a data interleaving method according to an embodiment of this application.

1001: Separately delay n data streams based on n delay lines.

Figure 11:
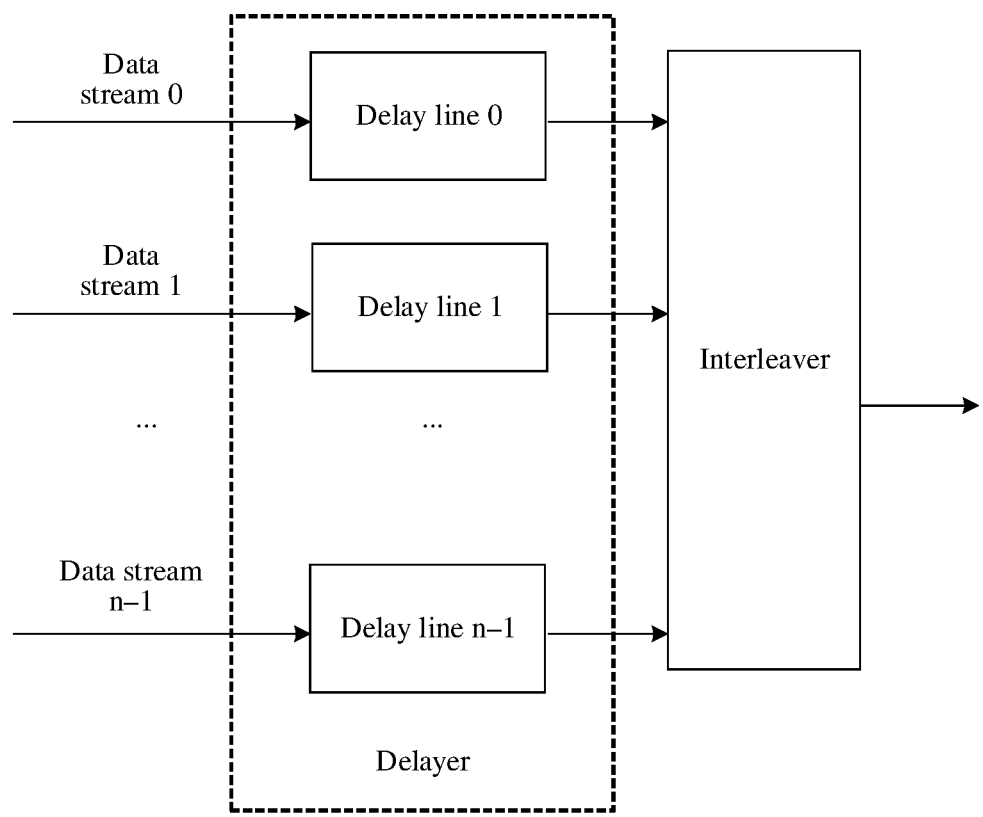
FIG. 11 is a schematic structural diagram in which a delayer delays n data streams according to an embodiment of this application.
Figure 12:
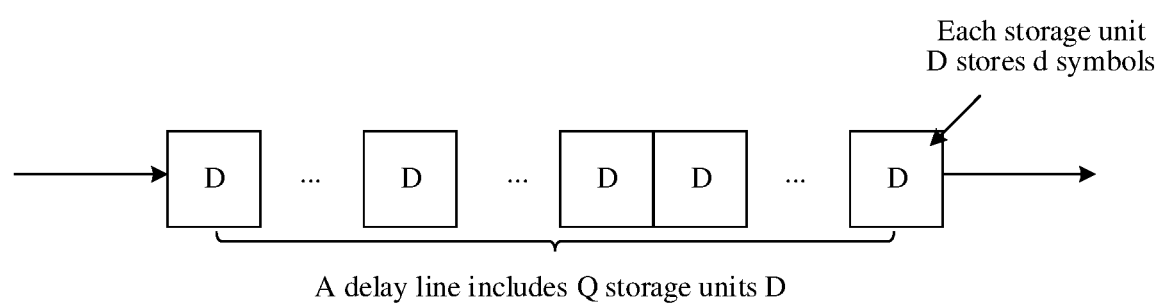
FIG. 12 is a schematic structural diagram of a delay line according to an embodiment of this application.

FIG. 11 is a schematic structural diagram in which a delayer delays n data streams according to an embodiment of this application. As shown in FIG. 11, the delayer includes n delay lines that correspond one-to-one to the n data streams. Each data stream is delayed by using the corresponding delay line and then sent to an interleaver for data interleaving. It should be noted that a value of a delay in this application is calculated in a unit of a symbol, and the symbol may include one or more bits. A larger quantity of symbols included in a delay value of the delay line indicates a higher delay (also referred to as a latency) delayed by using the delay line for the data stream. FIG. 12 is a schematic structural diagram of a delay line according to an embodiment of this application. As shown in FIG. 12, the delay line may include Q storage elements (storage elements) D, and each storage element D may store d symbols, where both Q and d are integers. It should be understood that when the delay line includes no storage element, a delay of the delay line is 0 symbols, in other words, transmission is transparent without any delay.

It should be noted that, in this embodiment, n is a positive integer that is divisible by p, and p is an integer greater than 1. A delay value of each delay line is any delay value in a delay value set, and the delay value set includes p delay values. A smallest delay value in the delay value set is 0, and a difference between every two adjacent delay values in the p delay values in the delay value set in ascending order is V symbols, where V=Q*d. A quantity of delay lines corresponding to each delay value in the delay value set is n/p, and V is an integer greater than or equal to 34. In some example implementations, V may alternatively be an integer greater than or equal to 68. For example, n=32, p=4, the delay value set includes four delay values: 0, V, 2V, and 3V, the delay value of each delay line can only be any one of the four delay values, and a quantity of delay lines corresponding to each of the four delay values 0, V, 2V, and 3V is 8.

In some possible implementations, before the n data streams are separately delayed based on the n delay lines, lane reordering is performed on the n data streams, to enable the n data streams to be arranged in a preset order. In some other possible implementations, after the n data streams are separately delayed based on the n delay lines, lane reordering is performed on the n data streams, to enable the n data streams to be arranged in a preset order. 32 data streams are used as an example. The 32 data streams may be sorted from 0 to 31 from top to bottom. Certainly, it may be simply extended to a case in which the data streams are sorted in another order. A specific implementation is known to a person of ordinary skill in the art, and details are not described herein again. It should be understood that, different delay line distribution rules are correspondingly designed based on different sorting of the n data streams, and a delay may further be reduced as much as possible while performance is ensured. The delay line distribution rule provided in this application is subsequently described in detail.

In some possible implementations, before the n data streams are separately delayed based on the n delay lines, lane de-skew processing is further performed on the n data streams to obtain n aligned lane data streams. When the n data streams are a plurality of channels of service data streams, the n aligned lane data streams satisfy the following constraints: A plurality of lane data streams in each channel of service data streams have no skew, and the lane data streams between the channels of service data streams are symbol-aligned. In some specific implementations, a lane de-skew processing module uses first in first out (FIFO) to buffer data. In consideration of a case in which a delay line in designed delaying processing is implemented by using a storage element, to reduce hardware implementation complexity and power consumption, lane de-skew processing and delaying processing may be implemented together, so that a set of FIFO is used for implementing both de-skew processing and delaying processing.

It should be further noted that the n data streams input into the delayer are all data streams on which FEC encoding is performed, namely, the foregoing described data streams obtained through outer-code encoding. Specifically, the outer-code encoding may use RS code, and the n data streams obtained through the outer-code encoding may include a plurality of RS codewords. During actual application, another coding scheme may alternatively be used for performing outer-code encoding. For ease of description, an RS codeword is uniformly used below to represent a codeword generated after the outer-code encoding.

1002: Obtain L*m symbols from each of n delayed data streams to obtain L first symbol sets.

The interleaver may obtain the L*m symbols from each of the n delayed data streams to obtain the L first symbol sets, where L is an integer greater than or equal to 1, and m is an integer greater than or equal to 1. In other words, each first symbol set includes n*m symbols. The interleaver may obtain n*m symbols each time to obtain the first symbol set, and repeatedly obtain n*m symbols for L times to obtain the L first symbol sets. Alternatively, the interleaver may read L*n*m symbols once to obtain the L first symbol sets. It should be understood that L buffers may be disposed in the interleaver, and are respectively configured to store the L first symbol sets. Specifically, each first symbol set may include a plurality of first symbol subsets. For example, each first symbol set includes n first symbol subsets, and each first symbol subset includes m symbols that are sequentially arranged. For another example, each first symbol set includes m first symbol subsets, and each first symbol subset includes n symbols that are sequentially arranged. For ease of description, the following uses an example in which each first symbol set includes the n first symbol subsets for description. A person skilled in the art may directly derive another description manner in which the first symbol set includes the m first symbol subsets, and the following does not provide detailed descriptions with reference to the another description manner. Optionally, m symbols in first symbol subset h in the first symbol set are from delayed data stream h, where $0 \leq h \leq n-1$.

It should be noted that the first symbol subset is merely a concept introduced for ease of description. During actual application, the first symbol set is a whole and does not have division, and each first symbol subset may be considered as one or more symbols selected from the first symbol set.

In a possible implementation, the first symbol set is presented in a form of a data stream, to be specific, the symbols in the first symbol set are arranged to form the data stream. In another possible implementation, the first symbol set is presented in a form of a symbol matrix. Specifically, the first symbol set is represented as a first symbol matrix, and the first symbol matrix includes n rows and m columns of symbols. m symbols in each row of the first symbol matrix may be understood as a first symbol subset. In other words, the first symbol matrix is essentially a set of a plurality of symbols, and introduction of the first symbol matrix is merely for description in another dimension. A symbol in a first symbol subset in the first symbol set may alternatively be simply converted into a symbol in a row and a column of the first symbol matrix. For ease of description, only one form of the first symbol set or the first symbol matrix is used for description below. A person skilled in the art may directly derive descriptions of the other form based on the foregoing described correspondence between the first symbol set and the first symbol matrix.

1003: Separately interleave the L first symbol sets to obtain L second symbol sets.

The interleaver separately interleaves the L first symbol sets to obtain the L second symbol sets. Each second symbol set may include a plurality of second symbol subsets. For example, each second symbol set includes r second symbol subsets, and each second symbol subset includes c symbols. For another example, each second symbol set includes c second symbol subsets, and each second symbol subset includes r symbols. r is an integer greater than 1, c is an integer greater than 1, and n*m=r*c, to be specific, a quantity of symbols in the first symbol set is the same as a quantity of symbols in the second symbol set. For ease of description, the following uses an example in which each second symbol set includes the r second symbol subsets for description. A person skilled in the art may directly derive another description manner in which the second symbol set includes the c second symbol subsets, and the following does not provide detailed descriptions with reference to the another description manner. Specifically, the c symbols in each second symbol subset correspond to c symbols distributed in c first symbol subsets in the first symbol set, so that the c symbols in each second symbol subset are from more different RS codewords as much as possible, to achieve a better data interleaving effect. The following describes in detail a data interleaving rule provided in this application.

It should be noted that the second symbol subset is merely a concept introduced for ease of description. During actual application, the second symbol set is a whole and does not have division, and each second symbol subset may be considered as one or more symbols selected from the second symbol set.

In a possible implementation, the second symbol set is presented in a form of a data stream, to be specific, the symbols in the second symbol set are arranged to form the data stream. In another possible implementation, the second symbol set is presented in a form of a symbol matrix. Specifically, the second symbol set is represented as a second symbol matrix, and the second symbol matrix includes r rows and c columns of symbols. c symbols in each row of the second symbol matrix may be understood as a second symbol subset. The c symbols in each row of the second symbol matrix correspond to c symbols distributed in c rows of the first symbol matrix. In other words, the second symbol matrix is essentially a set of a plurality of symbols, and introduction of the second symbol matrix is merely for description in another dimension. A symbol in a second symbol subset in the second symbol set may alternatively be simply converted into a symbol in a row and a column of the second symbol matrix. For ease of description, only one form of the second symbol set or the second symbol matrix is used for description below. A person skilled in the art may directly derive descriptions of the other form based on the foregoing described correspondence between the second symbol set and the second symbol matrix.

It should be noted that after the interleaver separately interleaves the L first symbol sets to obtain the L second symbol sets, the interleaver outputs the L second symbol sets to an encoding apparatus. Further, the encoding apparatus separately performs FEC encoding on the r second symbol subsets in each second symbol set to obtain L*r codewords, that is, performs inner-code encoding described above. In a possible implementation, the encoding apparatus separately performs FEC encoding on the r second symbol subsets in each of the L second symbol sets by using Hamming codes, to obtain L*r Hamming codewords.

In this embodiment of this application, all the n data streams are codewords obtained through outer-code encoding. After the n data streams are separately delayed, data interleaving is further performed on the n delayed data streams. According to the delaying processing solution provided in this application, n symbols output from the n delayed data streams at a same moment can be from a plurality of different outer-code codewords by using a low latency. This helps reduce a data interleaving latency while ensuring good performance. In other words, the solution combining delaying processing and data interleaving in this application uses a low overall latency, and is more applicable to an application scenario requiring a low latency.

The following describes a specific implementation of delaying the n data streams provided in this application.

It should be noted that the following uses an example in which n is divisible by 16 and p=4 for description. The n delay lines include at least one group, and each group includes 16 adjacent delay lines. In other words, in this application, a delay line distribution rule is described by using a group of 16 delay lines as a granularity. It should be understood that the data streams correspond one-to-one to the delay lines, and an order of the n delay lines is consistent with an order of the corresponding n data streams. If the data streams obtained through the lane reordering are arranged in an order of 0, 1, 2, 3 . . . , the delay lines are also arranged in an order of 0, 1, 2, 3 . . . . If the data streams are arranged in another order, the delay lines are also arranged in the corresponding order. In addition, group k (0≤k<n/16) of delay lines includes delay line 16*k, delay line 16*k+1, . . . , and delay line 16*k+15. There are a plurality of cases of constraints satisfied by four adjacent delay lines, for example, delay line 16*k and delay line 16*k+1 satisfy a designed constraint, and delay line 16*k+2 and delay line 16*k+3 satisfy another designed constraint; or delay line 16*k and delay line 16*k+3 satisfy a designed constraint, and delay line 16*k+1 and delay line 16*k+2 satisfy another designed constraint. In consideration of a non-unique delay line selection order in descriptions of a delay line rule, for ease of description of the delay line distribution rule provided in this application, serial numbers of 16 delay lines in each group are respectively denoted as $a_0$, $a_1$, $a_2$, $a_3$, $a_4$, $a_5$, $a_6$, $a_7$, $a_8$, $a_9$, $a_{10}$, $a_{11}$, $a_{12}$, $a_{13}$, $a_{14}$, and $a_{15}$, where $a_0$, $a_1$, $a_2$, $a_3$, $a_4$, $a_5$, $a_6$, $a_7$, $a_8$, $a_9$, $a_{10}$, $a_{11}$, $a_{12}$, $a_{13}$, $a_{14}$, and $a_{15}$ are non-negative integers that are not equal to each other and are less than 16. In other words, serial number values of $a_0$ to $a_{15}$ may sequentially correspond one-to-one to 0 to 15, that is, {0, 1, 2, 3, 4, 5, 6, 7, 8, 9, 10, 11, 12, 13, 14, 15}. In addition, serial number values of $a_0$ to $a_{15}$ may not be sequentially 0 to 15, for example, {0, 3, 1, 2, 4, 7, 5, 6, 8, 11, 9, 10, 12, 15, 13, 14}.

It should be understood that if n is greater than or equal to 32, the n delay lines include a plurality of groups, for example, group 0 of delay lines and group 1 of delay lines. Values of serial numbers $a_0$ to $a_{15}$ of group 0 of delay lines are selected from 0 to 15, values of serial numbers $a_0$ to $a_{15}$ of group 1 of delay lines are selected from 16 to 31, and 16 serial numbers are used as one group. The rest can be deduced by analogy. For ease of description, regardless of a specific group of delay lines, in the following descriptions, a case in which values of serial numbers $a_0$ to $a_{15}$ of the group of delay lines are selected from 0 to 15 is used for description, and actual serial numbers of the group of delay lines are 16*k plus each serial number based on $a_0$ to $a_{15}$, where 0≤k<n/16. In other words, serial number values of group k of delay lines are $a_0$+16*k, $a_1$+16*k, . . . , and $a_{15}$+16*k. In addition, 16 delay lines in different groups may be numbered in a same order or may be numbered in different orders. n=32 is used as an example. Serial numbers values $a_0$ to $a_{15}$ of 16 delay lines in group 0 included in the 32 delay lines value are {0, 1, 2, 3, 4, 5, 6, 7, 8, 9, 10, 11, 12, 13, 14, 15}, that is, are sequentially 0 to 15. 16 delay lines in group 1 may be numbered in the order of 0 to 15 that is consistent with that in group 0 of delay lines, or may be numbered in another order. This is not specifically limited herein.

In a possible implementation, in group k (0≤k<n/16) of delay lines, delay values of delay line $a_0$, delay line $a_1$, delay line $a_2$, delay line $a_3$, delay line $a_4$, delay line $a_5$, delay line $a_6$, delay line $a_7$, delay line $a_8$, delay line $a_9$, delay line $a_{10}$, delay line $a_{11}$, delay line $a_{12}$, delay line $a_{13}$, delay line $a_{14}$, and delay line $a_{15}$ satisfy a first condition. Specifically, the first condition is:

a difference between the delay value of delay line $a_0$ and the delay value of delay line $a_1$ is 2V symbols;
a difference between the delay value of delay line $a_2$ and the delay value of delay line $a_3$ is 2V symbols;
a difference between the delay value of delay line $a_4$ and the delay value of delay line $a_5$ is 2V symbols;
a difference between the delay value of delay line $a_6$ and the delay value of delay line $a_7$ is 2V symbols;
a difference between the delay value of delay line $a_8$ and the delay value of delay line $a_9$ is 2V symbols;
a difference between the delay value of delay line $a_{10}$ and the delay value of delay line $a_{11}$ is 2V symbols;
a difference between the delay value of delay line $a_{12}$ and the delay value of delay line $a_{13}$ is 2V symbols; and
a difference between the delay value of delay line $a_{14}$ and the delay value of delay line $a_{15}$ is 2V symbols.

It should be noted that a client side has 8*100G interfaces with each lane of 100 Gb/s and uses a "100G RS-FEC" mode. If the foregoing first condition is satisfied and V≥68, in 16 symbols output each time after data streams 0 to 15 (or data streams 16 to 31) in 32 data streams are delayed, symbol $a_0$ and symbol $a_1$ are from two different RS codeword symbols, symbol $a_2$ and symbol $a_3$ are from two different RS codeword symbols, . . . , and symbol $a_{14}$ and symbol $a_{15}$ are from two different RS codeword symbols. This delay design manner facilitates subsequent use of an interleaving processing solution that is easy to implement and has a low latency, so as to implement good performance of a cascaded FEC solution and reduce an overall latency of a transmission solution.

Based on the foregoing descriptions, in each group of 16 delay lines, quantities of delay lines whose delay values are 0 symbols, V symbols, 2V symbols, and 3V symbols are all 4.

Based on the foregoing descriptions, in group k (0≤k<n/16) of delay lines, the delay values of delay line $a_0$, delay line $a_1$, delay line $a_2$, delay line $a_3$, delay line $a_4$, delay line $a_5$, delay line $a_6$, delay line $a_7$, delay line $a_8$, delay line $a_9$, delay line $a_{10}$, delay line $a_{11}$, delay line $a_{12}$, delay line $a_{13}$, delay line $a_{14}$, and delay line $a_{15}$ satisfy a second condition. Specifically, the second condition is:

the delay value of delay line $a_0$, the delay value of delay line $a_4$, the delay value of delay line $a_8$, and the delay value of delay line $a_{12}$ are not equal to each other; the delay value of delay line $a_1$, the delay value of delay line $a_5$, the delay value of delay line $a_9$, and the delay value of delay line $a_{13}$ are not equal to each other; the delay value of delay line $a_2$, the delay value of delay line $a_6$, the delay value of delay line $a_{10}$, and the delay value of delay line $a_{14}$ are not equal to each other; and the delay value of delay line $a_3$, the delay value of delay line $a_7$, the delay value of delay line $a_{11}$, and the delay value of delay line $a_{15}$ are not equal to each other.

It should be noted that the client side has a 1*800G interface or 2*400G interfaces with each lane of 100 Gb/s. If the second condition is satisfied and V≥68, in the 16 symbols output each time after data streams 0 to 15 (or data streams 16 to 31) in the 32 data streams are delayed, symbol $a_0$, symbol $a_4$, symbol $a_8$, and symbol $a_{12}$ are from 4 different RS codeword symbols; symbol $a_1$, symbol as, symbol $a_8$, and symbol $a_{13}$ are from 4 different RS codeword symbols; symbol $a_2$, symbol $a_6$, symbol $a_{10}$, and symbol $a_{14}$ are from four different RS codeword symbols; and symbol $a_3$, symbol $a_7$, symbol $a_{11}$, and symbol $a_{15}$ are from four different RS codeword symbols. This delay design manner facilitates subsequent use of the interleaving processing solution that is easy to implement and has a low latency, so as to implement good performance of the cascaded FEC solution, and reduce the overall latency of the transmission solution.

Based on the foregoing descriptions, the delay values of delay line $a_0$, delay line $a_2$, delay line $a_4$, delay line $a_6$, delay line $a_8$, delay line $a_{10}$, delay line $a_{12}$, and delay line $a_{14}$ in group k (0≤k<n/16) of delay lines satisfy a third condition. Specifically, the third condition is:

a difference between the delay value of delay line $a_0$ and the delay value of delay line $a_4$ is 2V symbols, a difference between the delay value of delay line $a_2$ and the delay value of delay line $a_6$ is 2V symbols, a difference between the delay value of delay line $a_8$ and the delay value of delay line $a_{12}$ is 2V symbols, and a difference between the delay value of delay line $a_{10}$ and the delay value of delay line $a_{14}$ is 2V symbols.

It should be noted that the client side has 4*200G interfaces with each lane of 100 Gb/s. If the first and third conditions are satisfied and V≥68, in the 16 symbols output each time after data streams 0 to 15 (or data streams 16 to 31) in the 32 data streams are delayed, symbol $a_0$, symbol $a_1$, symbol $a_4$, and symbol as are from four different RS codeword symbols; symbol $a_2$, symbol $a_3$, symbol $a_6$, and symbol $a_7$ are from four different RS codeword symbols; symbol $a_8$, symbol $a_9$, symbol $a_{12}$, and symbol $a_{13}$ are from four different RS codeword symbols; and symbol $a_{10}$, symbol $a_{11}$, symbol $a_{14}$, and symbol $a_{15}$ are from four different RS codeword symbols. This delay design manner facilitates subsequent use of the interleaving processing solution that is easy to implement and has a low latency, so as to implement good performance of the cascaded FEC solution, and reduce the overall latency of the transmission solution.

Based on the foregoing descriptions, a first delay value set {A} sequentially includes the delay values of delay line $a_0$, delay line $a_1$, delay line $a_2$, delay line $a_3$, delay line $a_4$, delay line as, delay line $a_6$, delay line $a_7$, delay line $a_8$, delay line $a_9$, delay line $a_{10}$, delay line $a_{11}$, delay line $a_{12}$, delay line $a_{13}$, delay line $a_{14}$, and delay line $a_{15}$ in group k (0≤k<n/16) of delay lines, and the first delay value set {A} includes one of the following:

{0, 2V, 0, 2V, 2V, 0, 2V, 0, V, 3V, V, 3V, 3V, V, 3V, V},
{0, 2V, 0, 2V, 2V, 0, 2V, 0, V, 3V, 3V, V, 3V, V, V, 3V},
{0, 2V, 0, 2V, 2V, 0, 2V, 0, 3V, V, V, 3V, V, 3V, 3V, V},
{0, 2V, 0, 2V, 2V, 0, 2V, 0, 3V, V, 3V, V, V, 3V, V, 3V},
{0, 2V, V, 3V, 2V, 0, 3V, V, V, 3V, 0, 2V, 3V, V, 2V, 0},
{0, 2V, V, 3V, 2V, 0, 3V, V, V, 3V, 2V, 0, 3V, V, 0, 2V},
{0, 2V, V, 3V, 2V, 0, 3V, V, 3V, V, 0, 2V, V, 3V, 2V, 0},
{0, 2V, V, 3V, 2V, 0, 3V, V, 3V, V, 2V, 0, V, 3V, 0, 2V},
{0, 2V, 2V, 0, 2V, 0, 0, 2V, V, 3V, V, 3V, 3V, V, 3V, V},
{0, 2V, 2V, 0, 2V, 0, 0, 2V, V, 3V, 3V, V, 3V, V, V, 3V},
{0, 2V, 2V, 0, 2V, 0, 0, 2V, 3V, V, V, 3V, V, 3V, 3V, V},
{0, 2V, 2V, 0, 2V, 0, 0, 2V, 3V, V, 3V, V, V, 3V, V, 3V},
{0, 2V, 3V, V, 2V, 0, V, 3V, V, 3V, 0, 2V, 3V, V, 2V, 0},
{0, 2V, 3V, V, 2V, 0, V, 3V, V, 3V, 2V, 0, 3V, V, 0, 2V},
{0, 2V, 3V, V, 2V, 0, V, 3V, 3V, V, 0, 2V, V, 3V, 2V, 0},
{0, 2V, 3V, V, 2V, 0, V, 3V, 3V, V, 2V, 0, V, 3V, 0, 2V},
{V, 3V, 0, 2V, 3V, V, 2V, 0, 0, 2V, V, 3V, 2V, 0, 3V, V},
{V, 3V, 0, 2V, 3V, V, 2V, 0, 0, 2V, 3V, V, 2V, 0, V, 3V},
{V, 3V, 0, 2V, 3V, V, 2V, 0, 2V, 0, V, 3V, 0, 2V, 3V, V},
{V, 3V, 0, 2V, 3V, V, 2V, 0, 2V, 0, 3V, V, 0, 2V, V, 3V},
{V, 3V, V, 3V, 3V, V, 3V, V, 0, 2V, 0, 2V, 2V, 0, 2V, 0},
{V, 3V, V, 3V, 3V, V, 3V, V, 0, 2V, 2V, 0, 2V, 0, 0, 2V},
{V, 3V, V, 3V, 3V, V, 3V, V, 2V, 0, 0, 2V, 0, 2V, 2V, 0},
{V, 3V, V, 3V, 3V, V, 3V, V, 2V, 0, 2V, 0, 0, 2V, 0, 2V},
{V, 3V, 2V, 0, 3V, V, 0, 2V, 0, 2V, V, 3V, 2V, 0, 3V, V},
{V, 3V, 2V, 0, 3V, V, 0, 2V, 0, 2V, 3V, V, 2V, 0, V, 3V},
{V, 3V, 2V, 0, 3V, V, 0, 2V, 2V, 0, V, 3V, 0, 2V, 3V, V},
{V, 3V, 2V, 0, 3V, V, 0, 2V, 2V, 0, 3V, V, 0, 2V, V, 3V},
{V, 3V, 3V, V, 3V, V, V, 3V, 0, 2V, 0, 2V, 2V, 0, 2V, 0},
{V, 3V, 3V, V, 3V, V, V, 3V, 0, 2V, 2V, 0, 2V, 0, 0, 2V},
{V, 3V, 3V, V, 3V, V, V, 3V, 2V, 0, 0, 2V, 0, 2V, 2V, 0},
{V, 3V, 3V, V, 3V, V, V, 3V, 2V, 0, 2V, 0, 0, 2V, 0, 2V},
{2V, 0, 0, 2V, 0, 2V, 2V, 0, V, 3V, V, 3V, 3V, V, 3V, V},
{2V, 0, 0, 2V, 0, 2V, 2V, 0, V, 3V, 3V, V, 3V, V, V, 3V},
{2V, 0, 0, 2V, 0, 2V, 2V, 0, 3V, V, V, 3V, V, 3V, 3V, V},
{2V, 0, 0, 2V, 0, 2V, 2V, 0, 3V, V, 3V, V, V, 3V, V, 3V},
{2V, 0, V, 3V, 0, 2V, 3V, V, V, 3V, 0, 2V, 3V, V, 2V, 0},
{2V, 0, V, 3V, 0, 2V, 3V, V, V, 3V, 2V, 0, 3V, V, 0, 2V},
{2V, 0, V, 3V, 0, 2V, 3V, V, 3V, V, 0, 2V, V, 3V, 2V, 0},
{2V, 0, V, 3V, 0, 2V, 3V, V, 3V, V, 2V, 0, V, 3V, 0, 2V},
{2V, 0, 2V, 0, 0, 2V, 0, 2V, V, 3V, V, 3V, 3V, V, 3V, V},
{2V, 0, 2V, 0, 0, 2V, 0, 2V, V, 3V, 3V, V, 3V, V, V, 3V},
{2V, 0, 2V, 0, 0, 2V, 0, 2V, 3V, V, V, 3V, V, 3V, 3V, V},
{2V, 0, 2V, 0, 0, 2V, 0, 2V, 3V, V, 3V, V, V, 3V, V, 3V},
{2V, 0, 3V, V, 0, 2V, V, 3V, V, 3V, 0, 2V, 3V, V, 2V, 0},
{2V, 0, 3V, V, 0, 2V, V, 3V, V, 3V, 2V, 0, 3V, V, 0, 2V},
{2V, 0, 3V, V, 0, 2V, V, 3V, 3V, V, 0, 2V, V, 3V, 2V, 0},
{2V, 0, 3V, V, 0, 2V, V, 3V, 3V, V, 2V, 0, V, 3V, 0, 2V},
{3V, V, 0, 2V, V, 3V, 2V, 0, 0, 2V, V, 3V, 2V, 0, 3V, V},
{3V, V, 0, 2V, V, 3V, 2V, 0, 0, 2V, 3V, V, 2V, 0, V, 3V},
{3V, V, 0, 2V, V, 3V, 2V, 0, 2V, 0, V, 3V, 0, 2V, 3V, V},
{3V, V, 0, 2V, V, 3V, 2V, 0, 2V, 0, 3V, V, 0, 2V, V, 3V},
{3V, V, V, 3V, V, 3V, 3V, V, 0, 2V, 0, 2V, 2V, 0, 2V, 0},
{3V, V, V, 3V, V, 3V, 3V, V, 0, 2V, 2V, 0, 2V, 0, 0, 2V},
{3V, V, V, 3V, V, 3V, 3V, V, 2V, 0, 0, 2V, 0, 2V, 2V, 0},
{3V, V, V, 3V, V, 3V, 3V, V, 2V, 0, 2V, 0, 0, 2V, 0, 2V},
{3V, V, 2V, 0, V, 3V, 0, 2V, 0, 2V, V, 3V, 2V, 0, 3V, V},
{3V, V, 2V, 0, V, 3V, 0, 2V, 0, 2V, 3V, V, 2V, 0, V, 3V},
{3V, V, 2V, 0, V, 3V, 0, 2V, 2V, 0, V, 3V, 0, 2V, 3V, V},
{3V, V, 2V, 0, V, 3V, 0, 2V, 2V, 0, 3V, V, 0, 2V, V, 3V},
{3V, V, 3V, V, V, 3V, V, 3V, 0, 2V, 0, 2V, 2V, 0, 2V, 0},
{3V, V, 3V, V, V, 3V, V, 3V, 0, 2V, 2V, 0, 2V, 0, 0, 2V},
{3V, V, 3V, V, V, 3V, V, 3V, 2V, 0, 0, 2V, 0, 2V, 2V, 0}, and
{3V, V, 3V, V, V, 3V, V, 3V, 2V, 0, 2V, 0, 0, 2V, 0, 2V}.

It should be noted that the client side has a 1*800G interface, 2*400G interfaces, modes) with each lane of 100 Gb/s. If the foregoing first delay value set {A} is satisfied and V≥68, in the 16 symbols output each time after data streams 0 to 15 (or data streams 16 to 31) in the 32 data streams are delayed, symbol $a_0$, symbol $a_1$, symbol $a_4$, symbol $a_5$, symbol $a_8$, symbol $a_9$, symbol $a_{12}$, and symbol $a_{13}$ are from eight different RS codeword symbols; and symbol $a_2$, symbol $a_3$, symbol $a_6$, symbol $a_7$, symbol $a_{10}$, symbol $a_{11}$, symbol $a_{14}$, and symbol $a_{15}$ are from eight different RS codeword symbols. This delay design manner facilitates subsequent use of the interleaving processing solution that is easy to implement and has a low latency, so as to implement good performance of the cascaded FEC solution, and reduce the overall latency of the transmission solution.

Based on the foregoing descriptions, in group k (0≤k<n/16) of delay lines, the delay values of delay line $a_0$, delay line $a_1$, delay line $a_2$, delay line $a_3$, delay line $a_4$, delay line $a_5$, delay line $a_6$, delay line $a_7$, delay line $a_8$, delay line $a_9$, delay line $a_{10}$, delay line $a_{11}$, delay line $a_{12}$, delay line $a_{13}$, delay line $a_{14}$, and delay line $a_{15}$ satisfy a fourth condition. Specifically, the fourth condition is:

the delay value of delay line $a_0$ and the delay value of delay line $a_2$ are equal or have a difference of 2V symbols;

the delay value of delay line $a_1$ and the delay value of delay line $a_3$ are equal or have a difference of 2V symbols;

the delay value of delay line $a_2$ and the delay value of delay line $a_4$ are equal or have a difference of 2V symbols;

the delay value of delay line $a_3$ and the delay value of delay line $a_5$ are equal or have a difference of 2V symbols;

the delay value of delay line $a_4$ and the delay value of delay line $a_6$ are equal or have a difference of 2V symbols;

the delay value of delay line $a_5$ and the delay value of delay line $a_7$ are equal or have a difference of 2V symbols;

the delay value of delay line $a_8$ and the delay value of delay line $a_{10}$ are equal or have a difference of 2V symbols;

the delay value of delay line $a_9$ and the delay value of delay line $a_{11}$ are equal or have a difference of 2V symbols;

the delay value of delay line $a_{10}$ and the delay value of delay line $a_{12}$ are equal or have a difference of 2V symbols;

the delay value of delay line $a_{11}$ and the delay value of delay line $a_{13}$ are equal or have a difference of 2V symbols;

the delay value of delay line $a_{12}$ and the delay value of delay line $a_{14}$ are equal or have a difference of 2V symbols; and the delay value of delay line $a_{13}$ and the delay value of delay line $a_{15}$ are equal or have a difference of 2V symbols.

Based on the first delay value set {A} and the fourth condition, a second delay value set {B} sequentially includes the delay values of delay line $a_0$, delay line $a_1$, delay line $a_2$, delay line $a_3$, delay line $a_4$, delay line $a_5$, delay line $a_6$, delay line $a_7$, delay line $a_8$, delay line $a_9$, delay line $a_{10}$, delay line $a_{11}$, delay line $a_{12}$, delay line $a_{13}$, delay line $a_{14}$, and delay line $a_{15}$ in group k (0≤k<n/16) of delay lines, and the second delay value set {B} includes one of the following:

{0, 2V, 0, 2V, 2V, 0, 2V, 0, V, 3V, V, 3V, 3V, V, 3V, V},
{0, 2V, 0, 2V, 2V, 0, 2V, 0, V, 3V, 3V, V, 3V, V, V, 3V},
{0, 2V, 0, 2V, 2V, 0, 2V, 0, 3V, V, V, 3V, V, 3V, 3V, V},
{0, 2V, 0, 2V, 2V, 0, 2V, 0, 3V, V, 3V, V, 3V, V, V, 3V},
{0, 2V, 2V, 0, 2V, 0, 0, 2V, V, 3V, V, 3V, 3V, V, 3V, V},
{0, 2V, 2V, 0, 2V, 0, 0, 2V, V, 3V, 3V, V, 3V, V, V, 3V},
{0, 2V, 2V, 0, 2V, 0, 0, 2V, 3V, V, V, 3V, V, 3V, 3V, V},
{0, 2V, 2V, 0, 2V, 0, 0, 2V, 3V, V, 3V, V, 3V, V, V, 3V},
{V, 3V, V, 3V, 3V, V, 3V, V, 0, 2V, 0, 2V, 2V, 0, 2V, 0},
{V, 3V, V, 3V, 3V, V, 3V, V, 0, 2V, 2V, 0, 2V, 0, 0, 2V},
{V, 3V, V, 3V, 3V, V, 3V, V, 2V, 0, 0, 2V, 0, 2V, 2V, 0},
{V, 3V, V, 3V, 3V, V, 3V, V, 2V, 0, 2V, 0, 0, 2V, 0, 2V},
{V, 3V, 3V, V, 3V, V, V, 3V, 0, 2V, 0, 2V, 2V, 0, 2V, 0},
{V, 3V, 3V, V, 3V, V, V, 3V, 0, 2V, 2V, 0, 2V, 0, 0, 2V},
{V, 3V, 3V, V, 3V, V, V, 3V, 2V, 0, 0, 2V, 0, 2V, 2V, 0},
{V, 3V, 3V, V, 3V, V, V, 3V, 2V, 0, 2V, 0, 0, 2V, 0, 2V},
{2V, 0, 0, 2V, 0, 2V, 2V, 0, V, 3V, V, 3V, 3V, V, 3V, V},
{2V, 0, 0, 2V, 0, 2V, 2V, 0, V, 3V, 3V, V, 3V, V, V, 3V},
{2V, 0, 0, 2V, 0, 2V, 2V, 0, 3V, V, V, 3V, V, 3V, 3V, V},
{2V, 0, 0, 2V, 0, 2V, 2V, 0, 3V, V, 3V, V, 3V, V, V, 3V},
{2V, 0, 2V, 0, 0, 2V, 0, 2V, V, 3V, V, 3V, 3V, V, 3V, V},
{2V, 0, 2V, 0, 0, 2V, 0, 2V, V, 3V, 3V, V, 3V, V, V, 3V},
{2V, 0, 2V, 0, 0, 2V, 0, 2V, 3V, V, V, 3V, V, 3V, 3V, V},
{2V, 0, 2V, 0, 0, 2V, 0, 2V, 3V, V, 3V, V, 3V, V, V, 3V},
{3V, V, V, 3V, V, 3V, 3V, V, 0, 2V, 0, 2V, 2V, 0, 2V, 0},
{3V, V, V, 3V, V, 3V, 3V, V, 0, 2V, 2V, 0, 2V, 0, 0, 2V},
{3V, V, V, 3V, V, 3V, 3V, V, 2V, 0, 0, 2V, 0, 2V, 2V, 0},
{3V, V, V, 3V, V, 3V, 3V, V, 2V, 0, 2V, 0, 0, 2V, 0, 2V},
{3V, V, 3V, V, V, 3V, V, 3V, 0, 2V, 0, 2V, 2V, 0, 2V, 0},
{3V, V, 3V, V, V, 3V, V, 3V, 0, 2V, 2V, 0, 2V, 0, 0, 2V},
{3V, V, 3V, V, V, 3V, V, 3V, 2V, 0, 0, 2V, 0, 2V, 2V, 0}, and
{3V, V, 3V, V, V, 3V, V, 3V, 2V, 0, 2V, 0, 0, 2V, 0, 2V}.

Based on the foregoing descriptions, a serial number value set {C} of the delay lines sequentially includes values of $a_0, a_1, a_2, a_3, a_4, a_5, a_6, a_7, a_8, a_9, a_{10}, a_{11}, a_{12}, a_{13}, a_{14}$, and $a_{15}$, and the serial number value set {C} includes one of the following:

{0, 1, 2, 3, 4, 5, 6, 7, 8, 9, 10, 11, 12, 13, 14, 15},
{0, 1, 2, 3, 4, 5, 6, 7, 8, 9, 10, 11, 14, 15, 12, 13},
{0, 1, 2, 3, 4, 5, 6, 7, 10, 11, 8, 9, 12, 13, 14, 15},
{0, 1, 2, 3, 4, 5, 6, 7, 10, 11, 8, 9, 14, 15, 12, 13},
{0, 1, 2, 3, 6, 7, 4, 5, 8, 9, 10, 11, 12, 13, 14, 15},
{0, 1, 2, 3, 6, 7, 4, 5, 8, 9, 10, 11, 14, 15, 12, 13},
{0, 1, 2, 3, 6, 7, 4, 5, 10, 11, 8, 9, 12, 13, 14, 15},
{0, 1, 2, 3, 6, 7, 4, 5, 10, 11, 8, 9, 14, 15, 12, 13},
{2, 3, 0, 1, 4, 5, 6, 7, 8, 9, 10, 11, 12, 13, 14, 15},
{2, 3, 0, 1, 4, 5, 6, 7, 8, 9, 10, 11, 14, 15, 12, 13},
{2, 3, 0, 1, 4, 5, 6, 7, 10, 11, 8, 9, 12, 13, 14, 15},
{2, 3, 0, 1, 4, 5, 6, 7, 10, 11, 8, 9, 14, 15, 12, 13},
{2, 3, 0, 1, 6, 7, 4, 5, 8, 9, 10, 11, 12, 13, 14, 15},
{2, 3, 0, 1, 6, 7, 4, 5, 8, 9, 10, 11, 14, 15, 12, 13},
{2, 3, 0, 1, 6, 7, 4, 5, 10, 11, 8, 9, 12, 13, 14, 15},
{2, 3, 0, 1, 6, 7, 4, 5, 10, 11, 8, 9, 14, 15, 12, 13},
{0, 3, 1, 2, 4, 7, 5, 6, 8, 11, 9, 10, 12, 15, 13, 14},
{0, 3, 1, 2, 4, 7, 5, 6, 8, 11, 9, 10, 13, 14, 12, 15},
{0, 3, 1, 2, 4, 7, 5, 6, 9, 10, 8, 11, 12, 15, 13, 14},
{0, 3, 1, 2, 4, 7, 5, 6, 9, 10, 8, 11, 13, 14, 12, 15},
{0, 3, 1, 2, 5, 6, 4, 7, 8, 11, 9, 10, 12, 15, 13, 14},
{0, 3, 1, 2, 5, 6, 4, 7, 8, 11, 9, 10, 13, 14, 12, 15},
{0, 3, 1, 2, 5, 6, 4, 7, 9, 10, 8, 11, 12, 15, 13, 14},
{0, 3, 1, 2, 5, 6, 4, 7, 9, 10, 8, 11, 13, 14, 12, 15},
{1, 2, 0, 3, 4, 7, 5, 6, 8, 11, 9, 10, 12, 15, 13, 14},
{1, 2, 0, 3, 4, 7, 5, 6, 8, 11, 9, 10, 13, 14, 12, 15},
{1, 2, 0, 3, 4, 7, 5, 6, 9, 10, 8, 11, 12, 15, 13, 14},
{1, 2, 0, 3, 4, 7, 5, 6, 9, 10, 8, 11, 13, 14, 12, 15},
{1, 2, 0, 3, 5, 6, 4, 7, 8, 11, 9, 10, 12, 15, 13, 14},
{1, 2, 0, 3, 5, 6, 4, 7, 8, 11, 9, 10, 13, 14, 12, 15},
{1, 2, 0, 3, 5, 6, 4, 7, 9, 10, 8, 11, 12, 15, 13, 14}, and
{1, 2, 0, 3, 5, 6, 4, 7, 9, 10, 8, 11, 13, 14, 12, 15}.

The following describes several specific data interleaving implementations provided in this application.

It should be noted that the following several implementations are described by using an example in which n=32. The first symbol set includes 32 first symbol subsets. The n delay lines include two groups: group 0 of delay lines and group 1 of delay lines. Specifically, serial number values of the 32 first symbol subsets include $b_0$, $b_1$, $b_2$, $b_3$, $b_4$, $b_5$, $b_6$, $b_7$, $b_8$, $b_9$, $b_{10}$, $b_{11}$, $b_{12}$, $b_{13}$, $b_{14}$, $b_{15}$, $b_{16}$, $b_{17}$, $b_{18}$, $b_{19}$, $b_{20}$, $b_{21}$, $b_{22}$, $b_{23}$, $b_{24}$, $b_{25}$, $b_{26}$, $b_{27}$, $b_{28}$, $b_{29}$, $b_{30}$, and $b_{31}$. $b_0$, $b_1$, $b_2$, $b_3$, $b_4$, $b_5$, $b_6$, $b_7$, $b_8$, $b_9$, $b_{10}$, $b_{11}$, $b_{12}$, $b_{13}$, $b_{14}$, and $b_{15}$ are respectively equal to delay line serial number values $a_0$, $a_1$, $a_2$, $a_3$, $a_4$, $a_5$, $a_6$, $a_7$, $a_8$, $a_9$, $a_{10}$, $a_{11}$, $a_{12}$, $a_{13}$, $a_{14}$, and $a_{15}$ of group 0 of delay lines in sequence. $b_{16}$, $b_{17}$, $b_{18}$, $b_{19}$, $b_{20}$, $b_{21}$, $b_{22}$, $b_{23}$, $b_{24}$, $b_{25}$, $b_{26}$, $b_{27}$, $b_{28}$, $b_{29}$, $b_{30}$, and $b_{31}$ are respectively equal to delay line serial number values $a_0+16$, $a_1+16$, $a_2+16$, $a_3+16$, $a_4+16$, $a_5+16$, $a_6+16$, $a_7+16$, $a_8+16$, $a_9+16$, $a_{10}+16$, $a_{11}+16$, $a_{12}+16$, $a_{13}+16$, $a_{14}+16$, and $a_{15}+16$ of group 1 of delay lines in sequence. It should be understood that, both the delay line serial number values $a_0$ to $a_{15}$ of group 0 of delay lines and the delay line serial number values $a_0$ to $a_{15}$ of group 1 of delay lines may be any one in the foregoing serial number value set {C}, and the delay line serial number values $a_0$ to $a_{15}$ of group 0 of delay lines and the delay line serial number values $a_0$ to $a_{15}$ of group 1 of delay lines may be the same or different.

It should be noted that the client side has a 1*800G interface, 2*400G interfaces, 4*200G interfaces, or 8*100G interfaces (including "100G RS-FEC-Int" and "100G RS-FEC" modes) with each lane of 100 Gb/s. If the foregoing first delay value set {A} is satisfied and V≥68, in 32 symbols output each time after 32 data streams are delayed, symbol $b_0$, symbol $b_1$, symbol $b_4$, symbol $b_5$, symbol $b_8$, symbol $b_9$, symbol $b_{12}$, symbol $b_{13}$, and symbol $b_{16}$; and symbol $b_{17}$, symbol $b_{20}$, symbol $b_{21}$, symbol $b_{24}$, symbol $b_{25}$, symbol $b_{28}$, and symbol $b_{29}$ (or symbol $b_{18}$, symbol $b_{19}$, symbol $b_{22}$, symbol $b_{23}$, symbol $b_{26}$, symbol $b_{27}$, symbol $b_{30}$, and symbol $b_{31}$) are from 16 different RS codeword symbols; and in the 32 symbols, symbol $b_2$, symbol $b_3$, symbol $b_6$, symbol $b_7$, symbol $b_{10}$, symbol $b_{11}$, symbol $b_{14}$, symbol $b_{15}$, and symbol $b_{16}$; and symbol $b_{17}$, symbol $b_{20}$, symbol $b_{21}$, symbol $b_{24}$, symbol $b_{25}$, symbol $b_{28}$, and symbol $b_{29}$ (or symbol $b_{18}$, symbol $b_{19}$, symbol $b_{22}$, symbol $b_{23}$, symbol $b_{26}$, symbol $b_{27}$, symbol $b_{30}$, and symbol $b_{31}$) are from 16 different RS codeword symbols. This delay design manner facilitates subsequent use of the interleaving processing solution that is easy to implement and has a low latency, so as to implement good performance of the cascaded FEC solution, and reduce the overall latency of the transmission solution.

First data interleaving implementation: n=32, m=1, c=8, and r=4. To be specific, each first symbol set includes 32 first symbol subsets, and each first symbol subset includes one symbol. Each second symbol set includes four second symbol subsets, and each second symbol subset includes eight symbols.

Eight symbols in each second symbol subset satisfy a fifth condition. Specifically, the fifth condition includes any one of the following conditions:

the eight symbols in each second symbol subset are respectively from first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set;

the eight symbols in each second symbol subset are respectively from first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set;

the eight symbols in each second symbol subset are respectively from first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

the eight symbols in each second symbol subset are respectively from first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set;

four symbols in each second symbol subset are respectively from four first symbol subsets in first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other four symbols in each second symbol subset are respectively from four first symbol subsets in first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

four symbols in each second symbol subset are respectively from four first symbol subsets in first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other four symbols in each second symbol subset are respectively from four first symbol subsets in first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set;

four symbols in each second symbol subset are respectively from four first symbol subsets in first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other four symbols in each second symbol subset are respectively from four first symbol subsets in first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set; and four symbols in each second symbol subset are respectively from four first symbol subsets in first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other four symbols in each second symbol subset are respectively from four first symbol subsets in first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set.

In a possible implementation, symbol j in second symbol subset i in the second symbol set is from first symbol subset $b_x$ in the first symbol set, where x=i+j*4, 0≤i<4, and 0≤j<8.

Specifically, a second symbol set shown in Table 1 may be obtained according to the data interleaving rule, and each row represents one second symbol subset. As shown in Table 1, a digit x in row i and column j indicates that symbol j in second symbol subset i in the second symbol set obtained through interleaving is from a symbol in first symbol subset $b_x$ in the first symbol set. It should be noted that, transposition of locations of any two rows in Table 1 also belongs to the data interleaving rule provided in this application, and transposition of locations of eight digits in each row in Table 1 also belongs to the data interleaving rule provided in this application.

TABLE 1

| 0 | 4 | 8 | 12 | 16 | 20 | 24 | 28 |
|---|---|---|---|---|---|---|---|
| 1 | 5 | 9 | 13 | 17 | 21 | 25 | 29 |
| 2 | 6 | 10 | 14 | 18 | 22 | 26 | 30 |
| 3 | 7 | 11 | 15 | 19 | 23 | 27 | 31 |

In another possible implementation, symbol j in second symbol subset i in the second symbol set is from first symbol subset $b_x$ in the first symbol set, where $x=(i \%2)*2+\lfloor i/2 \rfloor*16+(j \%2)+\lfloor j/2 \rfloor*4$, $0 \le i<4$, $0 \le j<8$, $Y \% Z$ represents a remainder obtained by dividing Y by Z, and $\lfloor Y/Z \rfloor$ represents a quotient obtained by dividing Y by Z. Specifically, a second symbol set shown in Table 2 may be obtained according to the data interleaving rule, and each row represents one second symbol subset. As shown in Table 2, a digit x in row i and column j indicates that symbol j in second symbol subset i in the second symbol set obtained through interleaving is from a symbol in first symbol subset $b_x$ in the first symbol set. It should be noted that, transposition of locations of any two rows in Table 2 also belongs to the data interleaving rule provided in this application, and transposition of locations of eight digits in each row in Table 2 also belongs to the data interleaving rule provided in this application.

TABLE 2

| 0 | 1 | 4 | 5 | 8 | 9 | 12 | 13 |
|---|---|---|---|---|---|---|---|
| 2 | 3 | 6 | 7 | 10 | 11 | 14 | 15 |
| 16 | 17 | 20 | 21 | 24 | 25 | 28 | 29 |
| 18 | 19 | 22 | 23 | 26 | 27 | 30 | 31 |

Second data interleaving implementation: n=32, m=1, c=16, and r=2. To be specific, each first symbol set includes 32 first symbol subsets, and each first symbol subset includes one symbol. Each second symbol set includes two second symbol subsets, and each second symbol subset includes 16 symbols.

16 symbols in each second symbol subset satisfy a sixth condition. Specifically, the sixth condition includes any one of the following conditions:

eight symbols in each second symbol subset are respectively from first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other eight symbols in each second symbol subset are respectively from first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

eight symbols in each second symbol subset are respectively from first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other eight symbols in each second symbol subset are respectively from first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set;

eight symbols in each second symbol subset are respectively from first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other eight symbols in each second symbol subset are respectively from first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set; and eight symbols in each second symbol subset are respectively from first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other eight symbols in each second symbol subset are respectively from first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set.

In a possible implementation, symbol j in second symbol subset i in the second symbol set is from first symbol subset $b_x$ in the first symbol set, where $x=i*2+(j \%8)*4+\lfloor j/8 \rfloor$, $0 \le i<2$, $0 \le j<16$, $Y \% Z$ represents a remainder obtained by dividing Y by Z, and $\lfloor Y/Z \rfloor$ represents a quotient obtained by dividing Y by Z. Specifically, a second symbol set shown in Table 3 may be obtained according to the data interleaving rule, and each row represents one second symbol subset. As shown in Table 3, a digit x in row i and column j indicates that symbol j in second symbol subset i in the second symbol set obtained through interleaving is from a symbol in first symbol subset $b_x$ in the first symbol set. It should be noted that, transposition of locations of any two rows in Table 3 also belongs to the data interleaving rule provided in this application, and transposition of locations of 16 digits in each row in Table 3 also belongs to the data interleaving rule provided in this application.

TABLE 3

| 0 | 4 | 8 | 12 | 16 | 20 | 24 | 28 | 1 | 5 | 9 | 13 | 17 | 21 | 25 | 29 |
|---|---|---|---|---|---|---|---|---|---|---|---|---|---|---|---|
| 2 | 6 | 10 | 14 | 18 | 22 | 26 | 30 | 3 | 7 | 11 | 15 | 19 | 23 | 27 | 31 |

In another possible implementation, symbol j in second symbol subset i in the second symbol set is from first symbol subset $b_x$ in the first symbol set, where $x=i*2+\lfloor j/2 \rfloor*4+j \%2$, $0 \le i<2$, $0 \le j<16$, $Y \% Z$ represents a remainder obtained by dividing Y by Z, and $\lfloor Y/Z \rfloor$ represents a quotient obtained by dividing Y by Z. Specifically, a second symbol set shown in Table 4 may be obtained according to the data interleaving rule, and each row represents one second symbol subset. As shown in Table 4, a digit x in row i and column j indicates that symbol j in second symbol subset i in the second symbol set obtained through interleaving is from a symbol in first symbol subset $b_x$ in the first symbol set. It should be noted that, transposition of locations of any two rows in Table 4 also belongs to the data interleaving rule provided in this application, and transposition of locations of 16 digits in each row in Table 4 also belongs to the data interleaving rule provided in this application.

TABLE 4

| 0 | 1 | 4 | 5 | 8  | 9  | 12 | 13 | 16 | 17 | 20 | 21 | 24 | 25 | 28 | 29 |
|---|---|---|---|----|----|----|----|----|----|----|----|----|----|----|----|
| 2 | 3 | 6 | 7 | 10 | 11 | 14 | 15 | 18 | 19 | 22 | 23 | 26 | 27 | 30 | 31 |

In another possible implementation, symbol j in second symbol subset i in the second symbol set is from first symbol subset $b_x$ in the first symbol set, where $x=(i\hat{\ }\lfloor j/8 \rfloor)*2+\lfloor j/2 \rfloor*4+j\ \%2$, $0 \le i < 2$, $0 \le j < 16$, $Y\ \%\ Z$ represents a remainder obtained by dividing Y by Z, and $\lfloor Y/Z \rfloor$ represents a quotient obtained by dividing Y by Z. Specifically, a second symbol set shown in Table 5 may be obtained according to the data interleaving rule, and each row represents one second symbol subset. As shown in Table 5, a digit x in row i and column j indicates that symbol j in second symbol subset i in the second symbol set obtained through interleaving is from a symbol in first symbol subset $b_x$ in the first symbol set. It should be noted that, transposition of locations of any two rows in Table 5 also belongs to the data interleaving rule provided in this application, and transposition of locations of 16 digits in each row in Table 5 also belongs to the data interleaving rule provided in this application.

TABLE 5

| 0 | 1 | 4 | 5 | 8  | 9  | 12 | 13 | 18 | 19 | 22 | 23 | 26 | 27 | 30 | 31 |
|---|---|---|---|----|----|----|----|----|----|----|----|----|----|----|----|
| 2 | 3 | 6 | 7 | 10 | 11 | 14 | 15 | 16 | 17 | 20 | 21 | 24 | 25 | 28 | 29 |

Third data interleaving implementation: n=32, m=3, c=12, and r=8. To be specific, each first symbol set includes 32 first symbol subsets, and each first symbol subset includes three symbols. Each second symbol set includes eight second symbol subsets, and each second symbol subset includes 12 symbols.

12 symbols in each second symbol subset satisfy a seventh condition. Specifically, the seventh condition includes any one of the following conditions:

eight symbols in each second symbol subset are respectively from first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other four symbols in each second symbol subset are respectively from four first symbol subsets in first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

six symbols in each second symbol subset are respectively from six first symbol subsets in first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other six symbols in each second symbol subset are respectively from six first symbol subsets in first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

four symbols in each second symbol subset are respectively from four first symbol subsets in first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other eight symbols in each second symbol subset are respectively from first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

eight symbols in each second symbol subset are respectively from first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other four symbols in each second symbol subset are respectively from four first symbol subsets in first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set;

six symbols in each second symbol subset are respectively from six first symbol subsets in first symbol subset $b_0$, first symbol subset $b_1$, first symbol subset $b_4$, first symbol subset $b_5$, first symbol subset $b_8$, first symbol subset $b_9$, first symbol subset $b_{12}$, and first symbol subset $b_{13}$ in the first symbol set; and the other six symbols in each second symbol subset are respectively from six first symbol subsets in first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set;

four symbols in each second symbol subset are respectively from four first symbol subsets in first symbol subset $b_0$, first symbol subset $b_1$, first symbol subset $b_4$, first symbol subset by, first symbol subset $b_8$, first symbol subset $b_9$, first symbol subset $b_{12}$, and first symbol subset $b_{13}$ in the first symbol set; and the other eight symbols in each second symbol subset are respectively from first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set;

eight symbols in each second symbol subset are respectively from first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other four symbols in each second symbol subset are respectively from four first symbol subsets in first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

six symbols in each second symbol subset are respectively from six first symbol subsets in first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other six symbols in each second symbol subset are respectively from six first symbol subsets in first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

four symbols in each second symbol subset are respectively from four first symbol subsets in first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other eight symbols in each second symbol subset are respectively from first symbol subset $b_{16}$, first symbol subset $b_{17}$, first symbol subset $b_{20}$, first symbol subset $b_{21}$, first symbol subset $b_{24}$, first symbol subset $b_{25}$, first symbol subset $b_{28}$, and first symbol subset $b_{29}$ in the first symbol set;

eight symbols in each second symbol subset are respectively from first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other four symbols in each second symbol subset are respectively from four first symbol subsets in first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set;

six symbols in each second symbol subset are respectively from six first symbol subsets in first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other six symbols in each second symbol subset are respectively from six first symbol subsets in first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set; and four symbols in each second symbol subset are respectively from four first symbol subsets in first symbol subset $b_2$, first symbol subset $b_3$, first symbol subset $b_6$, first symbol subset $b_7$, first symbol subset $b_{10}$, first symbol subset $b_{11}$, first symbol subset $b_{14}$, and first symbol subset $b_{15}$ in the first symbol set; and the other eight symbols in each second symbol subset are respectively from first symbol subset $b_{18}$, first symbol subset $b_{19}$, first symbol subset $b_{22}$, first symbol subset $b_{23}$, first symbol subset $b_{26}$, first symbol subset $b_{27}$, first symbol subset $b_{30}$, and first symbol subset $b_{31}$ in the first symbol set.

In a possible implementation, symbol j in second symbol subset i in the second symbol set is from symbol $\lfloor x/32 \rfloor$ in first symbol subset $b_{x\,\%32}$ in the first symbol set, where x=(i %4)*24+$\lfloor$i/4$\rfloor$*2+(j %6)*4+$\lfloor$j/6$\rfloor$, 0≤i<8, 0≤j<12, Y % Z represents a remainder obtained by dividing Y by Z, and $\lfloor Y/Z \rfloor$ represents a quotient obtained by dividing Y by Z. Specifically, a second symbol set shown in Table 6 may be obtained according to the data interleaving rule, and each row represents one second symbol subset. As shown in Table 6, a digit x in row i and column j indicates that symbol j in second symbol subset i in the second symbol set obtained through interleaving is from symbol $\lfloor x/32 \rfloor$ in first symbol subset $b_{x\,\%32}$ in the first symbol set. It should be noted that, transposition of locations of any two rows in Table 6 also belongs to the data interleaving rule provided in this application, and transposition of locations of 12 digits in each row in Table 6 also belongs to the data interleaving rule provided in this application.

TABLE 6

| 0 | 4 | 8 | 12 | 16 | 20 | 1 | 5 | 9 | 13 | 17 | 21 |
|---|---|---|---|---|---|---|---|---|---|---|---|
| 24 | 28 | 32 | 36 | 40 | 44 | 25 | 29 | 33 | 37 | 41 | 45 |
| 48 | 52 | 56 | 60 | 64 | 68 | 49 | 53 | 57 | 61 | 65 | 69 |
| 72 | 76 | 80 | 84 | 88 | 92 | 73 | 77 | 81 | 85 | 89 | 93 |
| 2 | 6 | 10 | 14 | 18 | 22 | 3 | 7 | 11 | 15 | 19 | 23 |
| 26 | 30 | 34 | 38 | 42 | 46 | 27 | 31 | 35 | 39 | 43 | 47 |
| 50 | 54 | 58 | 62 | 66 | 70 | 51 | 55 | 59 | 63 | 67 | 71 |
| 74 | 78 | 82 | 86 | 90 | 94 | 75 | 79 | 83 | 87 | 91 | 95 |

In another possible implementation, symbol j in second symbol subset i in the second symbol set is from symbol $\lfloor x/32 \rfloor$ in first symbol subset $b_{x\,\%32}$ in the first symbol set, where x=$\lfloor$i/2$\rfloor$*24+(i %2)*2+$\lfloor$j/2$\rfloor$*4+(j %2), 0≤i<8, 0≤j<12, Y % Z represents a remainder obtained by dividing Y by Z, and $\lfloor Y/Z \rfloor$ represents a quotient obtained by dividing Y by Z. Specifically, a second symbol set shown in Table 7 may be obtained according to the data interleaving rule, and each row represents one second symbol subset. As shown in Table 7, a digit x in row i and column j indicates that symbol j in second symbol subset i in the second symbol set obtained through interleaving is from symbol $\lfloor x/32 \rfloor$ in first symbol subset $b_{x\,\%32}$ in the first symbol set. It should be noted that, transposition of locations of any two rows in Table 7 also belongs to the data interleaving rule provided in this application, and transposition of locations of 12 digits in each row in Table 7 also belongs to the data interleaving rule provided in this application.

TABLE 7

| 0  | 1  | 4  | 5  | 8  | 9  | 12 | 13 | 16 | 17 | 20 | 21 |
|----|----|----|----|----|----|----|----|----|----|----|----|
| 2  | 3  | 6  | 7  | 10 | 11 | 14 | 15 | 18 | 19 | 22 | 23 |
| 24 | 25 | 28 | 29 | 32 | 33 | 36 | 37 | 40 | 41 | 44 | 45 |
| 26 | 27 | 30 | 31 | 34 | 35 | 38 | 39 | 42 | 43 | 46 | 47 |
| 48 | 49 | 52 | 53 | 56 | 57 | 60 | 61 | 64 | 65 | 68 | 69 |
| 50 | 51 | 54 | 55 | 58 | 59 | 62 | 63 | 66 | 67 | 70 | 71 |
| 72 | 73 | 76 | 77 | 80 | 81 | 84 | 85 | 88 | 89 | 92 | 93 |
| 74 | 75 | 78 | 79 | 82 | 83 | 86 | 87 | 90 | 91 | 94 | 95 |

In another possible implementation, 12 symbols in each second symbol subset satisfy an eighth condition, where the eighth condition includes: four symbols in each second symbol subset are respectively from symbol 0 in first symbol subset $k_1$, symbol 0 in first symbol subset $k_1+8$, symbol 0 in first symbol subset $k_1+16$, and symbol 0 in first symbol subset $k_1+24$ in the first symbol set; other four symbols in each second symbol subset are respectively from symbol 1 in first symbol subset $k_2$, symbol 1 in first symbol subset $k_2+8$, symbol 1 in first symbol subset $k_2+16$, and symbol 1 in first symbol subset $k_2+24$ in the first symbol set; and the other four symbols in each second symbol subset are respectively from symbol 2 in first symbol subset $k_3$, symbol 2 in first symbol subset $k_3+8$, symbol 2 in first symbol subset $k_3+16$, and symbol 2 in first symbol subset $k_3+24$ in the first symbol set, where $k_1$, $k_2$, and $k_3$ are not equal to each other, and a delay value of delay line $16k_1+z_1$ and a delay value of delay line $16k_1+z_1+2$ in the n delay lines are equal or have a difference of 2V symbols.

Symbol j in second symbol subset i in the second symbol set is from symbol $\lfloor x/32 \rfloor$ in first symbol subset $b_{x \%32}$ in the first symbol set, where $x=(i+(j \%4)*8+\lfloor j/4 \rfloor *G) \%32+\lfloor j/4 \rfloor *32$, $0 \le i<8$, $0 \le j<12$, Y % Z represents a remainder obtained by dividing Y by Z, $\lfloor Y/Z \rfloor$ represents a quotient obtained by dividing Y by Z, and G is 2, 6, 10, 14, 18, 22, 26, or 30. Specifically, when G=2, a second symbol set shown in Table 8 may be obtained according to the data interleaving rule, and each row represents one second symbol subset. As shown in Table 8, a digit x in row i and column j indicates that symbol j in second symbol subset i in the second symbol set obtained through interleaving is from symbol $\lfloor x/32 \rfloor$ in first symbol subset $b_{x \%32}$ in the first symbol set. It should be noted that, transposition of locations of any two rows in Table 8 also belongs to the data interleaving rule provided in this application, and transposition of locations of 12 digits in each row in Table 8 also belongs to the data interleaving rule provided in this application.

Embodiment 1: n=32, 32 delay lines include two groups, and each group includes 16 delay lines. Serial number values of $a_0$, $a_1$, $a_2$, $a_3$, $a_4$, $a_5$, $a_6$, $a_7$, $a_8$, $a_9$, $a_{10}$, $a_{11}$, $a_{12}$, $a_{13}$, $a_{14}$, and $a_{15}$ of the 16 delay lines in each group are {0, 1, 2, 3, 4, 5, 6, 7, 8, 9, 10, 11, 12, 13, 14, 15}. Serial number values of 32 first symbol subsets $b_0$, $b_1$, $b_2$, $b_3$, $b_4$, $b_5$, $b_6$, $b_7$, $b_8$, $b_9$, $b_{10}$, $b_{11}$, $b_{12}$, $b_{13}$, $b_{14}$, $b_{15}$, $b_{16}$, $b_{17}$, $b_{18}$, $b_{19}$, $b_{20}$, $b_{21}$, $b_{22}$, $b_{23}$, $b_{24}$, $b_{25}$, $b_{26}$, $b_{27}$, $b_{28}$, $b_{29}$, $b_{30}$, and $b_{31}$ are {0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31}.

Figure 13A:
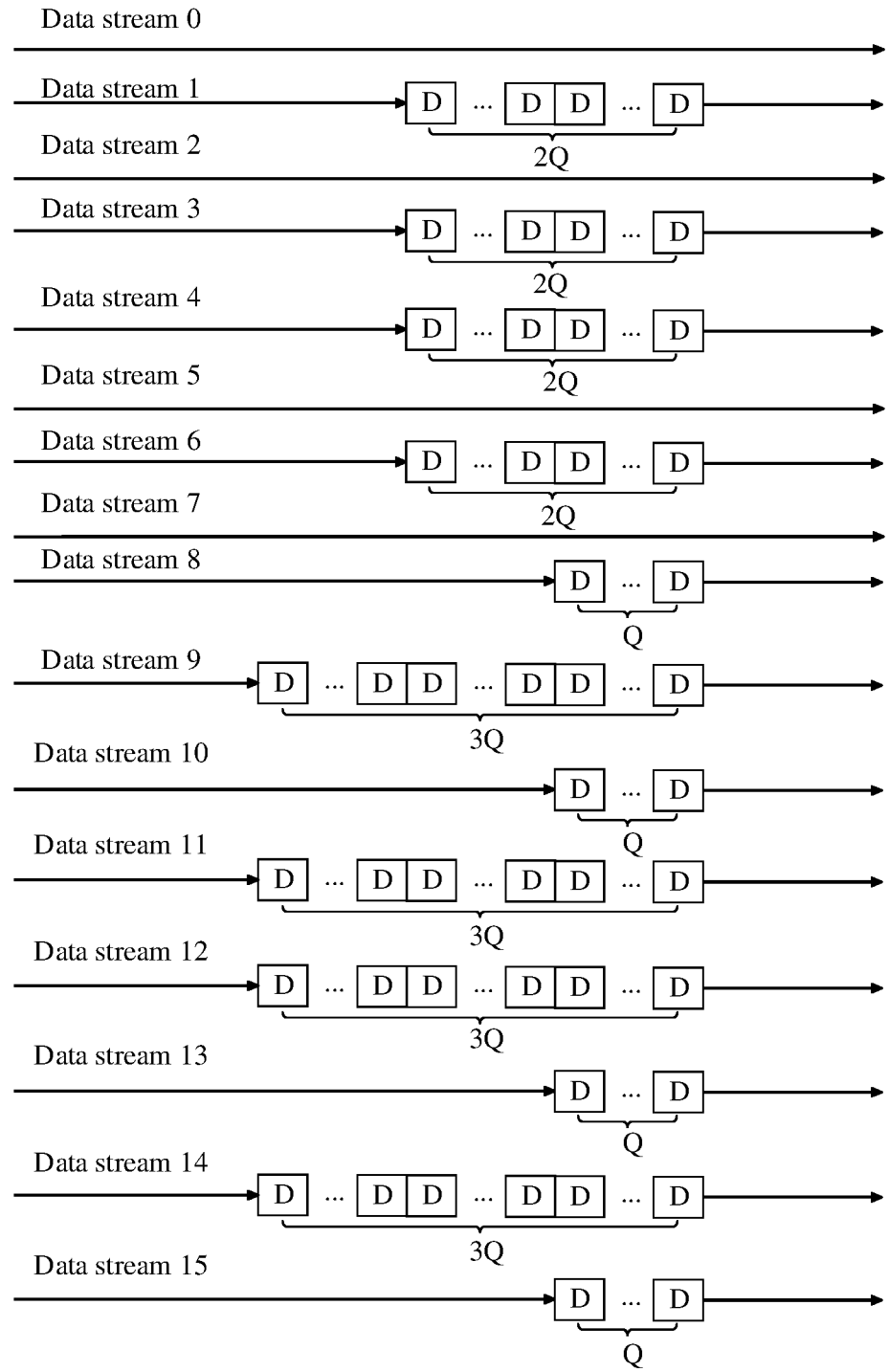
FIG. 13A and FIG. 13B are a schematic distribution diagram of 32 delay lines according to an embodiment of this application.
Figure 13B:
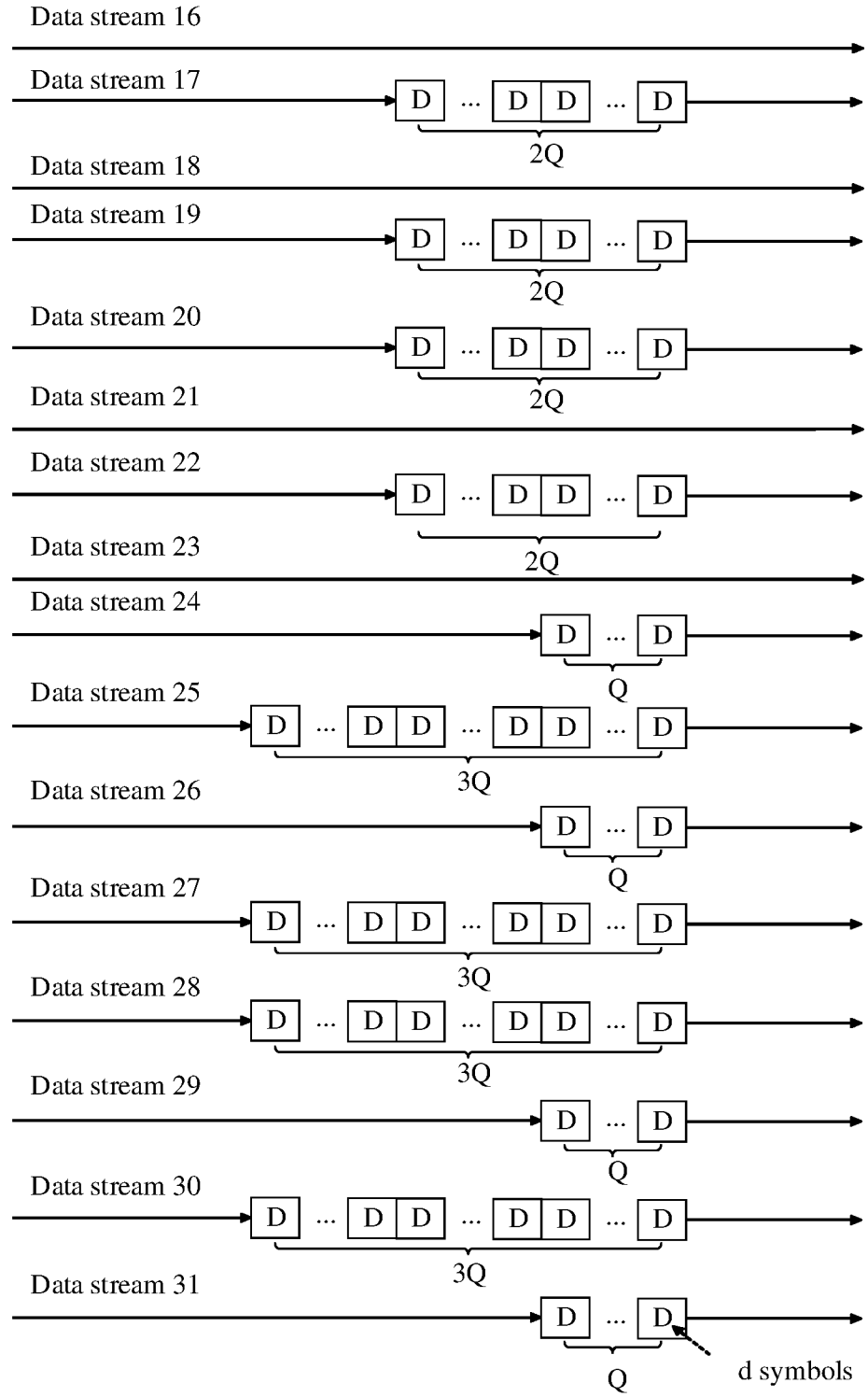
Figure 32:
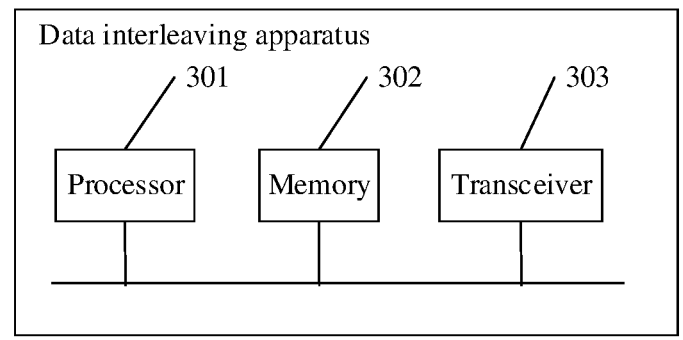
FIG. 32 is another schematic structural diagram of a data interleaving apparatus according to an embodiment of this application.

FIG. 13A and FIG. 13B are a schematic distribution diagram of 32 delay lines according to an embodiment of this application. As shown in FIG. 13A and FIG. 13B, 32 data streams respectively correspond to the 32 delay lines, the delay line may include 0, Q, 2Q, or 3Q storage elements D, and each storage element D may store d symbols. In other words, a delay value of the delay line may be 0, V symbols, 2V symbols, or 3V symbols, where V=Q*d. In each group of 16 delay lines, delay values of delay line $a_0$, delay line $a_1$, delay line $a_2$, delay line $a_3$, delay line $a_4$, delay line $a_5$, delay line $a_6$, delay line $a_7$, delay line $a_8$, delay line $a_9$, delay line $a_{10}$, delay line $a_{11}$, delay line $a_{12}$, delay line $a_{13}$, delay line $a_{14}$, and delay line $a_{15}$ are {0, 2V, 0, 2V, 2V, 0, 2V, 0, V, 3V, V, 3V, 3V, V, 3V, V}. Correspondingly, quantities of delay symbols of delay lines 0 to 31 are respectively {0, 2V, 0, 2V, 2V, 0, 2V, 0, V, 3V, V, 3V, 3V, V, 3V, V, 0, 2V, 0, 2V, 2V, 0, 2V, 0, V, 3V, V, 3V, 3V, V, 3V, V}. Specifically, a delayer outputs d symbols from a rightmost storage element of each delay line to obtain 32*d symbols. Correspondingly, a symbol stored in the storage element in each delay line is shifted rightwards by d symbols. Further, d symbols are obtained from each of the 32 data streams, and are separately written into leftmost storage elements in the 32 delay lines. It should be understood that, when the delay line includes 0 storage elements (for example, delay lines 0, 2, 5, 7, 16, 18, 21, and 23 in FIG. 13A and FIG. 13B), d symbols output from the delay line are d symbols obtained, through a current operation, from a corresponding PCS or FEC lane data stream. It should be understood that d symbols are output from each delay line through one delaying operation. When $d \le L*m$, the delaying operation may be repeatedly performed for φ times to obtain φ*d symbols, where $φ*d \ge L*m$, and φ is a positive integer.

TABLE 8

| 0 | 8  | 16 | 24 | 34 | 42 | 50 | 58 | 68 | 76 | 84 | 92 |
|---|----|----|----|----|----|----|----|----|----|----|----|
| 1 | 9  | 17 | 25 | 35 | 43 | 51 | 59 | 69 | 77 | 85 | 93 |
| 2 | 10 | 18 | 26 | 36 | 44 | 52 | 60 | 70 | 78 | 86 | 94 |
| 3 | 11 | 19 | 27 | 37 | 45 | 53 | 61 | 71 | 79 | 87 | 95 |
| 4 | 12 | 20 | 28 | 38 | 46 | 54 | 62 | 72 | 80 | 88 | 64 |
| 5 | 13 | 21 | 29 | 39 | 47 | 55 | 63 | 73 | 81 | 89 | 65 |
| 6 | 14 | 22 | 30 | 40 | 48 | 56 | 32 | 74 | 82 | 90 | 66 |
| 7 | 15 | 23 | 31 | 41 | 49 | 57 | 33 | 75 | 83 | 91 | 67 |

The following provides several specific embodiments for describing a complete procedure of the data interleaving method shown in FIG. 10.

An interleaver obtains L*m symbols from each of 32 delayed data streams, to obtain L first symbol sets. Each first symbol set includes 32 first symbol subsets, and each first symbol subset includes m symbols. m symbols in first symbol subset h (0≤h<32) of each first symbol set are from delayed data stream h. The interleaver separately interleaves the L first symbol sets to obtain L second symbol sets, where the second symbol set includes r*c symbols. Each second symbol set includes r second symbol subsets, and each second symbol subset includes c symbols, where 32*m=r*c.

It should be noted that the first symbol set may alternatively be a symbol matrix including 32 rows and m columns of symbols, and is referred to as a first symbol matrix. The second symbol set may alternatively be a symbol matrix including r rows and c columns of symbols, and is referred to as a second symbol matrix. In this case, the L*m symbols obtained from delayed data stream h are respectively sent to columns m in rows h of the L first symbol matrices. m symbols in row h of each first symbol matrix are from delayed data stream h. The interleaver interleaves 32*m symbols in each of the L first symbol matrices to obtain L second symbol matrices, where the second symbol matrix includes r rows and c columns of symbols.

Figure 14:
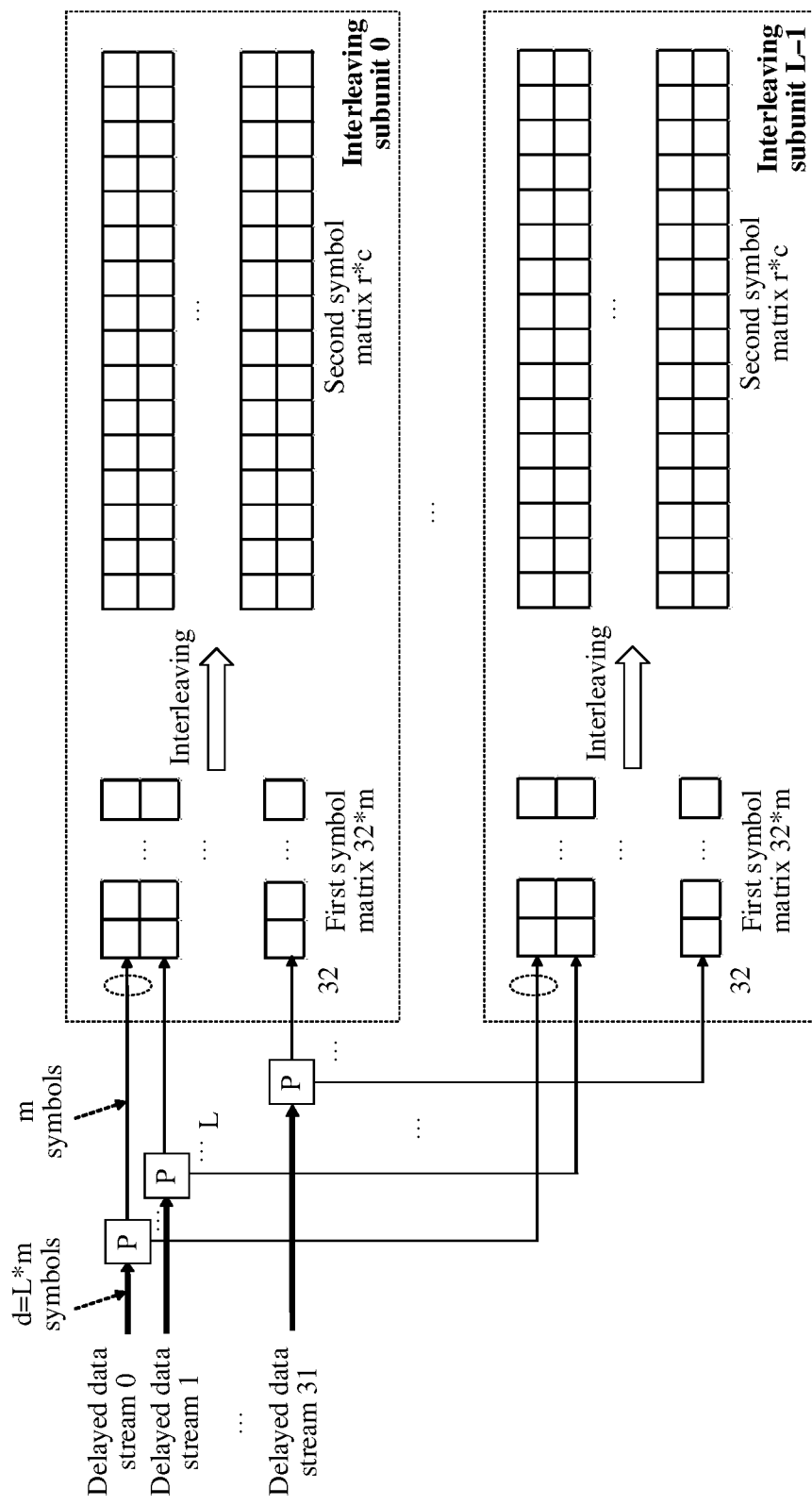
FIG. 14 is a schematic diagram of interleaving L first symbol matrices according to an embodiment of this application.

FIG. 14 is a schematic diagram of interleaving L first symbol matrices according to an embodiment of this application. As shown in FIG. 14, in a possible implementation, the interleaver includes L interleaving subunits, and the L interleaving subunits separately interleave the L first symbol matrices to obtain L second symbol matrices. Specifically, a data division unit $\boxed{P}$ obtains L*m symbols from delayed data stream h (0≤h<32), where the L*m symbols include L groups, and each group includes m symbols. The L groups of symbols are respectively sent to rows h in the L first symbol matrices. In another possible implementation, the interleaver does not need to be divided into a plurality of interleaving subunits. The interleaver interleaves the first symbol matrix to obtain a second symbol matrix, and repeats the operation for L times to obtain L second symbol matrices. In still another possible implementation, the interleaver does not need to be divided into a plurality of interleaving subunits, and the interleaver obtains one symbol matrix after obtaining L*n*m symbols from the n delayed data streams. The symbol matrix includes n rows and L*m columns of symbols, and may be considered as one symbol matrix formed by combining the L first symbol matrices. Similarly, the interleaver interleaves the symbol matrix including the n rows and L*m columns of symbols to obtain another symbol matrix. The another symbol matrix includes L*r rows and c columns of symbols, and may be considered as one symbol matrix formed by combining the L second symbol matrices.

In an example, the first symbol matrix includes 32 rows and one column of symbols, the second symbol matrix includes two rows and 16 columns of symbols, L=1, Q=68, and d=1. To be specific, the interleaver obtains one symbol from each of the 32 delayed data streams, each storage element D in the delay lines stores d=1 symbol, and each symbol includes 10 bits. V=Q*d=68, and the delay value of each delay line is 0 symbols, 68 symbols, 136 symbols, or 204 symbols. Specifically, the delay values of the 32 delay lines may be shown in Table 9.

TABLE 9

| Delay line | Quantity of delayed symbols |
| --- | --- |
| 0 | 0 |
| 1 | 136 |
| 2 | 0 |
| 3 | 136 |
| 4 | 136 |
| 5 | 0 |
| 6 | 136 |
| 7 | 0 |
| 8 | 68 |
| 9 | 204 |
| 10 | 68 |
| 11 | 204 |
| 12 | 204 |
| 13 | 68 |
| 14 | 204 |
| 15 | 68 |
| 16 | 0 |
| 17 | 136 |
| 18 | 0 |
| 19 | 136 |
| 20 | 136 |
| 21 | 0 |
| 22 | 136 |
| 23 | 0 |
| 24 | 68 |
| 25 | 204 |
| 26 | 68 |
| 27 | 204 |
| 28 | 204 |
| 29 | 68 |
| 30 | 204 |
| 31 | 68 |

A symbol in row i and column j (0≤i<2, 0≤j<16) of the second symbol matrix is from a symbol in row $b_x$=x of the first symbol matrix, where a non-negative integer x=i*2+⌊j/2⌋*4+j %2, Y % Z represents a remainder obtained by dividing Y by Z, and ⌊Y/Z⌋ represents a quotient obtained by dividing Y by Z. The data interleaving rule may be represented by using the following Table 10. In Table 10, a digit x in row i and column j indicates that a symbol in row i and column j of the second symbol matrix is from a symbol in row $b_x$=x and column 0 of the first symbol matrix, where 0≤i<2, 0≤j<16, and 0≤x<32. After the interleaver outputs the second symbol matrix, an inner-code encoding apparatus separately performs inner-code encoding on 16 symbols in two rows of the second symbol matrix to obtain two codewords. When Hamming(170,160) is used for the inner-code encoding, the inner-code encoding is performed on 32 symbols, which are 320 bits in total, output by the interleaver, and two inner-code codewords, which are 2*170=340 bits in total, may be obtained.

TABLE 10

| 0 | 1 | 4 | 5 | 8 | 9 | 12 | 13 | 16 | 17 | 20 | 21 | 24 | 25 | 28 | 29 |
| --- | --- | --- | --- | --- | --- | --- | --- | --- | --- | --- | --- | --- | --- | --- | --- |
| 2 | 3 | 6 | 7 | 10 | 11 | 14 | 15 | 18 | 19 | 22 | 23 | 26 | 27 | 30 | 31 |

The foregoing example provides an implementation in which L=1. Based on this, an implementation in which L>1 may be further extended. This is an extension of an application scenario. For a specific implementation, refer to the foregoing descriptions. Details are not described herein again. The following provides several typical parameter combinations.

L=2, d=2, Q=34, and V=Q*d=68. The interleaver outputs L 2*16 second symbol matrices, where L=2, and inner-code encoding is performed to obtain 2*L=4 codewords.

L=3, d=3, Q=24, and V=Q*d=72. The interleaver outputs L 2*16 second symbol matrices, where L=3, and inner-code encoding is performed to obtain 2*L=6 codewords.

L=4, d=4, Q=17, and V=Q*d=68. The interleaver outputs L 2*16 second symbol matrices, where L=4, and inner-code encoding is performed to obtain 2*L=8 codewords.

L=5, d=5, Q=14, and V=Q*d=70. The interleaver outputs L 2*16 second symbol matrices, where L=5, and inner-code encoding is performed to obtain 2*L=10 codewords.

L=6, d=6, Q=12, and V=Q*d=72. The interleaver outputs L 2*16 second symbol matrices, where L=6, and inner-code encoding is performed to obtain 2*L=12 codewords.

L=8, d=8, Q=9, and V=Q*d=72. The interleaver outputs L 2*16 second symbol matrices, where L=8, and inner-code encoding is performed to obtain 2*L=16 codewords.

L=12, d=12, Q=6, and V=Q*d=72. The interleaver outputs L 2*16 second symbol matrices, where L=12, and inner-code encoding is performed to obtain 2*L=24 codewords.

L=16, d=16, Q=5, and V=Q*d=80. The interleaver outputs L 2*16 second symbol matrices, where L=16, and inner-code encoding is performed to obtain 2*L=32 codewords.

The following uses L=5 as an example for description. The first symbol matrix includes 32 rows and one column of symbols, and the second symbol matrix includes two rows and 16 columns of symbols. The interleaver may use the structure shown in FIG. 14, to be specific, the interleaver includes five interleaving subunits. Each storage element D in the delay lines may store d=5 symbols, each symbol includes 10 bits, and the delay value of each delay line is 0 symbols, 70 symbols, 140 symbols, or 210 symbols. Specifically, the delay values of the 32 delay lines may be shown in Table 11.

TABLE 11

| Delay line | Quantity of delayed symbols |
| --- | --- |
| 0 | 0 |
| 1 | 140 |
| 2 | 0 |
| 3 | 140 |
| 4 | 140 |
| 5 | 0 |
| 6 | 140 |
| 7 | 0 |
| 8 | 70 |
| 9 | 210 |
| 10 | 70 |
| 11 | 210 |
| 12 | 210 |
| 13 | 70 |
| 14 | 210 |
| 15 | 70 |
| 16 | 0 |
| 17 | 140 |

TABLE 11-continued

| Delay line | Quantity of delayed symbols |
| --- | --- |
| 18 | 0 |
| 19 | 140 |
| 20 | 140 |
| 21 | 0 |
| 22 | 140 |
| 23 | 0 |
| 24 | 70 |
| 25 | 210 |
| 26 | 70 |
| 27 | 210 |
| 28 | 210 |
| 29 | 70 |
| 30 | 210 |
| 31 | 70 |

Figure 15:
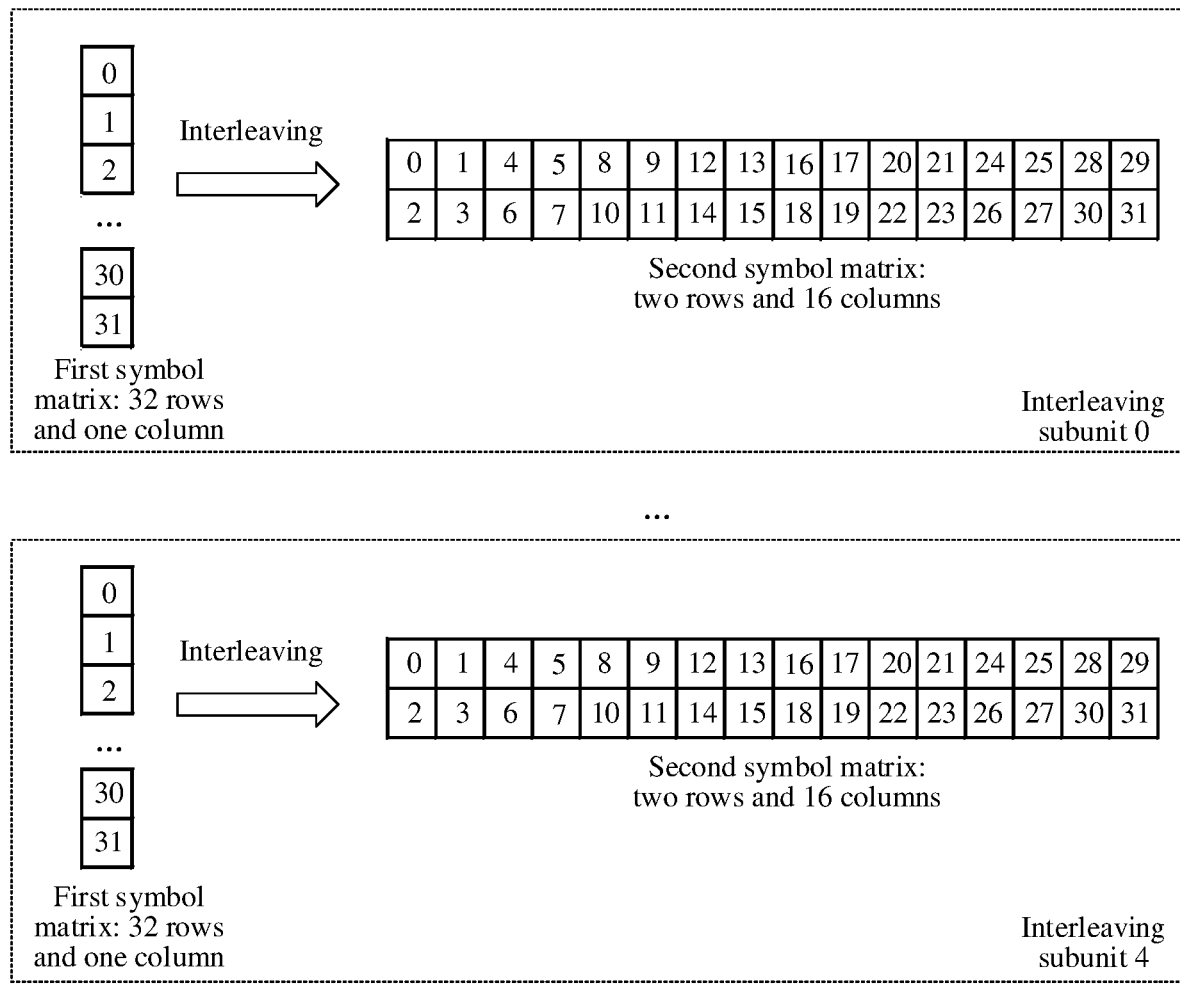
FIG. 15 is a schematic diagram of data interleaving in a scenario in which L=5 according to an embodiment of this application.

FIG. 15 is a schematic diagram of data interleaving in a scenario in which L=5 according to an embodiment of this application. Based on the interleaving rule provided in the scenario in which L=1, to be specific, the symbol in row i and column j (0≤i<2, 0≤j<16) of the second symbol matrix is from the symbol in row $b_x$=x of the first symbol matrix, where the non-negative integer x=i*2+⌊j/2⌋*4+j %2, Y % Z represents a remainder obtained by dividing Y by Z, and ⌊Y/Z⌋ represents a quotient obtained by dividing Y by Z. As shown in FIG. 15, five second symbol matrices may be obtained by separately interleaving the five first symbol matrices by the five interleaving subunits. A digit in the first symbol matrix represents a quantity of rows in the first symbol matrix, and a digit x in the second symbol matrix represents that a symbol at the location in the second symbol matrix is from row x of the first symbol matrix. After the interleaver outputs the five second symbol matrices, the inner-code encoding apparatus performs inner-code encoding on 16 symbols in each row of the five second symbol matrices to obtain 2*L=10 codewords. When Hamming (170,160) is used for the inner-code encoding, the inner-code encoding is performed on 160 symbols, which are 1600 bits in total, output by the interleaver, and 10 inner-code codewords, which are 10*170=1700 bits in total, may be obtained.

In this embodiment, when L=1 and d=1, the highest delay in the 32 delay lines is 3V=3Q*d=3*68*1=204 symbols, that is, 2040 bits. When L=5 and d=5, the highest delay in the 32 delay lines is 3V=3Q*d=3*14*5=210 symbols, that is, 2100 bits. A required delay is low. When Hamming(170, 160) is used for the inner-code encoding, each Hamming codeword has 160 information bits, which are 16 symbols in total. For a 1*800G interface, 2*400G interfaces, 4*200G interfaces, or 8*100G interfaces with each lane of 100 Gb/s on a client side, the 16 symbols in each Hamming information bit are from 16 different outer-code codewords. This ensures good performance of an overall cascade FEC solution. It should be understood that, in some scenarios that require an ultra-low latency, a smaller value of V may be used. In this case, 16 symbols in each Hamming codeword are from less than 16 different outer-code codewords. Performance slightly deteriorates, but an overall transmission latency corresponding to the solution is low.

Embodiment 2: n=32, 32 delay lines include two groups, and each group includes 16 delay lines. Serial number values of $a_0, a_1, a_2, a_3, a_4, a_5, a_6, a_7, a_8, a_9, a_{10}, a_{11}, a_{12}, a_{13}, a_{14}$, and $a_{15}$ of the 16 delay lines in each group are {0, 3, 1, 2, 4, 7, 5, 6, 8, 11, 9, 10, 12, 15, 13, 14}. Serial number values of 32 first symbol subsets $b_0, b_1, b_2, b_3, b_4, b_5, b_6, b_7, b_8, b_9, b_{10}, b_{11}, b_{12}, b_{13}, b_{14}, b_{15}, b_{16}, b_{17}, b_{18}, b_{19}, b_{20}, b_{21}, b_{22}, b_{23},$ $b_{24}$, $b_{25}$, $b_{26}$, $b_{27}$, $b_{28}$, $b_{29}$, $b_{30}$, and $b_{31}$ are {0, 3, 1, 2, 4, 7, 5, 6, 8, 11, 9, 10, 12, 15, 13, 14, 16, 19, 17, 18, 20, 23, 21, 22, 24, 27, 25, 26, 28, 31, 29, 30}.

Figure 16A:
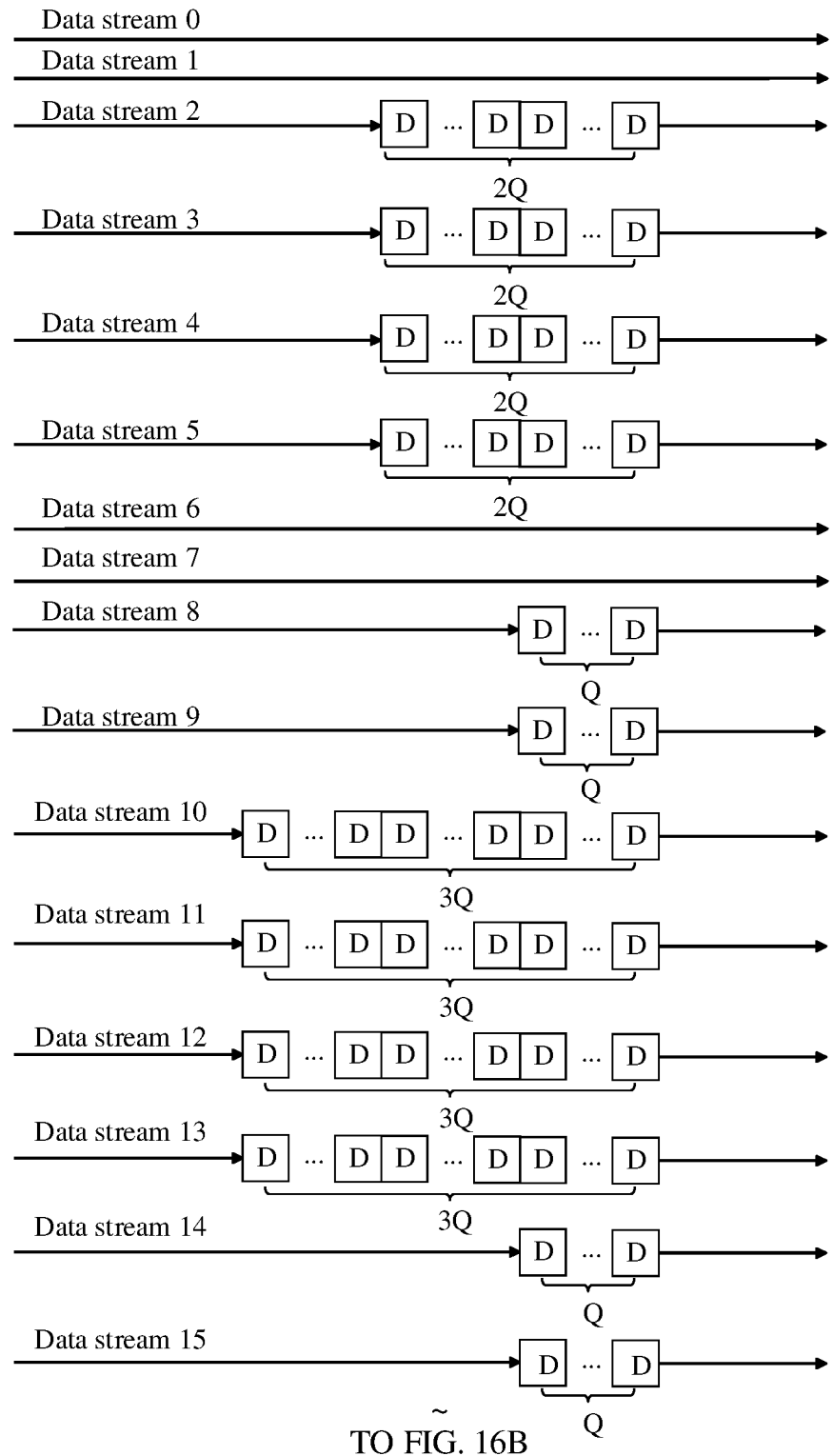
FIG. 16A and FIG. 16B are another schematic distribution diagram of 32 delay lines according to an embodiment of this application.
Figure 16B:
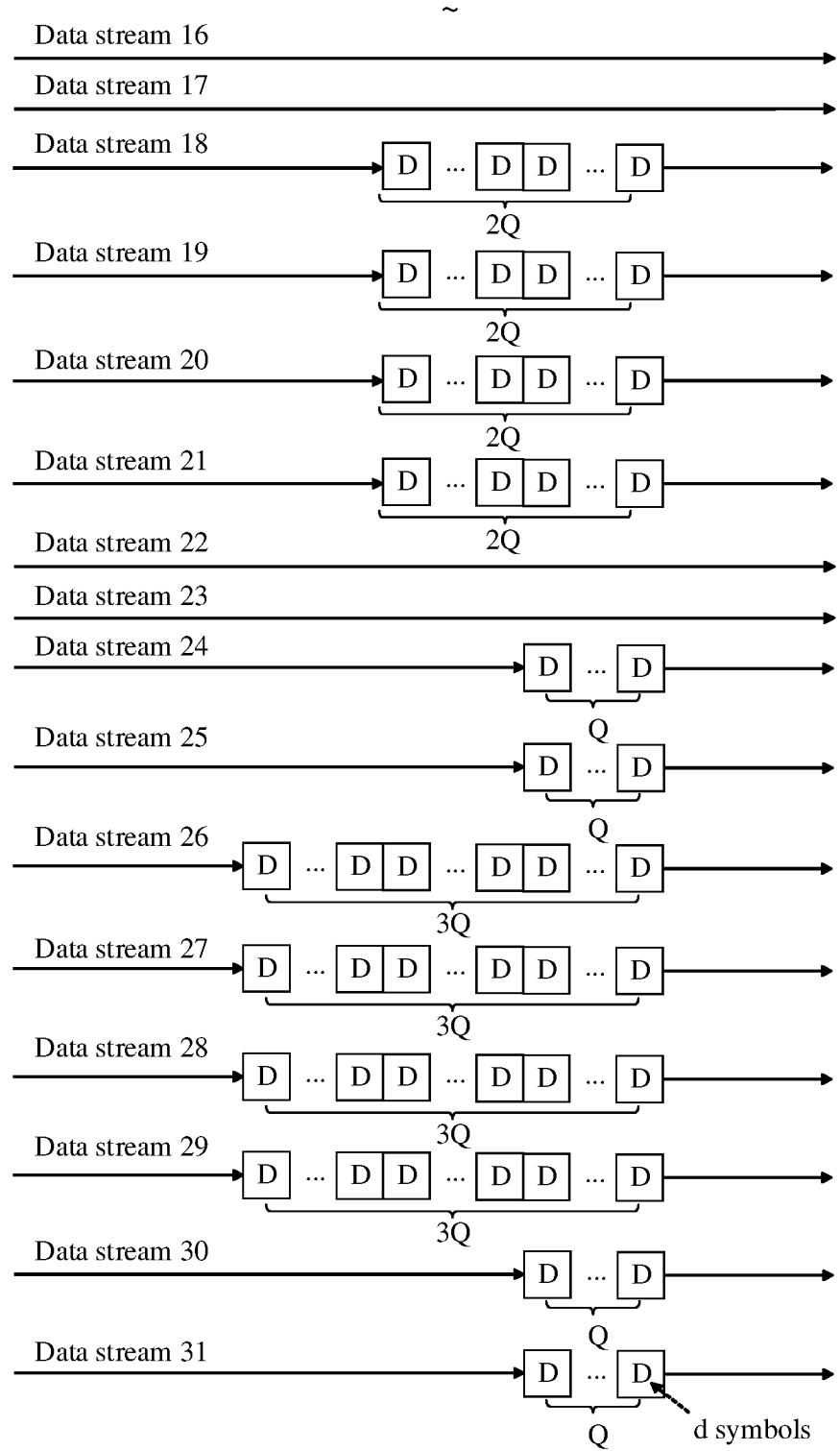

FIG. 16A and FIG. 16B are another schematic distribution diagram of 32 delay lines according to an embodiment of this application. As shown in FIG. 16A and FIG. 16B, 32 data streams respectively correspond to the 32 delay lines, the delay line may include 0, Q, 2Q, or 3Q storage elements D, and each storage element D may store d symbols. In other words, a delay value of the delay line may be 0, V symbols, 2V symbols, or 3V symbols, where V=Q*d. In each group of 16 delay lines, delay values of delay line $a_0$, delay line $a_1$, delay line $a_2$, delay line $a_3$, delay line $a_4$, delay line $a_5$, delay line $a_6$, delay line $a_7$, delay line $a_8$, delay line $a_9$, delay line $a_{10}$, delay line $a_{11}$, delay line $a_{12}$, delay line $a_{13}$, delay line $a_{14}$, and delay line $a_{15}$ are {0, 2V, 0, 2V, 2V, 0, 2V, 0, V, 3V, V, 3V, 3V, V, 3V, V}. Correspondingly, quantities of delay symbols of delay lines 0 to 31 are respectively {0, 0, 2V, 2V, 2V, 2V, 0, 0, V, V, 3V, 3V, 3V, 3V, V, V, 0, 0, 2V, 2V, 2V, 2V, 0, 0, V, V, 3V, 3V, 3V, 3V, V, V}. Specifically, a delayer outputs d symbols from a rightmost storage element of each delay line to obtain 32*d symbols. Correspondingly, a symbol stored in the storage element in each delay line is shifted rightwards by d symbols. Further, d symbols are obtained from each of the 32 data streams, and are separately written into leftmost storage elements in the 32 delay lines. It should be understood that, when the delay line includes 0 storage elements (for example, delay lines 0, 1, 6, 7, 16, 17, 22, and 23 in FIG. 16A and FIG. 16B), d symbols output from the delay line are d symbols obtained, through a current operation, from a corresponding PCS or FEC lane data stream. It should be understood that d symbols are output from each delay line through one delaying operation. When d≤L*m, the delaying operation may be repeatedly performed for φ times to obtain φ*d symbols, where φ*d≥L*m, and φ is a positive integer.

An interleaver obtains L*m symbols from each of 32 delayed data streams, to obtain L first symbol sets. Each first symbol set includes 32 first symbol subsets, and each first symbol subset includes m symbols. m symbols in first symbol subset h (0≤h<32) of each first symbol set are from delayed data stream h. The interleaver separately interleaves the L first symbol sets to obtain L second symbol sets, where the second symbol set includes r*c symbols. Each second symbol set includes r second symbol subsets, and each second symbol subset includes c symbols, where 32*m=r*c.

It should be noted that the first symbol set may alternatively be a symbol matrix including 32 rows and m columns of symbols, and is referred to as a first symbol matrix. The second symbol set may alternatively be a symbol matrix including r rows and c columns of symbols, and is referred to as a second symbol matrix. In this case, the L*m symbols obtained from delayed data stream h are respectively sent to columns m in rows h of the L first symbol matrices. m symbols in row h of each first symbol matrix are from delayed data stream h. The interleaver interleaves 32*m symbols in each of the L first symbol matrices to obtain L second symbol matrices, where the second symbol matrix includes r rows and c columns of symbols.

As shown in FIG. 14, in a possible implementation, the interleaver includes L interleaving subunits, and the L interleaving subunits separately interleave the L first symbol matrices to obtain L second symbol matrices. Specifically, a data division unit P obtains L*m symbols from delayed data stream h (0≤h<32), where the L*m symbols include L groups, and each group includes m symbols. The L groups of symbols are respectively sent to rows h in the L first symbol matrices. In another possible implementation, the interleaver does not need to be divided into a plurality of interleaving subunits. The interleaver interleaves the first symbol matrix to obtain a second symbol matrix, and repeats the operation for L times to obtain L second symbol matrices. In still another possible implementation, the interleaver does not need to be divided into a plurality of interleaving subunits, and the interleaver obtains one symbol matrix after obtaining L*n*m symbols from the n delayed data streams. The symbol matrix includes n rows and L*m columns of symbols, and may be considered as one symbol matrix formed by combining the L first symbol matrices. Similarly, the interleaver interleaves the symbol matrix including the n rows and L*m columns of symbols to obtain another symbol matrix. The another symbol matrix includes L*r rows and c columns of symbols, and may be considered as one symbol matrix formed by combining the L second symbol matrices.

In an example, the first symbol matrix includes 32 rows and three columns of symbols, the second symbol matrix includes eight rows and 12 columns of symbols, L=1, Q=24, and d=3. To be specific, the interleaver obtains three symbols from each of the 32 delayed data streams, each storage element D in the delay lines stores d=3 symbols, and each symbol includes 10 bits. V=Q*d=72, and the delay value of each delay line is 0 symbols, 72 symbols, 144 symbols, or 216 symbols. Specifically, the delay values of the 32 delay lines may be shown in Table 12.

TABLE 12

| Delay line | Quantity of delayed symbols |
|---|---|
| 0 | 0 |
| 1 | 0 |
| 2 | 144 |
| 3 | 144 |
| 4 | 144 |
| 5 | 144 |
| 6 | 0 |
| 7 | 0 |
| 8 | 72 |
| 9 | 72 |
| 10 | 216 |
| 11 | 216 |
| 12 | 216 |
| 13 | 216 |
| 14 | 72 |
| 15 | 72 |
| 16 | 0 |
| 17 | 0 |
| 18 | 144 |
| 19 | 144 |
| 20 | 144 |
| 21 | 144 |
| 22 | 0 |
| 23 | 0 |
| 24 | 72 |
| 25 | 72 |
| 26 | 216 |
| 27 | 216 |
| 28 | 216 |
| 29 | 216 |
| 30 | 72 |
| 31 | 72 |

A symbol in row i and column j (0≤i<8, 0≤j<12) of the second symbol matrix is from a symbol in row $b_{x\ \%32}$ and column $\lfloor x/32 \rfloor$ of the first symbol matrix, where x=(i %4)*24+$\lfloor i/4 \rfloor$*2+(j %6)*4+$\lfloor j/6 \rfloor$, Y % Z represents a remainder obtained by dividing Y by Z, and $\lfloor Y/Z \rfloor$ represents a quotient obtained by dividing Y by Z. The data interleaving rule may be represented by using the following Table 13. In Table 13, a digit x in row i and column j indicates that a symbol in row i and column j of the second symbol matrix is from a symbol in row x %32 and column $\lfloor x/32 \rfloor$ of the first symbol matrix, where $0 \le i < 8$, $0 \le j < 12$, and $0 \le x < 96$. Correspondingly, a symbol in row i and column j ($0 \le i < 8$, $0 \le j < 12$) of the second symbol matrix is from a symbol in row x %32 and column $\lfloor x/32 \rfloor$ of the first symbol matrix, where x=(i %4)*24+$\lfloor i/4 \rfloor$+(j %6)*4+$\lfloor j/6 \rfloor$*(3−$\lfloor i/4 \rfloor$*2), Y % Z represents a remainder obtained by dividing Y by Z, and $\lfloor Y/Z \rfloor$ represents a quotient obtained by dividing Y by Z. The data interleaving rule may be represented by using the following Table 14. In Table 14, a digit x in row i and column j indicates that a symbol in row i and column j of the second symbol matrix is from a symbol in row x %32 and column $\lfloor x/32 \rfloor$ of the first symbol matrix, where $0 \le i < 8$, $0 \le j < 12$, and $0 \le x < 96$. After the interleaver outputs the second symbol matrix, an inner-code encoding apparatus separately performs inner-code encoding on 12 symbols in each row of the second symbol matrix to obtain eight codewords. When Hamming(128,120) is used for the inner-code encoding, the inner-code encoding is performed on 96 symbols, which are 960 bits in total, output by the interleaver, and eight inner-code codewords, which are 8*128=1024 bits in total, may be obtained.

of symbols, and the second symbol matrix includes eight rows and 12 columns of symbols. The interleaver may use the structure shown in FIG. 14, to be specific, the interleaver includes four interleaving subunits. Four second symbol matrices may be obtained by performing interleaving on four first symbol matrices by using the four interleaving subunits. Each storage element D in the delay lines may store d=12 symbols, each symbol includes 10 bits, and the delay value of each delay line is 0 symbols, 72 symbols, 144 symbols, or 216 symbols. After the interleaver outputs the four second symbol matrices, the inner-code encoding apparatus performs inner-code encoding on 12 symbols in each row of the four second symbol matrices to obtain 8*L=32 codewords. When Hamming(128,120) is used for the inner-code encoding, the inner-code encoding is performed on 384 symbols, which are 3840 bits in total, output by the interleaver, and 32 inner-code codewords, which are 32*128=4096 bits in total, may be obtained.

In this embodiment, the highest delay in the 32 delay lines is 3Q*d=216 symbols, that is, 2160 bits. A required delay is low. When Hamming(128,120) is used for the inner-code encoding, each Hamming codeword has 120 information bits, which are 12 symbols in total. For a 1*800G interface, 2*400G interfaces, 4*200G interfaces, or 8*100G interfaces with each lane of 100 Gb/s on a client side, the 12 symbols

TABLE 13

| 0  | 4  | 8  | 12 | 16 | 20 | 1  | 5  | 9  | 13 | 17 | 21 |
| 24 | 28 | 32 | 36 | 40 | 44 | 25 | 29 | 33 | 37 | 41 | 45 |
| 48 | 52 | 56 | 60 | 64 | 68 | 49 | 53 | 57 | 61 | 65 | 69 |
| 72 | 76 | 80 | 84 | 88 | 92 | 73 | 77 | 81 | 85 | 89 | 93 |
| 2  | 6  | 10 | 14 | 18 | 22 | 3  | 7  | 11 | 15 | 19 | 23 |
| 26 | 30 | 34 | 38 | 42 | 46 | 27 | 31 | 35 | 39 | 43 | 47 |
| 50 | 54 | 58 | 62 | 66 | 70 | 51 | 55 | 59 | 63 | 67 | 71 |
| 74 | 78 | 82 | 86 | 90 | 94 | 75 | 79 | 83 | 87 | 91 | 95 |

TABLE 14

| 0  | 4  | 8  | 12 | 16 | 20 | 3  | 7  | 11 | 15 | 19 | 23 |
| 24 | 28 | 32 | 36 | 40 | 44 | 27 | 31 | 35 | 39 | 43 | 47 |
| 48 | 52 | 56 | 60 | 64 | 68 | 51 | 55 | 59 | 63 | 67 | 71 |
| 72 | 76 | 80 | 84 | 88 | 92 | 75 | 79 | 83 | 87 | 91 | 95 |
| 1  | 5  | 9  | 13 | 17 | 21 | 2  | 6  | 10 | 14 | 18 | 22 |
| 25 | 29 | 33 | 37 | 41 | 45 | 26 | 30 | 34 | 38 | 42 | 46 |
| 49 | 53 | 57 | 61 | 65 | 69 | 50 | 54 | 58 | 62 | 66 | 70 |
| 73 | 77 | 81 | 85 | 89 | 93 | 74 | 78 | 82 | 86 | 90 | 94 |

The foregoing example provides an implementation in which L=1. Based on this, an implementation in which L>1 may be further extended. This is an extension of an application scenario. For a specific implementation, refer to the foregoing descriptions. Details are not described herein again. The following provides several typical parameter combinations.
  L=2, d=6, Q=12, and V=Q*d=72. The interleaver outputs L 8*12 second symbol matrices, where L=2, and inner-code encoding is performed to obtain 8*L=16 codewords.
  L=3, d=9, Q=8, and V=Q*d=72. The interleaver outputs L 8*12 second symbol matrices, where L=3, and inner-code encoding is performed to obtain 8*L=24 codewords.
  L=4, d=12, Q=6, and V=Q*d=72. The interleaver outputs L 8*12 second symbol matrices, where L=4, and inner-code encoding is performed to obtain 8*L=32 codewords.
The following uses L=4 as an example for description. The first symbol matrix includes 32 rows and three columns of symbols, and the second symbol matrix includes eight rows and 12 columns of symbols. In each Hamming information bit are from 12 different outer-code codewords. This ensures good performance of an overall cascade FEC solution. It should be understood that, in some scenarios that require an ultra-low latency, a smaller value of V may be used. In this case, 12 symbols in each Hamming information bit are from less than 12 different outer-code codewords. Performance slightly deteriorates, but an overall transmission latency corresponding to the solution is low.

Embodiment 3: n=32, 32 delay lines include two groups, and each group includes 16 delay lines. Serial number values of $a_0, a_1, a_2, a_3, a_4, a_5, a_6, a_7, a_8, a_9, a_{10}, a_{11}, a_{12}, a_{13}, a_{14}$, and $a_{15}$ of the 16 delay lines in each group are {0, 1, 2, 3, 4, 5, 6, 7, 8, 9, 10, 11, 12, 13, 14, 15}. Serial number values of 32 first symbol subsets $b_0, b_1, b_2, b_3, b_4, b_5, b_6, b_7, b_8, b_9, b_{10}, b_{11}, b_{12}, b_{13}, b_{14}, b_{15}, b_{16}, b_{17}, b_{18}, b_{19}, b_{20}, b_{21}, b_{22}, b_{23}, b_{24}, b_{25}, b_{26}, b_{27}, b_{28}, b_{29}, b_{30}$, and $b_{31}$ are {0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31}.

Figure 17A:
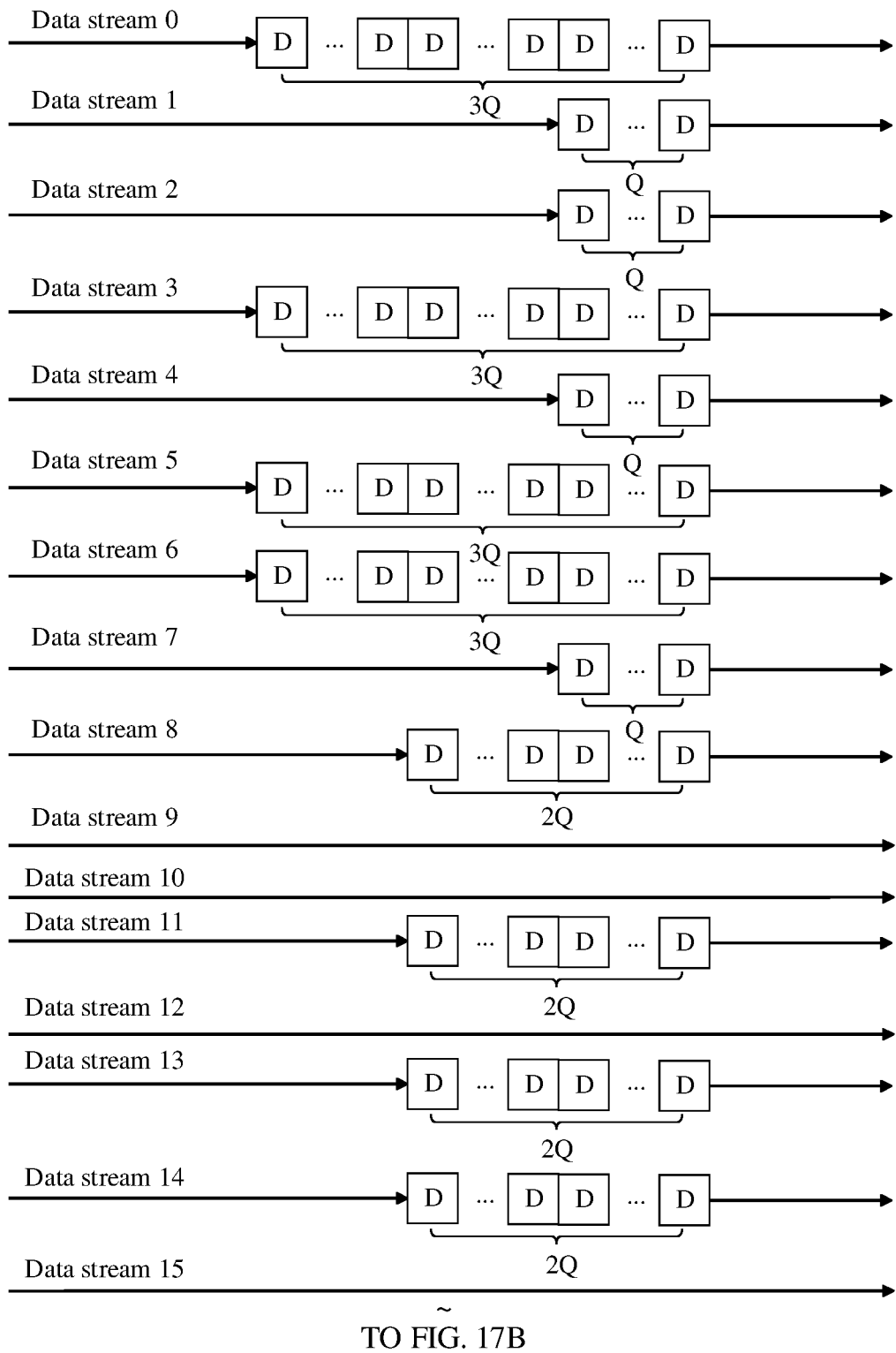
FIG. 17A and FIG. 17B are another schematic distribution diagram of 32 delay lines according to an embodiment of this application.
Figure 17B:
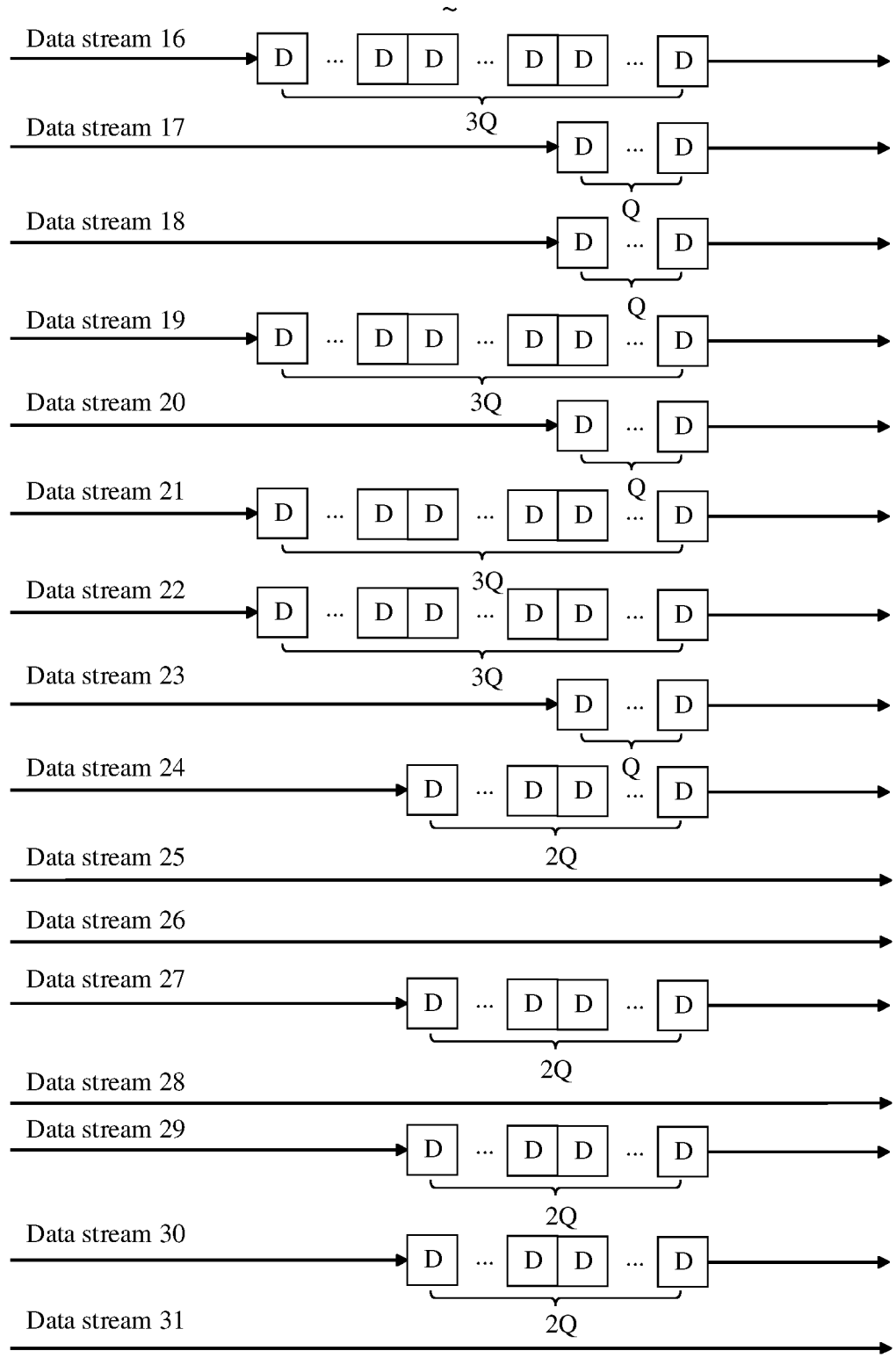

FIG. 17A and FIG. 17B are another schematic distribution diagram of 32 delay lines according to an embodiment of this application. As shown in FIG. 17A and FIG. 17B, 32 data streams respectively correspond to the 32 delay lines, the delay line may include 0, Q, 2Q, or 3Q storage elements D, and each storage element D may store d symbols. In other words, a delay value of the delay line may be 0, V symbols, 2V symbols, or 3V symbols, where V=Q*d. In each group of 16 delay lines, delay values of delay line $a_0$, delay line $a_1$, delay line $a_2$, delay line $a_3$, delay line $a_4$, delay line $a_5$, delay line $a_6$, delay line $a_7$, delay line $a_8$, delay line $a_9$, delay line $a_{10}$, delay line $a_{11}$, delay line $a_{12}$, delay line $a_{13}$, delay line $a_{14}$, and delay line $a_{15}$ are {3V, V, V, 3V, V, 3V, 3V, V, 2V, 0, 0, 2V, 0, 2V, 2V, 0}. Correspondingly, quantities of delay symbols of delay lines 0 to 31 are respectively {3V, V, V, 3V, V, 3V, 3V, V, 2V, 0, 0, 2V, 0, 2V, 2V, 0 and 3V, V, V, 3V, V, 3V, 3V, V, 2V, 0, 0, 2V, 0, 2V, 2V, 0}. Specifically, a delayer outputs d symbols from a rightmost storage element of each delay line to obtain 32*d symbols. Correspondingly, a symbol stored in the storage element in each delay line is shifted rightwards by d symbols. Further, d symbols are obtained from each of the 32 data streams, and are separately written into leftmost storage elements in the 32 delay lines. It should be understood that, when the delay line includes 0 storage elements (for example, delay lines 9, 10, 12, 15, 25, 26, 28, and 31 in FIG. 17A and FIG. 17B), d symbols output from the delay line are d symbols obtained, through a current operation, from a corresponding PCS or FEC lane data stream. It should be understood that d symbols are output from each delay line through one delaying operation. When d≤L*m, the delaying operation may be repeatedly performed for φ times to obtain φ*d symbols, where φ*d≥L*m, and φ is a positive integer.

An interleaver obtains L*m symbols from each of 32 delayed data streams, to obtain L first symbol sets. Each first symbol set includes 32 first symbol subsets, and each first symbol subset includes m symbols. m symbols in first symbol subset h (0≤h<32) of each first symbol set are from delayed data stream h. The interleaver separately interleaves the L first symbol sets to obtain L second symbol sets, where the second symbol set includes r*c symbols. Each second symbol set includes r second symbol subsets, and each second symbol subset includes c symbols, where 32*m=r*c.

It should be noted that the first symbol set may alternatively be a symbol matrix including 32 rows and m columns of symbols, and is referred to as a first symbol matrix. The second symbol set may alternatively be a symbol matrix including r rows and c columns of symbols, and is referred to as a second symbol matrix. In this case, the L*m symbols obtained from delayed data stream h are respectively sent to columns m in rows h of the L first symbol matrices. m symbols in row h of each first symbol matrix are from delayed data stream h. The interleaver interleaves 32*m symbols in each of the L first symbol matrices to obtain L second symbol matrices, where the second symbol matrix includes r rows and c columns of symbols.

As shown in FIG. 17A and FIG. 17B, in a possible implementation, the interleaver includes L interleaving subunits, and the L interleaving subunits separately interleave the L first symbol matrices to obtain L second symbol matrices. Specifically, a data division unit P obtains L*m symbols from delayed data stream h (0≤h<32), where the L*m symbols include L groups, and each group includes m symbols. The L groups of symbols are respectively sent to rows h in the L first symbol matrices. In another possible implementation, the interleaver does not need to be divided into a plurality of interleaving subunits. The interleaver interleaves the first symbol matrix to obtain a second symbol matrix, and repeats the operation for L times to obtain L second symbol matrices. In still another possible implementation, the interleaver does not need to be divided into a plurality of interleaving subunits, and the interleaver obtains one symbol matrix after obtaining L*n*m symbols from the n delayed data streams. The symbol matrix includes n rows and L*m columns of symbols, and may be considered as one symbol matrix formed by combining the L first symbol matrices. Similarly, the interleaver interleaves the symbol matrix including the n rows and L*m columns of symbols to obtain another symbol matrix. The another symbol matrix includes L*r rows and c columns of symbols, and may be considered as one symbol matrix formed by combining the L second symbol matrices.

In an example, the first symbol matrix includes 32 rows and three columns of symbols, the second symbol matrix includes eight rows and 12 columns of symbols, L=2, Q=12, and d=6. To be specific, the interleaver obtains six symbols from each of the 32 delayed data streams, each storage element D in the delay lines stores d=6 symbols, and each symbol includes 10 bits. V=Q*d=72, and the delay value of each delay line is 0 symbols, 72 symbols, 144 symbols, or 216 symbols. Specifically, the delay values of the 32 delay lines may be shown in Table 15.

TABLE 15

| Delay line | Quantity of delayed symbols |
|---|---|
| 0 | 216 |
| 1 | 72 |
| 2 | 72 |
| 3 | 216 |
| 4 | 72 |
| 5 | 216 |
| 6 | 216 |
| 7 | 72 |
| 8 | 144 |
| 9 | 0 |
| 10 | 0 |
| 11 | 144 |
| 12 | 0 |
| 13 | 144 |
| 14 | 144 |
| 15 | 0 |
| 16 | 216 |
| 17 | 72 |
| 18 | 72 |
| 19 | 216 |
| 20 | 72 |
| 21 | 216 |
| 22 | 216 |
| 23 | 72 |
| 24 | 144 |
| 25 | 0 |
| 26 | 0 |
| 27 | 144 |
| 28 | 0 |
| 29 | 144 |
| 30 | 144 |
| 31 | 0 |

A symbol in row i and column j (0≤i<8, 0≤j<12) of the second symbol matrix is from a symbol in row by % 32=x %32 and column ⌊x/32⌋ of the first symbol matrix, where x=(i+(j %4)*8+⌊j/4⌋+2)%32+⌊j/4⌋+32, Y % Z represents a remainder obtained by dividing Y by Z, and ⌊Y/Z⌋ represents a quotient obtained by dividing Y by Z. The data interleaving rule may be represented by using the following Table 16.

TABLE 16

| 0 | 8  | 16 | 24 | 34 | 42 | 50 | 58 | 68 | 76 | 84 | 92 |
| 1 | 9  | 17 | 25 | 35 | 43 | 51 | 59 | 69 | 77 | 85 | 93 |
| 2 | 10 | 18 | 26 | 36 | 44 | 52 | 60 | 70 | 78 | 86 | 94 |
| 3 | 11 | 19 | 27 | 37 | 45 | 53 | 61 | 71 | 79 | 87 | 95 |
| 4 | 12 | 20 | 28 | 38 | 46 | 54 | 62 | 72 | 80 | 88 | 64 |
| 5 | 13 | 21 | 29 | 39 | 47 | 55 | 63 | 73 | 81 | 89 | 65 |
| 6 | 14 | 22 | 30 | 40 | 48 | 56 | 32 | 74 | 82 | 90 | 66 |
| 7 | 15 | 23 | 31 | 41 | 49 | 57 | 33 | 75 | 83 | 91 | 67 |

In Table 16, a digit x in row i and column j indicates that a symbol in row i and column j of the second symbol matrix is from a symbol in row x %32 and column $\lfloor x/32 \rfloor$ of the first symbol matrix, where $0 \le i < 8$, $0 \le j < 12$, and $0 \le x < 96$. After the interleaver outputs two second symbol matrices, an encoding apparatus performs inner-code encoding on 12 symbols in each row of the two second symbol matrices to obtain 16 codewords. When Hamming(128,120) is used for the inner-code encoding, the inner-code encoding is performed on 192 symbols, which are 1920 bits in total, output by the interleaver, and 16 inner-code codewords, which are 16*128=2048 bits in total, may be obtained.

In this embodiment, the highest delay in the 32 delay lines is 3V=3Q*d=216 symbols, that is, 2160 bits. A required delay is low. When Hamming(128,120) is used for the inner-code encoding, each Hamming codeword has 120 information bits, which are 12 symbols in total. For a 1*800G interface, 2*400G interfaces, 4*200G interfaces, or 8*100G interfaces with each lane of 100 Gb/s on a client side, the 12 symbols in each Hamming information bit are from at least 10 different outer-code codewords. This ensures good performance of an overall cascade FEC solution.

It should be noted that, the foregoing example provides an implementation in which L=2. Based on this, another implementation in which a value of L is used may be further extended. This is an extension of an application scenario. For a specific implementation, refer to the foregoing descriptions. Details are not described herein again.

Embodiment 4: Different from Embodiment 3, Embodiment 4 uses a different interleaving rule. The first symbol matrix includes 32 rows and three columns of symbols, the second symbol matrix includes eight rows and 12 columns of symbols, L=2, Q=12, and d=6. To be specific, the interleaver obtains six symbols from each of the 32 delayed data streams, each storage element D in the delay lines stores d=6 symbols, and each symbol includes 10 bits. V=Q*d=72, and the delay value of each delay line is 0 symbols, 72 symbols, 144 symbols, or 216 symbols. Specifically, the delay values of the 32 delay lines may be shown in Table 15 in Embodiment 3. A symbol in row i and column j ($0 \le i < 8$, $0 \le j < 12$) of the second symbol matrix is from a symbol in row $b_{x\%32}$=x %32 and column $\lfloor x/32 \rfloor$ of the first symbol matrix, where x=$\lfloor i/2 \rfloor$*24+(i %2)*2+$\lfloor j/2 \rfloor$*4+(j %2), Y % Z represents a remainder obtained by dividing Y by Z, and $\lfloor Y/Z \rfloor$ represents a quotient obtained by dividing Y by Z. The data interleaving rule may be represented by using the following Table 17.

TABLE 17

| 0  | 1  | 4  | 5  | 8  | 9  | 12 | 13 | 16 | 17 | 20 | 21 |
| 2  | 3  | 6  | 7  | 10 | 11 | 14 | 15 | 18 | 19 | 22 | 23 |
| 24 | 25 | 28 | 29 | 32 | 33 | 36 | 37 | 40 | 41 | 44 | 45 |
| 26 | 27 | 30 | 31 | 34 | 35 | 38 | 39 | 42 | 43 | 46 | 47 |
| 48 | 49 | 52 | 53 | 56 | 57 | 60 | 61 | 64 | 65 | 68 | 69 |
| 50 | 51 | 54 | 55 | 58 | 59 | 62 | 63 | 66 | 67 | 70 | 71 |
| 72 | 73 | 76 | 77 | 80 | 81 | 84 | 85 | 88 | 89 | 92 | 93 |
| 74 | 75 | 78 | 79 | 82 | 83 | 86 | 87 | 90 | 91 | 94 | 95 |

In Table 17, a digit x in row i and column j indicates that a symbol in row i and column j of the second symbol matrix is from a symbol in row x %32 and column $\lfloor x/32 \rfloor$ of the first symbol matrix, where $0 \le i < 8$, $0 \le j < 12$, and $0 \le x < 96$.

After the interleaver outputs two second symbol matrices, an inner-code encoding apparatus performs inner-code encoding on 12 symbols in each row of the two second symbol matrices to obtain 16 codewords. When Hamming (128,120) is used for the inner-code encoding, the inner-code encoding is performed on 192 symbols, which are 1920 bits in total, output by the interleaver, and 16 inner-code codewords, which are 16*128=2048 bits in total, may be obtained.

In this embodiment, the highest delay in the 32 delay lines is 3V=3Q*d=216 symbols, that is, 2160 bits. A required delay is low. When Hamming(128,120) is used for the inner-code encoding, each Hamming codeword has 120 information bits, which are 12 symbols in total. For a 1*800G interface, 2*400G interfaces, 4*200G interfaces, or 8*100G interfaces with each lane of 100 Gb/s on a client side, the 12 symbols in each Hamming information bit are from 12 different outer-code codewords. This ensures good performance of an overall cascade FEC solution.

Embodiment 5: n=32, 32 delay lines include two groups, and each group includes 16 delay lines.

As shown in FIG. 13A and FIG. 13B, 32 data streams respectively correspond to the 32 delay lines, the delay line may include 0, Q, 2Q, or 3Q storage elements D, and each storage element D may store d symbols. In other words, a delay value of the delay line may be 0, V symbols, 2V symbols, or 3V symbols, where V is an integer greater than or equal to 68. Specifically, a delayer outputs d symbols from a rightmost storage element of each delay line to obtain 32*d symbols. Correspondingly, a symbol stored in the storage element in each delay line is shifted rightwards by d symbols. Further, d symbols are obtained from each of the 32 data streams, and are separately written into leftmost storage elements in the 32 delay lines. It should be understood that, when the delay line includes 0 storage elements, d symbols output from the delay line are d symbols obtained, through a current operation, from a corresponding PCS or FEC lane data stream. It should be understood that d symbols are output from each delay line through one delaying operation. When d≤L*m, the delaying operation may be repeatedly performed for φ times to obtain φd symbols, where φd≥L+m, and φ is a positive integer.

An interleaver obtains L*m symbols from each of 32 delayed data streams, to obtain L first symbol sets. Each first symbol set includes 32 first symbol subsets, and each first symbol subset includes m symbols. m symbols in first symbol subset h (0≤h<32) of each first symbol set are from delayed data stream h. The interleaver separately interleaves the L first symbol sets to obtain L second symbol sets, where the second symbol set includes r*c symbols. Each second symbol set includes r second symbol subsets, and each second symbol subset includes c symbols, where 32*m=r*c.

It should be noted that the first symbol set may alternatively be a symbol matrix including 32 rows and m columns of symbols, and is referred to as a first symbol matrix. The second symbol set may alternatively be a symbol matrix including r rows and c columns of symbols, and is referred to as a second symbol matrix. In this case, the L*m symbols obtained from delayed data stream h are respectively sent to columns m in rows h of the L first symbol matrices. m symbols in row h of each first symbol matrix are from delayed data stream h. The interleaver interleaves 32*m symbols in each of the L first symbol matrices to obtain L second symbol matrices, where the second symbol matrix includes r rows and c columns of symbols.

As shown in FIG. 14, in a possible implementation, the interleaver includes L interleaving subunits, and the L interleaving subunits separately interleave the L first symbol matrices to obtain L second symbol matrices. Specifically, a data division unit [P] obtains L*m symbols from delayed data stream h (0≤h<32), where the L*m symbols include L groups, and each group includes m symbols. The L groups of symbols are respectively sent to rows h in the L first symbol matrices. In another possible implementation, the interleaver does not need to be divided into a plurality of interleaving subunits. The interleaver interleaves the first symbol matrix to obtain a second symbol matrix, and repeats the operation for L times to obtain L second symbol matrices.

In an example, the first symbol matrix includes 32 rows and 16 columns of symbols, the second symbol matrix includes 32 rows and 16 columns of symbols, L=1, Q=9, and d=8. To be specific, the interleaver obtains 16 symbols from each of the 32 delayed data streams, each storage element D in the delay lines stores d=8 symbols, and each symbol includes 10 bits. V=Q*d=72, and the delay value of each delay line is 0 symbols, 72 symbols, 144 symbols, or 204 symbols. Specifically, the delay values of the 32 delay lines may be shown in Table 18.

TABLE 18

| Delay line | Quantity of delayed symbols |
|---|---|
| 0 | 0 |
| 1 | 144 |
| 2 | 0 |
| 3 | 144 |
| 4 | 144 |
| 5 | 0 |
| 6 | 144 |
| 7 | 0 |
| 8 | 72 |
| 9 | 216 |
| 10 | 72 |
| 11 | 216 |
| 12 | 216 |
| 13 | 72 |
| 14 | 216 |
| 15 | 72 |
| 16 | 0 |
| 17 | 144 |
| 18 | 0 |
| 19 | 144 |
| 20 | 144 |
| 21 | 0 |
| 22 | 144 |
| 23 | 0 |
| 24 | 72 |
| 25 | 216 |
| 26 | 72 |
| 27 | 216 |
| 28 | 216 |
| 29 | 72 |
| 30 | 216 |
| 31 | 72 |

The rule of interleaving the first symbol matrix to obtain the second symbol matrix may be represented in Table 19. A digit k in row i and column j in the table indicates that a symbol in row i and column j of the second symbol matrix is from a symbol in row k and column j of the first symbol matrix. It should be noted that, transposition of locations of any two rows in Table 19 also belongs to the data interleaving rule provided in this application.

TABLE 19

| 0 | 1 | 5 | 4 | 8 | 9 | 13 | 12 | 16 | 17 | 21 | 20 | 24 | 25 | 29 | 28 |
|---|---|---|---|---|---|---|---|---|---|---|---|---|---|---|---|
| 1 | 0 | 4 | 5 | 9 | 8 | 12 | 13 | 17 | 16 | 20 | 21 | 25 | 24 | 28 | 29 |
| 2 | 3 | 7 | 6 | 10 | 11 | 15 | 14 | 18 | 19 | 23 | 22 | 26 | 27 | 31 | 30 |
| 3 | 2 | 6 | 7 | 11 | 10 | 14 | 15 | 19 | 18 | 22 | 23 | 27 | 26 | 30 | 31 |
| 4 | 5 | 1 | 0 | 12 | 13 | 9 | 8 | 20 | 21 | 17 | 16 | 28 | 29 | 25 | 24 |
| 5 | 4 | 0 | 1 | 13 | 12 | 8 | 9 | 21 | 20 | 16 | 17 | 29 | 28 | 24 | 25 |
| 6 | 7 | 3 | 2 | 14 | 15 | 11 | 10 | 22 | 23 | 19 | 18 | 30 | 31 | 27 | 26 |
| 7 | 6 | 2 | 3 | 15 | 14 | 10 | 11 | 23 | 22 | 18 | 19 | 31 | 30 | 26 | 27 |
| 8 | 9 | 13 | 12 | 0 | 1 | 5 | 4 | 24 | 25 | 29 | 28 | 16 | 17 | 21 | 20 |
| 9 | 8 | 12 | 13 | 1 | 0 | 4 | 5 | 25 | 24 | 28 | 29 | 17 | 16 | 20 | 21 |
| 10 | 11 | 15 | 14 | 2 | 3 | 7 | 6 | 26 | 27 | 31 | 30 | 18 | 19 | 23 | 22 |
| 11 | 10 | 14 | 15 | 3 | 2 | 6 | 7 | 27 | 26 | 30 | 31 | 19 | 18 | 22 | 23 |
| 12 | 13 | 9 | 8 | 4 | 5 | 1 | 0 | 28 | 29 | 25 | 24 | 20 | 21 | 17 | 16 |
| 13 | 12 | 8 | 9 | 5 | 4 | 0 | 1 | 29 | 28 | 24 | 25 | 21 | 20 | 16 | 17 |
| 14 | 15 | 11 | 10 | 6 | 7 | 3 | 2 | 30 | 31 | 27 | 26 | 22 | 23 | 19 | 18 |
| 15 | 14 | 10 | 11 | 7 | 6 | 2 | 3 | 31 | 30 | 26 | 27 | 23 | 22 | 18 | 19 |
| 16 | 17 | 21 | 20 | 24 | 25 | 29 | 28 | 0 | 1 | 5 | 4 | 8 | 9 | 13 | 12 |

TABLE 19-continued

| | | | | | | | | | | | | | | | |
|---|---|---|---|---|---|---|---|---|---|---|---|---|---|---|---|
| 17 | 16 | 20 | 21 | 25 | 24 | 28 | 29 | 1 | 0 | 4 | 5 | 9 | 8 | 12 | 13 |
| 18 | 19 | 23 | 22 | 26 | 27 | 31 | 30 | 2 | 3 | 7 | 6 | 10 | 11 | 15 | 14 |
| 19 | 18 | 22 | 23 | 27 | 26 | 30 | 31 | 3 | 2 | 6 | 7 | 11 | 10 | 14 | 15 |
| 20 | 21 | 17 | 16 | 28 | 29 | 25 | 24 | 4 | 5 | 1 | 0 | 12 | 13 | 9 | 8 |
| 21 | 20 | 16 | 17 | 29 | 28 | 24 | 25 | 5 | 4 | 0 | 1 | 13 | 12 | 8 | 9 |
| 22 | 23 | 19 | 18 | 30 | 31 | 27 | 26 | 6 | 7 | 3 | 2 | 14 | 15 | 11 | 10 |
| 23 | 22 | 18 | 19 | 31 | 30 | 26 | 27 | 7 | 6 | 2 | 3 | 15 | 14 | 10 | 11 |
| 24 | 25 | 29 | 28 | 16 | 17 | 21 | 20 | 8 | 9 | 13 | 12 | 0 | 1 | 5 | 4 |
| 25 | 24 | 28 | 29 | 17 | 16 | 20 | 21 | 9 | 8 | 12 | 13 | 1 | 0 | 4 | 5 |
| 26 | 27 | 31 | 30 | 18 | 19 | 23 | 22 | 10 | 11 | 15 | 14 | 2 | 3 | 7 | 6 |
| 27 | 26 | 30 | 31 | 19 | 18 | 22 | 23 | 11 | 10 | 14 | 15 | 3 | 2 | 6 | 7 |
| 28 | 29 | 25 | 24 | 20 | 21 | 17 | 16 | 12 | 13 | 9 | 8 | 4 | 5 | 1 | 0 |
| 29 | 28 | 24 | 25 | 21 | 20 | 16 | 17 | 13 | 12 | 8 | 9 | 5 | 4 | 0 | 1 |
| 30 | 31 | 26 | 26 | 22 | 23 | 19 | 18 | 14 | 15 | 11 | 10 | 6 | 7 | 3 | 2 |
| 31 | 30 | 27 | 27 | 23 | 22 | 18 | 19 | 15 | 14 | 10 | 11 | 7 | 6 | 2 | 3 |

In another example, the first symbol matrix includes 32 rows and 12 columns of symbols, the second symbol matrix includes 32 rows and 12 columns of symbols, L=1, Q=12, and d=6. To be specific, the interleaver obtains 12 symbols from each of the 32 delayed data streams, each storage element D in the delay lines stores d=6 symbols, and each symbol includes 10 bits. V=Q*d=72, and the delay value of each delay line is 0 symbols, 72 symbols, 144 symbols, or 216 symbols. Specifically, the delay values of the 32 delay lines may be shown in Table 20.

TABLE 20

| Delay line | Quantity of delayed symbols |
|---|---|
| 0 | 0 |
| 1 | 144 |
| 2 | 0 |
| 3 | 144 |
| 4 | 144 |
| 5 | 0 |
| 6 | 144 |
| 7 | 0 |
| 8 | 72 |
| 9 | 216 |
| 10 | 72 |
| 11 | 216 |
| 12 | 216 |
| 13 | 72 |
| 14 | 216 |
| 15 | 72 |
| 16 | 0 |
| 17 | 144 |
| 18 | 0 |
| 19 | 144 |
| 20 | 144 |
| 21 | 0 |
| 22 | 144 |
| 23 | 0 |
| 24 | 72 |
| 25 | 216 |
| 26 | 72 |
| 27 | 216 |
| 28 | 216 |
| 29 | 72 |
| 30 | 216 |
| 31 | 72 |

The rule of interleaving the first symbol matrix to obtain the second symbol matrix may be represented in Table 21. A digit k in row i and column j in the table indicates that a symbol in row i and column j of the second symbol matrix is from a symbol in row k and column j of the first symbol matrix. It should be noted that, transposition of locations of any two rows in Table 21 also belongs to the data interleaving rule provided in this application.

TABLE 21

| | | | | | | | | | | | |
|---|---|---|---|---|---|---|---|---|---|---|---|
| 0 | 1 | 5 | 4 | 8 | 9 | 13 | 12 | 16 | 17 | 21 | 20 |
| 1 | 0 | 4 | 5 | 9 | 8 | 12 | 13 | 17 | 16 | 20 | 21 |
| 2 | 3 | 7 | 6 | 10 | 11 | 15 | 14 | 18 | 19 | 23 | 22 |
| 3 | 2 | 6 | 7 | 11 | 10 | 14 | 15 | 19 | 18 | 22 | 23 |
| 4 | 5 | 1 | 0 | 12 | 13 | 9 | 8 | 20 | 21 | 17 | 16 |
| 5 | 4 | 0 | 1 | 13 | 12 | 8 | 9 | 21 | 20 | 16 | 17 |
| 6 | 7 | 3 | 2 | 14 | 15 | 11 | 10 | 22 | 23 | 19 | 18 |
| 7 | 6 | 2 | 3 | 15 | 14 | 10 | 11 | 23 | 22 | 18 | 19 |
| 8 | 9 | 13 | 12 | 0 | 1 | 5 | 4 | 24 | 25 | 29 | 28 |
| 9 | 8 | 12 | 13 | 1 | 0 | 4 | 5 | 25 | 24 | 28 | 29 |
| 10 | 11 | 15 | 14 | 2 | 3 | 7 | 6 | 26 | 27 | 31 | 30 |
| 11 | 10 | 14 | 15 | 3 | 2 | 6 | 7 | 27 | 26 | 30 | 31 |
| 12 | 13 | 9 | 8 | 4 | 5 | 1 | 0 | 28 | 29 | 25 | 24 |
| 13 | 12 | 8 | 9 | 5 | 4 | 0 | 1 | 29 | 28 | 24 | 25 |
| 14 | 15 | 11 | 10 | 6 | 7 | 3 | 2 | 30 | 31 | 27 | 26 |
| 15 | 14 | 10 | 11 | 7 | 6 | 2 | 3 | 31 | 30 | 26 | 27 |
| 16 | 17 | 21 | 20 | 24 | 25 | 29 | 28 | 0 | 1 | 5 | 4 |
| 17 | 16 | 20 | 21 | 25 | 24 | 28 | 29 | 1 | 0 | 4 | 5 |
| 18 | 19 | 23 | 22 | 26 | 27 | 31 | 30 | 2 | 3 | 7 | 6 |
| 19 | 18 | 22 | 23 | 27 | 26 | 30 | 31 | 3 | 2 | 6 | 7 |
| 20 | 21 | 17 | 16 | 28 | 29 | 25 | 24 | 4 | 5 | 1 | 0 |
| 21 | 20 | 16 | 17 | 29 | 28 | 24 | 25 | 5 | 4 | 0 | 1 |
| 22 | 23 | 19 | 18 | 30 | 31 | 27 | 26 | 6 | 7 | 3 | 2 |
| 23 | 22 | 18 | 19 | 31 | 30 | 26 | 27 | 7 | 6 | 2 | 3 |

TABLE 21-continued

| 24 | 25 | 29 | 28 | 16 | 17 | 21 | 20 | 8  | 9  | 13 | 12 |
|----|----|----|----|----|----|----|----|----|----|----|----|
| 25 | 24 | 28 | 29 | 17 | 16 | 20 | 21 | 9  | 8  | 12 | 13 |
| 26 | 27 | 31 | 30 | 18 | 19 | 23 | 22 | 10 | 11 | 15 | 14 |
| 27 | 26 | 30 | 31 | 19 | 18 | 22 | 23 | 11 | 10 | 14 | 15 |
| 28 | 29 | 25 | 24 | 20 | 21 | 17 | 16 | 12 | 13 | 9  | 8  |
| 29 | 28 | 24 | 25 | 21 | 20 | 16 | 17 | 13 | 12 | 8  | 9  |
| 30 | 31 | 26 | 26 | 22 | 23 | 19 | 18 | 14 | 15 | 11 | 10 |
| 31 | 30 | 27 | 27 | 23 | 22 | 18 | 19 | 15 | 14 | 10 | 11 |

In this embodiment, the highest delay in the 32 delay lines is 3Q*d=240 symbols, that is, 2400 bits. A required delay is low. When Hamming(170,160) is used for inner-code encoding with reference to the delay value in Table 16 and the interleaving rule in Table 17, each Hamming codeword has 160 information bits, which are 16 symbols in total. For a 1*800G interface, 2*400G interfaces, 4*200G interfaces, or 8*100G interfaces with each lane of 100 Gb/s on a client side, the 16 symbols in each Hamming information bit are from 16 different outer-code codewords. This ensures good performance of an overall cascade FEC solution. However, when Hamming(128,120) is used for inner-code encoding with reference to the delay value in Table 18 and the interleaving rule in Table 19, each Hamming codeword has 120 information bits, which are 12 symbols in total. For the 1*800G interface, 2*400G interfaces, 4*200G interfaces, or 8*100G interfaces with each lane of 100 Gb/s on the client side, the 12 symbols in each Hamming information bit are from 12 different outer-code codewords. This ensures good performance of an overall cascade FEC solution.

It should be noted that the foregoing embodiments provide cases in which inner-code information symbol lengths c are 8, 12, and 16 symbols, and other cases in which inner-code information symbol lengths are 9, 10, 11, 13, 14, and 15 may further be extended. After the 32 data streams are delayed, 16 symbols in group 0 in 32 symbols that are output each time are from 16 different RS codeword symbols. The 16 symbols in group 0 include: symbol $b_0$, symbol $b_1$, symbol $b_4$, symbol $b_5$, symbol $b_8$, symbol $b_9$, symbol $b_{12}$, symbol $b_{13}$, symbol $b_{16}$, symbol $b_{17}$, symbol $b_{20}$, symbol $b_{21}$, symbol $b_{24}$, symbol $b_{25}$, symbol $b_{28}$, and symbol $b_{29}$. After the 32 data streams are delayed, 16 symbols in group 1 in the 32 symbols that are output each time are from 16 different RS codeword symbols. The 16 symbols in group 1 include: symbol $b_2$, symbol $b_3$, symbol $b_6$, symbol $b_7$, symbol $b_{10}$, symbol $b_{11}$, symbol $b_{14}$, symbol $b_{15}$, symbol $b_{18}$, symbol $b_{19}$, symbol $b_{22}$, symbol $b_{23}$, symbol $b_{26}$, symbol $b_{27}$, symbol $b_{30}$, and symbol $b_{31}$.

Alternatively, the 16 symbols in group 0 include: symbol $b_0$, symbol $b_1$, symbol $b_4$, symbol $b_5$, symbol $b_8$, symbol $b_9$, symbol $b_{12}$, symbol $b_{13}$, symbol $b_{18}$, symbol $b_{19}$, symbol $b_{22}$, symbol $b_{23}$, symbol $b_{26}$, symbol $b_{27}$, symbol $b_{30}$, and symbol $b_{31}$. The 16 symbols in group 1 include: symbol $b_2$, symbol $b_3$, symbol $b_6$, symbol $b_7$, symbol $b_{10}$, symbol $b_{11}$, symbol $b_{14}$, symbol $b_{15}$, symbol $b_{16}$, symbol $b_{17}$, symbol $b_{20}$, symbol $b_{21}$, symbol $b_{24}$, symbol $b_{25}$, symbol $b_{28}$, and symbol $b_{29}$.

With reference to the foregoing features, the interleaver may be designed, so that c symbols output by the interleaver in each row are from c different RS codeword symbols. The following uses $b_i=i$ as an example to describe an interleaving manner. The first symbol matrix includes 32 rows and m columns, the second symbol matrix includes r rows and c columns, and 32*m=r*c. 16 rows of symbols in group 0 in the first symbol matrix sequentially include symbols in row 0, 1, 4, 5, 8, 9, 12, 13, 16, 17, 20, 21, 24, 25, 28, and 29. 16 rows of symbols in group 1 in the first symbol matrix sequentially include symbols in row 2, 3, 6, 7, 10, 11, 14, 15, 18, 19, 22, 23, 26, 27, 30, and 31.

Specifically, symbols in row 0 to row 15 of each column in the 16 rows of symbols in group 0 are 16 symbols arranged in the order; in two adjacent columns of the 16 rows of symbols in group 0, symbols in row 15 of the former column to row 0 of the latter column are two symbols arranged in the order; and c symbols in row 0 in r/2 rows of symbols in group 0 in the second symbol matrix are from c symbols in group 0 that are arranged in the order starting from row 0 and column 0 in the 16 rows of symbols in group 0, and the rest can be deduced by analogy, until c symbols in row r/2-1 in the r/2 rows of symbols in group 0 in the second symbol matrix are from the last group of c symbols that are arranged in the order starting from row 0 and column 0 in the 16 rows of symbols in group 0. That is, the c symbols are sequentially obtained from the 16 rows of symbols in group 0 in a manner of top-down and then left-right as one row of the second symbol matrix, to obtain the r/2 rows of the second symbol matrix in total.

Similarly, 16 rows of symbols in group 1 are arranged in an order, and symbols in row 0 to row 15 of each column in the 16 rows of symbols in group 1 are 16 symbols arranged in the order; in two adjacent columns of the 16 rows of symbols in group 1, symbols in row 15 of the former column to row 0 of the latter column are two symbols arranged in the order; and c symbols in row 0 in r/2 rows of symbols in group 1 in the second symbol matrix are from c symbols in group 0 that are arranged in the order starting from row 0 and column 0 in the 16 rows of symbols in group 1, and the rest can be deduced by analogy, until c symbols in row r/2-1 in the r/2 rows of symbols in group 1 in the second symbol matrix are from the last group of c symbols that are arranged in the order starting from row 0 and column 0 in the 16 rows of symbols in group 1. In other words, the c symbols are sequentially obtained from the 16 rows of symbols in group 1 from top to bottom and then from left to right as one row of the second symbol matrix, to obtain the r/2 rows of the second symbol matrix in total.

More specifically, the following provides several typical parameter combinations:

$\{m = 9, r = 32, c = 9\}, \{m = 5, r = 16, c = 10\},$ $\{m = 11, r = 32, c = 11\}, \{m = 13, r = 32, c = 13\},$ $\{m = 7, r = 16, c = 14\}, \text{ and } \{m = 15, r = 32, c = 15\}.$ It should be noted that, in addition to the data interleaving method described above, this application further provides another data interleaving method based on data stream grouping, which is described below.

Figure 18:
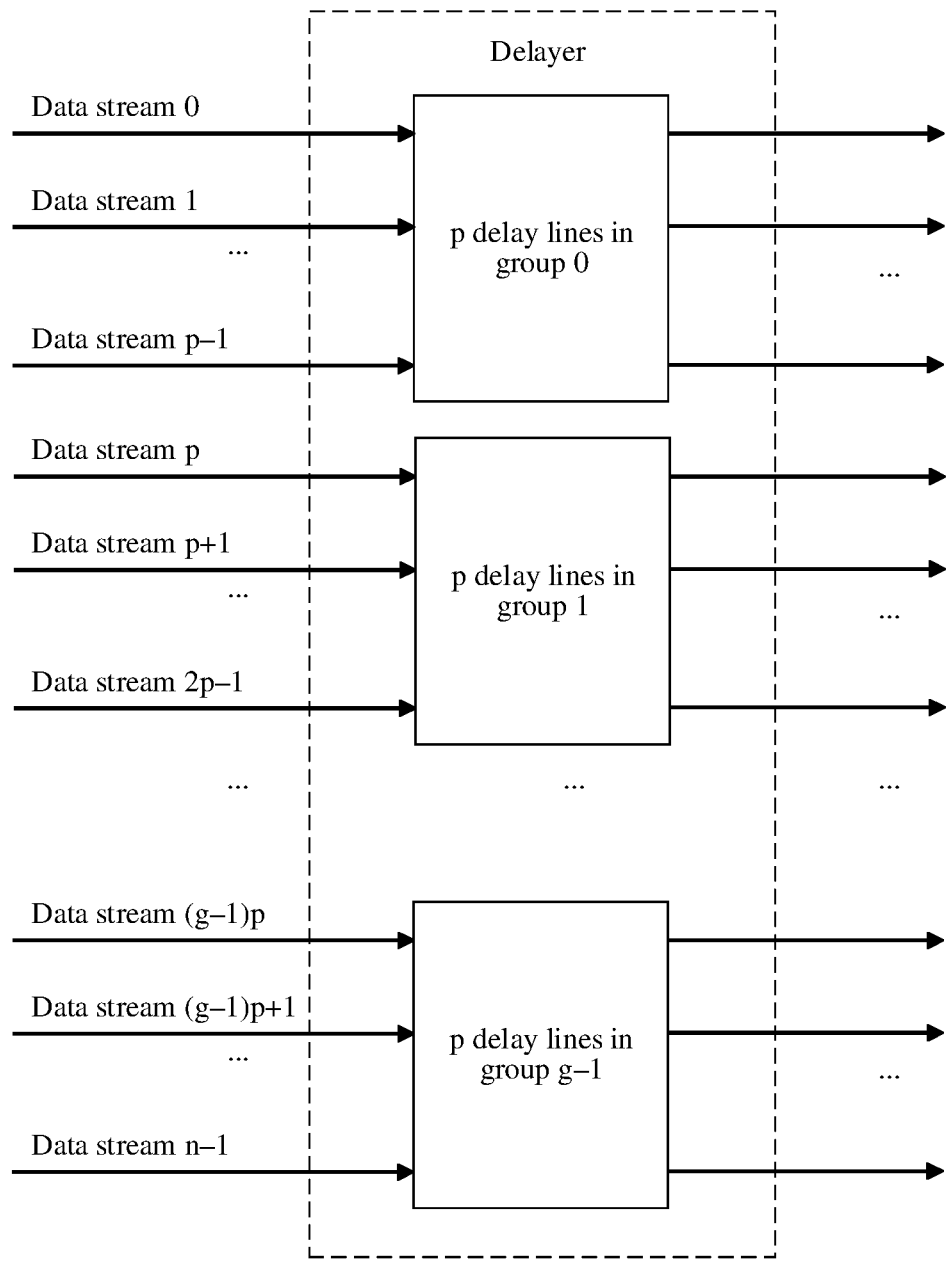
FIG. 18 is a schematic diagram of grouping data streams according to an embodiment of this application.

FIG. 18 is a schematic diagram of grouping data streams according to an embodiment of this application. As shown in FIG. 18, n data streams include g groups, and each group includes p data streams. g is an integer greater than or equal to 1, p is an integer greater than or equal to 1, and n=g*p. Specifically, data stream 0, data stream 1, . . . , and data stream p−1 belong to a same group. Data stream p, data stream p+1, . . . , and data stream 2p−1 belong to a same group. By analogy, data stream (g−1)p, data stream (g−1)p+1, . . . , and data stream n−1 belong to a same group. Correspondingly, n delay lines in a delayer also correspondingly include g groups, and each group includes p delay lines. The g groups of delay lines correspond one-to-one to the g groups of data streams, the p delay lines in each group of delay lines respectively include 0 storage elements, Q storage elements, 2Q storage elements, . . . , and (p−1)Q storage elements, and each storage element is used for storing d symbols, where Q is an integer greater than or equal to 1, and d is an integer greater than or equal to 1. In other words, the p delay lines in each group of delay lines respectively correspond to p delay values, which are respectively 0 symbols, V symbols, 2V symbols, . . . , and (p−1)V symbols, where V=Q*d.

Figure 19:
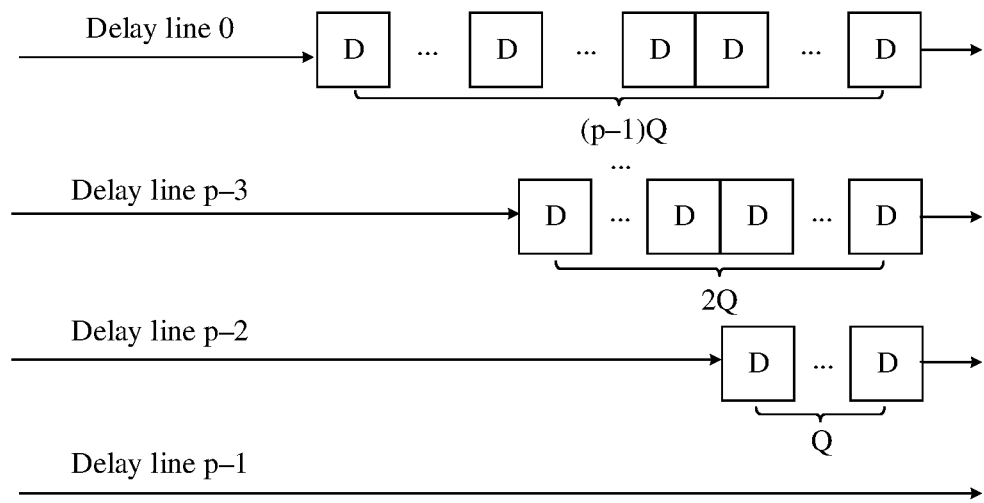
FIG. 19 is a schematic structural diagram of a group of delay lines according to an embodiment of this application.
Figure 20:
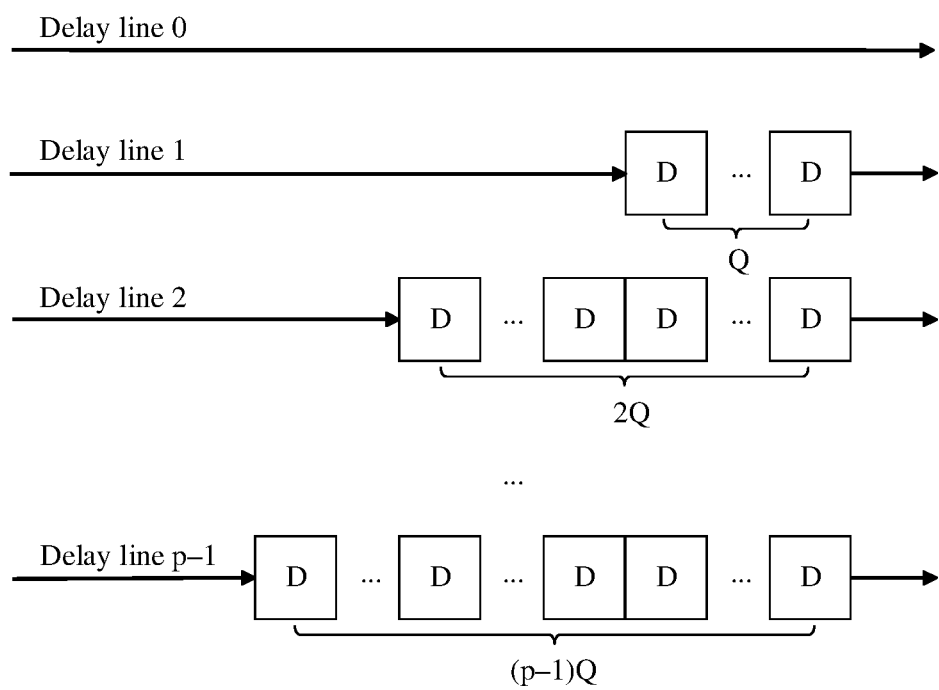
FIG. 20 is another schematic structural diagram of a group of delay lines according to an embodiment of this application.

FIG. 19 is a schematic structural diagram of a group of delay lines according to an embodiment of this application. As shown in FIG. 19, delay line 0 has (p−1)Q storage elements, and then based on an order in the group, Q storage elements are reduced for each delay line in the order, to be specific, delay line p−1 has 0 storage elements. FIG. 20 is another schematic structural diagram of a group of delay lines according to an embodiment of this application. As shown in FIG. 20, delay line 0 has 0 storage elements, and then based on an order in the group, Q storage elements are increased for each delay line in the order, to be specific, delay line p−1 has (p−1)Q storage elements. It should be understood that, FIG. 19 and FIG. 20 merely provide two examples of intra-group delay line allocation. During actual application, provided that the p delay lines in each group of delay lines respectively correspond to the p delay values, the foregoing sequentially decreasing or increasing delay line allocation manner may not be used. Details are not listed one by one herein.

Figure 21A:
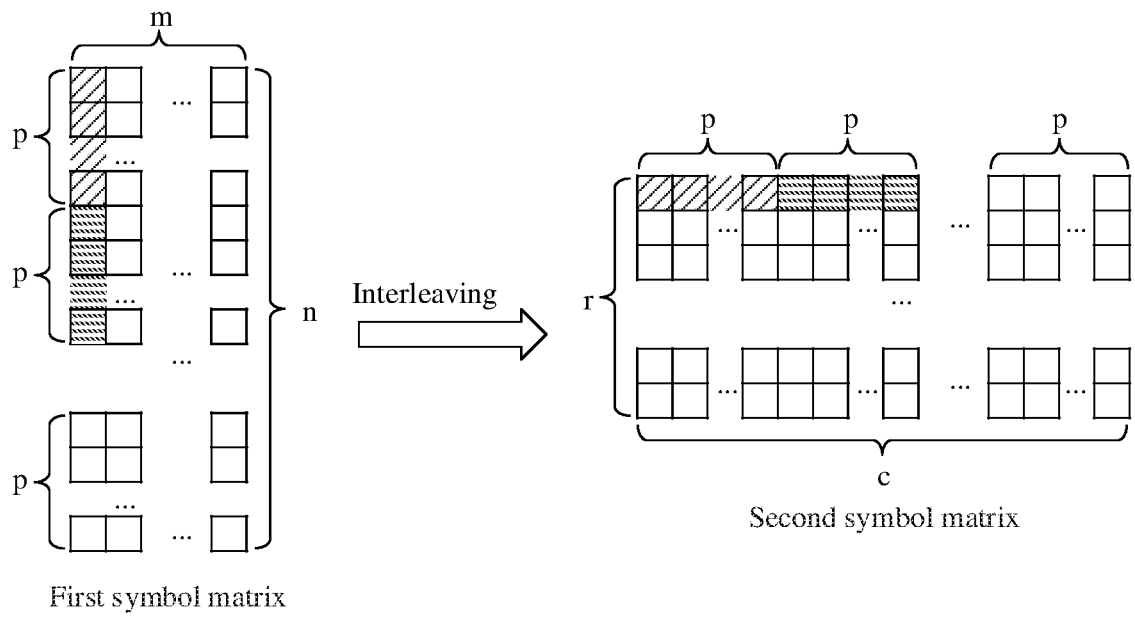
FIG. 21(a) is a schematic diagram of grouping a first symbol matrix and a second symbol matrix according to an embodiment of this application.

Based on the foregoing grouping of the delay lines, correspondingly, a first symbol matrix and a second symbol matrix also need to be grouped. FIG. 21(a) is a schematic diagram of grouping a first symbol matrix and a second symbol matrix according to an embodiment of this application. As shown in FIG. 21(a), n symbols in each column of the first symbol matrix include g groups, and each group includes p symbols. c symbols in each row of the second symbol matrix include s groups, and each group includes p symbols. g is an integer greater than 1, s is an integer greater than 1, and p is an integer greater than or equal to 1. Specifically, one group of p symbols in the second symbol matrix is from one group of p symbols in the first symbol matrix, and a total of 2p symbols in any two groups in each row of the second symbol matrix are from different rows of the first symbol matrix. For example, if the p symbols in group 0 in row 0 of the second symbol matrix are from the p symbols in group 0 in column 0 of the first symbol matrix, symbols in another group in row 0 of the second symbol matrix cannot be from symbols in group 0 in all columns of the first symbol matrix.

Figure 21B:
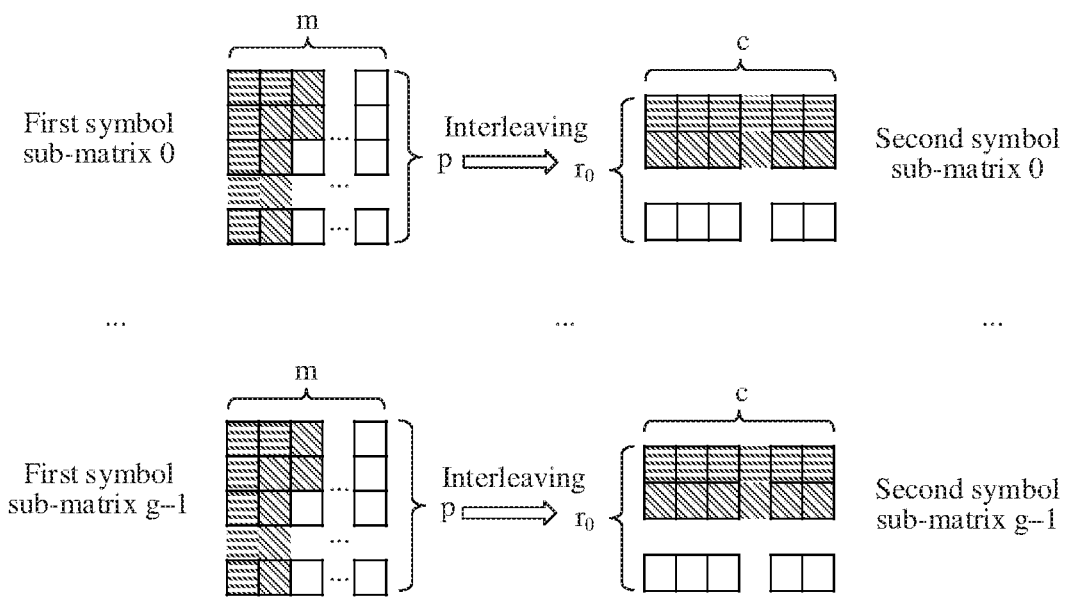
FIG. 21(b) is another schematic diagram of grouping a first symbol matrix and a second symbol matrix according to an embodiment of this application.

FIG. 21(b) is another schematic diagram of grouping a first symbol matrix and a second symbol matrix according to an embodiment of this application. As shown in FIG. 21(b), the first symbol matrix includes g first symbol sub-matrices, and each first symbol sub-matrix includes p rows and m columns, where g, p, and m are integers greater than or equal to 1, and n=p*g. The second symbol matrix includes g second symbol sub-matrices, and each second symbol sub-matrix includes r0 rows and c columns, where r0 and c are integers greater than or equal to 1, r=r0*g, and p*m=r0*c. Interleaving is performed on first symbol sub-matrix i (0≤i<g) to obtain second symbol sub-matrix i. c symbols in each row of each second symbol matrix are from c different codewords.

In consideration of some specific scenarios, a transmit-end device performs KP4 RS(544,514) outer-code encoding on a to-be-transmitted service data stream to obtain n PCS lane data streams, where every A outer-code codewords are distributed in the n lane data streams. Specifically, in the n PCS lane data streams, each data stream is separated by B symbols, and there are n*B symbols in total, including A RS codewords, where n*B=A*544. A consecutive symbols in each PCS lane data stream are from A different RS codewords, and A symbols at same locations of A consecutive PCS lane data streams are from A different RS codewords, where an integer A may be 2, 4, or the like. The n PCS lane data streams are processed at a PMA sublayer and then sent to a transmit-end processing module through an attachment unit interface. In the transmit-end processing module, n aligned lane data streams are obtained through lane de-skew processing. The delayer shown in FIG. 18 is used. The delayer includes g groups of delay lines, and p delay lines in each group of delay lines respectively correspond to p delay values, which are respectively 0 symbols, V symbols, 2V symbols, . . . , and (p−1)V symbols, where V=Q*d. When V≥b, A*p symbols in symbols output from each group of p delay lines are from A*p different RS outer-code codewords, where each delay line provides A consecutive symbols.

An interleaver obtains L*m symbols from each of n delayed data streams, to obtain L first symbol sets. Each first symbol set includes n first symbol subsets, and each first symbol subset includes m symbols. m symbols in first symbol subset h (0≤h<n) of each first symbol set are from delayed data stream h. The interleaver separately interleaves the L first symbol sets to obtain L second symbol sets, where the second symbol set includes r*c symbols. Each second symbol set includes r second symbol subsets, and each second symbol subset includes c symbols, where n*m=r*c. It should be noted that the first symbol set may alternatively be a symbol matrix including n rows and m columns of symbols, and is referred to as a first symbol matrix. The second symbol set may alternatively be a symbol matrix including r rows and c columns of symbols, and is referred to as a second symbol matrix. In this case, the L*m symbols obtained from delayed data stream h are respectively sent to columns m in rows h of the L first symbol matrices. m symbols in row h of each first symbol matrix are from delayed data stream h. The interleaver interleaves n*m symbols in each of the L first symbol matrices to obtain L second symbol matrices, where the second symbol matrix includes r rows and c columns of symbols.

The L*m symbols are obtained from each of the n delayed data streams to obtain the L first symbol matrices. The interleaver shown in FIG. 21(b) is used for separately interleaving the L first symbol matrices to obtain the L second symbol matrices. The first symbol matrix includes g first symbol sub-matrices, and the second symbol matrix includes g second symbol sub-matrices. Interleaving is performed on each first symbol sub-matrix to obtain the second symbol sub-matrix. Specifically, c symbols in each row of the second symbol sub-matrix are from c symbols in the first symbol sub-matrix, and the c symbols in the first symbol sub-matrix are distributed in at most A columns of the first symbol sub-matrix.

In a possible implementation, symbols in first symbol sub-matrix t are arranged in an order, and symbols in row 0 to row p−1 of each column of first symbol sub-matrix t are p symbols arranged in the order; in two adjacent columns of first symbol sub-matrix t, symbols in row p−1 of the former column to row 1 of the latter column are two symbols arranged in the order; and c symbols in row 0 of second symbol sub-matrix t are from c symbols in group 0 that are arranged in the order starting from row 0 and column 0 of first symbol sub-matrix t, and the rest can be deduced by analogy, until c symbols in row r0−1 of second symbol sub-matrix t are from the last group of c symbols that are arranged in the order starting from row 0 and column 0 of first symbol sub-matrix t. In other words, c symbols are sequentially obtained from each row of the first symbol sub-matrix from top to bottom and then from left to right, to obtain a total of c symbols to form one row of c symbols in the second symbol sub-matrix, where c̃≤a. In this case, the c symbols in each row of the second symbol sub-matrix are from c different RS outer-code codewords. According to the foregoing solution, overall performance of the cascaded FEC solution is good.

It should be noted that the L first symbol matrices input by the interleaver may be respectively stored in L buffers of the interleaver, and the interleaver outputs the L second symbol matrices to an encoder after completing interleaving. The encoder performs inner-code encoding on the symbols in each row of the L second symbol matrices. Specifically, the L second symbol matrices include L*r rows of symbols, and the encoder may separately perform inner-code encoding on the L*r rows of symbols by using L*r independent encoding units.

The following further describes, by using some specific application scenarios, the data interleaving method based on data stream grouping. It should be noted that a quantity of bits included in one symbol is not limited in this application. In the following examples, an example in which one symbol includes 10 bits is used for description.

Figure 22A:
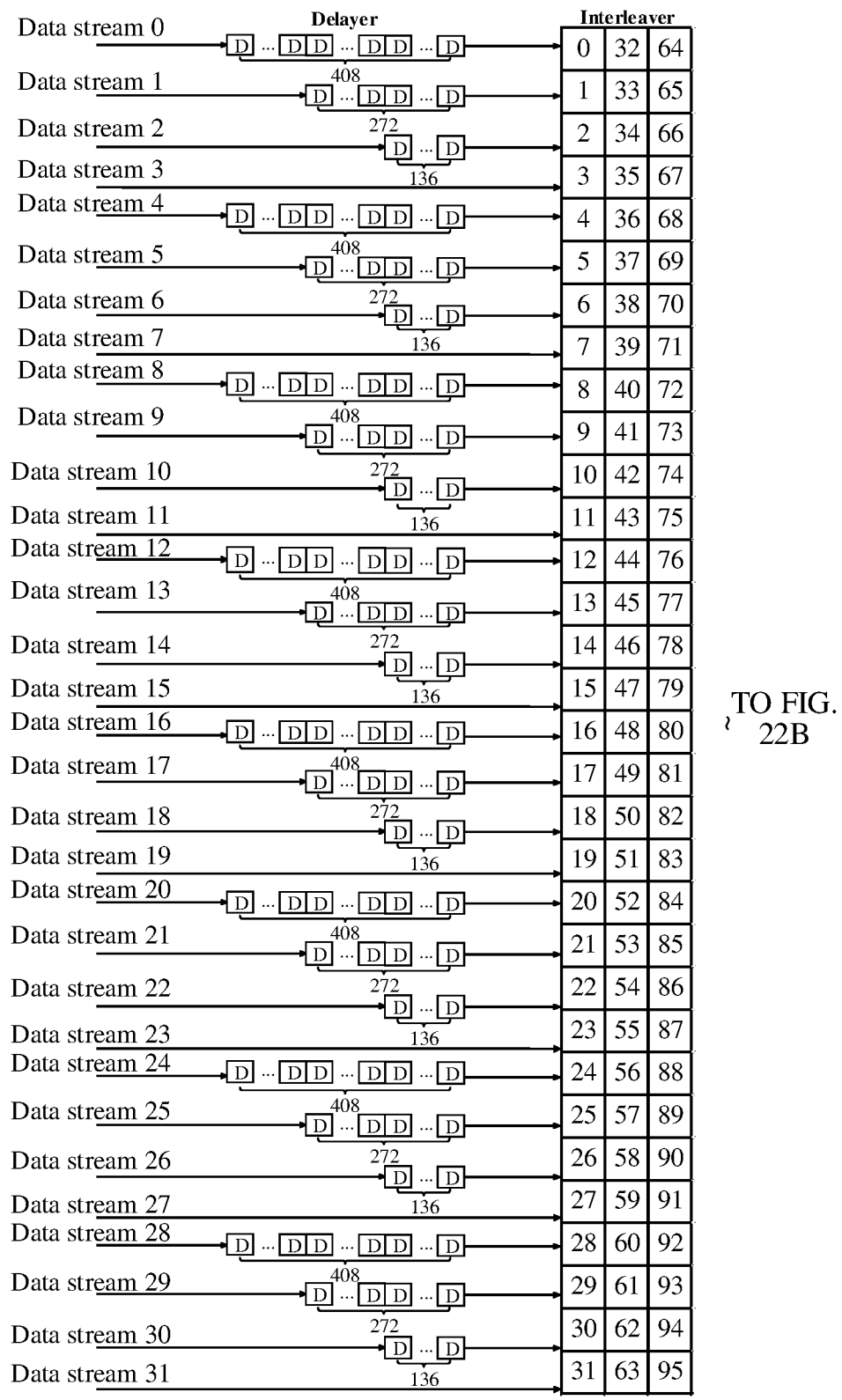
FIG. 22A and FIG. 22B are a schematic diagram of an application scenario of data interleaving according to an embodiment of this application.
Figure 22B:
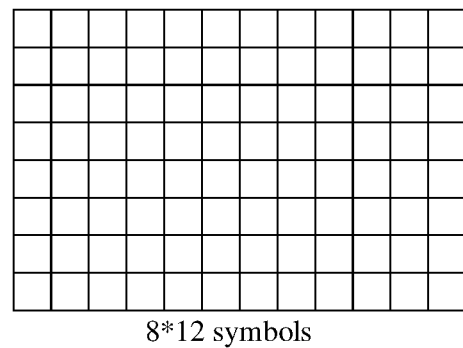

Application scenario 1: FIG. 22A and FIG. 22B are a schematic diagram of an application scenario of data interleaving according to an embodiment of this application. As shown in FIG. 22A and FIG. 22B, n=32, m=3, r=8, c=12, p=4, g=8, and s=3. To be specific, a first symbol matrix includes 32 rows and three columns of symbols, and four symbols in each column form one group. A second symbol matrix includes eight rows and 12 columns of symbols, and four symbols in each row form one group. A delayer includes 32 delay lines, where every four delay lines form a group, and the four delay lines in each group respectively include 0 storage elements, Q storage elements, 2Q storage elements, and 3Q storage elements. Q=136, d=1, and L=1. It should be understood that structural distribution of the four delay lines in each group in FIG. 22A and FIG. 22B is merely an example, and may be changed based on the manners described in FIG. 19 and FIG. 20. Details are not described herein again.

Specifically, an interleaver obtains d=1 symbol from a rightmost storage element of each delay line to obtain 32 symbols. Correspondingly, a symbol stored in the storage element in each delay line is shifted rightwards by d=1 symbol. Further, d=1 symbol is obtained from each of 32 data streams, and is separately written into leftmost storage elements in the 32 delay lines. 32 symbols output by the delayer each time are stored in one column of a buffer of the interleaver. The foregoing operations are repeated for three times, and a total of 32*3=96 symbols, that is, the first symbol matrix, are written into the buffer of the interleaver. The interleaver interleaves the first symbol matrix to obtain 8*12 symbols, that is, the second symbol matrix.

It should be noted that each group of four symbols in each row of 12 symbols in the second symbol matrix is from four symbols in one group in one column of the first symbol matrix, and any two groups of symbols in each row of three groups of symbols in the second symbol matrix are from two groups of symbols in different rows of the first symbol matrix. In a possible implementation, 12 symbols in one row of the second symbol matrix respectively correspond to four symbols in group a in column 0 of the first symbol matrix, four symbols in group b in column 1 of the first symbol matrix, and four symbols in group e in column 2 of the first symbol matrix, where a, b, and e are not equal to each other; and 0≤a<4 and 4≤e<8, or 0≤e<4 and 4≤a<8.

Further, a symbol in row i and column j of the second symbol matrix corresponds to a symbol in row x %32 and column ⌊x/32⌋ of the first symbol matrix. x=(4*i+⌊j/4⌋*24+j %4)%32+⌊j/4⌋*32, where 0≤i<8 and 0≤j<12. x %32 represents a remainder obtained after x is divided by 32, ⌊x/32⌋ represents a quotient obtained after x is divided by 32, j %4 represents a remainder obtained after j is divided by 4, and ⌊j/4⌋ represents a quotient obtained after j is divided by 4. Based on this calculation manner, a second symbol matrix shown in Table 22 may be obtained.

TABLE 22

| 0 | 1 | 2 | 3 | 56 | 57 | 58 | 59 | 80 | 81 | 82 | 83 |
|---|---|---|---|----|----|----|----|----|----|----|----|
| 4 | 5 | 6 | 7 | 60 | 61 | 62 | 63 | 84 | 85 | 86 | 87 |
| 8 | 9 | 10 | 11 | 32 | 33 | 34 | 35 | 88 | 89 | 90 | 91 |
| 12 | 13 | 14 | 15 | 36 | 37 | 38 | 39 | 92 | 93 | 94 | 95 |
| 16 | 17 | 18 | 19 | 40 | 41 | 42 | 43 | 64 | 65 | 66 | 67 |
| 20 | 21 | 22 | 23 | 44 | 45 | 46 | 47 | 68 | 69 | 70 | 71 |
| 24 | 25 | 26 | 27 | 48 | 49 | 50 | 51 | 72 | 73 | 74 | 75 |
| 28 | 29 | 30 | 31 | 52 | 53 | 54 | 55 | 76 | 77 | 78 | 79 |

Further, the interleaver outputs the second symbol matrix to an encoder, and the encoder performs inner-code encoding on 12 symbols, which are 120 bits in total, in each row of the second symbol matrix, to obtain eight codewords. In a possible implementation, the inner-code encoding is performed by using Hamming(128,120), and 8*128=1024 bits are obtained through the inner-code encoding. In another possible implementation, the inner-code encoding is performed by using BCH(136,120), and 8*136=1088 bits are obtained through the inner-code encoding.

In the application scenario 1, there are 32 delay lines in the convolutional interleaver, the highest delay is 3V=3Q*d=408 symbols, and the delay is low. When Hamming(128,120) is used for the inner-code encoding, each Hamming information bit has 12 symbols in total. For a 1*800G interface, 2*400G interfaces, 4*200G interfaces, or 8*100G interfaces with each lane of 100 Gb/s on a client side, the 12 symbols in each Hamming information bit are from 12 different outer-code codewords. This ensures good performance of an overall cascade FEC solution.

Figure 23A:
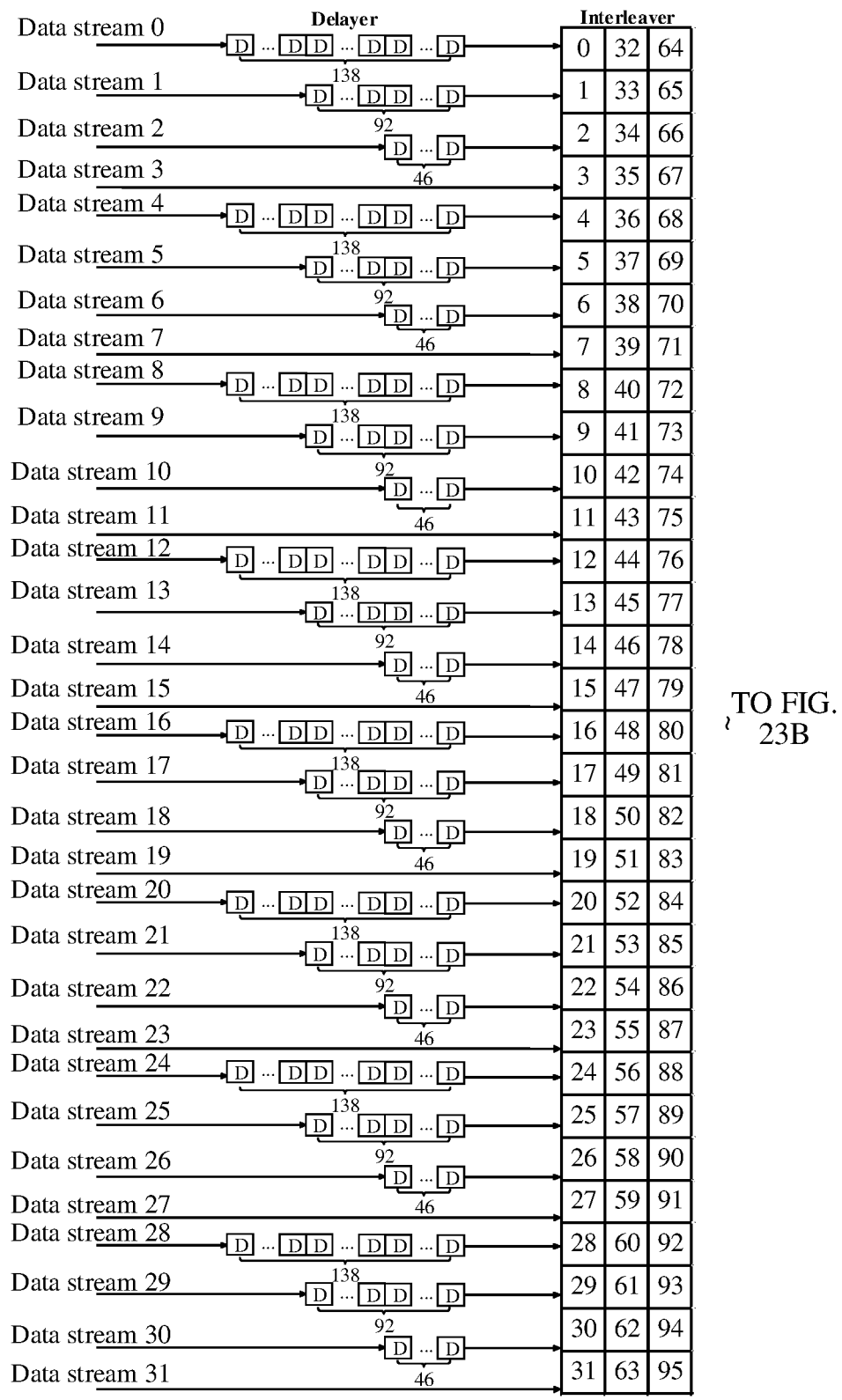
FIG. 23A and FIG. 23B are a schematic diagram of another application scenario of data interleaving according to an embodiment of this application.
Figure 23B:
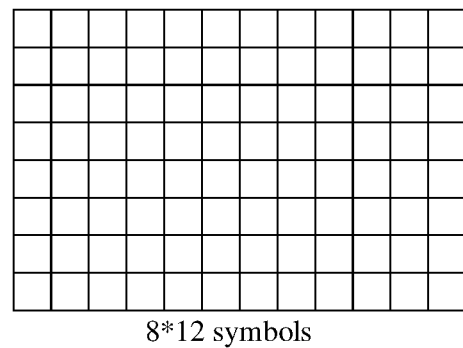

Application scenario 2: FIG. 23A and FIG. 23B are a schematic diagram of another application scenario of data interleaving according to an embodiment of this application. As shown in FIG. 23A and FIG. 23B, different from the foregoing application scenario 1, in this application scenario 2, Q=46 and d=3. Specifically, a delayer outputs d=3 symbols from a rightmost storage element of each delay line to obtain 32*3=96 symbols. Correspondingly, a symbol stored in a storage element in each delay line is shifted rightwards by d=3 symbols. Further, d=3 symbols are obtained from each of 32 data streams, and are separately written into leftmost storage elements in 32 delay lines. An interleaver can obtain 32*3=96 symbols once, and does not need to perform three read operations as in the application scenario 1.

It should be noted that the delayer outputs 96 symbols each time and writes the 96 symbols into a buffer of the interleaver. Three symbols that are output by the delayer and that are from data stream h (0≤h<32) are written into row h in the buffer of the interleaver. A writing manner is as follows: For the three symbols output by the delayer, symbol 0, symbol 1, and symbol 2 from data stream h are respectively written into column 0, column 1, and column 2 of row h in the buffer of the interleaver. Another writing manner is as follows: For the three symbols output by the delayer, symbol 0, symbol 1, and symbol 2 from data stream h are respectively written into column 2, column 1, and column 0 of row h in the buffer of the interleaver.

The data interleaving method in the application scenario 2 is similar to the data interleaving method described in the foregoing application scenario 1, and details are not described herein again. In the application scenario 2, there are 32 delay lines in the convolutional interleaver, the highest delay is 3V=3Q*d=414 symbols, and the delay is low. When Hamming(128,120) is used for the inner-code encoding, each Hamming information bit has 12 symbols in total. For a 1*800G interface, 2*400G interfaces, 4*200G interfaces, or 8*100G interfaces with each lane of 100 Gb/s on a client side, the 12 symbols in each Hamming information bit are from 12 different outer-code codewords. This ensures good performance of an overall cascade FEC solution.

Figure 24A:
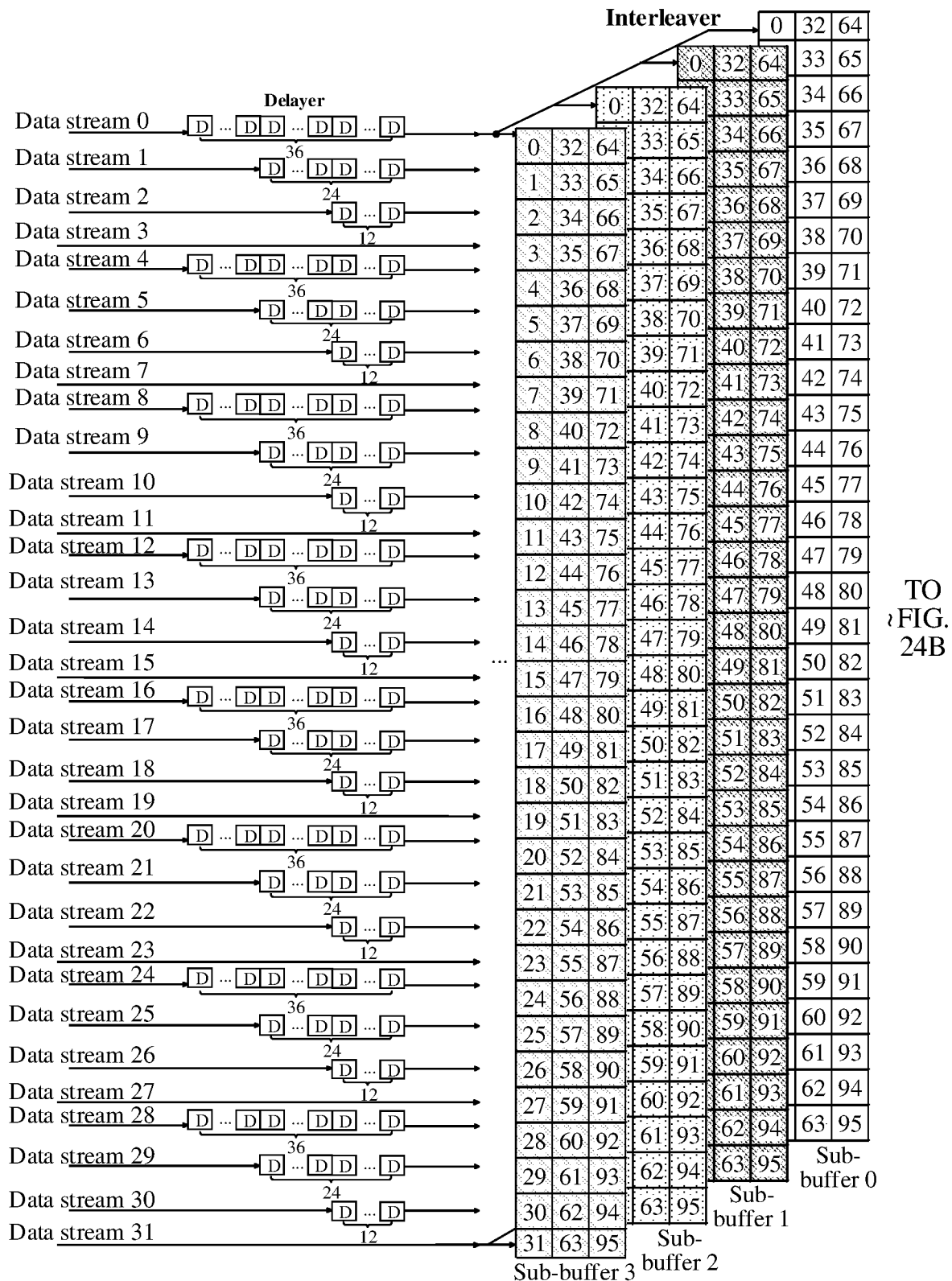
FIG. 24A and FIG. 24B are a schematic diagram of another application scenario of data interleaving according to an embodiment of this application.
Figure 24B:
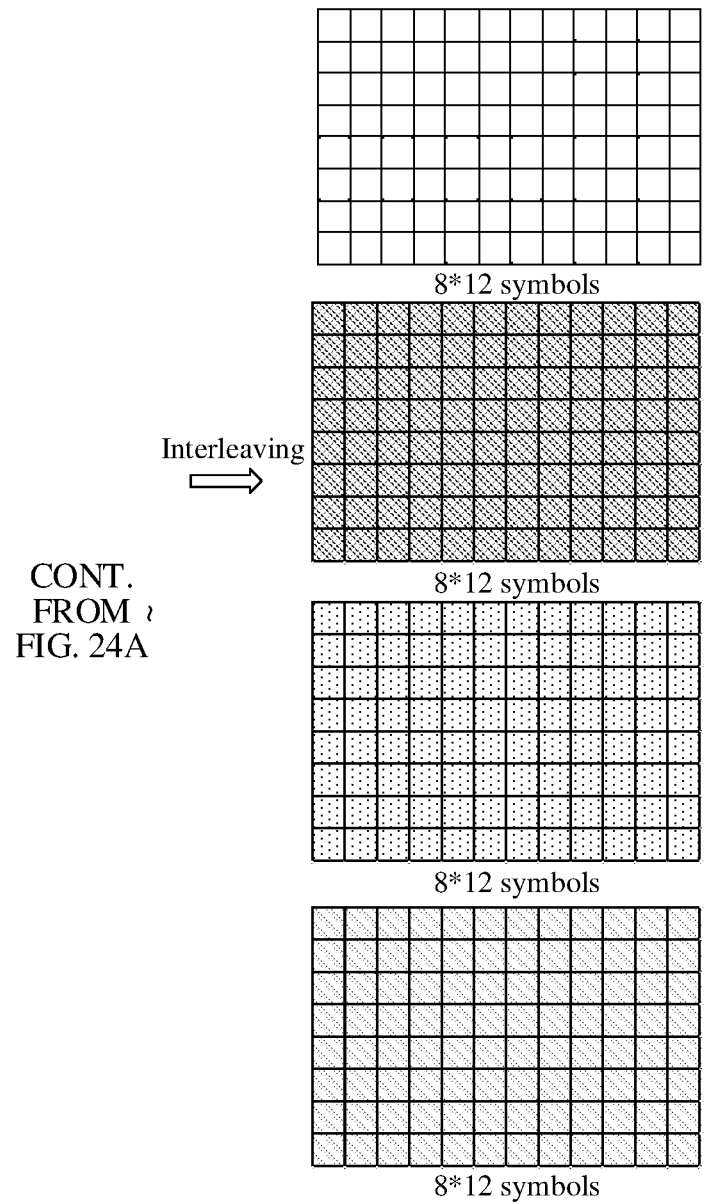

Application scenario 3: FIG. 24A and FIG. 24B are a schematic diagram of another application scenario of data interleaving according to an embodiment of this application. As shown in FIG. 24A and FIG. 24B, different from the foregoing application scenario 1, in this application scenario 3, Q=12 and d=12. Specifically, a delayer outputs d=12 symbols from a rightmost storage element of each delay line to obtain 32*12=384 symbols. Correspondingly, a symbol stored in a storage element in each delay line is shifted rightwards by d=12 symbols. Further, d=12 symbols are obtained from each of 32 data streams, and are separately written into leftmost storage elements in 32 delay lines. A total of 32*12=384 symbols are written into a buffer of an interleaver, and are stored in four sub-buffers of the interleaver. Each sub-buffer stores 32*3=96 symbols, in other words, each sub-buffer stores one first symbol matrix. The interleaver separately interleaves the four first symbol matrices to obtain four second symbol matrices, and each second symbol matrix includes 8*12=96 symbols.

It should be noted that the 12 symbols that are output by the delayer and that are from data stream h (0≤h<32) are written into rows h of the four sub-buffers of the interleaver, to be specific, three symbols are written into row h of each sub-buffer. A writing manner is as follows: Symbol 0, symbol 1, and symbol 2 from data stream h are separately written into row h of sub-buffer 0; symbol 3, symbol 4, and symbol 5 from data stream h are separately written into row h of sub-buffer 1; symbol 6, symbol 7, and symbol 8 from data stream h are separately written into row h of sub-buffer 2; and symbol 9, symbol 10, and symbol 11 from data stream h are separately written into row h of sub-buffer 3. Another writing manner is as follows: Symbol 0, symbol 1, and symbol 2 from data stream h are separately written into row h of sub-buffer 3; symbol 3, symbol 4, and symbol 5 from data stream h are separately written into row h of sub-buffer 2; symbol 6, symbol 7, and symbol 8 from data stream h are separately written into row h of sub-buffer 1; and symbol 9, symbol 10, and symbol 11 from data stream h are separately written into row h of sub-buffer 0. In addition, for the three symbols written into the sub-buffer once, the three symbols may be respectively written into column 0, column 1, and column 2 of row h in the sub-buffer, or may be respectively written into column 2, column 1, and column 0 of row h in the sub-buffer.

The data interleaving method in the application scenario 3 is similar to the data interleaving method described in the foregoing application scenario 1, and details are not described herein again. The interleaver outputs 32 rows of symbols in total, where each row includes 12 symbols. The encoder separately performs FEC encoding on the 32 rows of symbols to obtain 32 inner-code codewords in total. In a possible implementation, inner-code encoding is performed by using Hamming(128,120), and 32*128=4096 bits are obtained through the inner-code encoding.

In a possible implementation, based on the application scenario 2 in which the interleaver outputs eight rows of symbols in total and the application scenario 3 in which the interleaver outputs 32 rows of symbols in total, a case in which the interleaver outputs 16 rows or 24 rows of symbols in total may further be extended. To enable 12 symbols of each inner-code codeword information bit are from 12 different outer-code codewords, V=Q*d≥136 needs to be satisfied, and Q*d is an even number.

In a scenario in which the interleaver outputs 16 rows of symbols in total, Q=23 and d=6. Specifically, the delayer outputs d=6 symbols from the rightmost storage element of each delay line to obtain 32*6=192 symbols. A total of 192 symbols are written into the buffer of the interleaver, and are stored in two sub-buffers of the interleaver. Each sub-buffer stores 96 symbols, in other words, each sub-buffer stores one first symbol matrix. The interleaver separately interleaves the two first symbol matrices to obtain two second symbol matrices, and each second symbol matrix includes 96 symbols. According to the data interleaving method described in the foregoing application scenario 1, the interleaver outputs 16 rows of symbols in total, where each row includes 12 symbols. The encoder separately performs FEC encoding on the 16 rows of symbols to obtain 16 inner-code codewords in total. In a possible implementation, inner-code encoding is performed by using Hamming(128,120), and 16*128=2048 bits are obtained through the inner-code encoding.

In a scenario in which the interleaver outputs 24 rows of symbols in total, Q=16 and d=9. Specifically, the delayer outputs d=9 symbols from the rightmost storage element of each delay line to obtain 32*6=288 symbols. A total of 288 symbols are written into the buffer of the interleaver, and are stored in three sub-buffers of the interleaver. Each sub-buffer stores 96 symbols, in other words, each sub-buffer stores one first symbol matrix. The interleaver separately interleaves the three first symbol matrices to obtain three second symbol matrices, and each second symbol matrix includes 96 symbols. According to the data interleaving method described in the foregoing application scenario 1, the interleaver outputs 24 rows of symbols in total, where each row includes 12 symbols. The encoder separately performs FEC encoding on the 24 rows of symbols to obtain 24 inner-code codewords in total. In a possible implementation, inner-code encoding is performed by using Hamming(128,120), and 24*128=3072 bits are obtained through the inner-code encoding.

In the application scenario 3, there are 32 delay lines in the convolutional interleaver, the highest delay is 3Q*d=432 symbols, and the delay is low. When Hamming(128,120) is used for the inner-code encoding, each Hamming information bit has 12 symbols in total. For a 1*800G interface, 2*400G interfaces, 4*200G interfaces, or 8*100G interfaces with each lane of 100 Gb/s on a client side, the 12 symbols in each Hamming information bit are from 12 different outer-code codewords. This ensures good performance of an overall cascade FEC solution.

Figure 25A:
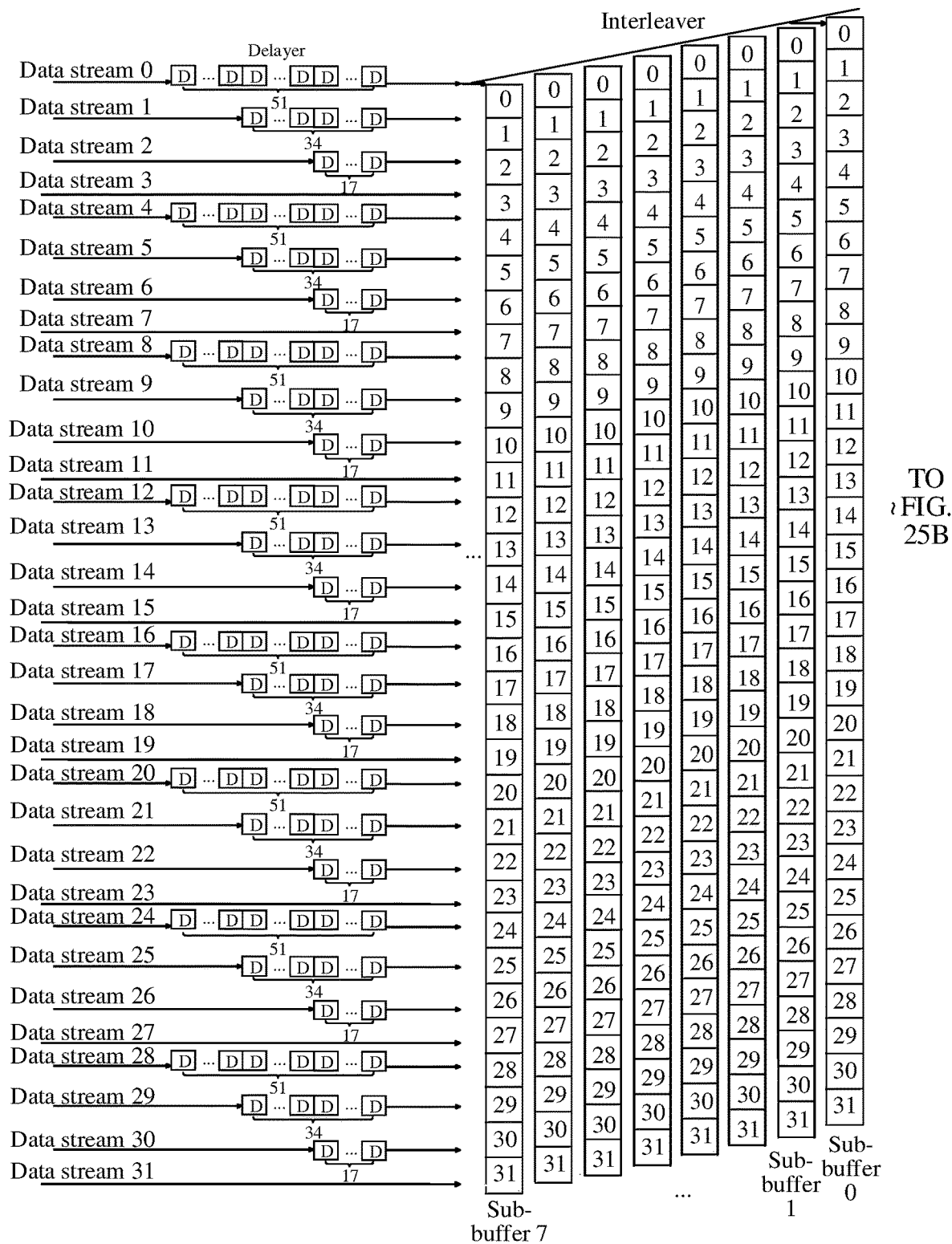
FIG. 25A and FIG. 25B are a schematic diagram of another application scenario of data interleaving according to an embodiment of this application.
Figure 25B:
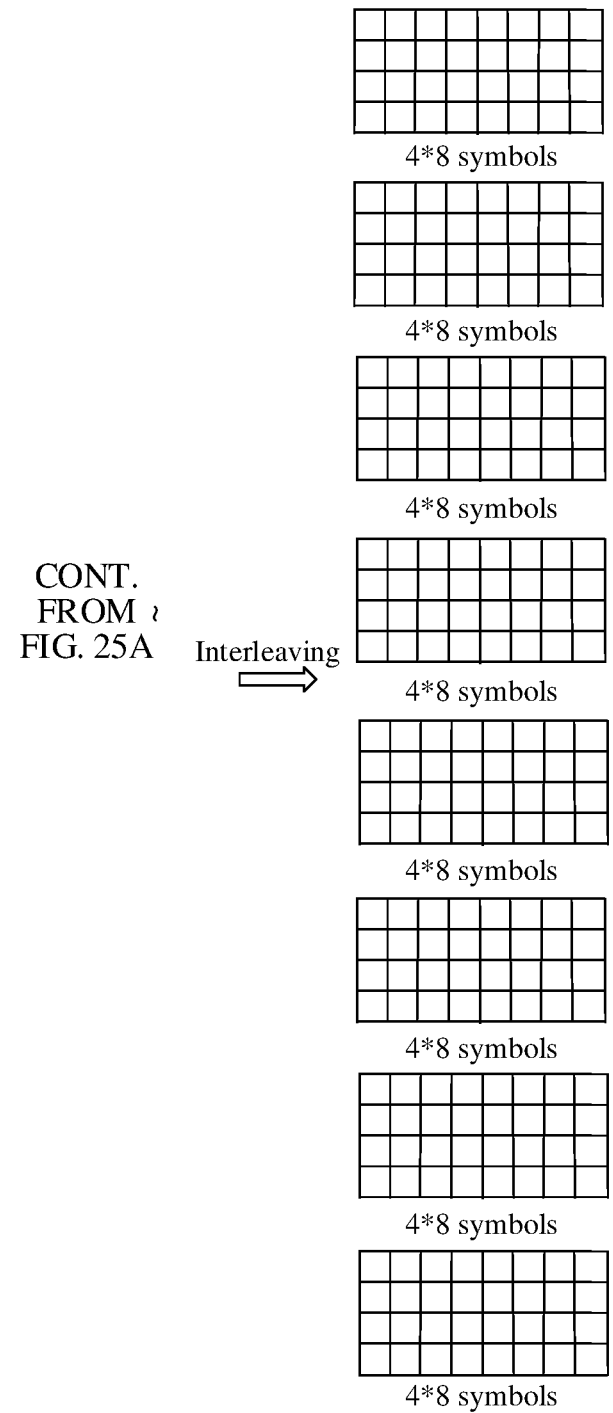

Application scenario 4: FIG. 25A and FIG. 25B are a schematic diagram of another application scenario of data interleaving according to an embodiment of this application. As shown in FIG. 25A and FIG. 25B, in this application scenario 4, Q=17 and d=8. Specifically, a delayer outputs d=8 symbols from a rightmost storage element of each delay line to obtain 32*8=256 symbols. Correspondingly, a symbol stored in a storage element in each delay line is shifted rightwards by d=8 symbols. Further, d=8 symbols are obtained from each of 32 data streams, and are separately written into leftmost storage elements in 32 delay lines. A total of 32*8=256 symbols are written into a buffer of an interleaver, and are stored in eight sub-buffers of the interleaver. Each sub-buffer stores 32*1=32 symbols, in other words, each sub-buffer stores one first symbol matrix. The interleaver separately interleaves the eight first symbol matrices to obtain eight second symbol matrices, where each second symbol matrix includes 4*8=32 symbols.

It should be noted that the eight symbols that are output by the delayer and that are from data stream h (0≤h<32) are written into rows h of the eight sub-buffers of the interleaver, to be specific, one symbol is written into row h of each sub-buffer. A writing manner is as follows: Symbol t (0≤t<8) from data stream h is written into row h of sub-buffer t. Another writing manner is as follows: Symbol t (0≤t<8) from data stream h is written into row h of sub-buffer 7-t.

It should be noted that each group of four symbols in each row of eight symbols in the second symbol matrix is from four symbols in one group in column 0 of the first symbol matrix, and two groups of symbols in the second symbol matrix are from two groups of symbols in different rows of the first symbol matrix. In a possible implementation, eight symbols in one row of the second symbol matrix respectively correspond to four symbols in group a in column 0 of the first symbol matrix and four symbols in group b in column 0 of the first symbol matrix, where 0≤a<4 and 4≤b<8.

Further, a symbol in row i and column j of the second symbol matrix corresponds to a symbol in row x and column 0 of the first symbol matrix. x=(4*i+⌊j/4⌋*G+j %4)%16+⌊j/4⌋*16, where a value of G may be 0, 4, 8, 12, 0≤i<4, 0≤j<8, Y % Z represents a remainder obtained by dividing Y by Z, and ⌊Y/Z⌋ represents a quotient obtained by dividing Y by Z. Based on this calculation manner, when G is 0, a second symbol matrix shown in Table 23 may be obtained.

TABLE 23

| 0  | 1  | 2  | 3  | 16 | 17 | 18 | 19 |
| 4  | 5  | 6  | 7  | 20 | 21 | 22 | 23 |
| 8  | 9  | 10 | 11 | 24 | 25 | 26 | 27 |
| 12 | 13 | 14 | 15 | 28 | 29 | 30 | 31 |

The interleaver outputs 32 rows of symbols in total, where each row includes 12 symbols. An encoder separately performs FEC encoding on the 32 rows of symbols to obtain 32 inner-code codewords in total. In a possible implementation, inner-code encoding is performed by using Hamming(87, 80), and 32*87=2784 bits are obtained through the inner-code encoding. In another possible implementation, inner-code encoding is performed by using BCH(94,80), and 32*94=3008 bits are obtained through the inner-code encoding.

In the application scenario 4, there are 32 delay lines in the convolutional interleaver, the highest delay is 3Q*d=408 symbols, and the delay is low. When Hamming(87,80) is used for the inner-code encoding, each Hamming information bit has 8 symbols in total. For a 1*800G interface, 2*400G interfaces, 4*200G interfaces, or 8*100G interfaces with each lane of 100 Gb/s on a client side, the eight symbols in each Hamming information bit are from eight different outer-code codewords. This ensures good performance of an overall cascade FEC solution.

Figure 26A:
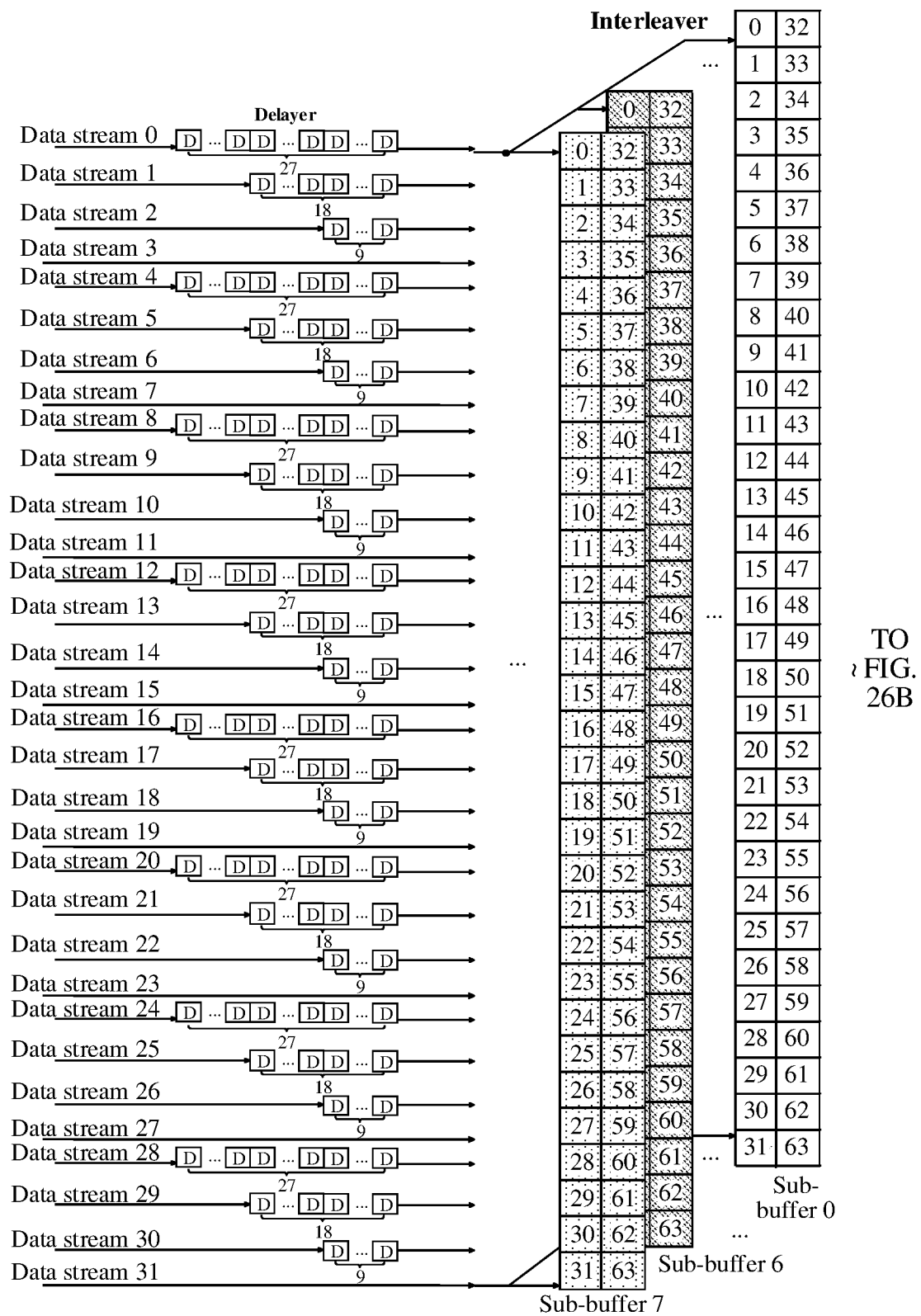
FIG. 26A and FIG. 26B are a schematic diagram of another application scenario of data interleaving according to an embodiment of this application.
Figure 26B:
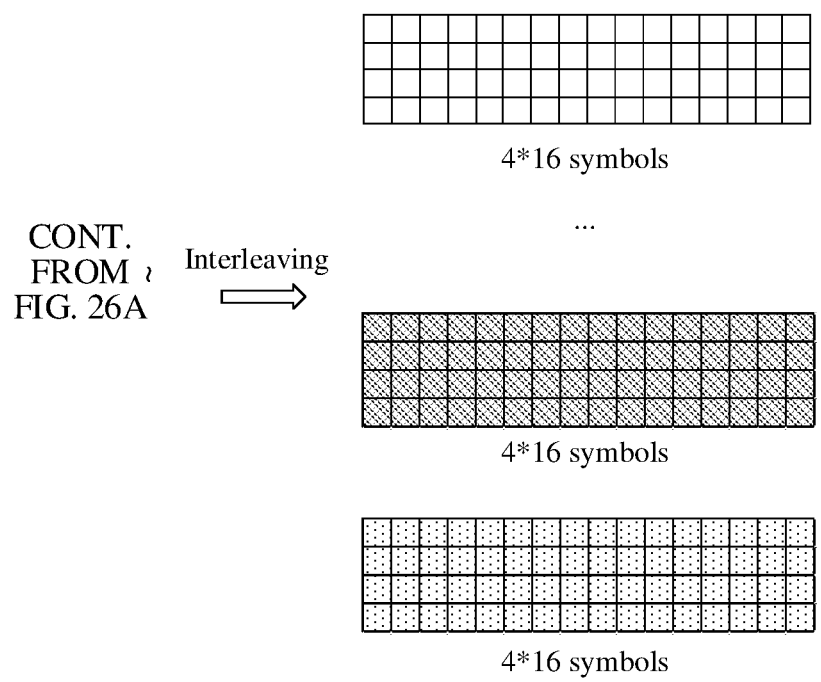

Application scenario 5: FIG. 26A and FIG. 26B are a schematic diagram of another application scenario of data interleaving according to an embodiment of this application. As shown in FIG. 26A and FIG. 26B, in this application scenario 5, Q=9 and d=16. Specifically, a delayer outputs d=16 symbols from a rightmost storage element of each delay line to obtain 32*16=512 symbols. Correspondingly, a symbol stored in a storage element in each delay line is shifted rightwards by d=16 symbols. Further, d=16 symbols are obtained from each of 32 data streams, and are separately written into leftmost storage elements in 32 delay lines. A total of 32*16=512 symbols are written into a buffer of an interleaver, and are stored in eight sub-buffers of the interleaver. Each sub-buffer stores 32*2=64 symbols, in other words, each sub-buffer stores one first symbol matrix. The interleaver separately interleaves the eight first symbol matrices to obtain eight second symbol matrices, where each second symbol matrix includes 4*16=64 symbols.

It should be noted that the 16 symbols that are output by the delayer and that are from data stream h (0≤h<32) are written into rows h of the eight sub-buffers of the interleaver, to be specific, two symbols are written into row h of each sub-buffer. A writing manner is as follows: Symbol 0 and symbol 1 from data stream h are separately written into row h of sub-buffer 0; symbol 2 and symbol 3 from data stream h are separately written into row h of sub-buffer 1; symbol 4 and symbol 5 from data stream h are separately written into row h of sub-buffer 2; symbol 6 and symbol 7 from data stream h are separately written into row h of sub-buffer 3; symbol 8 and symbol 9 from data stream h are separately written into row h of sub-buffer 4; symbol 10 and symbol 11 from data stream h are separately written into row h of sub-buffer 5; symbol 12 and symbol 13 from data stream h are separately written into row h of sub-buffer 6; and symbol 14 and symbol 15 from data stream h are separately written into row h of sub-buffer 7. Another writing manner is as follows: Symbol 0 and symbol 1 from data stream h are separately written into row h of sub-buffer 7; symbol 2 and symbol 3 from data stream h are separately written into row h of sub-buffer 6; symbol 4 and symbol 5 from data stream h are separately written into row h of sub-buffer 5; symbol 6 and symbol 7 from data stream h are separately written into row h of sub-buffer 4; symbol 8 and symbol 9 from data stream h are separately written into row h of sub-buffer 3; symbol 10 and symbol 11 from data stream h are separately written into row h of sub-buffer 2; symbol 12 and symbol 13 from data stream h are separately written into row 1 of sub-buffer 6; and symbol 14 and symbol 15 from data stream h are separately written into row h of sub-buffer 0. In addition, for the two symbols written into the sub-buffer once, the two symbols may be respectively written into column 0 and column 1 of row h in the sub-buffer, or may be respectively written into column 1 and column 0 of row h in the sub-buffer.

It should be noted that each group of four symbols in each row of 16 symbols in the second symbol matrix is from four symbols in one group in one column of the first symbol matrix, and any two groups of symbols in each row of four groups of symbols in the second symbol matrix are from two groups of symbols in different rows of the first symbol matrix. In a possible implementation, 16 symbols in one row of the second symbol matrix respectively correspond to four symbols in group a in column 0 of the first symbol matrix, four symbols in group b in column 0 of the first symbol matrix, four symbols in group e in column 1 of the first symbol matrix, and four symbols in group f in column 1 of the first symbol matrix, where a, b, e, and f are not equal to each other; and $0 \leq a < 4$, $0 \leq e < 4$, $4 \leq b < 8$, and $4 \leq f < 8$.

Further, a symbol in row i and column j of the second symbol matrix corresponds to a symbol in row x %32 and column $\lfloor x/32 \rfloor$ of the first symbol matrix. $x = (4*i + \lfloor j/8 \rfloor *8 + j \%4)\%16 + \lfloor j/4 \rfloor *16$, where $0 \leq i < 4$, $0 \leq j < 16$, Y % Z represents a remainder obtained by dividing Y by Z, and $\lfloor Y/Z \rfloor$ represents a quotient obtained by dividing Y by Z. Based on this calculation manner, a second symbol matrix shown in Table 24 may be obtained.

TABLE 24

| 0 | 1 | 2 | 3 | 16 | 17 | 18 | 19 | 40 | 41 | 42 | 43 | 56 | 57 | 58 | 59 |
|---|---|---|---|----|----|----|----|----|----|----|----|----|----|----|----|
| 4 | 5 | 6 | 7 | 20 | 21 | 22 | 23 | 44 | 45 | 46 | 47 | 60 | 61 | 62 | 63 |
| 8 | 9 | 10 | 11 | 24 | 25 | 26 | 27 | 32 | 33 | 34 | 35 | 48 | 49 | 50 | 51 |
| 12 | 13 | 14 | 15 | 28 | 29 | 30 | 31 | 36 | 37 | 38 | 39 | 52 | 53 | 54 | 55 |

The interleaver outputs 32 rows of symbols in total, where each row includes 16 symbols. An encoder separately performs FEC encoding on the 32 rows of symbols to obtain 32 inner-code codewords in total. In a possible implementation, inner-code encoding is performed by using Hamming(170, 160), and 32*170=5440 bits are obtained through the inner-code encoding.

In a possible implementation, based on an application scenario 8 in which the interleaver outputs 32 rows of symbols in total, cases in which the interleaver outputs four rows, eight rows, 12 rows, 16 rows, 20 rows, 24 rows, or 28 rows of symbols in total may further be extended. To enable 16 symbols of each inner-code codeword information bit are from 16 different outer-code codewords, $Q*d \geq 136$ needs to be satisfied, and $Q*d$ is an even number.

In a scenario in which the interleaver outputs eight rows of symbols in total, Q=34 and d=4. Specifically, the delayer outputs d=4 symbols from the rightmost storage element of each delay line to obtain 32*4=128 symbols. A total of 128 symbols are written into the buffer of the interleaver. The interleaver interleaves one first symbol matrix to obtain one second symbol matrix. According to the data interleaving method described in the foregoing application scenario 1, the interleaver outputs eight rows of symbols in total, where each row includes 16 symbols. The encoder separately performs FEC encoding on the eight rows of symbols to obtain eight inner-code codewords in total. In a possible implementation, the inner-code encoding is performed by using Hamming(170,160), and 8*170=1360 bits are obtained through the inner-code encoding.

In a scenario in which the interleaver outputs 16 rows of symbols in total, Q=17 and d=8. Specifically, the delayer outputs d=8 symbols from the rightmost storage element of each delay line to obtain 32*8=256 symbols. A total of 256 symbols are written into the buffer of the interleaver, and are stored in two sub-buffers of the interleaver. Each sub-buffer stores 128 symbols, in other words, each sub-buffer stores one first symbol matrix. The interleaver separately interleaves the two first symbol matrices to obtain two second symbol matrices, and each second symbol matrix includes 128 symbols. According to the data interleaving method described in the foregoing application scenario 1, the interleaver outputs 16 rows of symbols in total, where each row includes 16 symbols. The encoder separately performs FEC encoding on the 16 rows of symbols to obtain 16 inner-code codewords in total. In a possible implementation, the inner-code encoding is performed by using Hamming(170,160), and 16*170=2720 bits are obtained through the inner-code encoding.

In the application scenario 5, there are 32 delay lines in the convolutional interleaver, the highest delay is 3Q*d=432 symbols, and the delay is low. When Hamming(170,160) is used for the inner-code encoding, each Hamming information bit has 16 symbols in total. For a 1*800G interface, 2*400G interfaces, 4*200G interfaces, or 8*100G interfaces with each lane of 100 Gb/s on a client side, the 16 symbols in each Hamming information bit are from 16 different outer-code codewords. This ensures good performance of an overall cascade FEC solution.

Figure 27:
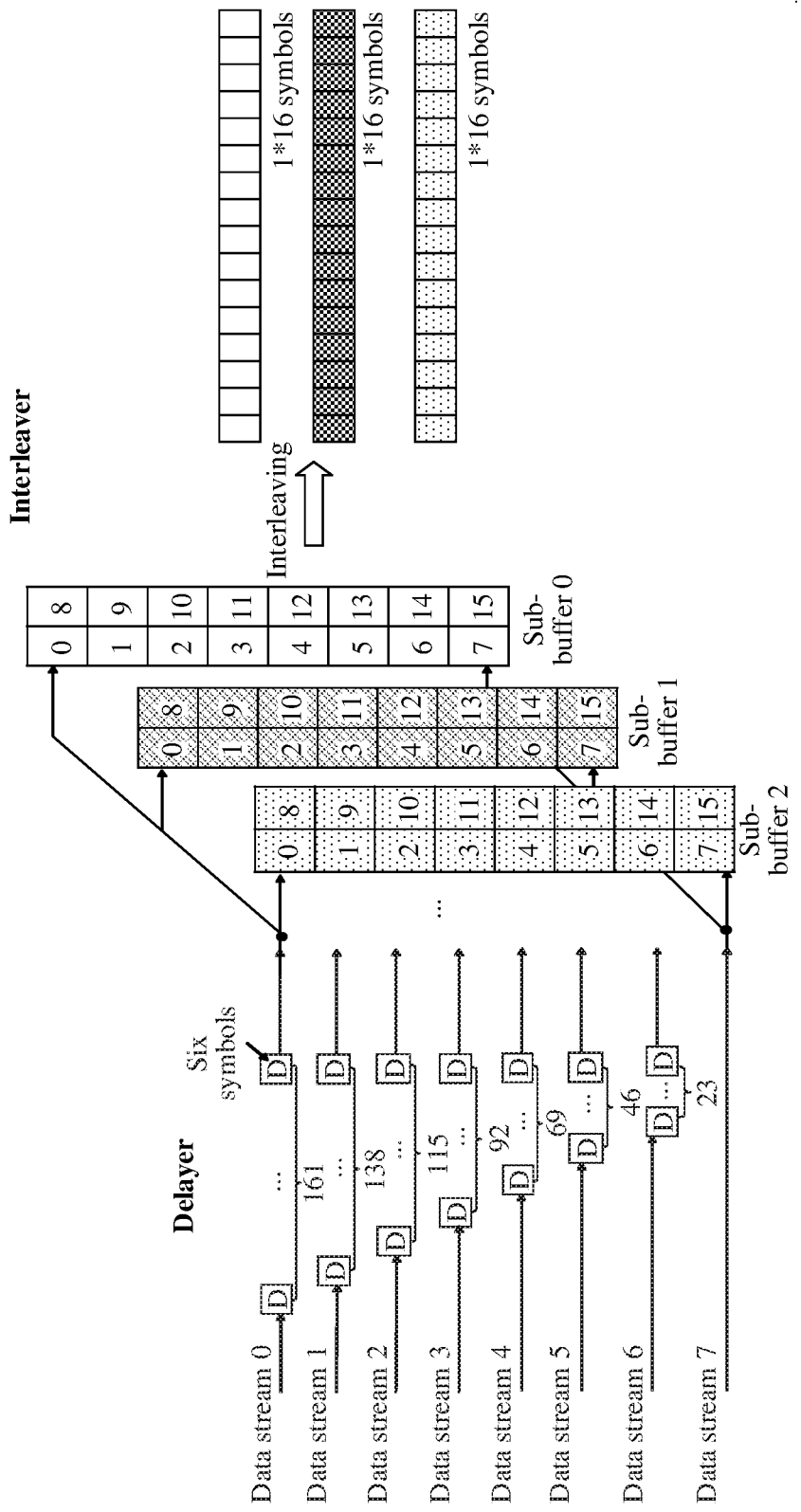
FIG. 27 is a schematic diagram of still another application scenario of data interleaving according to an embodiment of this application.

Application scenario 6: FIG. 27 is a schematic diagram of still another application scenario of data interleaving according to an embodiment of this application. As shown in FIGS. 27, A=2, B=136, n=8, p=8, and g=1. To be specific, a transmit-end device performs KP4 RS(544,514) outer-code encoding on a to-be-transmitted service data stream to obtain eight PCS lane data streams, where every two outer-code codewords are distributed in the 8 lane data streams. Specifically, in the eight PCS lane data streams, each data stream is separated by 136 symbols, and there are 1088 symbols in total, including two RS codewords. Two adjacent symbols in each PCS lane data stream are from two different RS codewords, and two symbols at same locations of two adjacent PCS lane data streams are from two different RS codewords. The eight data streams respectively correspond to eight delay lines. The delay line may include 0, Q, 2Q, 3Q, 4Q, 5Q, 6Q, or 7Q storage elements D, and each storage element D may store d symbols. In other words, a delay value of the delay line may be 0, V symbols, 2V symbols, 3V symbols, 4V symbols, 5V symbols, 6V symbols, or 7V symbols, where V=Q*d≥136. d symbols are output from each delay line through one delaying operation. When d≤L*m, the delaying operation may be repeatedly performed for φ times to obtain φ*d symbols, where φ*d≥L*m, and φ is a positive integer. For ease of hardware implementation, an integer d is usually selected as a multiple of an integer m. It should be understood that structural distribution of the eight delay lines in FIG. 27 is merely an example, and may be changed based on the manners described in FIG. 19 and FIG. 20. Details are not described herein again.

As shown in FIG. 27, in this embodiment, L=3, d=6, Q=23, m=2, and c=16 are used. An interleaver obtains six symbols from each of eight delayed data streams, to obtain three first symbol matrices. Each first symbol matrix includes a total of 16 symbols in eight rows and two columns, and each second symbol matrix includes a total of 16 symbols in one row and 16 columns. 16 symbols in one row of the second symbol matrix are from eight rows and two columns of the first symbol matrix. A possible interleaving rule is that a symbol in column j of the second symbol matrix corresponds to a symbol in row x %8 and column ⌊x/8⌋ of the first symbol matrix, where x=⌊j/2⌋+⌊j %2⌋*8, 0≤j<16, Y % Z represents a remainder obtained by dividing Y by Z, and ⌊Y/Z⌋ represents a quotient obtained by dividing Y by Z. Another possible interleaving rule is that a symbol in column j of the second symbol matrix corresponds to a symbol in row j %8 and column ⌊j/8⌋ of the first symbol matrix. After the interleaver outputs three second symbol matrices, an inner-code encoding apparatus performs inner-code encoding on 16 symbols in each row of the three second symbol matrices to obtain three codewords. When Hamming(170,160) is used for the inner-code encoding, the inner-code encoding is performed on 48 symbols, which are 480 bits in total, output by the interleaver, and three inner-code codewords, which are 3*170=510 bits in total, may be obtained.

The foregoing example provides an implementation in which L=3. Based on this, an implementation in which L≥1 may be further extended. This is an extension of an application scenario. For a specific implementation, refer to the foregoing descriptions. Details are not described herein again. The following provides several typical parameter combinations.

L=1, d=2, Q=68, and V=Q*d=136. The interleaver outputs L 1*16 second symbol matrices, where L=1, and inner-code encoding is performed to obtain one inner-code codeword.

L=2, d=4, Q=34, and V=Q*d=136. The interleaver outputs L 1*16 second symbol matrices, where L=2, and inner-code encoding is performed to obtain two inner-code codewords.

L=4, d=8, Q=17, and V=Q*d=136. The interleaver outputs L 1*16 second symbol matrices, where L=4, and inner-code encoding is performed to obtain four inner-code codewords.

L=5, d=10, Q=14, and V=Q*d=140. The interleaver outputs L 1*16 second symbol matrices, where L=5, and inner-code encoding is performed to obtain five inner-code codewords.

L=6, d=12, Q=12, and V=Q*d=144. The interleaver outputs L 1*16 second symbol matrices, where L=6, and inner-code encoding is performed to obtain six inner-code codewords.

L=7, d=14, Q=10, and V=Q*d=140. The interleaver outputs L 1*16 second symbol matrices, where L=7, and inner-code encoding is performed to obtain seven inner-code codewords.

L=8, d=16, Q=9, and V=Q*d=144. The interleaver outputs L 1*16 second symbol matrices, where L=8, and inner-code encoding is performed to obtain eight inner-code codewords.

In the application scenario 6, when Hamming(170,160) is used for performing inner-code encoding, a total of 16 symbols in each Hamming information bit are from 16 different outer-code codewords, so that performance of an overall cascaded FEC solution is good. When BCH(176, 160) is used for performing inner-code encoding, a total of 16 symbols of each BCH information bit are from 16 different outer-code codewords, so that performance of an overall cascaded FEC solution is good.

Figure 28:
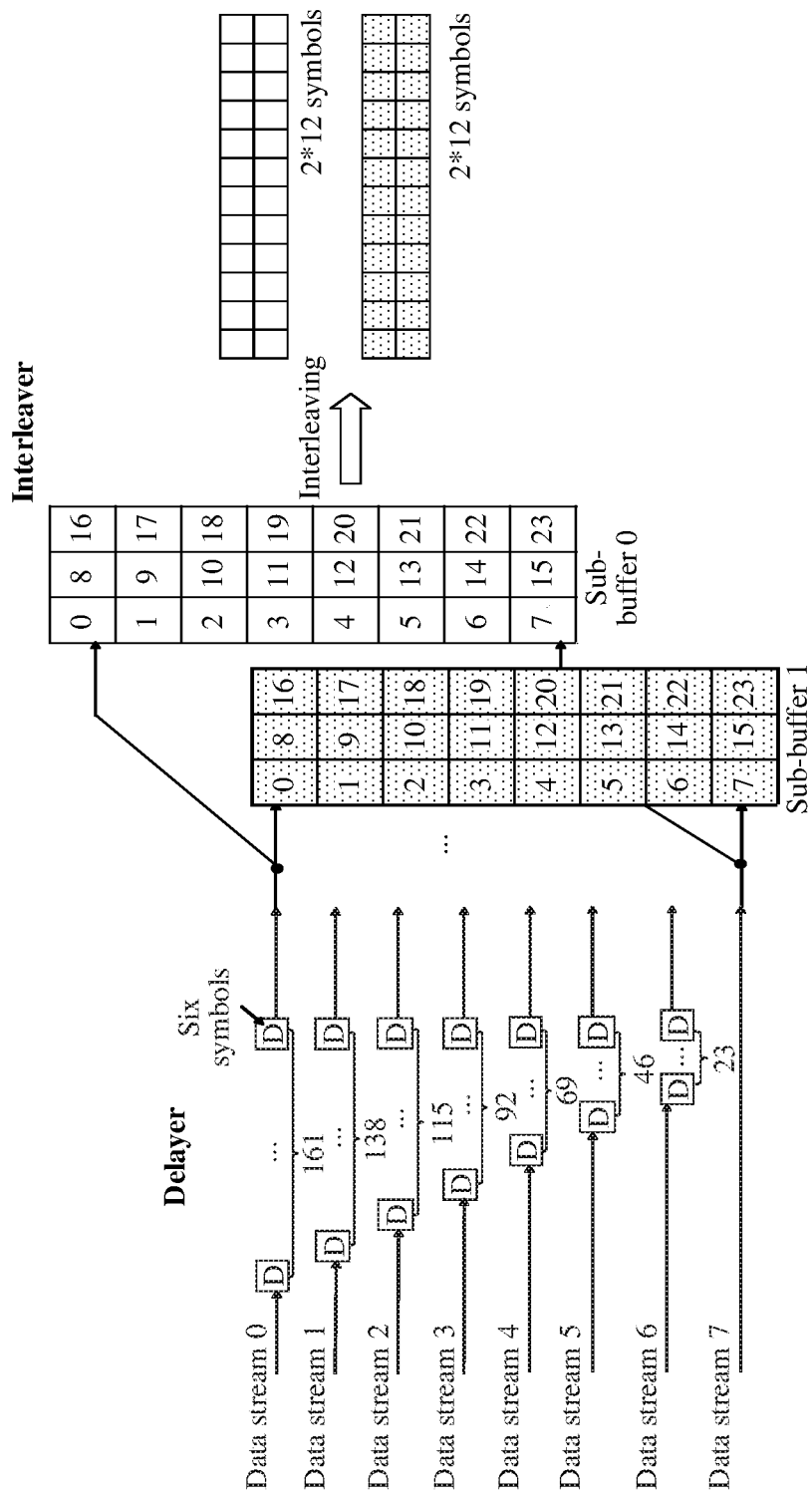
FIG. 28 is a schematic diagram of yet another application scenario of data interleaving according to an embodiment of this application.

Application scenario 7: FIG. 28 is a schematic diagram of yet another application scenario of data interleaving according to an embodiment of this application. As shown in FIGS. 28, A=2, B=136, n=8, p=8, and g=1. Eight data streams respectively correspond to eight delay lines. The delay line may include 0, Q, 2Q, 3Q, 4Q, 5Q, 6Q, or 7Q storage elements D, and each storage element D may store d symbols. In other words, a delay value of the delay line may be 0, V symbols, 2V symbols, 3V symbols, 4V symbols, 5V symbols, 6V symbols, or 7V symbols, where V=Q*d≥136. It should be understood that structural distribution of the eight delay lines in FIG. 28 is merely an example, and may be changed based on the manners described in FIG. 19 and FIG. 20. Details are not described herein again.

Different from the application scenario 6, as shown in FIG. 28, in this embodiment, L=2, d=6, Q=23, m=3, and c=12 are used. An interleaver obtains six symbols from each of eight delayed data streams, to obtain two first symbol matrices. Each first symbol matrix includes a total of 24 symbols in eight rows and three columns, and each second symbol matrix includes a total of 24 symbols in two rows and 12 columns. 12 symbols in one row of the second symbol matrix are from 12 symbols in 16 symbols in two columns of the first symbol matrix. A possible interleaving rule is that a symbol in row i and column j of the second symbol matrix corresponds to a symbol in row x %8 and column ⌊x/8⌋ of the first symbol matrix, where x=i*12+j, 0≤i<2, 0≤j<16, Y % Z represents a remainder obtained by dividing Y by Z, and ⌊Y/Z⌋ represents a quotient obtained by dividing Y by Z. After the interleaver outputs two second symbol matrices, an inner-code encoding apparatus performs inner-code encoding on 12 symbols in each row of the two second symbol matrices to obtain four inner-code codewords. When Hamming(128,120) is used for the inner-code encoding, the inner-code encoding is performed on 48 symbols, which are 480 bits in total, output by the interleaver, and four inner-code codewords, which are 4*128=512 bits in total, may be obtained.

The foregoing example provides an implementation in which L=2. Based on this, an implementation in which L≥1 may be further extended. This is an extension of an application scenario. For a specific implementation, refer to the foregoing descriptions. Details are not described herein again. The following provides several typical parameter combinations.

L=1, d=3, Q=46, and V=Q*d=138. The interleaver outputs L 2*12 second symbol matrices, where L=1, and inner-code encoding is performed to obtain two inner-code codewords.

L=3, d=9, Q=16, and V=Q*d=144. The interleaver outputs L 2*12 second symbol matrices, where L=3, and inner-code encoding is performed to obtain six inner-code codewords.

L=4, d=12, Q=6, and V=Q*d=144. The interleaver outputs L 2*12 second symbol matrices, where L=4, and inner-code encoding is performed to obtain eight inner-code codewords.

L=5, d=15, Q=10, and V=Q*d=150. The interleaver outputs L 2*12 second symbol matrices, where L=5, and inner-code encoding is performed to obtain 10 inner-code codewords.

L=6, d=18, Q=8, and V=Q*d=144. The interleaver outputs L 2*12 second symbol matrices, where L=6, and inner-code encoding is performed to obtain 12 inner-code codewords.

L=7, d=21, Q=7, and V=Q*d=147. The interleaver outputs L 2*12 second symbol matrices, where L=7, and inner-code encoding is performed to obtain 14 inner-code codewords.

L=8, d=24, Q=6, and V=Q*d=144. The interleaver outputs L 2*12 second symbol matrices, where L=8, and inner-code encoding is performed to obtain 16 inner-code codewords.

In the application scenario 7, when Hamming(128,120) is used for performing inner-code encoding, a total of 12 symbols in each Hamming information bit are from 12 different outer-code codewords, so that performance of an overall cascaded FEC solution is good.

It should be noted that the foregoing application scenario 6 and 7 provide cases in which inner-code information symbol lengths c are 16 and 12 symbols, and other cases in which inner-code information symbol lengths are 9, 10, 11, 13, 14, and 15 may further be extended. After the eight data streams are delayed, 16 symbols output each time are from 16 different RS codeword symbols, where the 16 symbols are from the eight delayed data streams, and each data stream provides two symbols. With reference to the foregoing features, the interleaver may be designed, so that c symbols output by the interleaver in each row are from c different RS codeword symbols. One interleaving manner is that the first symbol matrix includes eight rows and m columns, the second symbol matrix includes r rows and c columns, and 8*m=r*c. The c symbols in one row of the second symbol matrix are from c symbols in a total of 16 symbols in two columns of the first symbol matrix. The following provides a specific interleaving manner. c symbols are sequentially obtained from 8*m symbols in the first symbol matrix from top to bottom and then from left to right, as one row of the second symbol matrix, to obtain r rows of the second symbol matrix in total. More specifically, the following provides several typical parameter combinations: {m=9, r=8*g, c=9}, {m=5, r=4*g, c=10}, {m=11, r=8*g, c=11}, {m=13, r=8*g, c=13}, {m=7, r=4*g, c=14}, and {m=15, r=8*g, c=15}.

Figure 29:
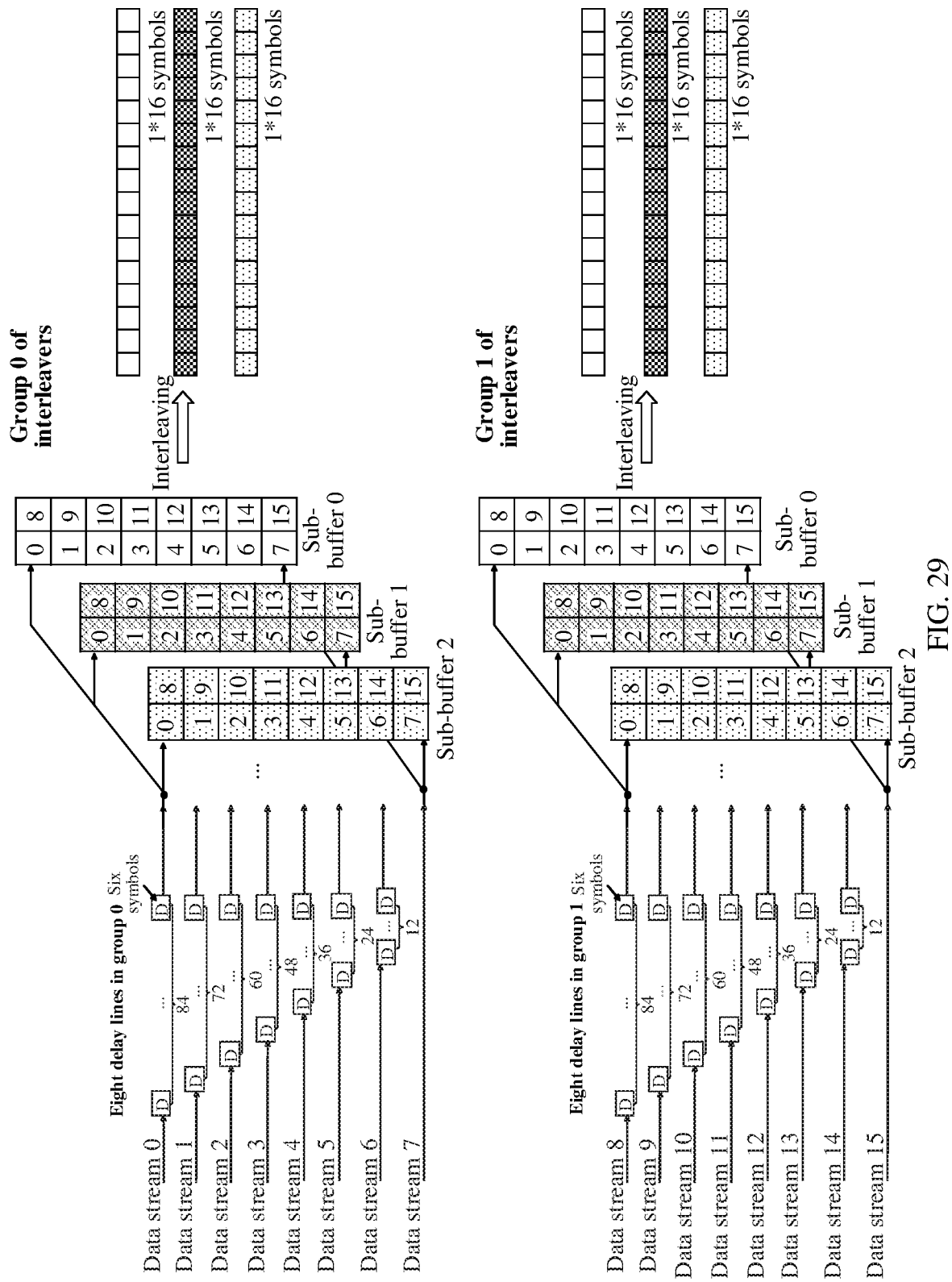
FIG. 29 is a schematic diagram of still another application scenario of data interleaving according to an embodiment of this application.

Application scenario 8: FIG. 29 is a schematic diagram of still another application scenario of data interleaving according to an embodiment of this application. As shown in FIGS. 29, A=2, B=68, n=16, p=8, and g=2. To be specific, a transmit-end device performs KP4 RS(544,514) outer-code encoding on a to-be-transmitted service data stream to obtain 16 PCS lane data streams, where every two outer-code codewords are distributed in the 16 lane data streams. Specifically, in the 16 PCS lane data streams, each data stream is separated by 68 symbols, and there are 1088 symbols in total, including two RS codewords. Two adjacent symbols in each PCS lane data stream are from two different RS codewords, and two symbols at same locations of two adjacent PCS lane data streams are from two different RS codewords. The 16 data streams respectively correspond to 16 delay lines. A delayer includes 16 delay lines, which may be divided into two groups of delay lines. Every eight delay lines form one group. The delay line in each group may include 0, Q, 2Q, 3Q, 4Q, 5Q, 6Q, or 7Q storage elements D, and each storage element D may store d symbols. In other words, a delay value of the delay line may be 0, V symbols, 2V symbols, 3V symbols, 4V symbols, 5V symbols, 6V symbols, or 7V symbols, where V=Q*d≥68. d symbols are output from each delay line through one delaying operation. When d≤L*m, the delaying operation may be repeatedly performed for φ times to obtain φ*d symbols, where φ*d≥L*m, and φ is a positive integer. For ease of hardware implementation, an integer d is usually selected as a multiple of an integer m. It should be understood that structural distribution of each group of eight delay lines in FIG. 29 is merely an example, and may be changed based on the manners described in FIG. 19 and FIG. 20. Details are not described herein again.

As shown in FIG. 29, in this embodiment, L=3, d=6, Q=12, m=2, and c=16 are used. An interleaver obtains six symbols from each of 16 delayed data streams, to obtain three first symbol matrices. The first symbol matrix includes two first symbol sub-matrices, and each first symbol sub-matrix includes a total of 16 symbols in eight rows and two columns. Correspondingly, a second symbol matrix includes two second symbol sub-matrices, and each second symbol sub-matrix includes a total of 16 symbols in one row and 16 columns. For two groups of interleavers, each group of interleavers interleaves three first symbol sub-matrices into three second symbol sub-matrices. The 16 symbols in one row of the second symbol sub-matrix are from eight rows and two columns of the first symbol sub-matrix. A possible interleaving rule is that a symbol in column j of the second symbol sub-matrix corresponds to a symbol in row x %8 and column ⌊x/8⌋ of the first symbol sub-matrix, where x=⌊j/2⌋+⌊j %2⌋*8, 0≤j<16, Y % Z represents a remainder obtained by dividing Y by Z, and ⌊Y/Z⌋ represents a quotient obtained by dividing Y by Z. Another possible interleaving rule is that a symbol in column j of the second symbol sub-matrix corresponds to a symbol in row j %8 and column ⌊j/8⌋ of the first symbol sub-matrix. After the interleaver outputs six second symbol sub-matrices, an inner-code encoding apparatus performs inner-code encoding on 16 symbols in each row of the six second symbol sub-matrices to obtain six inner-code codewords. When Hamming(170, 160) is used for the inner-code encoding, the inner-code encoding is performed on 96 symbols, which are 960 bits in total, output by the interleaver, and six inner-code codewords, which are 6*170=1020 bits in total, may be obtained.

The foregoing example provides an implementation in which L=3. Based on this, an implementation in which L≥1 may be further extended. This is an extension of an application scenario. For a specific implementation, refer to the foregoing descriptions. Details are not described herein again. The following provides several typical parameter combinations.

- L=1, d=2, Q=34, and V=Q*d=68. The interleaver outputs two 1*16 second symbol sub-matrices in total, and inner-code encoding is performed to obtain two inner-code codewords.
- L=2, d=4, Q=17, and V=Q*d=68. The interleaver outputs four 1*16 second symbol sub-matrices in total, and inner-code encoding is performed to obtain four inner-code codewords.
- L=4, d=8, Q=9, and V=Q*d=72. The interleaver outputs eight 1*16 second symbol sub-matrices in total, and inner-code encoding is performed to obtain eight inner-code codewords.
- L=5, d=10, Q=7, and V=Q*d=70. The interleaver outputs 10 1*16 second symbol sub-matrices in total, and inner-code encoding is performed to obtain 10 inner-code codewords.
- L=6, d=12, Q=6, and V=Q*d=72. The interleaver outputs 12 1*16 second symbol sub-matrices in total, and inner-code encoding is performed to obtain 12 inner-code codewords.
- L=7, d=14, Q=5, and V=Q*d=70. The interleaver outputs 14 1*16 second symbol sub-matrices in total, and inner-code encoding is performed to obtain 14 inner-code codewords.
- L=8, d=16, Q=5, and V=Q*d=80. The interleaver outputs 16 1*16 second symbol sub-matrices in total, and inner-code encoding is performed to obtain 16 inner-code codewords.

In the application scenario 8, when Hamming(170,160) is used for performing inner-code encoding, a total of 16 symbols in each Hamming information bit are from 16 different outer-code codewords, so that performance of an overall cascaded FEC solution is good.

Figure 30:
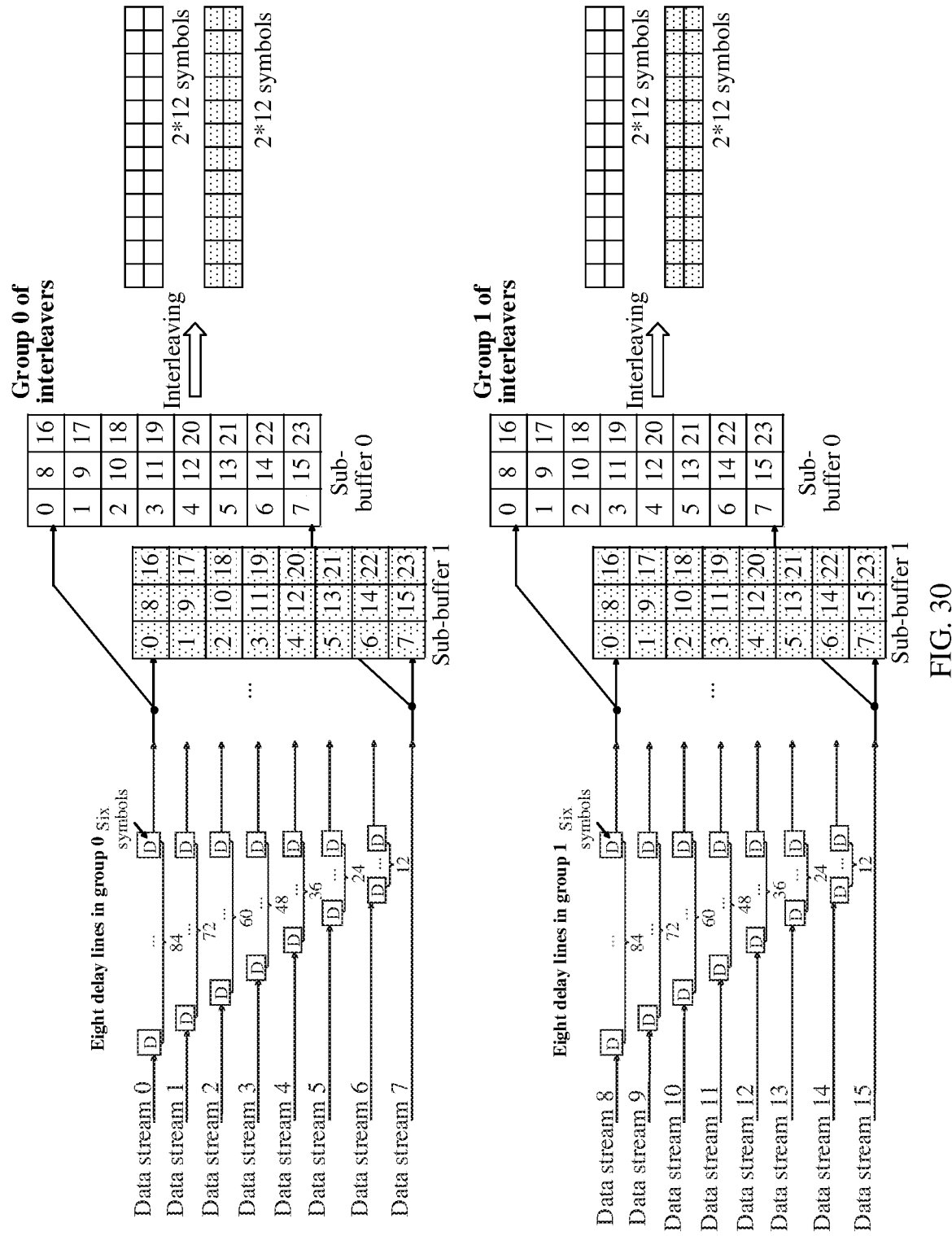
FIG. 30 is a schematic diagram of yet another application scenario of data interleaving according to an embodiment of this application.

Application scenario 9: FIG. 30 is a schematic diagram of yet another application scenario of data interleaving according to an embodiment of this application. As shown in FIGS. 30, A=2, B=68, n=16, p=8, and g=2. To be specific, a transmit-end device performs KP4 RS(544,514) outer-code encoding on a to-be-transmitted service data stream to obtain 16 PCS lane data streams, where every two outer-code codewords are distributed in the 16 lane data streams. Specifically, in the 16 PCS lane data streams, each data stream is separated by 68 symbols, and there are 1088 symbols in total, including two RS codewords. Two adjacent symbols in each PCS lane data stream are from two different RS codewords, and two symbols at same locations of two adjacent PCS lane data streams are from two different RS codewords. The 16 data streams respectively correspond to 16 delay lines. A delayer includes 16 delay lines, which may be divided into two groups of delay lines. Every eight delay lines form one group. The delay line in each group may include 0, Q, 2Q, 3Q, 4Q, 5Q, 6Q, or 7Q storage elements D, and each storage element D may store d symbols. In other words, a delay value of the delay line may be 0, V symbols, 2V symbols, 3V symbols, 4V symbols, 5V symbols, 6V symbols, or 7V symbols, where V=Q*d≥68. d symbols are output from each delay line through one delaying operation. When d≤L*m, the delaying operation may be repeatedly performed for φ times to obtain φ*d symbols, where φ*d≥L*m, and φ is a positive integer. For ease of hardware implementation, an integer d is usually selected as a multiple of an integer m. It should be understood that structural distribution of each group of eight delay lines in FIG. 30 is merely an example, and may be changed based on the manners described in FIG. 19 and FIG. 20. Details are not described herein again.

As shown in FIG. 30, in this embodiment, L=2, d=6, Q=12, m=3, and c=12 are used. An interleaver obtains six symbols from each of 16 delayed data streams, to obtain two first symbol matrices. The first symbol matrix includes two first symbol sub-matrices, and each first symbol sub-matrix includes a total of 24 symbols in eight rows and three columns. Correspondingly, a second symbol matrix includes two second symbol sub-matrices, and each second symbol sub-matrix includes a total of 24 symbols in two rows and 12 columns. For two groups of interleavers, each group of interleavers interleaves two first symbol sub-matrices into two second symbol sub-matrices. 12 symbols in one row of the second symbol sub-matrix are from 12 symbols in 16 symbols in two columns of the first symbol sub-matrix. A possible interleaving rule is that a symbol in row i and column j of the second symbol sub-matrix corresponds to a symbol in row x %8 and column $\lfloor x/8 \rfloor$ of the first symbol sub-matrix, where x=i*12+j, 0≤i<2, 0≤j<16, Y % Z represents a remainder obtained by dividing Y by Z, and $\lfloor Y/Z \rfloor$ represents a quotient obtained by dividing Y by Z. After the interleaver outputs four second symbol sub-matrices, an inner-code encoding apparatus performs inner-code encoding on 12 symbols in each row of the four second symbol sub-matrices to obtain eight inner-code codewords. When Hamming(128,120) is used for the inner-code encoding, the inner-code encoding is performed on 96 symbols, which are 960 bits in total, output by the interleaver, and eight inner-code codewords, which are 8*128=1024 bits in total, may be obtained.

The foregoing example provides an implementation in which L=2. Based on this, an implementation in which L≥1 may be further extended. This is an extension of an application scenario. For a specific implementation, refer to the foregoing descriptions. Details are not described herein again. The following provides several typical parameter combinations.

- L=1, d=3, Q=23, and V=Q*d=69. The interleaver outputs two 2*12 second symbol sub-matrices in total, and inner-code encoding is performed to obtain four inner-code codewords.
- L=3, d=9, Q=8, and V=Q*d=72. The interleaver outputs six 2*12 second symbol sub-matrices in total, and inner-code encoding is performed to obtain 12 inner-code codewords.
- L=4, d=12, Q=6, and V=Q*d=72. The interleaver outputs eight 2*12 second symbol sub-matrices in total, and inner-code encoding is performed to obtain 16 inner-code codewords.
- L=5, d=15, Q=5, and V=Q*d=75. The interleaver outputs 10 2*12 second symbol sub-matrices in total, and inner-code encoding is performed to obtain 20 inner-code codewords.
- L=6, d=18, Q=4, and V=Q*d=72. The interleaver outputs 12 2*12 second symbol sub-matrices in total, and inner-code encoding is performed to obtain 24 inner-code codewords.
- L=7, d=21, Q=4, and V=Q*d=84. The interleaver outputs 14 2*12 second symbol sub-matrices in total, and inner-code encoding is performed to obtain 28 inner-code codewords.
- L=8, d=24, Q=3, and V=Q*d=72. The interleaver outputs 16 2*12 second symbol sub-matrices in total, and inner-code encoding is performed to obtain 32 inner-code codewords.

In the application scenario 9, when Hamming(128,120) is used for performing inner-code encoding, a total of 12 symbols in each Hamming information bit are from 12 different outer-code codewords, so that performance of an overall cascaded FEC solution is good.

It should be noted that the foregoing application scenario 8 and 9 provide cases in which inner-code information symbol lengths c are 16 and 12 symbols, and other cases in which inner-code information symbol lengths are 9, 10, 11, 13, 14, and 15 may further be extended. The 16 delay lines include two groups of delay lines. After eight data streams in each group of delay lines are delayed, 16 symbols output each time are from 16 different RS codeword symbols, where the 16 symbols are from the eight delayed data streams, and each data stream provides two symbols. With reference to the foregoing features, the interleaver may be designed, so that c symbols output by the interleaver in each row are from c different RS codeword symbols. One interleaving manner is that the first symbol sub-matrix includes eight rows and m columns, the second symbol sub-matrix includes r0 rows and c columns, and $8*m=r0*c$. The c symbols in one row of the second symbol sub-matrix are from c symbols in a total of 16 symbols in two columns of the first symbol sub-matrix. The following provides a specific interleaving manner. c symbols are sequentially obtained from $8*m$ symbols in the first symbol sub-matrix from top to bottom and then from left to right, as one row of the second symbol sub-matrix, to obtain r0 rows of the second symbol sub-matrix in total. Each second symbol matrix includes two second symbol sub-matrices, and each second symbol matrix includes $r=2*r0$ rows. More specifically, the following provides several typical parameter combinations: $\{m=9, r=16, c=9\}$, $\{m=5, r=8, c=10\}$, $\{m=11, r=16, c=11\}$, $\{m=13, r=16, c=13\}$, $\{m=7, r=8, c=14\}$, and $\{m=15, r=16, c=15\}$.

The foregoing describes the data interleaving method provided in embodiments of this application. The following describes a data interleaving apparatus provided in embodiments of this application.

Figure 31:
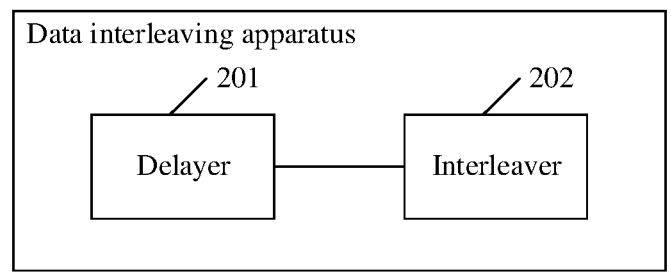
FIG. 31 is a schematic structural diagram of a data interleaving apparatus according to an embodiment of this application.

FIG. 31 is a schematic structural diagram of a data interleaving apparatus according to an embodiment of this application. As shown in FIG. 31, the data interleaving apparatus includes a delayer 201 and an interleaver 202. The delayer 201 is configured to perform an operation of delaying n data streams in the foregoing data interleaving method. The interleaver 202 is configured to perform an operation of obtaining a first symbol set from n delayed data streams and interleaving the first symbol set to obtain a second symbol set in the foregoing data interleaving method. For details, refer to related descriptions of the delaying operation and the interleaving operation in the foregoing data interleaving method. Details are not described herein again.

It should be understood that the apparatus provided in this application may alternatively be implemented in another manner. For example, the unit division of the foregoing apparatus is merely logical function division and may be other division during actual implementation. For example, a plurality of units or components may be combined or integrated into another system. In addition, the functional units in embodiments of this application may be integrated into one processing unit, each of the functional units may be an independent physical unit, or two or more functional units may be integrated into one processing unit. The integrated unit may be implemented in a form of hardware, or may be implemented in a form of a software functional unit.

FIG. 32 is another schematic structural diagram of a data interleaving apparatus according to an embodiment of this application. As shown in FIG. 32, the data interleaving apparatus includes a processor 301, a memory 302, and a transceiver 303. The processor 301, the memory 302, and the transceiver 303 are connected through a line. The memory 302 is configured to store program instructions and data. Specifically, the transceiver 303 is configured to receive n data streams obtained through outer-code encoding. The processor 301 is configured to perform the operations in the steps shown in FIG. 10. In a possible implementation, the processor 301 may include the delayer 201 and the interleaver 202 shown in FIG. 31.

It should be noted that the processor shown in FIG. 32 may use a general-purpose central processing unit (Central Processing Unit, CPU), a general-purpose processor, a digital signal processor (DSP), an application-specific integrated circuit (ASIC), a field programmable gate array (FPGA) or another programmable logic device, a transistor logic device, a hardware component, or any combination thereof. The memory shown in FIG. 32 may store an operating system and another application program. When the technical solutions provided in embodiments of this application are implemented by using software or firmware, program code used for implementing the technical solutions provided in embodiments of this application is stored in the memory, and is executed by the processor. In an embodiment, the memory may be included in the processor. In another embodiment, the processor and the memory are two independent structures.

It can be clearly understood by a person skilled in the art that, for a purpose of convenient and brief description, for detailed working processes of the foregoing system, apparatus, and unit, refer to corresponding processes in the foregoing method embodiments. Details are not described herein again.

A person of ordinary skill in the art may understand that all or some of the steps of the foregoing embodiments may be implemented by hardware or a program instructing related hardware. The program may be stored in a computer-readable storage medium. The storage medium may be a read-only memory, a random access memory, or the like. Whether the functions are performed by hardware or software depends on particular applications and designed constraint conditions of the technical solutions. A person skilled in the art may use different methods to implement the described functions for each particular application, but it should not be considered that the implementation goes beyond the scope of this application.

When software is used for implementing the foregoing embodiments, all or some of the method steps described in the foregoing embodiments may be implemented in a form of a computer program product. The computer program product includes one or more computer instructions. When the computer program instructions are loaded and executed on a computer, all or some of the procedures or the functions according to embodiments of this application are generated. The computer may be a general-purpose computer, a special-purpose computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, for example, a server or a data center, integrating one or more usable media. The usable medium may be a magnetic medium (for example, a floppy disk, a hard disk, or a magnetic tape), an optical medium (for example, DVD), a semiconductor medium (for example, a solid-state drive (Solid-State Drive, SSD)), or the like.

What is claimed is:

1. A method, comprising:
separately delaying n data streams based on n delay lines to obtain n delayed data streams, wherein n is a positive integer that is divisible by p, p is an integer greater than 1, a delay value of each delay line of the n delay lines is a delay value in a delay value set, the delay value set comprises p delay values, a smallest delay value in the delay value set is 0, a difference between every two adjacent delay values in the p delay values in the delay value set when arranged in ascending order is V symbols, V is an integer greater than or equal to 34, and a quantity of delay lines corresponding to each delay value in the delay value set is n/p;
obtaining L*m symbols from each of the n delayed data streams to obtain L first symbol sets, wherein each first symbol set of the L first symbol sets comprises n*m symbols, L is an integer greater than or equal to 1, and m is an integer greater than or equal to 1; and
separately interleaving the L first symbol sets to obtain L second symbol sets, wherein a quantity of symbols in each second symbol set of the L second symbol sets is the same as a quantity of symbols in each first symbol set.

2. The method according to claim 1, wherein p=4, n is divisible by 16, the n delay lines comprise at least one group of delay lines, and each group of delay lines of the at least one group of delay lines comprises 16 adjacent delay lines; and
wherein delay values of a delay line $a_0$, a delay line $a_1$, a delay line $a_2$, a delay line $a_3$, a delay line $a_4$, a delay line $a_5$, a delay line $a_6$, a delay line $a_7$, a delay line $a_8$, a delay line $a_9$, a delay line $a_{10}$, a delay line $a_{11}$, a delay line $a_{12}$, a delay line $a_{13}$, a delay line $a_{14}$, and a delay line $a_{15}$ in a group k of delay lines in the n delay lines satisfy a first condition, wherein $0 \leq k < n/16$, and $a_0, a_1, a_2, a_3, a_4, a_5, a_6, a_7, a_8, a_9, a_{10}, a_{11}, a_{12}, a_{13}, a_{14}$, and $a_{15}$ are non-negative integers less than 16 and are not equal to each other; and
wherein:
the first condition is: a difference between the delay value of the delay line $a_0$ and the delay value of the delay line $a_1$ is 2V symbols;
a difference between the delay value of the delay line $a_2$ and the delay value of the delay line $a_3$ is 2V symbols;
a difference between the delay value of the delay line $a_4$ and the delay value of the delay line $a_5$ is 2V symbols;
a difference between the delay value of the delay line $a_6$ and the delay value of the delay line $a_7$ is 2V symbols;
a difference between the delay value of the delay line $a_8$ and the delay value of the delay line $a_9$ is 2V symbols;
a difference between the delay value of the delay line $a_{10}$ and the delay value of the delay line $a_{11}$ is 2V symbols;
a difference between the delay value of the delay line $a_{12}$ and the delay value of the delay line $a_{13}$ is 2V symbols; and
a difference between the delay value of the delay line $a_{14}$ and the delay value of the delay line $a_{15}$ is 2V symbols.

3. The method according to claim 2, wherein in each group of delay lines in the n delay lines, quantities of delay lines whose delay values are 0 symbols, V symbols, 2V symbols, and 3V symbols are all 4.

4. The method according to claim 2, wherein the delay values of the delay line $a_0$, the delay line $a_1$, the delay line $a_2$, the delay line $a_3$, the delay line $a_4$, the delay line $a_5$, the delay line $a_6$, the delay line $a_7$, the delay line $a_8$, the delay line $a_9$, the delay line $a_{10}$, the delay line $a_{11}$, the delay line $a_{12}$, the delay line $a_{13}$, the delay line $a_{14}$, and the delay line $a_{15}$ in the group k of delay lines in the n delay lines further satisfy a second condition; and
wherein the second condition is:
the delay value of the delay line $a_0$, the delay value of the delay line $a_4$, the delay value of the delay line $a_8$, and the delay value of the delay line $a_{12}$ are not equal to each other;
the delay value of the delay line $a_1$, the delay value of the delay line $a_5$, the delay value of the delay line $a_9$, and the delay value of the delay line $a_{13}$ are not equal to each other;
the delay value of the delay line $a_2$, the delay value of the delay line $a_6$, the delay value of the delay line $a_{10}$, and the delay value of the delay line $a_{14}$ are not equal to each other; and
the delay value of the delay line $a_3$, the delay value of the delay line $a_7$, the delay value of the delay line $a_{11}$, and the delay value of the delay line $a_{15}$ are not equal to each other.

5. The method according to claim 2, wherein the delay values of the delay line $a_0$, the delay line $a_2$, the delay line $a_4$, the delay line $a_6$, the delay line $a_8$, the delay line $a_{10}$, the delay line $a_{12}$, and the delay line $a_{14}$ in the group k of delay lines in the n delay lines further satisfy a third condition; and
wherein the third condition is:
a difference between the delay value of the delay line $a_0$ and the delay value of the delay line $a_4$ is 2V symbols, a difference between the delay value of the delay line $a_2$ and the delay value of the delay line $a_6$ is 2V symbols, a difference between the delay value of the delay line $a_8$ and the delay value of the delay line $a_{12}$ is 2V symbols, and a difference between the delay value of the delay line $a_{10}$ and the delay value of the delay line $a_{14}$ is 2V symbols.

6. The method according to claim 2, wherein a first delay value set {A} sequentially comprises the delay values of the delay line $a_0$, the delay line $a_1$, the delay line $a_2$, the delay line $a_3$, the delay line $a_4$, the delay line $a_5$, the delay line $a_6$, the delay line $a_7$, the delay line $a_8$, the delay line $a_9$, the delay line $a_{10}$, the delay line $a_{11}$, the delay line $a_{12}$, the delay line $a_{13}$, the delay line $a_{14}$, and the delay line $a_{15}$ in the group k of delay lines in the n delay lines, and the first delay value set {A} comprises one of the following sets of delay values:

{0, 2V, 0, 2V, 2V, 0, 2V, 0, V, 3V, V, 3V, 3V, V, 3V, V},
{0, 2V, 0, 2V, 2V, 0, 2V, 0, V, 3V, 3V, V, 3V, V, V, 3V},
{0, 2V, 0, 2V, 2V, 0, 2V, 0, 3V, V, V, 3V, V, 3V, 3V, V},
{0, 2V, 0, 2V, 2V, 0, 2V, 0, 3V, V, 3V, V, V, 3V, V, 3V},
{0, 2V, V, 3V, 2V, 0, 3V, V, V, 3V, 0, 2V, 3V, V, 2V, 0},
{0, 2V, V, 3V, 2V, 0, 3V, V, V, 3V, 2V, 0, 3V, V, 0, 2V},

-continued

{0, 2V, V, 3V, 2V, 0, 3V, V, 3V, V, 0, 2V, V, 3V, 2V, 0},
{0, 2V, V, 3V, 2V, 0, 3V, V, 3V, V, 2V, 0, V, 3V, 0, 2V},
{0, 2V, 2V, 0, 2V, 0, 0, 2V, V, 3V, V, 3V, 3V, V, 3V, V},
{0, 2V, 2V, 0, 2V, 0, 0, 2V, V, 3V, 3V, V, 3V, V, V, 3V},
{0, 2V, 2V, 0, 2V, 0, 0, 2V, 3V, V, V, 3V, V, 3V, 3V, V},
{0, 2V, 2V, 0, 2V, 0, 0, 2V, 3V, V, 3V, V, V, 3V, 3V, V},
{0, 2V, 3V, V, 2V, 0, V, 3V, V, 3V, 0, 2V, 3V, V, 2V, 0},
{0, 2V, 3V, V, 2V, 0, V, 3V, V, 3V, 2V, 0, 3V, V, 0, 2V},
{0, 2V, 3V, V, 2V, 0, V, 3V, 3V, V, 0, 2V, V, 3V, 2V, 0},
{0, 2V, 3V, V, 2V, 0, V, 3V, 3V, V, 2V, 0, V, 3V, 0, 2V},
{V, 3V, 0, 2V, 3V, V, 2V, 0, 0, 2V, V, 3V, 2V, 0, 3V, V},
{V, 3V, 0, 2V, 3V, V, 2V, 0, 0, 2V, 3V, V, 2V, 0, V, 3V},
{V, 3V, 0, 2V, 3V, V, 2V, 0, 2V, 0, V, 3V, 0, 2V, 3V, V},
{V, 3V, 0, 2V, 3V, V, 2V, 0, 2V, 0, 3V, V, 0, 2V, V, 3V},
{V, 3V, V, 3V, 3V, V, 3V, V, 0, 2V, 0, 2V, 2V, 0, 2V, 0},
{V, 3V, V, 3V, 3V, V, 3V, V, 0, 2V, 2V, 0, 2V, 0, 0, 2V},
{V, 3V, V, 3V, 3V, V, 3V, V, 2V, 0, 0, 2V, 0, 2V, 2V, 0},
{V, 3V, V, 3V, 3V, V, 3V, V, 2V, 0, 2V, 0, 0, 2V, 0, 2V},
{V, 3V, 2V, 0, 3V, V, 0, 2V, 0, 2V, V, 3V, 2V, 0, 3V, V},
{V, 3V, 2V, 0, 3V, V, 0, 2V, 0, 2V, 3V, V, 2V, 0, V, 3V},
{V, 3V, 2V, 0, 3V, V, 0, 2V, 2V, 0, V, 3V, 0, 2V, 3V, V},
{V, 3V, 2V, 0, 3V, V, 0, 2V, 2V, 0, 3V, V, 0, 2V, V, 3V},
{V, 3V, 3V, V, 3V, V, V, 3V, 0, 2V, 0, 2V, 2V, 0, 2V, 0},
{V, 3V, 3V, V, 3V, V, V, 3V, 0, 2V, 2V, 0, 2V, 0, 0, 2V},
{V, 3V, 3V, V, 3V, V, V, 3V, 2V, 0, 0, 2V, 0, 2V, 2V, 0},
{V, 3V, 3V, V, 3V, V, V, 3V, 2V, 0, 2V, 0, 0, 2V, 0, 2V},
{2V, 0, 0, 2V, 0, 2V, 2V, 0, V, 3V, V, 3V, 3V, V, 3V, V},
{2V, 0, 0, 2V, 0, 2V, 2V, 0, V, 3V, 3V, V, 3V, V, V, 3V},
{2V, 0, 0, 2V, 0, 2V, 2V, 0, 3V, V, V, 3V, V, 3V, 3V, V},
{2V, 0, 0, 2V, 0, 2V, 2V, 0, 3V, V, 3V, V, V, 3V, 3V, V},
{2V, 0, V, 3V, 0, 2V, 3V, V, V, 3V, 0, 2V, 3V, V, 2V, 0},
{2V, 0, V, 3V, 0, 2V, 3V, V, V, 3V, 2V, 0, 3V, V, 0, 2V},
{2V, 0, V, 3V, 0, 2V, 3V, V, 3V, V, 0, 2V, V, 3V, 2V, 0},
{2V, 0, V, 3V, 0, 2V, 3V, V, 3V, V, 2V, 0, V, 3V, 0, 2V},
{2V, 0, 2V, 0, 0, 2V, 0, 2V, V, 3V, V, 3V, 3V, V, 3V, V},
{2V, 0, 2V, 0, 0, 2V, 0, 2V, V, 3V, 3V, V, 3V, V, V, 3V},
{2V, 0, 2V, 0, 0, 2V, 0, 2V, 3V, V, V, 3V, V, 3V, 3V, V},
{2V, 0, 2V, 0, 0, 2V, 0, 2V, 3V, V, 3V, V, V, 3V, 3V, V},
{2V, 0, 3V, V, 0, 2V, V, 3V, V, 3V, 0, 2V, 3V, V, 2V, 0},
{2V, 0, 3V, V, 0, 2V, V, 3V, V, 3V, 2V, 0, 3V, V, 0, 2V},
{2V, 0, 3V, V, 0, 2V, V, 3V, 3V, V, 0, 2V, V, 3V, 2V, 0},
{2V, 0, 3V, V, 0, 2V, V, 3V, 3V, V, 2V, 0, V, 3V, 0, 2V},
{3V, V, 0, 2V, V, 3V, 2V, 0, 0, 2V, V, 3V, 2V, 0, 3V, V},
{3V, V, 0, 2V, V, 3V, 2V, 0, 0, 2V, 3V, V, 2V, 0, V, 3V},
{3V, V, 0, 2V, V, 3V, 2V, 0, 2V, 0, V, 3V, 0, 2V, 3V, V},
{3V, V, 0, 2V, V, 3V, 2V, 0, 2V, 0, 3V, V, 0, 2V, V, 3V},
{3V, V, V, 3V, V, 3V, 3V, V, 0, 2V, 0, 2V, 2V, 0, 2V, 0},
{3V, V, V, 3V, V, 3V, 3V, V, 0, 2V, 2V, 0, 2V, 0, 0, 2V},
{3V, V, V, 3V, V, 3V, 3V, V, 2V, 0, 0, 2V, 0, 2V, 2V, 0},
{3V, V, V, 3V, V, 3V, 3V, V, 2V, 0, 2V, 0, 0, 2V, 0, 2V},
{3V, V, 2V, 0, V, 3V, 0, 2V, 0, 2V, V, 3V, 2V, 0, 3V, V},
{3V, V, 2V, 0, V, 3V, 0, 2V, 0, 2V, 3V, V, 2V, 0, V, 3V},
{3V, V, 2V, 0, V, 3V, 0, 2V, 2V, 0, V, 3V, 0, 2V, 3V, V},
{3V, V, 2V, 0, V, 3V, 0, 2V, 2V, 0, 3V, V, 0, 2V, V, 3V},
{3V, V, 3V, V, V, 3V, V, 3V, 0, 2V, 0, 2V, 2V, 0, 2V, 0},
{3V, V, 3V, V, V, 3V, V, 3V, 0, 2V, 2V, 0, 2V, 0, 0, 2V},
{3V, V, 3V, V, V, 3V, V, 3V, 2V, 0, 0, 2V, 0, 2V, 2V, 0}, or
{3V, V, 3V, V, V, 3V, V, 3V, 2V, 0, 2V, 0, 0, 2V, 0, 2V}.

7. The method according to claim 2, wherein the delay values of the delay line $a_0$, the delay line $a_1$, the delay line $a_2$, the delay line $a_3$, the delay line $a_4$, the delay line $a_5$, the delay line $a_6$, the delay line $a_7$, the delay line $a_8$, the delay line $a_9$, the delay line $a_{10}$, the delay line $a_{11}$, the delay line $a_{12}$, the delay line $a_{13}$, the delay line $a_{14}$, and the delay line $a_{15}$ in the group k of delay lines in the n delay lines further satisfy a fourth condition; and
wherein the fourth condition is:
the delay value of the delay line $a_0$ and the delay value of the delay line $a_2$ are equal or have a difference of 2V symbols;
the delay value of the delay line $a_1$ and the delay value of the delay line $a_3$ are equal or have a difference of 2V symbols;
the delay value of the delay line $a_2$ and the delay value of the delay line $a_4$ are equal or have a difference of 2V symbols;
the delay value of the delay line $a_3$ and the delay value of the delay line $a_5$ are equal or have a difference of 2V symbols;
the delay value of the delay line $a_4$ and the delay value of the delay line $a_6$ are equal or have a difference of 2V symbols;
the delay value of the delay line $a_5$ and the delay value of the delay line $a_7$ are equal or have a difference of 2V symbols;
the delay value of the delay line $a_8$ and the delay value of the delay line $a_{10}$ are equal or have a difference of 2V symbols;
the delay value of the delay line $a_9$ and the delay value of the delay line $a_{11}$ are equal or have a difference of 2V symbols;
the delay value of the delay line $a_{10}$ and the delay value of the delay line $a_{12}$ are equal or have a difference of 2V symbols;
the delay value of the delay line $a_{11}$ and the delay value of the delay line $a_{13}$ are equal or have a difference of 2V symbols;
the delay value of the delay line $a_{12}$ and the delay value of the delay line $a_{14}$ are equal or have a difference of 2V symbols; and
the delay value of the delay line $a_{13}$ and the delay value of the delay line $a_{15}$ are equal or have a difference of 2V symbols.

8. The method according to claim 7, wherein a second delay value set {B} sequentially comprises the delay values of the delay line $a_0$, the delay line $a_1$, the delay line $a_2$, the delay line $a_3$, the delay line $a_4$, the delay line $a_5$, the delay line $a_6$, the delay line $a_7$, the delay line $a_8$, the delay line $a_9$, the delay line $a_{10}$, the delay line $a_{11}$, the delay line $a_{12}$, the delay line $a_{13}$, the delay line $a_{14}$, and the delay line $a_{15}$ in the group k of delay lines in the n delay lines, and the second delay value set {B} comprises one of the following:

{0, 2V, 0, 2V, 2V, 0, 2V, 0, V, 3V, V, 3V, 3V, V, 3V, V},
{0, 2V, 0, 2V, 2V, 0, 2V, 0, V, 3V, 3V, V, 3V, V, V, 3V},
{0, 2V, 0, 2V, 2V, 0, 2V, 0, 3V, V, V, 3V, V, 3V, 3V, V},
{0, 2V, 0, 2V, 2V, 0, 2V, 0, 3V, V, 3V, V, V, 3V, 3V, V},
{0, 2V, 2V, 0, 2V, 0, 0, 2V, V, 3V, V, 3V, 3V, V, 3V, V},
{0, 2V, 2V, 0, 2V, 0, 0, 2V, V, 3V, 3V, V, 3V, V, V, 3V},
{0, 2V, 2V, 0, 2V, 0, 0, 2V, 3V, V, V, 3V, V, 3V, 3V, V},
{0, 2V, 2V, 0, 2V, 0, 0, 2V, 3V, V, 3V, V, V, 3V, 3V, V},
{V, 3V, V, 3V, 3V, V, 3V, V, 0, 2V, 0, 2V, 2V, 0, 2V, 0},
{V, 3V, V, 3V, 3V, V, 3V, V, 0, 2V, 2V, 0, 2V, 0, 0, 2V},
{V, 3V, V, 3V, 3V, V, 3V, V, 2V, 0, 0, 2V, 0, 2V, 2V, 0},
{V, 3V, V, 3V, 3V, V, 3V, V, 2V, 0, 2V, 0, 0, 2V, 0, 2V},
{V, 3V, 3V, V, 3V, V, V, 3V, 0, 2V, 0, 2V, 2V, 0, 2V, 0},
{V, 3V, 3V, V, 3V, V, V, 3V, 0, 2V, 2V, 0, 2V, 0, 0, 2V},
{V, 3V, 3V, V, 3V, V, V, 3V, 2V, 0, 0, 2V, 0, 2V, 2V, 0},
{V, 3V, 3V, V, 3V, V, V, 3V, 2V, 0, 2V, 0, 0, 2V, 0, 2V},
{2V, 0, 0, 2V, 0, 2V, 2V, 0, V, 3V, V, 3V, 3V, V, 3V, V},
{2V, 0, 0, 2V, 0, 2V, 2V, 0, V, 3V, 3V, V, 3V, V, V, 3V},
{2V, 0, 0, 2V, 0, 2V, 2V, 0, 3V, V, V, 3V, V, 3V, 3V, V},
{2V, 0, 0, 2V, 0, 2V, 2V, 0, 3V, V, 3V, V, V, 3V, 3V, V},
{2V, 0, 2V, 0, 0, 2V, 0, 2V, V, 3V, V, 3V, 3V, V, 3V, V},
{2V, 0, 2V, 0, 0, 2V, 0, 2V, V, 3V, 3V, V, 3V, V, V, 3V},
{2V, 0, 2V, 0, 0, 2V, 0, 2V, 3V, V, V, 3V, V, 3V, 3V, V},
{2V, 0, 2V, 0, 0, 2V, 0, 2V, 3V, V, 3V, V, V, 3V, 3V, V},
{3V, V, V, 3V, V, 3V, 3V, V, 0, 2V, 0, 2V, 2V, 0, 2V, 0},
{3V, V, V, 3V, V, 3V, 3V, V, 0, 2V, 2V, 0, 2V, 0, 0, 2V},
{3V, V, V, 3V, V, 3V, 3V, V, 2V, 0, 0, 2V, 0, 2V, 2V, 0},
{3V, V, V, 3V, V, 3V, 3V, V, 2V, 0, 2V, 0, 0, 2V, 0, 2V},
{3V, V, 3V, V, V, 3V, V, 3V, 0, 2V, 0, 2V, 2V, 0, 2V, 0},
{3V, V, 3V, V, V, 3V, V, 3V, 0, 2V, 2V, 0, 2V, 0, 0, 2V},
{3V, V, 3V, V, V, 3V, V, 3V, 2V, 0, 0, 2V, 0, 2V, 2V, 0}, or
{3V, V, 3V, V, V, 3V, V, 3V, 2V, 0, 2V, 0, 0, 2V, 0, 2V}.

9. The method according to claim 2, wherein a serial number value set {C} sequentially comprises values of $a_0$, $a_1$, $a_2$, $a_3$, $a_4$, $a_5$, $a_6$, $a_7$, $a_8$, $a_9$, $a_{10}$, $a_{11}$, $a_{12}$, $a_{13}$, $a_{14}$, and $a_{15}$, and the value set {C} comprises one of the following:

{0, 1, 2, 3, 4, 5, 6, 7, 8, 9, 10, 11, 12, 13, 14, 15},
{0, 1, 2, 3, 4, 5, 6, 7, 8, 9, 10, 11, 14, 15, 12, 13},
{0, 1, 2, 3, 4, 5, 6, 7, 10, 11, 8, 9, 12, 13, 14, 15},
{0, 1, 2, 3, 4, 5, 6, 7, 10, 11, 8, 9, 14, 15, 12, 13},
{0, 1, 2, 3, 6, 7, 4, 5, 8, 9, 10, 11, 12, 13, 14, 15},
{0, 1, 2, 3, 6, 7, 4, 5, 8, 9, 10, 11, 14, 15, 12, 13},
{0, 1, 2, 3, 6, 7, 4, 5, 10, 11, 8, 9, 12, 13, 14, 15},
{0, 1, 2, 3, 6, 7, 4, 5, 10, 11, 8, 9, 14, 15, 12, 13},
{2, 3, 0, 1, 4, 5, 6, 7, 8, 9, 10, 11, 12, 13, 14, 15},
{2, 3, 0, 1, 4, 5, 6, 7, 8, 9, 10, 11, 14, 15, 12, 13},
{2, 3, 0, 1, 4, 5, 6, 7, 10, 11, 8, 9, 12, 13, 14, 15},
{2, 3, 0, 1, 4, 5, 6, 7, 10, 11, 8, 9, 14, 15, 12, 13},
{2, 3, 0, 1, 6, 7, 4, 5, 8, 9, 10, 11, 12, 13, 14, 15},
{2, 3, 0, 1, 6, 7, 4, 5, 8, 9, 10, 11, 14, 15, 12, 13},
{2, 3, 0, 1, 6, 7, 4, 5, 10, 11, 8, 9, 12, 13, 14, 15},
{2, 3, 0, 1, 6, 7, 4, 5, 10, 11, 8, 9, 14, 15, 12, 13},
{0, 3, 1, 2, 4, 7, 5, 6, 8, 11, 9, 10, 12, 15, 13, 14},
{0, 3, 1, 2, 4, 7, 5, 6, 8, 11, 9, 10, 13, 14, 12, 15},
{0, 3, 1, 2, 4, 7, 5, 6, 9, 10, 8, 11, 12, 15, 13, 14},
{0, 3, 1, 2, 4, 7, 5, 6, 9, 10, 8, 11, 13, 14, 12, 15},
{0, 3, 1, 2, 5, 6, 4, 7, 8, 11, 9, 10, 12, 15, 13, 14},
{0, 3, 1, 2, 5, 6, 4, 7, 8, 11, 9, 10, 13, 14, 12, 15},
{0, 3, 1, 2, 5, 6, 4, 7, 9, 10, 8, 11, 12, 15, 13, 14},
{0, 3, 1, 2, 5, 6, 4, 7, 9, 10, 8, 11, 13, 14, 12, 15},
{1, 2, 0, 3, 4, 7, 5, 6, 8, 11, 9, 10, 12, 15, 13, 14},
{1, 2, 0, 3, 4, 7, 5, 6, 8, 11, 9, 10, 13, 14, 12, 15},
{1, 2, 0, 3, 4, 7, 5, 6, 9, 10, 8, 11, 12, 15, 13, 14},
{1, 2, 0, 3, 4, 7, 5, 6, 9, 10, 8, 11, 13, 14, 12, 15},
{1, 2, 0, 3, 5, 6, 4, 7, 8, 11, 9, 10, 12, 15, 13, 14},
{1, 2, 0, 3, 5, 6, 4, 7, 8, 11, 9, 10, 13, 14, 12, 15},
{1, 2, 0, 3, 5, 6, 4, 7, 9, 10, 8, 11, 12, 15, 13, 14}, or
{1, 2, 0, 3, 5, 6, 4, 7, 9, 10, 8, 11, 13, 14, 12, 15}.

10. The method according to claim 1, wherein each first symbol set of the L first symbol sets comprises n first symbol subsets, and each first symbol subset of the n first symbol subsets comprises m symbols sequentially arranged; and
each second symbol set of the L second symbol sets comprises r second symbol subsets, and each second symbol subset of the r second symbol subsets comprises c symbols, wherein r is an integer greater than 1, c is an integer greater than 1, n*m=r*c, and the c symbols in each second symbol subset correspond to c symbols distributed in c first symbol subsets in the first symbol set.

11. An apparatus, comprising:
a delayer, configured to separately delay n data streams based on n delay lines, to obtain n delayed data streams, wherein n is a positive integer that is divisible by p, p is an integer greater than 1, a delay value of each delay line of the n delay lines is a delay value in a delay value set, the delay value set comprises p delay values, a smallest delay value in the delay value set is 0, a difference between every two adjacent delay values in the p delay values in the delay value set when arranged in ascending order is V symbols, V is an integer greater than or equal to 34, and a quantity of delay lines corresponding to each delay value in the delay value set is n/p; and
an interleaver, configured to: obtain L*m symbols from each of the n delayed data streams to obtain L first symbol sets, wherein each first symbol set of the L first symbol sets comprises n*m symbols, L is an integer greater than or equal to 1, and m is an integer greater than or equal to 1; and
separately interleave the L first symbol sets to obtain L second symbol sets, wherein a quantity of symbols in each second symbol set of the L second symbol sets is the same as a quantity of symbols in each first symbol set.

12. The apparatus according to claim 11, wherein p=4, n is divisible by 16, the n delay lines comprise at least one group of delay lines, and each group of delay lines comprises 16 adjacent delay lines; and
wherein delay values of a delay line $a_0$, a delay line $a_1$, a delay line $a_2$, a delay line $a_3$, a delay line $a_4$, a delay line $a_5$, a delay line $a_6$, a delay line $a_7$, a delay line $a_8$, a delay line $a_9$, a delay line $a_{10}$, a delay line $a_{11}$, a delay line $a_{12}$, a delay line $a_{13}$, a delay line $a_{14}$, and a delay line $a_{15}$ in a group k of delay lines in the n delay lines satisfy a first condition, wherein $0 \leq k < n/16$, and $a_0$, $a_1$, $a_2$, $a_3$, $a_4$, $a_5$, $a_6$, $a_7$, $a_8$, $a_9$, $a_{10}$, $a_{11}$, $a_{12}$, $a_{13}$, $a_{14}$, and $a_{15}$ are non-negative integers less than 16 and are not equal to each other; and
wherein the first condition is:
a difference between the delay value of the delay line $a_0$ and the delay value of the delay line $a_1$ is 2V symbols;
a difference between the delay value of the delay line $a_2$ and the delay value of the delay line $a_3$ is 2V symbols;
a difference between the delay value of the delay line $a_4$ and the delay value of the delay line $a_5$ is 2V symbols;
a difference between the delay value of the delay line $a_6$ and the delay value of the delay line $a_7$ is 2V symbols;
a difference between the delay value of the delay line $a_8$ and the delay value of the delay line $a_9$ is 2V symbols;
a difference between the delay value of the delay line $a_{10}$ and the delay value of the delay line $a_{11}$ is 2V symbols;
a difference between the delay value of the delay line $a_{12}$ and the delay value of the delay line $a_{13}$ is 2V symbols; and
a difference between the delay value of the delay line $a_{14}$ and the delay value of the delay line $a_{15}$ is 2V symbols.

13. The apparatus according to claim 12, wherein in each group of delay lines in the n delay lines, quantities of delay lines whose delay values are 0 symbols, V symbols, 2V symbols, and 3V symbols are all 4.

14. The apparatus according to claim 12, wherein the delay values of the delay line $a_0$, the delay line $a_1$, the delay line $a_2$, the delay line $a_3$, the delay line $a_4$, the delay line $a_5$, the delay line $a_6$, the delay line $a_7$, the delay line $a_8$, the delay line $a_9$, the delay line $a_{10}$, the delay line $a_{11}$, the delay line $a_{12}$, the delay line $a_{13}$, the delay line $a_{14}$, and the delay line $a_{15}$ in the group k of delay lines in the n delay lines satisfy a second condition; and
wherein the second condition is:
the delay value of the delay line $a_0$, the delay value of the delay line $a_4$, the delay value of the delay line $a_8$, and the delay value of the delay line $a_{12}$ are not equal to each other;
the delay value of the delay line $a_1$, the delay value of the delay line $a_5$, the delay value of the delay line $a_9$, and the delay value of the delay line $a_{13}$ are not equal to each other;
the delay value of the delay line $a_2$, the delay value of the delay line $a_6$, the delay value of the delay line $a_{10}$, and the delay value of the delay line $a_{14}$ are not equal to each other; and the delay value of the delay line $a_3$, the delay value of the delay line $a_7$, the delay value of the delay line $a_{11}$, and the delay value of the delay line $a_{15}$ are not equal to each other.

15. The apparatus according to claim 12, wherein the delay values of the delay line $a_0$, the delay line $a_2$, the delay line $a_4$, the delay line $a_6$, the delay line $a_8$, the delay line $a_{10}$, the delay line $a_{12}$, and the delay line $a_{14}$ in the group k of delay lines in the n delay lines satisfy a third condition; and wherein the third condition is:
 a difference between the delay value of the delay line $a_0$ and the delay value of the delay line $a_4$ is 2V symbols, a difference between the delay value of the delay line $a_2$ and the delay value of the delay line $a_6$ is 2V symbols, a difference between the delay value of the delay line $a_8$ and the delay value of the delay line $a_{12}$ is 2V symbols, and a difference between the delay value of the delay line $a_{10}$ and the delay value of the delay line $a_{14}$ is 2V symbols.

16. The apparatus according to claim 12, wherein a first delay value set {A} sequentially comprises the delay values of the delay line $a_0$, the delay line $a_1$, the delay line $a_2$, the delay line $a_3$, the delay line $a_4$, the delay line $a_5$, the delay line $a_6$, the delay line $a_7$, the delay line $a_8$, the delay line $a_9$, the delay line $a_{10}$, the delay line $a_{11}$, the delay line $a_{12}$, the delay line $a_{13}$, the delay line $a_{14}$, and the delay line $a_{15}$ in the group k of delay lines in the n delay lines, and the first delay value set {A} comprises one of the following:

{0, 2V, 0, 2V, 2V, 0, 2V, 0, V, 3V, V, 3V, 3V, V, 3V, V},
{0, 2V, 0, 2V, 2V, 0, 2V, 0, V, 3V, 3V, V, 3V, V, V, 3V},
{0, 2V, 0, 2V, 2V, 0, 2V, 0, 3V, V, V, 3V, V, 3V, 3V, V},
{0, 2V, 0, 2V, 2V, 0, 2V, 0, 3V, 3V, V, V, 3V, V, 3V},
{0, 2V, V, 3V, 2V, 0, 3V, V, V, 3V, 0, 2V, 3V, V, 2V, 0},
{0, 2V, V, 3V, 2V, 0, 3V, V, V, 3V, 2V, 0, 3V, V, 0, 2V},
{0, 2V, V, 3V, 2V, 0, 3V, V, 3V, V, 0, 2V, V, 3V, 2V, 0},
{0, 2V, V, 3V, 2V, 0, 3V, V, 3V, V, 2V, 0, V, 3V, 0, 2V},
{0, 2V, 2V, 0, 2V, 0, 0, 2V, V, 3V, V, 3V, 3V, V, 3V, V},
{0, 2V, 2V, 0, 2V, 0, 0, 2V, V, 3V, 3V, V, 3V, V, V, 3V},
{0, 2V, 2V, 0, 2V, 0, 0, 2V, 3V, V, V, 3V, V, 3V, 3V, V},
{0, 2V, 2V, 0, 2V, 0, 0, 2V, 3V, V, 3V, V, 3V, V, V, 3V},
{0, 2V, 3V, V, 2V, 0, V, 3V, V, 3V, 0, 2V, 3V, V, 2V, 0},
{0, 2V, 3V, V, 2V, 0, V, 3V, V, 3V, 2V, 0, 3V, V, 0, 2V},
{0, 2V, 3V, V, 2V, 0, V, 3V, 3V, V, 0, 2V, V, 3V, 2V, 0},
{0, 2V, 3V, V, 2V, 0, V, 3V, 3V, V, 2V, 0, V, 3V, 0, 2V},
{V, 3V, 0, 2V, 3V, V, 2V, 0, 0, 2V, V, 3V, 2V, 0, 3V, V},
{V, 3V, 0, 2V, 3V, V, 2V, 0, 0, 2V, 3V, V, 2V, 0, V, 3V},
{V, 3V, 0, 2V, 3V, V, 2V, 0, 2V, 0, V, 3V, 0, 2V, 3V, V},
{V, 3V, 0, 2V, 3V, V, 2V, 0, 2V, 0, 3V, V, 0, 2V, V, 3V},
{V, 3V, V, 3V, 3V, V, 3V, V, 0, 2V, 0, 2V, 2V, 0, 2V, 0},
{V, 3V, V, 3V, 3V, V, 3V, V, 0, 2V, 2V, 0, 2V, 0, 0, 2V},
{V, 3V, V, 3V, 3V, V, 3V, V, 2V, 0, 0, 2V, 0, 2V, 2V, 0},
{V, 3V, V, 3V, 3V, V, 3V, V, 2V, 0, 2V, 0, 0, 2V, 0, 2V},
{V, 3V, 2V, 0, 3V, V, 0, 2V, 0, 2V, V, 3V, 2V, 0, 3V, V},
{V, 3V, 2V, 0, 3V, V, 0, 2V, 0, 2V, 3V, V, 2V, 0, V, 3V},
{V, 3V, 2V, 0, 3V, V, 0, 2V, 2V, 0, V, 3V, 0, 2V, 3V, V},
{V, 3V, 2V, 0, 3V, V, 0, 2V, 2V, 0, 3V, V, 0, 2V, V, 3V},
{V, 3V, 3V, V, 3V, V, V, 3V, 0, 2V, 0, 2V, 2V, 0, 2V, 0},
{V, 3V, 3V, V, 3V, V, V, 3V, 0, 2V, 2V, 0, 2V, 0, 0, 2V},
{V, 3V, 3V, V, 3V, V, V, 3V, 2V, 0, 0, 2V, 0, 2V, 2V, 0},
{V, 3V, 3V, V, 3V, V, V, 3V, 2V, 0, 2V, 0, 0, 2V, 0, 2V},
{2V, 0, 0, 2V, 0, 2V, 2V, 0, V, 3V, V, 3V, 3V, V, 3V, V},
{2V, 0, 0, 2V, 0, 2V, 2V, 0, V, 3V, 3V, V, 3V, V, V, 3V},
{2V, 0, 0, 2V, 0, 2V, 2V, 0, 3V, V, V, 3V, V, 3V, 3V, V},
{2V, 0, 0, 2V, 0, 2V, 2V, 0, 3V, V, 3V, V, 3V, V, V, 3V},
{2V, 0, V, 3V, 0, 2V, 3V, V, V, 3V, 0, 2V, 3V, V, 2V, 0},
{2V, 0, V, 3V, 0, 2V, 3V, V, V, 3V, 2V, 0, 3V, V, 0, 2V},
{2V, 0, V, 3V, 0, 2V, 3V, V, 3V, V, 0, 2V, V, 3V, 2V, 0},
{2V, 0, V, 3V, 0, 2V, 3V, V, 3V, V, 2V, 0, V, 3V, 0, 2V},
{2V, 0, 2V, 0, 0, 2V, 0, 2V, V, 3V, V, 3V, 3V, V, 3V, V},
{2V, 0, 2V, 0, 0, 2V, 0, 2V, V, 3V, 3V, V, 3V, V, V, 3V},
{2V, 0, 2V, 0, 0, 2V, 0, 2V, 3V, V, V, 3V, V, 3V, 3V, V},
{2V, 0, 2V, 0, 0, 2V, 0, 2V, 3V, V, 3V, V, 3V, V, V, 3V},
{2V, 0, 3V, V, 0, 2V, V, 3V, V, 3V, 0, 2V, 3V, V, 2V, 0},

{2V, 0, 3V, V, 0, 2V, V, 3V, V, 3V, 2V, 0, 3V, V, 0, 2V},
{2V, 0, 3V, V, 0, 2V, V, 3V, 3V, V, 0, 2V, V, 3V, 2V, 0},
{2V, 0, 3V, V, 0, 2V, V, 3V, 3V, V, 2V, 0, V, 3V, 0, 2V},
{3V, V, 0, 2V, V, 3V, 2V, 0, 0, 2V, V, 3V, 2V, 0, 3V, V},
{3V, V, 0, 2V, V, 3V, 2V, 0, 0, 2V, 3V, V, 2V, 0, V, 3V},
{3V, V, 0, 2V, V, 3V, 2V, 0, 2V, 0, V, 3V, 0, 2V, 3V, V},
{3V, V, 0, 2V, V, 3V, 2V, 0, 2V, 0, 3V, V, 0, 2V, V, 3V},
{3V, V, V, 3V, V, 3V, 3V, V, 0, 2V, 0, 2V, 2V, 0, 2V, 0},
{3V, V, V, 3V, V, 3V, 3V, V, 0, 2V, 2V, 0, 2V, 0, 0, 2V},
{3V, V, V, 3V, V, 3V, 3V, V, 2V, 0, 0, 2V, 0, 2V, 2V, 0},
{3V, V, V, 3V, V, 3V, 3V, V, 2V, 0, 2V, 0, 0, 2V, 0, 2V},
{3V, V, 2V, 0, V, 3V, 0, 2V, 0, 2V, V, 3V, 2V, 0, 3V, V},
{3V, V, 2V, 0, V, 3V, 0, 2V, 0, 2V, 3V, V, 2V, 0, V, 3V},
{3V, V, 2V, 0, V, 3V, 0, 2V, 2V, 0, V, 3V, 0, 2V, 3V, V},
{3V, V, 2V, 0, V, 3V, 0, 2V, 2V, 0, 3V, V, 0, 2V, V, 3V},
{3V, V, 3V, V, V, 3V, V, 3V, 0, 2V, 0, 2V, 2V, 0, 2V, 0},
{3V, V, 3V, V, V, 3V, V, 3V, 0, 2V, 2V, 0, 2V, 0, 0, 2V},
{3V, V, 3V, V, V, 3V, V, 3V, 2V, 0, 0, 2V, 0, 2V, 2V, 0}, or
{3V, V, 3V, V, V, 3V, V, 3V, 2V, 0, 2V, 0, 0, 2V, 0, 2V}.

17. The apparatus according to claim 12, wherein the delay values of the delay line $a_0$, the delay line $a_1$, the delay line $a_2$, the delay line $a_3$, the delay line $a_4$, the delay line $a_5$, the delay line $a_6$, the delay line $a_7$, the delay line $a_8$, the delay line $a_9$, the delay line $a_{10}$, the delay line $a_{11}$, the delay line $a_{12}$, the delay line $a_{13}$, the delay line $a_{14}$, and the delay line $a_{15}$ in the group k of delay lines in the n delay lines satisfy a fourth condition; and
 wherein the fourth condition is:
  the delay value of the delay line $a_0$ and the delay value of the delay line $a_2$ are equal or have a difference of 2V symbols;
  the delay value of the delay line $a_1$ and the delay value of the delay line $a_3$ are equal or have a difference of 2V symbols;
  the delay value of the delay line $a_2$ and the delay value of the delay line $a_4$ are equal or have a difference of 2V symbols;
  the delay value of the delay line $a_3$ and the delay value of the delay line $a_5$ are equal or have a difference of 2V symbols;
  the delay value of the delay line $a_4$ and the delay value of the delay line $a_6$ are equal or have a difference of 2V symbols;
  the delay value of the delay line $a_5$ and the delay value of the delay line $a_7$ are equal or have a difference of 2V symbols;
  the delay value of the delay line $a_8$ and the delay value of the delay line $a_{10}$ are equal or have a difference of 2V symbols;
  the delay value of the delay line $a_9$ and the delay value of the delay line $a_{11}$ are equal or have a difference of 2V symbols;
  the delay value of the delay line $a_{10}$ and the delay value of the delay line $a_{12}$ are equal or have a difference of 2V symbols;
  the delay value of the delay line $a_{11}$ and the delay value of the delay line $a_{13}$ are equal or have a difference of 2V symbols;
  the delay value of the delay line $a_{12}$ and the delay value of the delay line $a_{14}$ are equal or have a difference of 2V symbols; and
  the delay value of the delay line $a_{13}$ and the delay value of the delay line $a_{15}$ are equal or have a difference of 2V symbols.

18. The apparatus according to claim 17, wherein a second delay value set {B} sequentially comprises the delay values of the delay line $a_0$, the delay line $a_1$, the delay line $a_2$, the delay line $a_3$, the delay line $a_4$, the delay line $a_5$, the delay line $a_6$, the delay line $a_7$, the delay line $a_8$, the delay line $a_9$, the delay line $a_{10}$, the delay line $a_{11}$, the delay line $a_{12}$, the delay line $a_{13}$, the delay line $a_{14}$, and the delay line $a_{15}$ in the group k of delay lines in the n delay lines, and the second delay value set {B} comprises one of the following:

{0, 2V, 0, 2V, 2V, 0, 2V, 0, V, 3V, V, 3V, 3V, V, 3V, V},
{0, 2V, 0, 2V, 2V, 0, 2V, 0, V, 3V, 3V, V, 3V, V, V, 3V},
{0, 2V, 0, 2V, 2V, 0, 2V, 0, 3V, V, V, 3V, V, 3V, 3V, V},
{0, 2V, 0, 2V, 2V, 0, 2V, 0, 3V, V, 3V, V, V, 3V, V, 3V},
{0, 2V, 2V, 0, 2V, 0, 0, 2V, V, 3V, V, 3V, 3V, V, 3V, V},
{0, 2V, 2V, 0, 2V, 0, 0, 2V, V, 3V, 3V, V, 3V, V, V, 3V},
{0, 2V, 2V, 0, 2V, 0, 0, 2V, 3V, V, V, 3V, V, 3V, 3V, V},
{0, 2V, 2V, 0, 2V, 0, 0, 2V, 3V, V, 3V, V, V, 3V, V, 3V},
{V, 3V, V, 3V, 3V, V, 3V, V, 0, 2V, 0, 2V, 2V, 0, 2V, 0},
{V, 3V, V, 3V, 3V, V, 3V, V, 0, 2V, 2V, 0, 2V, 0, 0, 2V},
{V, 3V, V, 3V, 3V, V, 3V, V, 2V, 0, 0, 2V, 0, 2V, 2V, 0},
{V, 3V, V, 3V, 3V, V, 3V, V, 2V, 0, 2V, 0, 0, 2V, 0, 2V},
{V, 3V, 3V, V, 3V, V, V, 3V, 0, 2V, 0, 2V, 2V, 0, 2V, 0},
{V, 3V, 3V, V, 3V, V, V, 3V, 0, 2V, 2V, 0, 2V, 0, 0, 2V},
{V, 3V, 3V, V, 3V, V, V, 3V, 2V, 0, 0, 2V, 0, 2V, 2V, 0},
{V, 3V, 3V, V, 3V, V, V, 3V, 2V, 0, 2V, 0, 0, 2V, 0, 2V},
{2V, 0, 0, 2V, 0, 2V, 2V, 0, V, 3V, V, 3V, 3V, V, 3V, V},
{2V, 0, 0, 2V, 0, 2V, 2V, 0, V, 3V, 3V, V, 3V, V, V, 3V},
{2V, 0, 0, 2V, 0, 2V, 2V, 0, 3V, V, V, 3V, V, 3V, 3V, V},
{2V, 0, 0, 2V, 0, 2V, 2V, 0, 3V, V, 3V, V, V, 3V, V, 3V},
{2V, 0, 2V, 0, 0, 2V, 0, 2V, V, 3V, V, 3V, 3V, V, 3V, V},
{2V, 0, 2V, 0, 0, 2V, 0, 2V, V, 3V, 3V, V, 3V, V, V, 3V},
{2V, 0, 2V, 0, 0, 2V, 0, 2V, 3V, V, V, 3V, V, 3V, 3V, V},
{2V, 0, 2V, 0, 0, 2V, 0, 2V, 3V, V, 3V, V, V, 3V, V, 3V},
{3V, V, V, 3V, V, 3V, 3V, V, 0, 2V, 0, 2V, 2V, 0, 2V, 0},
{3V, V, V, 3V, V, 3V, 3V, V, 0, 2V, 2V, 0, 2V, 0, 0, 2V},
{3V, V, V, 3V, V, 3V, 3V, V, 2V, 0, 0, 2V, 0, 2V, 2V, 0},
{3V, V, V, 3V, V, 3V, 3V, V, 2V, 0, 2V, 0, 0, 2V, 0, 2V},
{3V, V, 3V, V, V, 3V, V, 3V, 0, 2V, 0, 2V, 2V, 0, 2V, 0},
{3V, V, 3V, V, V, 3V, V, 3V, 0, 2V, 2V, 0, 2V, 0, 0, 2V},
{3V, V, 3V, V, V, 3V, V, 3V, 2V, 0, 0, 2V, 0, 2V, 2V, 0}, or
{3V, V, 3V, V, V, 3V, V, 3V, 2V, 0, 2V, 0, 0, 2V, 0, 2V}.

19. The apparatus according to claim 12, wherein a serial number value set {C} sequentially comprises values of $a_0$, $a_1$, $a_2$, $a_3$, $a_4$, $a_5$, $a_6$, $a_7$, $a_8$, $a_9$, $a_{10}$, $a_{11}$, $a_{12}$, $a_{13}$, $a_{14}$, and $a_{15}$, and the value set {C} comprises one of the following:

{0, 1, 2, 3, 4, 5, 6, 7, 8, 9, 10, 11, 12, 13, 14, 15},
{0, 1, 2, 3, 4, 5, 6, 7, 8, 9, 10, 11, 14, 15, 12, 13},
{0, 1, 2, 3, 4, 5, 6, 7, 10, 11, 8, 9, 12, 13, 14, 15},
{0, 1, 2, 3, 4, 5, 6, 7, 10, 11, 8, 9, 14, 15, 12, 13},
{0, 1, 2, 3, 6, 7, 4, 5, 8, 9, 10, 11, 12, 13, 14, 15},
{0, 1, 2, 3, 6, 7, 4, 5, 8, 9, 10, 11, 14, 15, 12, 13},
{0, 1, 2, 3, 6, 7, 4, 5, 10, 11, 8, 9, 12, 13, 14, 15},
{0, 1, 2, 3, 6, 7, 4, 5, 10, 11, 8, 9, 14, 15, 12, 13},
{2, 3, 0, 1, 4, 5, 6, 7, 8, 9, 10, 11, 12, 13, 14, 15},
{2, 3, 0, 1, 4, 5, 6, 7, 8, 9, 10, 11, 14, 15, 12, 13},
{2, 3, 0, 1, 4, 5, 6, 7, 10, 11, 8, 9, 12, 13, 14, 15},
{2, 3, 0, 1, 4, 5, 6, 7, 10, 11, 8, 9, 14, 15, 12, 13},
{2, 3, 0, 1, 6, 7, 4, 5, 8, 9, 10, 11, 12, 13, 14, 15},
{2, 3, 0, 1, 6, 7, 4, 5, 8, 9, 10, 11, 14, 15, 12, 13},
{2, 3, 0, 1, 6, 7, 4, 5, 10, 11, 8, 9, 12, 13, 14, 15},
{2, 3, 0, 1, 6, 7, 4, 5, 10, 11, 8, 9, 14, 15, 12, 13},
{0, 3, 1, 2, 4, 7, 5, 6, 8, 11, 9, 10, 12, 15, 13, 14},
{0, 3, 1, 2, 4, 7, 5, 6, 8, 11, 9, 10, 13, 14, 12, 15},
{0, 3, 1, 2, 4, 7, 5, 6, 9, 10, 8, 11, 12, 15, 13, 14},
{0, 3, 1, 2, 4, 7, 5, 6, 9, 10, 8, 11, 13, 14, 12, 15},
{0, 3, 1, 2, 5, 6, 4, 7, 8, 11, 9, 10, 12, 15, 13, 14},
{0, 3, 1, 2, 5, 6, 4, 7, 8, 11, 9, 10, 13, 14, 12, 15},
{0, 3, 1, 2, 5, 6, 4, 7, 9, 10, 8, 11, 12, 15, 13, 14},
{0, 3, 1, 2, 5, 6, 4, 7, 9, 10, 8, 11, 13, 14, 12, 15},
{1, 2, 0, 3, 4, 7, 5, 6, 8, 11, 9, 10, 12, 15, 13, 14},
{1, 2, 0, 3, 4, 7, 5, 6, 8, 11, 9, 10, 13, 14, 12, 15},
{1, 2, 0, 3, 4, 7, 5, 6, 9, 10, 8, 11, 12, 15, 13, 14},
{1, 2, 0, 3, 4, 7, 5, 6, 9, 10, 8, 11, 13, 14, 12, 15},
{1, 2, 0, 3, 5, 6, 4, 7, 8, 11, 9, 10, 12, 15, 13, 14},
{1, 2, 0, 3, 5, 6, 4, 7, 8, 11, 9, 10, 13, 14, 12, 15},
{1, 2, 0, 3, 5, 6, 4, 7, 9, 10, 8, 11, 12, 15, 13, 14}, or
{1, 2, 0, 3, 5, 6, 4, 7, 9, 10, 8, 11, 13, 14, 12, 15}.

20. The apparatus according to claim 11, wherein each first symbol set of the L first symbol sets comprises n first symbol subsets, and each first symbol subset of the n first symbol subsets comprises m symbols sequentially arranged; and wherein each second symbol set of the L second symbol sets comprises r second symbol subsets, and each second symbol subset of the r second symbol subsets comprises c symbols, wherein r is an integer greater than 1, c is an integer greater than 1, n*m=r*c, and the c symbols in each second symbol subset correspond to c symbols distributed in c first symbol subsets in the first symbol set.

\* \* \* \* \*

UNITED STATES PATENT AND TRADEMARK OFFICE
CERTIFICATE OF CORRECTION

| | | |
|---|---|---|
| PATENT NO. | : 12,395,192 B2 | Page 1 of 1 |
| APPLICATION NO. | : 18/593519 | |
| DATED | : August 19, 2025 | |
| INVENTOR(S) | : Kechao Huang | |

It is certified that error appears in the above-identified patent and that said Letters Patent is hereby corrected as shown below:

In the Claims

In Column 93, in Claim 1, Line 21, delete "Vis" and insert -- V is --.

In Column 100, in Claim 17, Line 50, delete "$a_8$" and insert -- $a_9$ --.

Signed and Sealed this
Twenty-third Day of September, 2025

John A. Squires
*Director of the United States Patent and Trademark Office*